US010126651B2

(12) United States Patent
Sugiyama et al.

(10) Patent No.: US 10,126,651 B2
(45) Date of Patent: Nov. 13, 2018

(54) PATTERN FORMING METHOD, AND, METHOD FOR PRODUCING ELECTRONIC DEVICE AND ELECTRONIC DEVICE, EACH USING THE SAME

(71) Applicant: FUJIFILM Corporation, Tokyo (JP)

(72) Inventors: Shinichi Sugiyama, Haibara-gun (JP); Tsukasa Yamanaka, Haibara-gun (JP); Ryosuke Ueba, Haibara-gun (JP); Makoto Momota, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/606,189

(22) Filed: Jan. 27, 2015

(65) Prior Publication Data

US 2015/0160555 A1 Jun. 11, 2015

Related U.S. Application Data

(63) Continuation of application No. PCT/JP2013/069077, filed on Jul. 5, 2013.

(60) Provisional application No. 61/680,830, filed on Aug. 8, 2012.

(30) Foreign Application Priority Data

Aug. 8, 2012 (JP) ................................. 2012-176075

(51) Int. Cl.
| G03F 7/004 | (2006.01) |
| G03F 7/38 | (2006.01) |
| G03F 7/16 | (2006.01) |
| G03F 7/40 | (2006.01) |
| G03F 7/00 | (2006.01) |
| G03F 7/30 | (2006.01) |
| G03F 7/039 | (2006.01) |
| G03F 7/11 | (2006.01) |
| G03F 7/20 | (2006.01) |
| G03F 7/32 | (2006.01) |

(52) U.S. Cl.
CPC ............ G03F 7/167 (2013.01); G03F 7/0035 (2013.01); G03F 7/0397 (2013.01); G03F 7/11 (2013.01); G03F 7/16 (2013.01); G03F 7/2041 (2013.01); G03F 7/30 (2013.01); G03F 7/325 (2013.01); G03F 7/38 (2013.01); G03F 7/40 (2013.01)

(58) Field of Classification Search
CPC . G03F 7/38; G03F 7/0035; G03F 7/40; G03F 7/0397; G03F 7/167
USPC .............. 430/313, 317, 270.1, 330
See application file for complete search history.

(56) References Cited

U.S. PATENT DOCUMENTS

| 4,743,529 A * | 5/1988 | Farid .................... C07D 311/16 |
| | | 430/281.1 |
| 2008/0187860 A1* | 8/2008 | Tsubaki ................ G03F 7/2024 |
| | | 430/270.1 |
| 2009/0087990 A1 | 4/2009 | Yatsuda et al. |
| 2009/0111281 A1 | 4/2009 | Bencher et al. |
| 2010/0055621 A1* | 3/2010 | Hatakeyama ....... H01L 21/0275 |
| | | 430/323 |
| 2010/0068650 A1* | 3/2010 | Nishimura ............ G03F 7/0035 |
| | | 430/280.1 |
| 2010/0239984 A1 | 9/2010 | Tsubaki |
| 2011/0059396 A1* | 3/2011 | Wang .................... G03F 7/0045 |
| | | 430/270.1 |
| 2011/0083988 A1* | 4/2011 | Yildirim ................ A61J 1/035 |
| | | 206/524.1 |
| 2012/0028437 A1* | 2/2012 | Watanabe ......... H01L 21/02164 |
| | | 438/425 |
| 2012/0077122 A1* | 3/2012 | Iwato ....................... G03F 7/38 |
| | | 430/270.1 |
| 2012/0160801 A1* | 6/2012 | Padmanaban ........... G03F 7/405 |
| | | 216/12 |
| 2012/0302066 A1 | 11/2012 | Iwao |

FOREIGN PATENT DOCUMENTS

| JP | 06077180 A | 3/1994 |
| JP | 2006-32648 A | 2/2006 |
| JP | 2007-305970 A | 11/2007 |
| JP | 2008-310314 A | 12/2008 |
| JP | 2009099938 A | 5/2009 |
| JP | 2010-66597 A | 3/2010 |
| JP | 2010-85977 A | 4/2010 |
| JP | 2010-96896 A | 4/2010 |
| JP | 2013-64829 A | 4/2013 |
| KR | 1020120063390 A | 6/2012 |

(Continued)

OTHER PUBLICATIONS

Notice of Reasons for Rejection, dated Aug. 18, 2015, issued in corresponding JP Application No. 2012-176075, 17 pages in English and Japanese.
Stephen Hsu et al., "Double Exposure Technique for 45nm node and Beyond", Proceeding of SPIE, 25th Annual BACUS Symposium on Photomask Technology, 2005, pp. 59921Q-1-59921Q-16, vol. 5992.
Takuya Kono et al., "Implementation of immersion lithography to NAND/CMOS device manufacturing", 4th Liquid Immersion Symposium 2007, Presentation No. PR-01, 24 pages.

(Continued)

*Primary Examiner* — John S Chu
(74) *Attorney, Agent, or Firm* — Sughrue Mion, PLLC

(57) ABSTRACT

The pattern forming method of the invention includes (i) a step of forming a first film on a substrate using an actinic ray-sensitive or radiation-sensitive resin composition including a resin (A) capable of increasing the polarity by the action of an acid to decrease the solubility in a developer including an organic solvent; (ii) a step of exposing the first film; (iii) a step of developing the exposed first film using a developer including an organic solvent to form a negative tone pattern; and (iv) a step of forming a second film on the second substrate so as to cover the periphery of the negative tone pattern.

9 Claims, 3 Drawing Sheets

(56) References Cited

FOREIGN PATENT DOCUMENTS

WO     2011/138871 A1     11/2011

OTHER PUBLICATIONS

International Search Report for PCT/JP2013/069077 dated Aug. 6, 2013, 3 pages.
Written Opinion for PCT/JP2013/069077 dated Aug. 6, 2013, 5 pages.
Office Action dated Mar. 18, 2016, issued by the Korean Intellectual Property Office in corresponding Korean Application No. 10-2014-7034985.
Office Action dated Sep. 30, 2017, from the State Intellectual Property Office of the P.R.C. in counterpart Chinese Application No. 201380031179.0.
Office Action dated Jul. 5, 2016 from the Taiwanese Intellectual Property Office in counterpart Taiwanese Application No. 102127906.
Office Action dated Jan. 22, 2018, issued by the State Intellectual Property Office of the People's Republic of China in counterpart Chinese Application No. 201380031179.0.

* cited by examiner

PATTERN FORMING METHOD, AND, METHOD FOR PRODUCING ELECTRONIC DEVICE AND ELECTRONIC DEVICE, EACH USING THE SAME

CROSS-REFERENCE TO RELATED APPLICATIONS

This application is a Continuation of PCT International Application No. PCT/JP2013/069077, filed on Jul. 5, 2013, which claims priority under 35 U.S.C. § 119(a) to Japanese Patent Application No. 2012-176075, filed on Aug. 8, 2012, and to U.S. provisional application No. 61/680,830, filed on Aug. 8, 2012. Each of the above application(s) is hereby expressly incorporated by reference, in its entirety, into the present application.

BACKGROUND OF THE INVENTION

1. Field of the Invention

The present invention relates to a pattern forming method, and a method for producing an electronic device and an electronic device, each using the same. More specifically, the invention relates to a pattern forming method, and a method for producing an electronic device and an electronic device, each using the same, each of which is suitable for a step of preparing semiconductors such as an IC, a step of preparing liquid crystals and circuit boards such as a thermal head, and further, a lithography step of other photofabrication processes. In particular, the invention relates to a pattern forming method, and a method for preparing an electronic device and an electronic device, each using the same, each of which is very suitable for exposure by an ArF exposure apparatus and an ArF liquid immersion-type projection exposure apparatus using far ultraviolet light at a wavelength of 300 nm or less as a light source.

2. Description of the Related Art

Currently, ArF liquid immersion lithography has been used in pattern formation with edges, but a resolution that can be reached by a maximum NA of water immersion lithography using a NA 1.35 lens is from 40 to 38 nm. Therefore, for the pattern formation beyond a 30 nm node, a double patterning process has been adopted (see Proc. SPIE Vol. 5992 p. 59921Q-1-16), and many processes have been proposed for the method.

As the double patterning, a spacer process has been proposed and has become a mainstream in the manufacture of an NAND flash memory (see 4$^{th}$ Liquid Immersion Symposium (2007) Presentation No.: PR-01, Title: Implementation of immersion lithography to NAND/CMOS lithography to NAND/CMOS device manufacturing).

Generally, in order to form a silicon oxide film on the periphery of a core material by a chemical vapor deposition (CVD) method and use this silicon oxide film as a spacer, the core material of the spacer is required to have heat resistance during CVD. Therefore, a technique in which a hard mask including a polysilicon film, a silicon oxide film, a silicon nitride film, a silicon nitride oxide film, a titanium nitride film, an amorphous carbon film, or the like is used as a core material of a spacer (see, for example, JP2006-32648A and JP2007-305970A) is a mainstream.

More specifically, in this technique, as shown in the schematic cross-sectional view of FIG. 2A, first, a substrate to be processed 13 as a second substrate, a hard mask layer 12, and a resist layer are formed in this order on a first substrate 14, and then the resist layer is subjected to exposure and development with an alkali developer to form a resist pattern 21.

Next, as shown in the schematic cross-sectional view of FIG. 2B, the hard mask layer 12 is subjected to an etching treatment using a resist pattern 21 as a mask to form a hard mask pattern 22 as a core material.

Next, as shown in the schematic cross-sectional view of FIG. 2C, a silicon oxide film 15 is formed on the substrate to be processed 13 by a chemical vapor deposition method (CVD) so as to cover the periphery of the hard mask layer 22, and as shown in the schematic cross-sectional view of FIG. 2D, an area other than the area on the side wall of the hard mask pattern 22 of the silicon oxide film 15 is removed to form a pattern including a plurality of spacers 25.

Subsequently, as shown in the schematic cross-sectional view of FIG. 2E, the hard mask pattern 22 as a core material is selectively removed, and then, as shown in the schematic cross-sectional view of FIG. 2F, the substrate to be processed 13 is subjected to an etching treatment using a pattern including a plurality of spacers 25 as a mask to form a desired pattern 24 on the first substrate 14.

SUMMARY OF THE INVENTION

However, in a spacer method using a hard mask pattern, in order to form a core material, a step of forming a resist layer on a hard mask layer, a step of subjecting the resist layer to exposure and development to form a resist pattern, and a step of subjecting the hard mask layer to etching using a resist pattern as a mask are required. Therefore, the number of the steps is large and the throughput is low, and thus, the process cost is high.

In view of the circumstances above, in recent years, there has been proposed a method for simplifying the processes, in which a resist film formed with a positive type resist composition is subjected to exposure and positive type development with an alkaline developer, thereby forming a resist pattern, and using the resist pattern itself as a core material, that is, by directly forming a silicon oxide film on the periphery of the resist pattern by a low-temperature CVD method (see JP2010-66597A and JP2010-96896A).

However, the present inventors have intensively studied, and as a result, they have found that as shown in the schematic cross-sectional view of FIG. 3A, when a resist film by a positive type resist composition is formed on a substrate to be processed 13, and this resist film is subjected to exposure and positive type development, thereby directly forming a silicon oxide film 35 on the periphery of the obtained a resist pattern 31, a shape having a bottom portion 31a of the resist pattern 31 protruding to the peripheral side (a so-called fitting shape), and a shape having a periphery 31b in a top portion of the resist pattern 31 contracted towards the inside (so-called round-top shape) are likely to occur. Thus, subsequently, the present inventors have found that the silicon oxide film 35 is formed on the periphery of the resist pattern 31 by, for example, a CVD method at 100° C., and thus, a spacer 45 formed by removing the silicon oxide film 35 existing in an area other than the area on the side walls of the resist pattern 31 has a diagonal shape as shown in the schematic cross-sectional view of FIG. 3B.

Incidentally, when the temperature in the CVD method is set to a higher temperature (for example, 200° C.), as shown in FIG. 3C, the resist pattern 31 is easily modified into a resist pattern 31' having a more apparent tapered shape (specifically, having a periphery 31b' having a shape contracted toward the inside, in particular, in the top portion) by heat during deposition of the silicon oxide film, and thus, the obtained spacer 45' has a more diagonal shape as shown in the schematic cross-sectional view of FIG. 3D.

As described above, in the methods in the related art as described above, it is difficult to form a spacer having high rectangularity and a high temperature condition (for example, 200° C.) advantageous for improving the preparation stability in CVD (for example, film stability of a silicon oxide film) leads to a decrease in the rectangularity of the spacer as described above. Therefore, it has been difficult to employ the methods in the related art.

In other words, in the methods in the related art above, the temperature for CVD should be low (for example, 100° C. or lower) due to a problem of heat resistance of the resist pattern as a core material, and there have been problems of a decrease in the film-forming stability for a silicon oxide film at a low temperature, a decrease in the throughput, or new investment in facilities for stabilization in some cases, which would lead to an increase in the process cost.

The invention has been made in view of the above-described problems, and thus, it has an object to provide a pattern forming method, and a method for producing an electronic device and an electronic device, each using the same, in each of which it is possible to form a spacer having high rectangularity and roughness performance in lithography by a spacer method, and further, even in the case where the resist pattern as a core material formed by the spacer method is subjected to a high-temperature treatment (for example, the case where the resist pattern is applied to a high-temperature CVD method), it is difficult to obtain a modified spacer, and as a result, an increase in the process cost can be suppressed.

The invention has the following configuration, whereby the above-described problems of the invention are solved.

[1] A pattern forming method including:
(i) a step of forming a first film on a substrate using an actinic ray-sensitive or radiation-sensitive resin composition including a resin (A) capable of increasing the polarity by the action of an acid to decrease the solubility in a developer including an organic solvent,
(ii) a step of exposing the first film,
(iii) a step of developing the exposed first film using a developer including an organic solvent to form a negative tone pattern, and
(iv) a step of forming a second film on the substrate so as to cover the periphery of the negative tone pattern.

[2] The pattern forming method as described in [1], in which the resin (A) comprises a repeating unit represented by the following general formula (AI).

[Chem. 1]

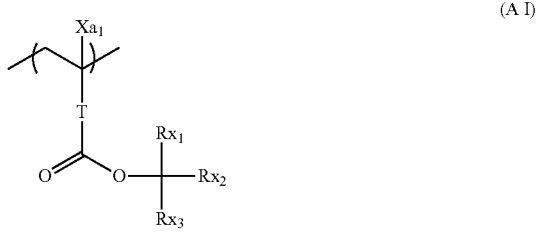

(AI)

(in the general formula (AI),
Xa$_1$ represents a hydrogen atom, an alkyl group, a cyano group, or a halogen atom;
T represents a single bond or a divalent linking group;

Rx$_1$ to Rx$_3$ each independently represent an alkyl group or a cycloalkyl group; and
any two members of Rx$_1$ to Rx$_3$ may be bonded to each other to form a ring structure).

[3] The pattern forming method as described in [2], in which the content of the repeating unit represented by the general formula (AI) is 40% by mole or more, based on all the repeating units of the resin (A).

[4] The pattern forming method as described in any one of [1] to [3], further including (v) a step of heating the negative tone pattern between the step (iii) and the step (iv).

[5] The pattern forming method as described in [4], in which the heating temperature in the step (v) is 150° C. or higher.

[6] The pattern forming method as described in any one of [1] to [5], in which the second film is formed by a chemical vapor deposition method (CVD) in the step (iv).

[7] The pattern forming method as described in any one of [1] to [6], in which the second film is a silicon oxide film.

[8] The pattern forming method as described in any one of [1] to [7], further including (vi) a step of removing the second film existing in an area other than the area on the side wall of the negative tone pattern, and (vii) a step of selectively removing the negative tone pattern, after the step (iv).

[9] A method for producing an electronic device, including the pattern forming method as described in any one of [1] to [8].

[10] An electronic device produced by the method for producing an electronic device as described in [9].

According to the invention, in the lithography by a spacer method, a spacer having high rectangularity and roughness performance can be formed, and further, in a case of subjecting a resist pattern as a core material formed in a spacer method to a high-temperature treatment (for example, a case of subjecting the resist pattern to a high-temperature CVD method), it is difficult to obtain a modified spacer, and as a result, there can be provided a pattern forming method, and a method for producing an electronic device and an electronic device, each using the same, in which an increase in the process cost can be suppressed.

DESCRIPTION OF THE PREFERRED EMBODIMENTS

Figure 1A:
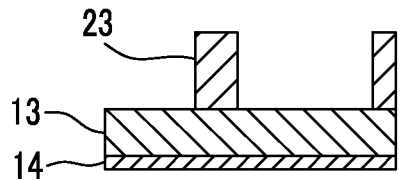
FIGS. 1A to 1E are each a schematic cross-sectional view for illustrating an embodiment of the invention.

Hereinbelow, the embodiments of the invention will be described in detail.

In the description of a group (atomic group) in the present specification, when the group (atomic group) is described without specifying whether substituted or unsubstituted, the group includes both a group (atomic group) having no substituent and a group (atomic group) having a substituent. For example, the term "alkyl group" includes not only an alkyl group having no substituent (unsubstituted alkyl group) but also an alkyl group having a substituent (substituted alkyl group).

In the present specification, the term "actinic ray" or "radiation" refers to, for example, a bright line spectrum of a mercury lamp, far ultraviolet rays typified by an excimer laser, extreme-ultraviolet rays (EUV light), X rays, an electron beam (EB), or the like. Further, the light in the invention means actinic rays or radiation.

Furthermore, unless otherwise specifically indicated, the term "exposure" in the present specification includes not only exposure to a mercury lamp, far ultraviolet rays typified by an excimer laser, X-rays, EUV light, or the like but also drawing with a particle beam such as an electron beam and an ion beam.

The pattern forming method of the invention includes (i) a step of forming a first film on a substrate using an actinic ray-sensitive or radiation-sensitive resin composition including a resin (A) capable of increasing its polarity by the action of an acid to decrease its solubility in a developer including an organic solvent; (ii) a step of exposing the first film; (iii) a step of developing the exposed first film using a developer including an organic solvent to form a negative tone pattern; and (iv) a step of forming a second film on the top surface and the side wall of the negative tone pattern and on the substrate.

According to the pattern forming method, a spacer having high rectangularity and roughness performance can be formed, and further, in a case of subjecting a resist pattern as a core material formed in a spacer method to a high-temperature treatment (for example, a case of subjecting the resist pattern to a high-temperature CVD method), it is difficult to obtain a modified spacer. The reason why an increase in the process cost can be suppressed as a result is not clear, but is presumed as follows.

First, in the case where exposure is carried out for a resist film with a positive type resist composition, as the exposed area is closer to the surface, the exposure amount increases, and thus the surface region dissolved in an alkaline developer tends to be widened. Therefore, the sectional shape of the pattern formed after development tends to be a forwardly tapered shape. Thus, it is believed that in the resist pattern as a core material formed by the example in the related art, a round-top shape easily occurs as described above.

Furthermore, it is contemplated that in the case where an undercoating layer of a resist pattern as a core material is particularly a substrate to be processed, which includes silicon, due to a standing wave, a footing shape easily occurs, as described above.

In addition, the resist pattern formed by the positive tone pattern forming method has low durability against heat in a CVD method or against a stress applied during the deposition of a silicon oxide film deposited on the periphery of the resist pattern, and as described above, particularly, for example, in the case where the temperature in CVD is set to a high temperature (for example, 200° C.), the shape of the resist pattern is easily modified (typically, more easily tapered).

On the other hand, in the invention, a negative tone pattern forming method, in which a resist film is formed using an actinic ray-sensitive or radiation-sensitive resin composition including a resin capable of increasing its polarity by the action of an acid to decrease its solubility in a developer including an organic solvent, and this resist film is subjected to exposure and development with an organic developer, is used. In this case, as the exposed area is closer to the surface, the exposure amount increases, and thus the surface region dissolved in an alkaline developer tends to be widened. Therefore, the sectional shape of the resist pattern tends to be a reversely tapered shape. Thus, first, the round-top shape and the footing shape of the resist pattern that easily occurs in a case of using a positive tone pattern forming method in a resist pattern hardly occur.

Moreover, if a film typified by a silicon oxide film is deposited on the periphery of such a resist pattern by a CVD method, thermal deformation of the resist pattern tends to occur in such a direction that a reversely tapered shape is eliminated in the cross section of the resist pattern. As a result, it is contemplated that in the invention, the rectangularity of the cross-sectional shape of the resist pattern covering the film formed by a CVD method increases, and thus, the rectangularity of the cross-sectional shape of the obtained spacer also increases.

In addition, it is contemplated that an increase in the rectangularity of the cross-sectional shape of the resist pattern as a core material leads to improvement of the roughness performance of the spacer.

Furthermore, it is contemplated that a resist pattern formed by the negative pattern forming method of the invention, which is different from a representative resist pattern formed by a positive tone pattern forming method, has polar groups, typically such as a carboxyl group and a hydroxyl group present therein, and therefore, by an interaction between the polar groups (for example, an interaction due to a hydrogen bond), for example, a glass transition temperature (Tg) of resin constituting a resist pattern increases, and thus, the heat resistance of the resist pattern is improved. Based on this, even when a film is deposited on the periphery of the resist pattern by a CVD method (particularly, a high-temperature CVD method), it is difficult to damage the high rectangularity in the cross-sectional shape of the resist pattern by heat during deposition of the film and as a result, for example, the film-forming stability of the silicon oxide film is improve, and thus, an increase in the process cost can be suppressed.

<Pattern Forming Method>

Hereinafter, the pattern forming method of the invention will be described in detail.

The pattern forming method of the invention includes:
(i) a step of forming a first film on a substrate using an actinic ray-sensitive or radiation-sensitive resin composition including a resin (A) capable of increasing its polarity by the action of an acid to decrease its solubility in a developer including an organic solvent,
(ii) a step of exposing the first film,
(iii) a step of developing the exposed first film using a developer including an organic solvent to form a negative tone pattern, and
(iv) a step of forming a second film on the substrate so as to cover the periphery of the negative tone pattern.

In the pattern forming method of the invention, the steps (i), (ii), and (iii) can be carried out by a generally known method.

In an embodiment of the invention, as shown by the schematic cross-sectional view in FIG. 1A, first, a substrate to be processed 13 as a second substrate and a resist layer (first film) formed with the actinic ray-sensitive or radiation-sensitive resin composition are formed in this order on a first substrate 14.

The first substrate 14, and the substrate to be processed 13 as a second substrate are not particularly limited, and for example, inorganic substrates such as silicon, SiN, SiO$_2$, and SiN, coating-type inorganic substrates such as SOG, or substrates generally used in a step of producing semiconductors such as an IC, a step of producing liquid crystals and circuit boards such as a thermal head, and further, a lithography step of other photofabrication processes may be used. Further, if necessary, an undercoating layer such as an antireflection film may be formed on the substrate. The undercoating layer may be suitably selected from organic antireflection films, inorganic antireflection films, and others. The materials for the undercoating layer may be available from Brewer Science, Inc., Nissan Chemical Industries, Ltd., and the like. Examples of the undercoating layer suitable for a process for development using a developer including an organic solvent include the undercoating layers described in WO2012/039337A.

The method for forming the substrate to be processed 13 can be typically carried out by a method in which materials constituting the substrate to be processed 13 are deposited on the first substrate 14 using a CVD method.

The method for forming a first film using an actinic ray-sensitive or radiation-sensitive resin composition can be typically carried out by coating an actinic ray-sensitive or radiation-sensitive resin composition on a substrate, and examples of the coating method include a spin coating method, a spraying method, a roller-coating method, and a dipping method, which are known in the related art. The actinic ray-sensitive or radiation-sensitive resin composition is preferably coated by a spin-coating method.

The pattern forming method of the invention also preferably includes, between the step (i) and the step (ii), a pre-baking step (PB).

Furthermore, the pattern forming method of the invention also preferably includes, between the step (iii) and the step (iv), a post-exposure baking step (PEB).

Regarding the heating temperature, any of PB and PEB is preferably heated at a temperature of 70° C. to 130° C., and more preferably at a temperature of 80° C. to 120° C.

The heating time is preferably from 30 seconds to 300 seconds, more preferably from 30 seconds to 180 seconds, and still more preferably from 30 seconds to 90 seconds.

Heating may be carried out by a unit included in an exposure/development apparatus, and may also be carried out using a hot plate or the like.

By the baking, the reaction of the exposed portion is accelerated and the sensitivity or pattern profile is improved.

At least one of the prebake step and the post-exposure bake may include repetitions heating steps.

In the step (ii), the light source wavelength used in the exposure apparatus is not limited, but examples thereof include infrared radiation, visible light, ultraviolet rays, far ultraviolet rays, X rays, and an electron beam. The far ultraviolet rays have a wavelength of preferably 250 nm or less, more preferably 220 nm or less, and particularly preferably 1 to 200 nm, specifically, a KrF excimer laser (248 nm), an ArF excimer laser (193 nm), an F2 excimer laser (157 nm), X rays, EUV (13 nm), and an electron beam, with a KrF excimer laser, an ArF excimer laser, EUV, or an electron beam being preferred, and an ArF excimer laser being more preferred.

The step (ii) may contain repetitions exposure steps.

Furthermore, in the step (ii), a liquid immersion exposure method may be applied.

The liquid immersion exposure method is a technique for improving the resolution, in which a high refractive-index liquid (hereinafter also referred to as "liquid for liquid immersion") is filled between a projection lens and a sample to carry out exposure.

As described above, with regard to the "effect of the liquid immersion", taking $\lambda_0$ as the wavelength of exposure light in air, n as the refractive index of the liquid for liquid immersion to air and $\theta$ as the convergent half angle of the light beam, where $NA_0 = \sin\theta$, the resolving power and the focal depth in the case of liquid immersion can be expressed by the following formulae. Here, $k_1$ and $k_2$ are coefficients involved in the process.

$$(\text{Resolution}) = k_1 \cdot (\lambda_0/n)/NA_0$$

$$(\text{Focal depth}) = \pm k_2 \cdot (\lambda_0/n)/NA_0^2$$

That is, the effect of the liquid immersion is equivalent to the use of an exposure wavelength of 1/n. In other words, in projection optical systems of identical NA, liquid immersion enables the focal depth to be n-fold. This is effective in all pattern configurations. Further, this can be combined with a super-resolution technology, such as a phase shift method or a modified illumination method, now under study.

In a case of carrying out a liquid immersion exposure, a step of washing the surface of the first film with an aqueous chemical solution may be carried out (1) after forming a first film on a substrate and before the exposure step, and/or (2) after the step of subjecting the first film to the liquid for liquid immersion and before heating the first film.

The liquid for liquid immersion is preferably a liquid which is transparent in exposure wavelength whose temperature coefficient of a refractive index is as low as possible so as to ensure minimization of any distortion of an optical image projected on the first film. Particularly, in the use of an ArF excimer laser (wavelength: 193 nm) as an exposure light source, however, it is more preferable to use water from the viewpoints of easiness of availability and easiness of handling in addition to the above-described viewpoints.

In the case where water is used as the liquid for liquid immersion, an additive (liquid) in which the resist layer on the wafer does not dissolve and the influence of which on the optical coat on the lower side of the lens element is negligible may be added in a slight proportion in order to reduce the surface tension of water and enhance the surface activity force.

The additive is preferably an aliphatic alcohol with a refractive index approximately equal to that of water, and specific examples thereof include methyl alcohol, ethyl alcohol, and isopropyl alcohol. The addition of an alcohol with a refractive index approximately equal to that of water is advantageous in that even when the alcohol component is evaporated from water, thereby causing a change in the concentration thereof, the change in the refractive index of the liquid as a whole can be minimized.

On the other hand, when a substance being opaque in light at 193 nm or an impurity whose refractive index is greatly different from that of water is mixed therein, the mixing would invite a distortion of optical image projected on the resist. Accordingly, distilled water is preferred as water used. Furthermore, pure water that has been filtered through an ion exchange filter or the like may be used.

For water, used as a liquid for liquid immersion, the electric resistivity is preferably 18.3 MΩcm or more, and the TOC (total organic matter concentration) is preferably 20 ppb or less. Further, water is preferably subjected to a deaeration treatment.

Furthermore, by increasing the refractive index of the liquid for liquid immersion, it is possible to enhance lithography performance. From such viewpoints, an additive capable of increasing a refractive index may be added to water, or heavy water ($D_2O$) may be used in place of water.

In a case of subjecting the first film formed using the actinic ray-sensitive or radiation-sensitive resin composition of the invention to exposure through a liquid immersion medium, if necessary, a hydrophobic resin (D) as described later may be further added. By adding the hydrophobic resin (D), the receding contact angle of the surface is improved. The receding contact angle of the first film is preferably from 60° to 90°, and more preferably from 70° or more.

In the liquid immersion exposure step, the liquid for liquid immersion needs to move on a wafer following the movement of an exposure head that is scanning the wafer at a high speed and forming an exposure pattern. Therefore, the contact angle of the liquid for liquid immersion with the resist film (the first film) in a dynamic state is important, and the resist is required to have a performance of allowing liquid droplets to follow the high-speed scanning of an exposure head without leaving any liquid droplet.

A film sparingly soluble in the liquid for liquid immersion (hereinafter the film is referred to also as "top coat") may be formed between the first film formed using the actinic ray-sensitive or radiation-sensitive resin composition of the invention and the liquid for liquid immersion in order to prevent the film from coming into direct contact with the liquid for liquid immersion. The functions required of the top coat are suitability for coating on the resist, transparency to radiation, particularly, radiation having a wavelength of 193 nm, and sparing solubility in the liquid for liquid immersion. The top coat is preferably unmixable with the resist and uniformly coatable on the resist.

In view of transparency to light at 193 nm, the top coat is preferably an aromatic-free polymer.

Specific examples of the polymer include a hydrocarbon polymer, an acrylic ester polymer, a polymethacrylic acid, a polyacrylic acid, a polyvinyl ether, a silicon-containing polymer, and a fluorine-containing polymer. The above-described hydrophobic resin (D) is suitable also as the top coat. If impurities are dissolved out into the liquid for liquid immersion from the top coat, the optical lens becomes contaminated, and therefore, it is preferable that little residual monomer components of the polymer be contained in the top coat.

On peeling off the top coat, a developer may be used or a release agent may be separately used. As the peeling agent, a solvent having low permeability to the first film is preferred. From the viewpoint that the peeling step may be carried out simultaneously with the development step of the first film, the top coat is preferably peelable with an alkaline developer. From the viewpoint of peeling with an alkaline developer, the top coat is preferably acidic, but from the viewpoint of non-intermixing with the first film, the top coat may be neutral or alkaline.

The difference in the refractive index between the top coat and the liquid for liquid immersion is preferably zero or small. In this case, the resolution can be enhanced. In the case where the exposure light source is an ArF excimer laser (wavelength: 193 nm), water is preferably used as the liquid for liquid immersion, and therefore, the top coat for ArF immersion exposure preferably has a refractive index close to the refractive index (1.44) of water. Also, from the viewpoints of transparency and a refractive index, the top coat is preferably a thin film.

The top coat is preferably unmixable with the first film and further unmixable with the liquid for liquid immersion. From this point of view, when the liquid for liquid immersion is water, the solvent used for the top coat is preferably a medium that is sparingly soluble in the solvent used for the composition of the invention and is insoluble in water.

Furthermore, when the liquid for liquid immersion is an organic solvent, the top coat may be either water-soluble or water-insoluble.

In the step (iii), as the developer in the step in which the first film is developed using a developer including an organic solvent to form a negative tone pattern (which may also be hereinafter referred to as an organic developer), a polar solvent such as a ketone-based solvent, an ester-based solvent, an alcohol-based solvent, an amide-based solvent, and an ether-based solvent, or a hydrocarbon-based solvent may be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methylethyl ketone, methyl isobutyl ketone, acetylacetone, acetonylacetone, ionone, diacetonyl alcohol, acetylcarbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, in addition to the glycol ether-based solvents above, dioxane, tetrahydrofuran, phenethol, and dibutyl ether.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing with a solvent other than those described above or water. However, in order to sufficiently bring out the effects of the invention, the water content of the entire developer is preferably less than 10% by mass, and it is more preferred to include substantially no water.

That is, the content of the organic solvent in the organic developer is preferably from 90% by mass to 100% by mass, and more preferably from 95% by mass to 100% by mass, based on the total amount of the developer.

In particular, the organic developer is preferably a developer containing at least one organic solvent selected from a group consisting of a ketone-based solvent, an ester-based solvent, an alcohol-based solvent, an amide-based solvent, and an ether-based solvent.

The vapor pressure at 20° C. of the organic developer is preferably 5 kPa or less, more preferably 3 kPa or less, and particularly preferably 2 kPa or less. By setting the vapor pressure of the developer to 5 kPa or less, evaporation of the developer on a substrate or in a development cup is inhibited and the temperature uniformity in the wafer plane is enhanced, as a result, the dimensional uniformity in the wafer plane is improved.

Specific examples of the solvent having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone, and methyl isobutyl ketone; ester-based solvents such as butyl acetate, pentyl acetate, isopentyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate; alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol; ether-based solvents such as tetrahydrofuran, phenetol, and dibutyl ether; amide-based solvents such as N-methyl-2-pyrrolidone, N,N-dimethylacetamide, and N,N-dimethylformamide; aromatic hydrocarbon-based solvents such as toluene and xylene; and aliphatic hydrocarbon-based solvents such as octane and decane.

Specific examples of the solvent having a vapor pressure of 2 kPa or less, which is a particularly preferred range, include ketone-based solvents such as 1-octanone, 2-octanone, 1-nonanone, 2-nonanone, 4-heptanone, 2-hexanone, diisobutyl ketone, cyclohexanone, methylcyclohexanone, and phenylacetone; ester-based solvents such as butyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate; alcohol-based solvents such as n-butyl alcohol, sec-butyl alcohol, tent-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol; ether-based solvents such as phenetol and dibutyl ether; amide-based solvents such as N-methyl-2-pyrrolidone, N,N-dimethylacetamide, and N,N-dimethylformamide; aromatic hydrocarbon-based solvents such as xylene; and aliphatic hydrocarbon-based solvents such as octane and decane.

An appropriate amount of a surfactant may be added to the organic developer, if desired.

The surfactant is not particularly limited but, for example, an ionic or nonionic fluorine-based and/or silicon-based surfactant can be used. Examples of such a fluorine-based and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720B, U.S. Pat. No. 5,360,692B, U.S. Pat. No. 5,529,881B, U.S. Pat. No. 5,296,330B, U.S. Pat. No. 5,436,098B, U.S. Pat. No. 5,576,143B, U.S. Pat. No. 5,294,511B, and U.S. Pat. No. 5,824,451B. A nonionic surfactant is preferred. The nonionic surfactant is not particularly limited, but use of a fluorine-based surfactant or a silicon-based surfactant is more preferred.

The amount of the surfactant used is usually from 0.001% by mass to 5% by mass, preferably from 0.005% by mass to 2% by mass, and more preferably from 0.01% by mass to 0.5% by mass, based on the total amount of the developer.

Further, after the development using a developer including an organic solvent, stopping the development by replacement with another solvent may be carried out.

The pattern forming method of the invention preferably includes a step of washing (rinsing step) using a rinsing liquid including an organic solvent, between the step (iii) and the step (iv), that is, after the step of developing using a developer including an organic solvent.

The rinsing liquid used in the rinsing step after the development using a developer including an organic solvent is not particularly limited as long as it does not dissolve the resist pattern, and a solution including an ordinary organic solvent may be used. As the rinsing liquid, a rinsing liquid including at least one organic solvent selected from a group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as mentioned above with respect to the developer including an organic solvent.

After the development using a developer including an organic solvent, more preferably washing with a rinsing liquid containing at least one organic solvent selected from the group consisting of a ketone-based solvent, an ester-based solvent, an alcohol-based solvent, and an amide-based solvent is carried out; still more preferably washing with a rinsing liquid containing an alcohol-based solvent or an ester-based solvent is carried out after the development; particularly preferably washing with a rinsing liquid containing a monohydric alcohol is carried out; and most preferably washing with a rinsing liquid containing a monohydric alcohol having 5 or more carbon atoms is carried out.

Here, the monohydric alcohol used in the rinsing includes linear, branched, and cyclic monohydric alcohols, and specifically 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like may be used. As the particularly preferred monohydric alcohol having 5 or more carbon atoms, 1-hexanol, 2-hexanol, 4-methyl-2-pentanol, 1-pentanol, 3-methyl-1-butanol, or the like may be used.

A plurality of these respective components may be mixed or the components may be used by mixing them with an organic solvent other than those described above.

The water content in the rinsing liquid is preferably 10% by mass or less, more preferably 5% by mass or less, and particularly preferably 3% by mass or less. By setting the water content to 10% by mass or less, good development characteristics can be obtained.

The vapor pressure at 20° C. of the rinsing liquid used after the development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a value ranging from 0.05 kPa to 5 kPa, the temperature uniformity in the wafer plane is enhanced and moreover, swelling due to permeation of the rinsing liquid is inhibited, as a result, the dimensional uniformity in the wafer plane is improved.

The method for the washing treatment in the rinsing step is not particularly limited but, for example, a method of continuously discharging the rinsing liquid on the substrate spinning at a fixed speed (spin coating method), a method of dipping the substrate in a bath filled with the rinsing liquid for a fixed time (dipping method), and a method of spraying the rinsing liquid on the substrate surface (spraying method) may be applied. Above all, it is preferable to perform the washing treatment by the spin coating method and after the washing, remove the rinsing liquid from the substrate surface by spinning the substrate at a rotational speed of 2000 rpm to 4000 rpm. Further, it is also preferable to include heating (Post Bake) after the rinsing. The developer and the rinsing liquid remaining between the patterns and inside the patterns are removed by the baking. The heating after the rinsing is carried out at usually from 40° C. to 160° C., and preferably from 70° C. to 95° C., and for usually from 10 seconds to 3 minutes, and preferably from 30 seconds to 90 seconds.

In addition, after the development treatment or the rinsing treatment, a treatment of removing the developer or the rinsing liquid adhered on the pattern with a supercritical fluid may be carried out.

As described above, by subjecting the resist layer to the steps (ii) and (iii), a resist pattern 23 is formed on the substrate to be processed 13 as shown in the schematic cross-sectional view of FIG. 1A.

Between the step (iii) and the step (iv) as described in detail later, (v) a step of heating the negative tone pattern may be further carried out, and as a result, low-molecular-weight components in the negative tone pattern may be evaporated. Thus, in the step (iii), deformation of the negative tone pattern can be further suppressed. The heating temperature in this heating step is usually 80° C. or higher, and preferably 150° C. or higher. Further, the heating temperature is usually 250° C. or lower. Heating is preferably carried out for about 30 seconds to 120 seconds.

Figure 1B:
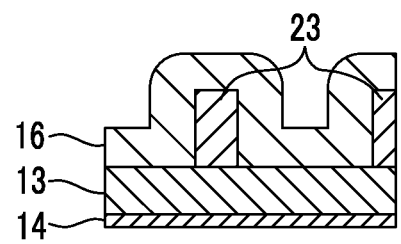

In the step (iv), a second film is formed on the substrate so as to cover the periphery of the negative tone pattern formed in the step (iii). That is, as shown in the schematic cross-sectional view of FIG. 1B, a second film 16 is formed on a substrate to be processed 13 as a second substrate so as to cover the periphery of a resist pattern 23.

Suitable examples of the method for forming the second film include Chemical Vapor Deposition (CVD), and examples of CVD include Low-Pressure Chemical Vapor Deposition (LPCVD), and Plasma-Exciton Chemical Vapor Deposition (PECVD), and Atomic Layer Deposition (ALD) (JP2003-7700A and JP2005-197561A).

The temperature for CVD varies depending on the device of CVD and the kind of the film to be formed, but in a case of a silicon oxide film ($SiO_2$ film), the temperature is preferably from 20° C. to 350° C., and more preferably from 180° C. to 300° C. However, recently, a CVD device in which a low-temperature region of, for example, 20° C. to 100° C. is preferred is also being developed. In a case of this CVD device, the kind of the film that can be formed is limited to $SiO_2$ and the like. On the other hand, if that the temperature for CVD is from 180° C. to 300° C., an increase in the process cost can be suppressed due to, for example, improvement of the film-forming stability. Further, it is also possible to form a film of SiN or the like in addition $SiO_2$.

Suitable examples of the second film formed by CVD include silicon oxide films, silicon nitride films, and films formed with various metal oxides or metal nitrides such as $HfO_2$ and $Al_2O_3$. The second film is preferably a silicon oxide film stably formable by CVD at a temperature which is not too high.

Furthermore, the pattern forming method of the invention typically further includes (vi) a step of removing the second film existing in an area other than the area on the side wall of the negative tone pattern, and (vii) a step of selectively removing the negative tone pattern, after the step (iv).

Figure 1C:
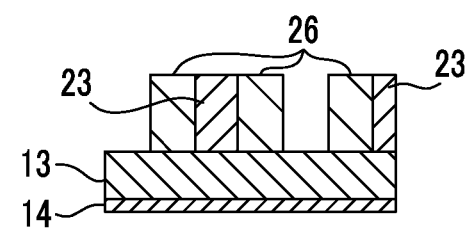
Figure 1D:
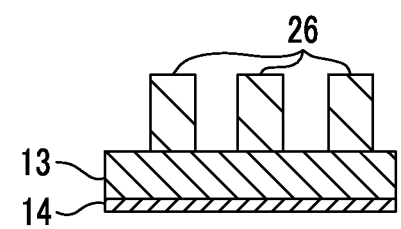

That is, in this case, as shown in the schematic cross-sectional view of FIG. 1C, an area other than the area on the side wall of the resist pattern 23 of the second film 16, and a pattern including a plurality of spacers 26 is formed. Then, as shown in the schematic cross-sectional view of FIG. 1D, the resist pattern 23 as the core material is selectively removed.

In the step (vi), as a method for removing the area of the second film, an etching process is representative, and as an etching process, anisotropic reactive-ion etching (RIE) is common (see JP2006-32648A and JP2007-305970A).

Furthermore, in the step (vii), as a method for removing a negative tone pattern selectively, an ashing process under an oxygen atmosphere ($O_2$ asher) or the like is common (see JP2006-32648A and JP2007-305970A).

The pattern forming method of the invention may further include a step (viii) of carrying out an etching treatment using a remaining film of the second film as a mask after the step (vii).

Figure 1E:
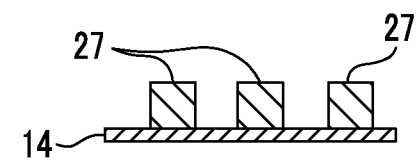
Figure 2A:
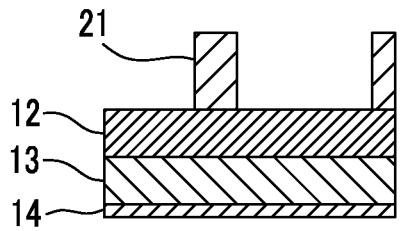
FIGS. 2A to 2F are each a schematic cross-sectional view for illustrating an embodiment in an example in the related art.
Figure 2B:
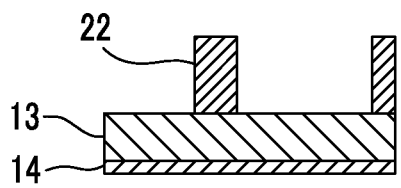
Figure 2C:
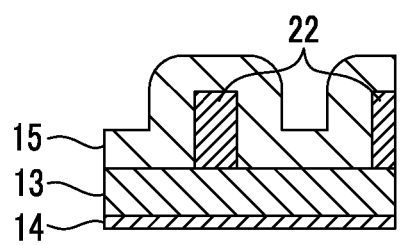
Figure 2D:
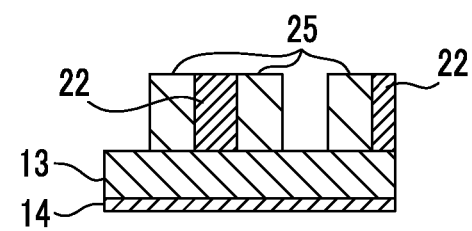
Figure 2E:
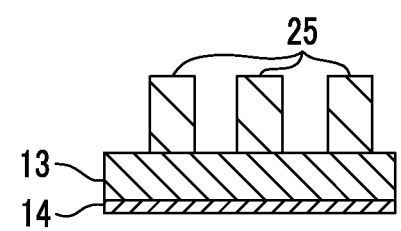
Figure 2F:
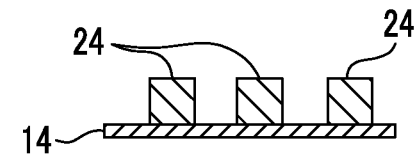
Figure 3A:
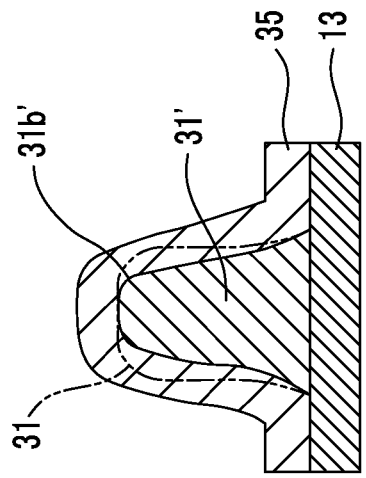
FIGS. 3A and 3C are each a schematic cross-sectional view for illustrating a resist pattern as a core material in an example in the related art.
Figure 3C:
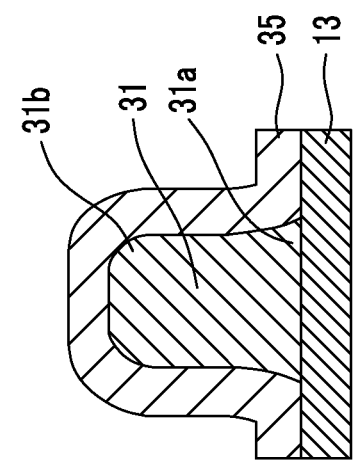
Figure 3B:
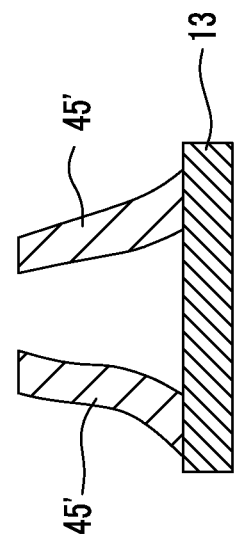
FIGS. 3B and 3D are each a schematic cross-sectional view for illustrating a spacer formed in an example in the related art.
Figure 3D:
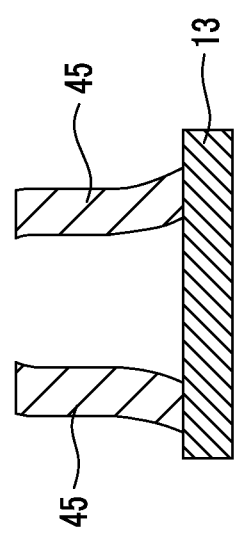

In this case, as shown in the schematic cross-sectional view of FIG. 1E, the substrate to be processed 13 is subjected to an etching treatment using a pattern including a plurality of spacers 26 as a mask, and thus, a desired pattern 27 having excellent rectangularity and roughness performance is formed on the first substrate 14.

The etching treatment is not particularly limited, and any of known ones may be employed.

<Actinic Ray-Sensitive or Radiation-Sensitive Resin Composition>

An actinic ray-sensitive or radiation-sensitive resin composition used in the pattern forming method of the invention will be described below.

The actinic ray-sensitive or radiation-sensitive resin composition is typically a resist composition, and is a negative type resist composition (that is, a resist composition for development in an organic solvent). In addition, the actinic ray-sensitive or radiation-sensitive resin composition is typically a chemical amplification type resist composition.

[1] (A) Resin Capable of Increasing its Polarity by Action of Acid to Decrease its Solubility in Developer Including Organic Solvent Examples of the resin (A) capable of increasing its polarity to decrease its solubility in a developer including an organic solvent, which is included in an actinic ray-sensitive or radiation-sensitive resin composition, include resins capable of decomposing in either a main chain or a side chain, or both of a main chain and a side chain of the resin by the action of an acid to generate a polar group (which may also be hereinafter referred to as an "acid-decomposable resin" or a "resin (A)") having a polar group (which may also be hereinafter referred to as an "acid-decomposable group").

The acid-decomposable group preferably has a structure where a polar group is protected by a group which decomposes and leaves by the action of an acid.

The polar group is not particularly limited as long as it is sparingly soluble or insoluble in a developer including an organic solvent, but examples thereof include acidic groups (groups which are dissociated in a 2.38%-by-mass aqueous tetramethylammonium hydroxide solution used as a developer for a resist in the related art) such as a phenolic hydroxyl group, a carboxyl group, a fluorinate alcohol group (preferably a hexafluoroisopropanol group), a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and alcoholic hydroxyl groups.

Herein, the alcoholic hydroxyl group refers to a hydroxyl group other than a hydroxyl group directly bonded to an aromatic ring as a hydroxyl group bonded to a hydrocarbon group (phenolic hydroxyl group). As the hydroxyl group, aliphatic alcohol having the α-position substituted with an electron-withdrawing group such as a fluorine atom (for example, a fluorinated alcohol group (a hexafluoroisopropanol group or the like)) is excluded. As the alcoholic hydroxyl group, a hydroxyl group having a pKa of 12 to 20 is preferred.

Preferred examples of the polar group include a carboxyl group, a fluorinated alcohol group (preferably a hexafluoroisopropanol group), and a sulfonic acid group.

The acid-decomposable group is preferably a group formed by substituting a group capable of leaving by an acid for a hydrogen atom of the above-described group.

Examples of the group capable of leaving by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$ and $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$ and $R_{02}$ may be either monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, and a cyclooctyl group. The polycyclic cycloalkyl group is preferably a cycloalkyl group having 6 to 20 carbon atoms, and examples thereof include an adamantyl group, a norbornyl group, an isobornyl group, a camphanyl group, a dicyclopentyl group, an α-pinel group, a tricyclodecanyl group, a tetracyclododecyl group, and an androstanyl group. Further, at least one carbon atom in the cycloalkyl group may be substituted with a heteroatom such as an oxygen atom.

The aryl group of $R_{36}$ to $R_{39}$, $R_{01}$ and $R_{02}$ is preferably an aryl group having 6 to 10 carbon atoms, and examples thereof include a phenyl group, a naphthyl group, and an anthryl group.

The aralkyl group of $R_{36}$ to $R_{39}$, $R_{01}$ and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having 2 to 8 carbon atoms, and examples thereof include a vinyl group, an allyl group, a butenyl group, and a cyclohexenyl group.

The ring formed by the mutual bonding of $R_{36}$ and $R_{37}$ is preferably a (monocyclic or polycyclic)cycloalkyl group. The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. A monocyclic cycloalkyl group having 5 or 6 carbon atoms is more preferred, and a monocyclic cycloalkyl group having 5 carbon atoms is particularly preferred.

Preferred examples of the acid-decomposable group include a cumyl ester group, an enol ester group, an acetal ester group and a tertiary alkyl ester group, with a tertiary alkyl ester group being more preferred.

The resin (A) preferably contains a repeating unit having an acid-decomposable group.

Moreover, the resin (A) preferably has a repeating unit represented by the following general formula (AI). The repeating unit represented by the general formula (AI) generates a carboxyl group as a polar group by the action of an acid, and exhibits a high interaction therebetween due to hydrogen bonds between a plurality of carboxyl groups, whereby the glass transition temperature (Tg) of the resin (A) can be further enhanced. As a result, even when a film is deposited on the periphery of the resist pattern by a CVD method (particularly, a high-temperature CVD method), damaging of a high rectangularity in the cross-sectional shape of the resist pattern due to heat during deposition of a film can be further made, and as a result, an increase in the process cost can be further suppressed.

[Chem. 2]

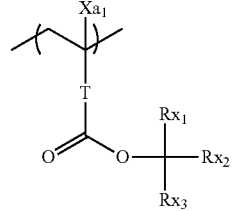

(AI)

In the general formula (AI), $Xa_1$ represents a hydrogen atom, an alkyl group, a cyano group, or a halogen atom;

T represents a single bond or a divalent linking group;

Rx$_1$ to Rx$_3$ each independently represent an alkyl group or a cycloalkyl group; and any two members of Rx$_1$ to Rx$_3$ may be bonded to each other to form a ring structure.

Examples of the divalent linking group of T include an alkylene group, a —COO-Rt- group, a —O-Rt- group, and a phenylene group. In the formulae, Rt represents an alkylene group or a cycloalkylene group.

T is preferably a single bond or a —COO-Rt- group. Rt is preferably an alkylene group having 1 to 5 carbon atoms, and more preferably a —CH$_2$— group, a —(CH$_2$)$_2$— group, or a —(CH$_2$)$_3$— group. T is still more preferably a single bond.

The alkyl group of X$_{a1}$ may have a substituent, and examples of the substituent include a hydroxyl group and a halogen atom (preferably a fluorine atom).

The alkyl group of X$_{a1}$ preferably has 1 to 4 carbon atoms, and examples thereof include a methyl group, an ethyl group, a propyl group, a hydroxymethyl group, and a trifluoromethyl group, with a methyl group being preferred.

X$_{a1}$ is preferably a hydrogen atom or a methyl group.

The alkyl group of Rx$_1$, Rx$_2$, and Rx$_3$ may be linear or branched, and is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group of Rx$_1$, Rx$_2$, and Rx$_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

The ring structure formed by the mutual bonding of at least two members out of Rx$_1$, Rx$_2$, and Rx$_3$ is preferably a monocyclic cycloalkane ring such as a cyclopentyl ring and a cyclohexyl ring, or a polycyclic cycloalkyl group such as a norbornane ring, a tetracyclodecane ring, a tetracyclododecane ring, and an adamantane ring, with a monocyclic cycloalkane ring having 5 or 6 carbon atoms being particularly preferred.

Rx$_1$, Rx$_2$, and Rx$_3$ are each independently preferably an alkyl group, and more preferably a linear or branched alkyl group having 1 to 4 carbon atoms.

Each of the groups above may have a substituent, and examples of the substituent include an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms), and the substituent preferably has 8 or less carbon atoms. Among those, from the viewpoint of improvement of a dissolution contrast with respect to a developer containing an organic solvent before and after acid decomposition, a substituent having no hetero atom such as an oxygen atom, a nitrogen atom, and a sulfur atom is more preferred (for example, more preferably it is not an alkyl or the like substituted with a hydroxyl group), a group consisting of only hydrogen atoms and carbon atoms is still more preferred, and a linear or branched alkyl group, or a cycloalkyl group is particularly preferred.

Specific examples of the repeating unit represented by the general formula (AI) are shown below, but the invention is not limited to these specific examples.

In the specific examples, Rx represents a hydrogen atom, CH$_3$, CF$_3$, or CH$_2$OH. Rxa and Rxb each represent an alkyl group having 1 to 4 carbon atoms. Xa$_1$ represents a hydrogen atom, CH$_3$, CF$_3$, or CH$_2$OH. Z represents a substituent, and when a plurality of Z's are present, they may be the same as or different from each other. p represents 0 or a positive integer. Specific examples and preferred examples of Z are the same as specific examples and preferred examples of the substituent that each of Rx$_1$ to Rx$_3$ and the like may have.

[Chem. 3]

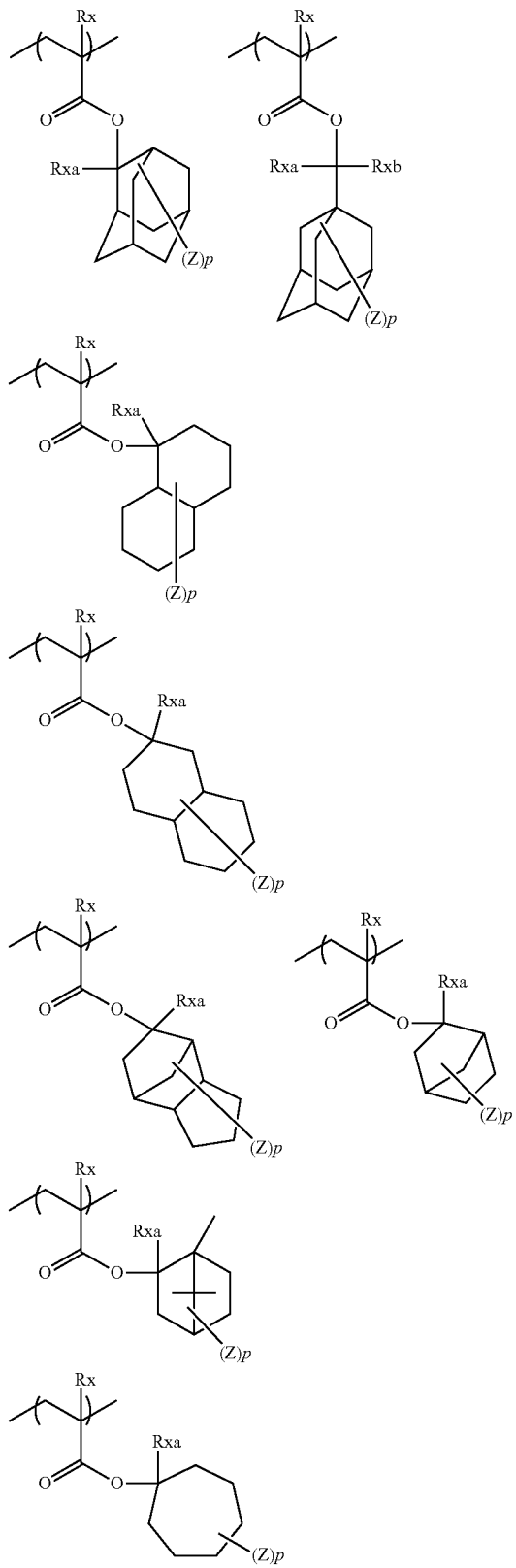

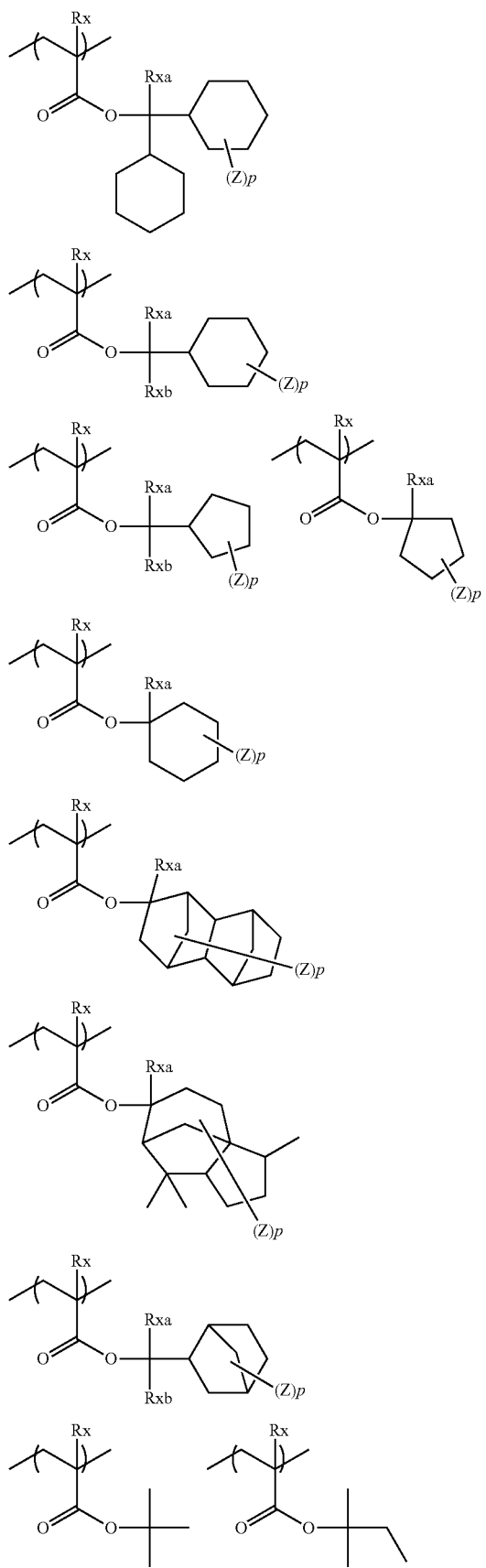
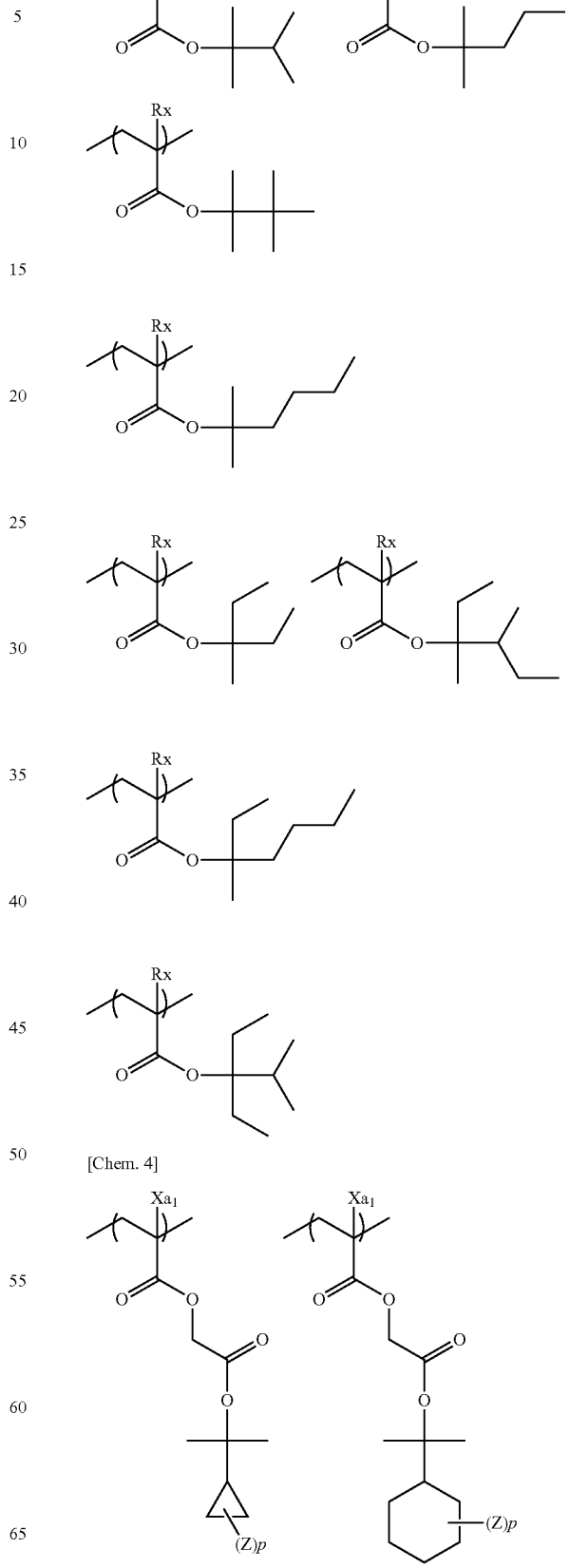
[Chem. 4]

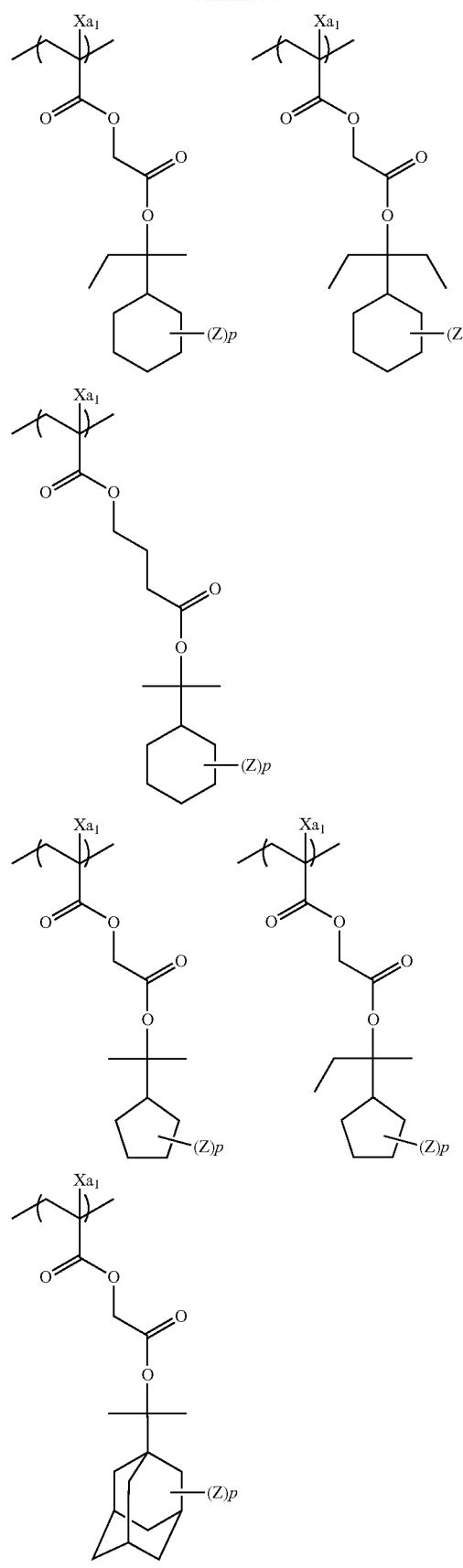
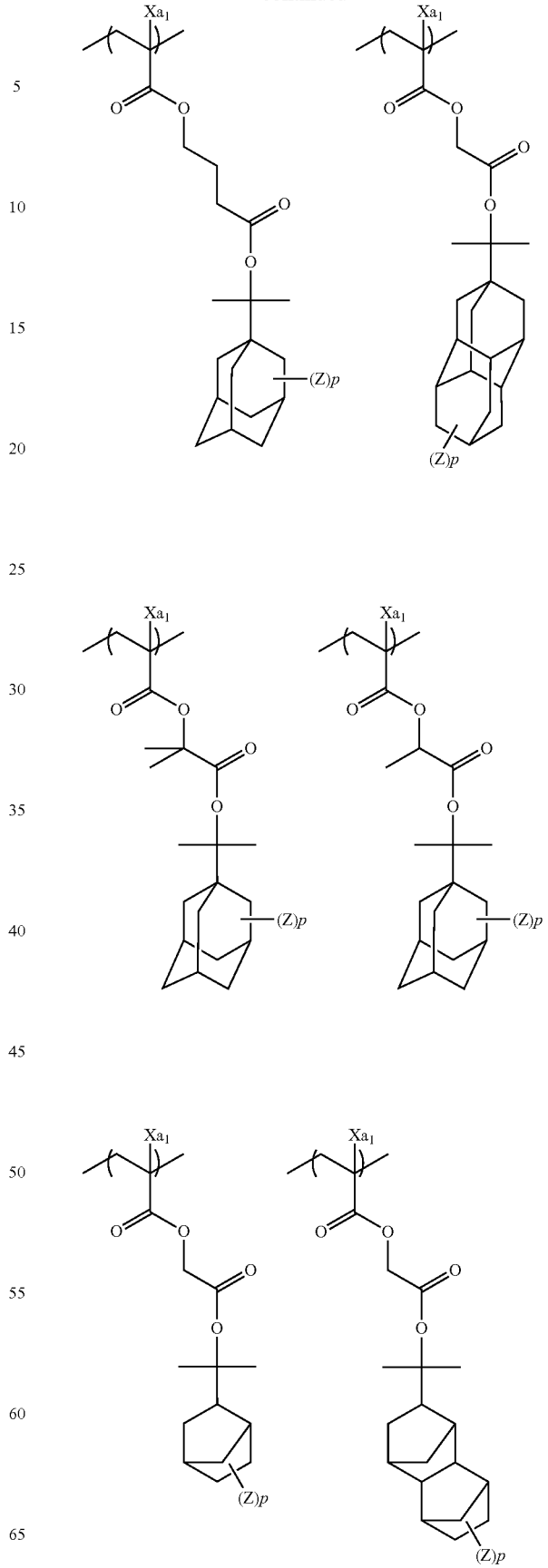

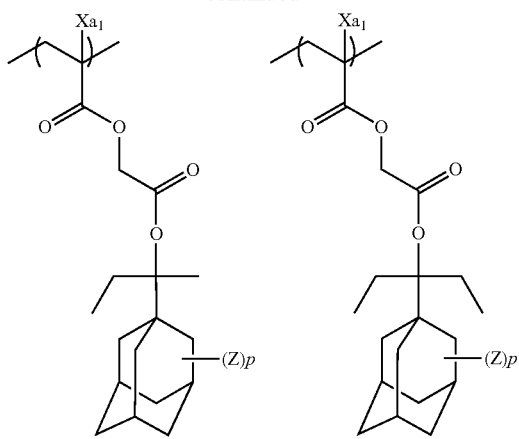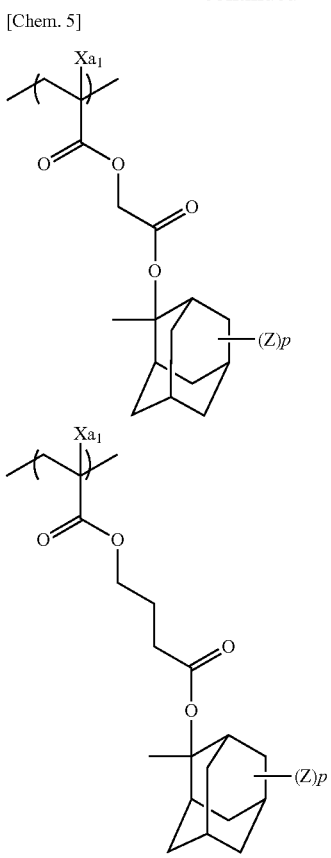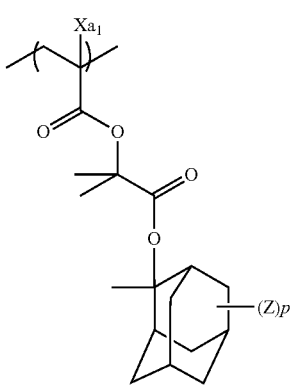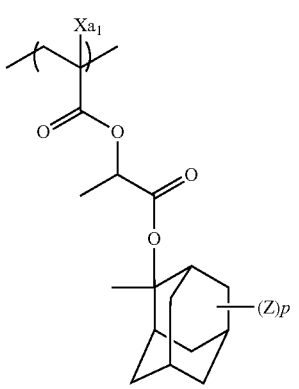

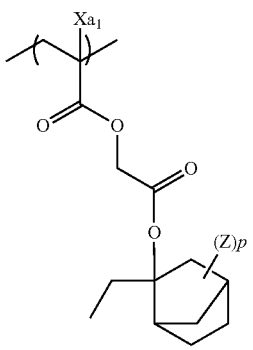
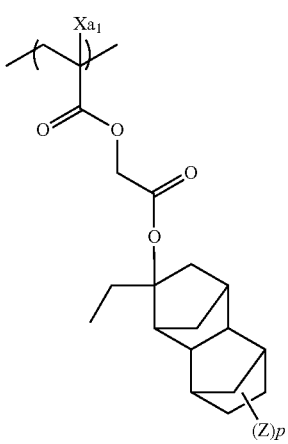
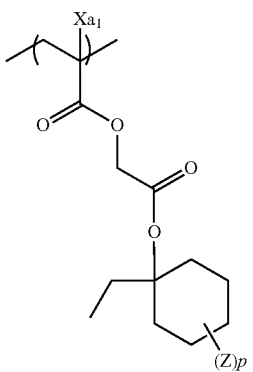
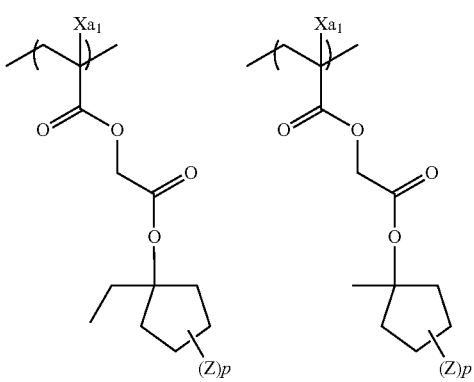
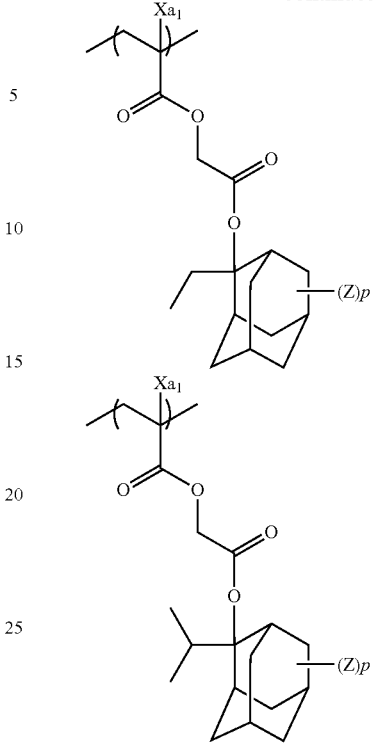

In addition, the resin (A) preferably has a repeating unit represented by the following general formula (IV) as a repeating unit having an acid-decomposable group.

[Chem. 6]

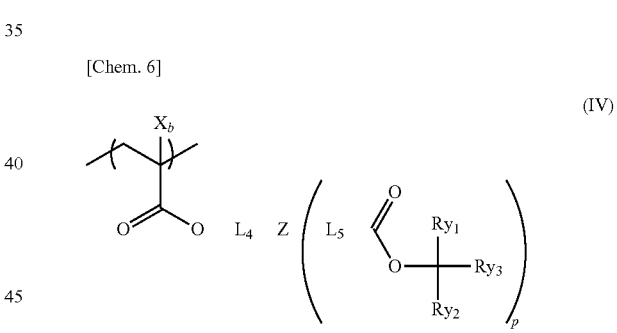

(IV)

In the general formula (IV), $X_b$ represents a hydrogen atom, an alkyl group, a cyano group, or a halogen atom;
$Ry_1$ to $Ry_3$ each independently represent an alkyl group or a cycloalkyl group, and any two members of $Ry_1$ to $Ry_3$ may be linked to each other to form a ring;
Z represents a (p+1)-valent linking group having a polycyclic hydrocarbon structure which may have a hetero atom as a ring member. Z preferably has no ester bond as an atomic group constituting a polycycle (in other words, Z preferably has no lactone ring as a ring constituting a polycycle);
$L_4$ and $L_5$ each independently represent a single bond or a divalent linking group;
p represents an integer of 1 to 3; and
when p is 2 or 3, a plurality of $L_5$'s, a plurality of $Ry_1$'s, a plurality of $Ry_2$'s, and a plurality of $Ry_3$'s may be the same as or different from each other.
The alkyl group of $X_b$ may have a substituent, and examples of the substituent include a hydroxyl group and a halogen atom (preferably a fluorine atom).

The alkyl group of $X_b$ preferably has 1 to 4 carbon atoms, and examples thereof include a methyl group, an ethyl group, a propyl group, a hydroxymethyl group, and a trifluoromethyl group, with a methyl group being preferred.

$X_b$ is preferably a hydrogen atom or a methyl group.

Specific examples and preferred examples of the alkyl group and the cycloalkyl group of $Ry_1$ to $Ry_3$ are the same as the specific examples and preferred examples of the alkyl group and the cycloalkyl group of $Rx_1$ to $Rx_3$ in the general formula (AI).

Specific examples and preferred examples of the ring structure formed by the mutual bonding of two members out of $Ry_1$ to $Ry_3$ are the same as the specific examples and preferred examples of the ring structure formed by the mutual bonding of two members out of $Rx_1$ to $Rx_3$ in the general formula (AI).

$Ry_1$ to $Ry_3$ each independently preferably represent an alkyl group, and more preferably a chained or branched alkyl group having 1 to 4 carbon atoms. Further, the total number of carbon atoms of the chained or branched alkyl group as $Ry_1$ to $Ry_3$ is preferably 5 or less.

$Ry_1$ to $Ry_3$ may further have a substituent, and examples of such a substituent include those exemplified as a substituent that $Rx_1$ to $Rx_3$ further have in the general formula (AI).

Examples of the linking group having a polycyclic hydrocarbon structure of Z include a ring-assembly hydrocarbon ring group and a crosslinked cyclic hydrocarbon ring group, each including a group formed by removing arbitrary (p+1) hydrogen atoms from a ring-assembly hydrocarbon ring, and a group formed by removing arbitrary (p+1) hydrogen atoms from a crosslinked-ring hydrocarbon ring.

Examples of the ring assembly hydrocarbon group include a bicyclohexane ring and a perhydronaphthalene ring group. Examples of the crosslinked cyclic hydrocarbon ring group include a bicyclic hydrocarbon ring group such as a pinane ring, a bornane ring, a norpinane ring, a norbornane ring, and a bicyclooctane ring (for example, a bicyclo[2.2.2]octane ring and a bicyclo[3.2.1]octane ring), a tricyclic hydrocarbon ring group such as a homobrendane ring, an adamantane ring, a tricyclo[5.2.1.0$^{2,6}$]decane ring, and a tricyclo[4.3.1.1$^{2,5}$]undecane ring, and a tetracyclic hydrocarbon ring group such as a tetracyclo[4.4.0.1$^{2,5}$.1$^{7,10}$]dodecane ring and a perhydro-1,4-methano-5,8-methanonaphthalene ring. The crosslinked cyclic hydrocarbon ring group also includes a condensed cyclic hydrocarbon ring group, for example, a condensed ring formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring, and a perhydrophenalene ring.

Preferred examples of the crosslinked cyclic hydrocarbon ring group include a norbornane ring group, an adamantane ring group, a bicyclooctane ring group, and a tricyclo[5,2,1,0$^{2,6}$]decane ring group. More preferred examples of the crosslinked cyclic hydrocarbon ring group include a norbornane ring group and an adamantane ring group.

The linking group having a polycyclic hydrocarbon structure represented by Z may have a substituent. Examples of the substituent which Z may have include substituents such as an alkyl group, a hydroxyl group, a cyano group, a keto group (alkylcarbonyl group and the like), an acyloxy group, —COOR, —CON(R)$_2$, —SO$_2$R, —SO$_3$R, and —SO$_2$N(R)$_2$. Herein, R represents a hydrogen atom, an alkyl group, a cycloalkyl group, or an aryl group.

The alkyl group, the alkylcarbonyl group, the acyloxy group, —COOR, —CON(R)$_2$, —SO$_2$R, —SO$_3$R, or —SO$_2$N(R)$_2$ as a substituent which Z may have include a halogen atom (preferably a fluorine atom).

Carbon (carbon which contributes to forming a ring) constituting a polycycle in the linking group having a polycyclic hydrocarbon structure represented by Z and may be a carbonyl carbon. Further, the polycycle may have a hetero atom such as an oxygen atom and a sulfur atom as a ring member as described above. However, as described above, Z does not include an ester bond as an atomic group included in the polycyclic structure.

Examples of the linking group represented by $L_4$ and $L_5$ include —COO—, —OCO—, —CONH—, —NHCO—, —CO—, —O—, —S—, —SO—, —SO$_2$—, an alkylene group (preferably 1 to 6 carbon atoms), a cycloalkylene group (preferably 3 to 10 carbon atoms), an alkenylene group (preferably 2 to 6 carbon atoms) or a linking group formed by these plural groups, with a linking group having a total number of carbon atoms of 12 or less being preferred.

$L_4$ is preferably a single bond, an alkylene group, —COO—, —OCO—, —CONH—, —NHCO—, -alkylene group-COO—, -alkylene group-OCO—, -alkylene group-CONH—, -alkylene group-NHCO—, —CO—, —O—, —SO$_2$—, and -alkylene group-O—, and more preferably a single bond, an alkylene group, -alkylene group-COO—, or -alkylene group-O—.

$L_5$ is preferably a single bond, an alkylene group, —COO—, —OCO—, —CONH—, —NHCO—, —COO-alkylene group-, —OCO-alkylene group-, —CONH-alkylene group-, —NHCO-alkylene group-, —CO—, —O—, —SO$_2$—, —O-alkylene group-, or —O-cycloalkylene group-, and more preferably a single bond, an alkylene group, —COO-alkylene group-, —O-alkylene group-, or —O-cycloalkylene group-.

In the method described above, the bond "—" on the left side means a connection to an ester bond of the main chain in $L_4$ and to Z in $L_5$, and the bond "—" on the right side means a connection to Z in $L_4$ and to an ester bond connected to a group represented by $(Ry_1)(Ry_2)(Ry_3)C$— in $L_5$.

Incidentally, $L_4$ and $L_5$ may be bonded to the same atom as an atom constituting a polycycle in Z.

p is preferably 1 or 2, and more preferably 1.

Specific examples of a repeating unit represented by the general formula (IV) are shown below, but the invention is not limited thereto. In the following specific examples, Xa represents a hydrogen atom, an alkyl group, a cyano group, or a halogen atom.

[Chem. 7]

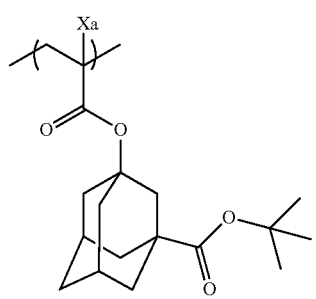

29
-continued
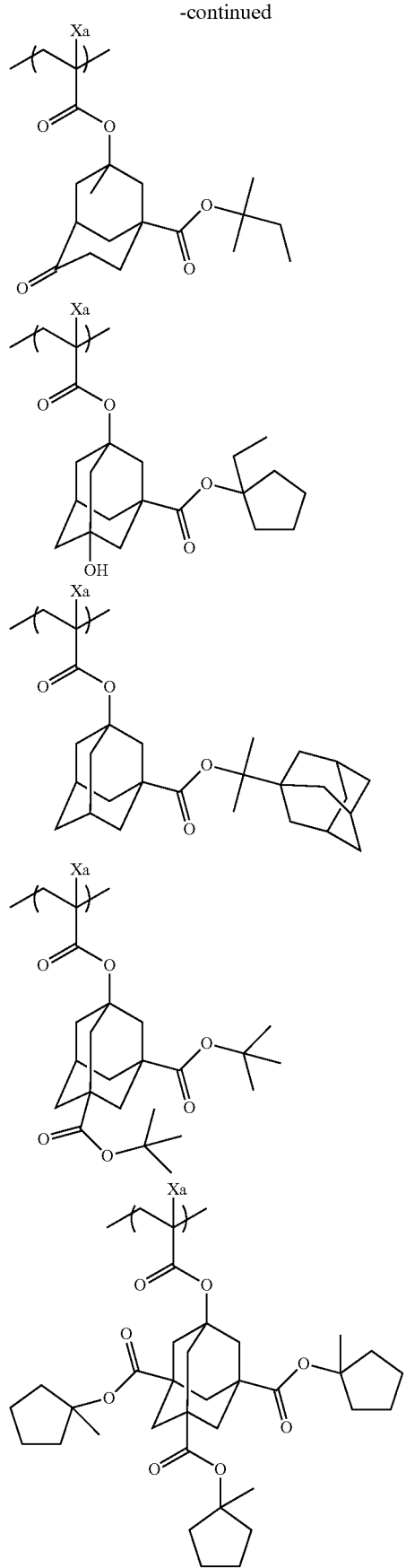
30
-continued
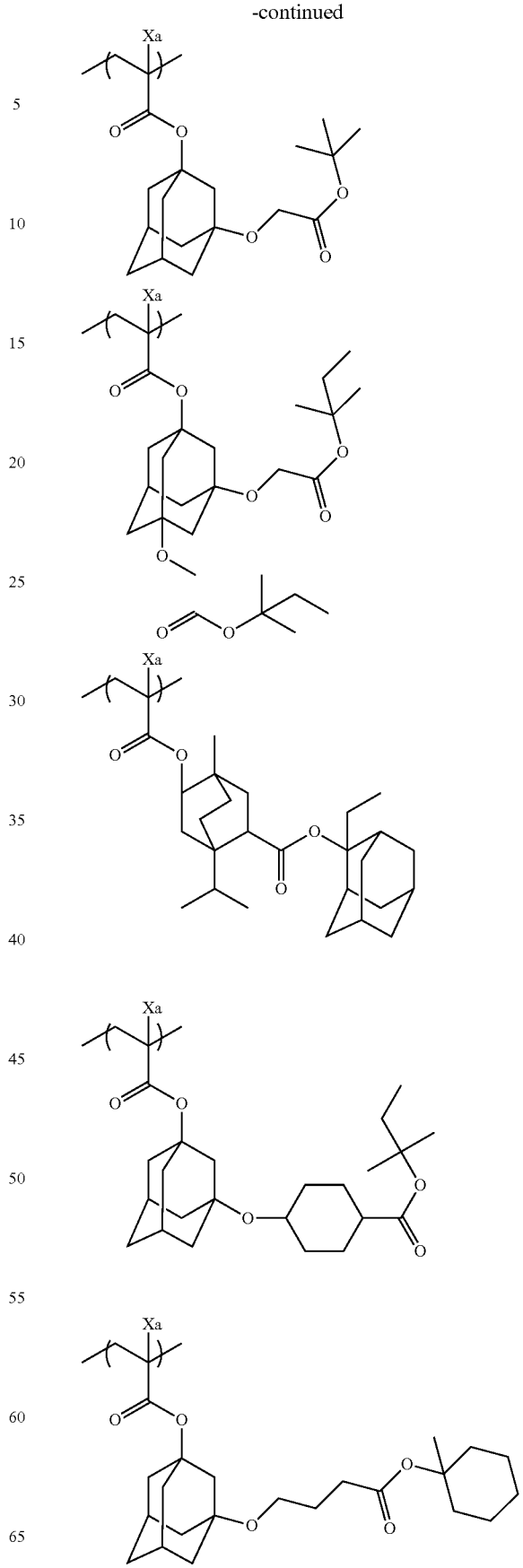

-continued
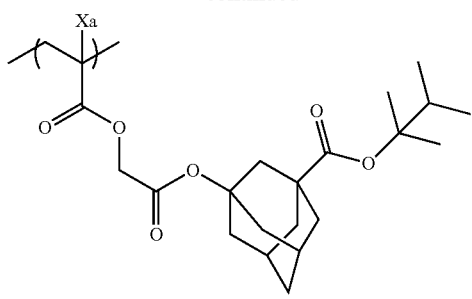
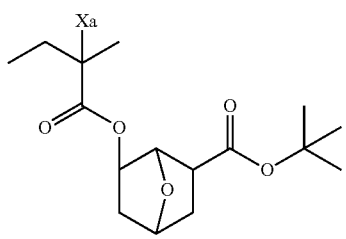
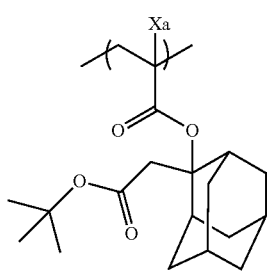
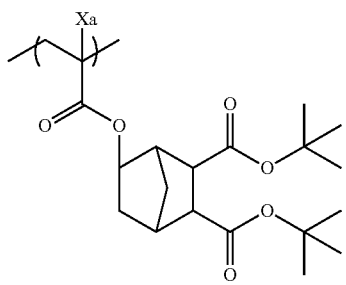
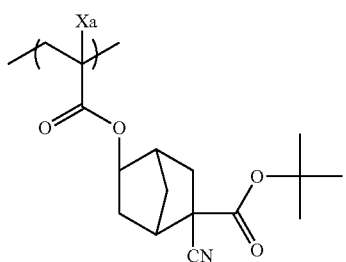
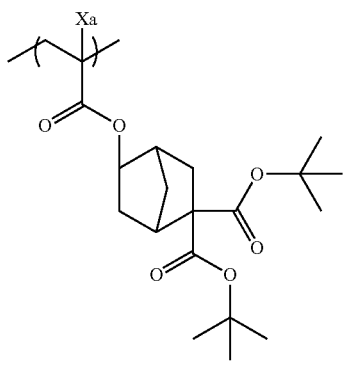
-continued
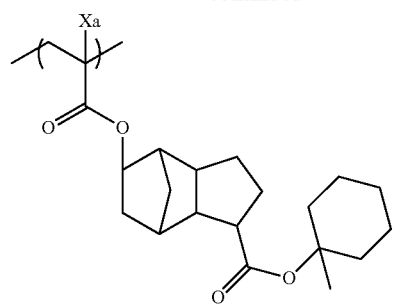
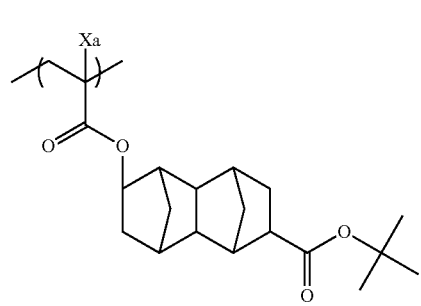
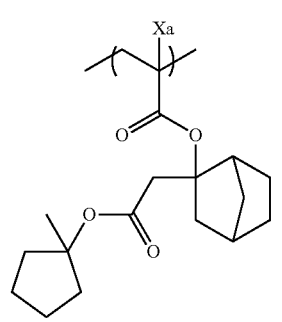
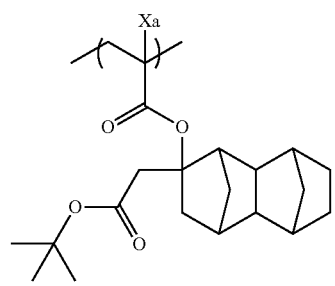
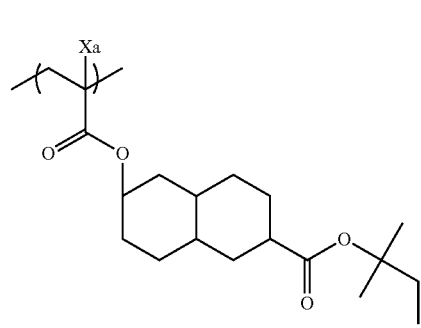

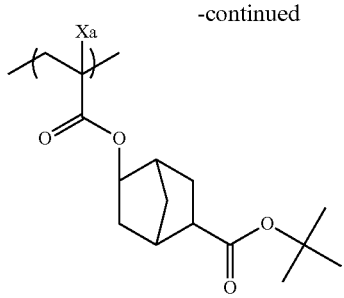
Furthermore, the resin (A) may have a repeating unit capable of decomposing by the action of an acid and generating an alcoholic hydroxyl group as shown below, as a repeating unit having an acid-decomposable group.
Among the following specific examples, $Xa_1$ represents a hydrogen atom, $CH_3$, $CF_3$, or $CH_2OH$.
[Chem. 8]
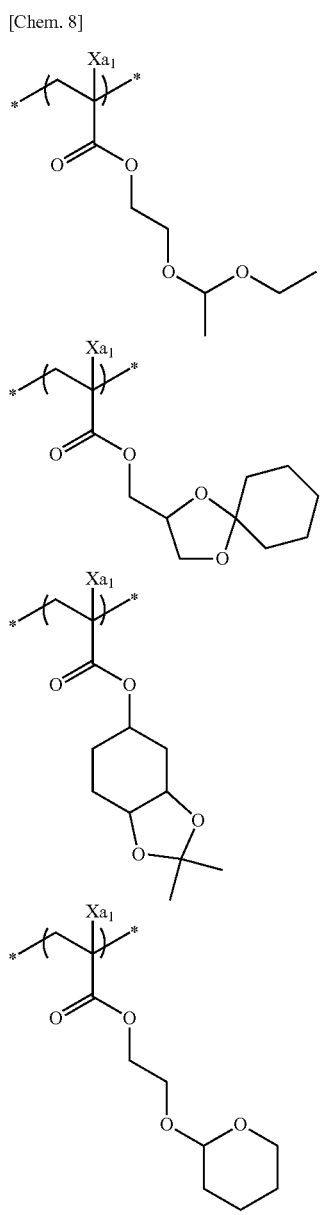
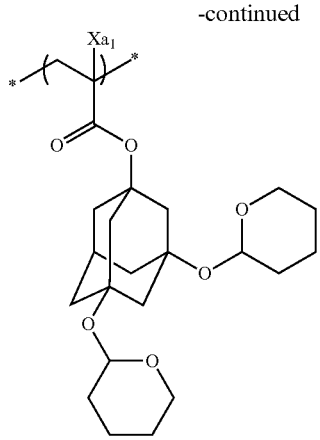
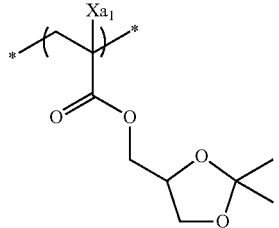
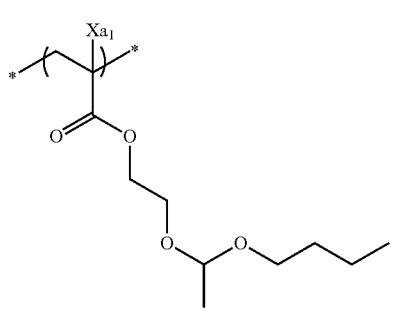
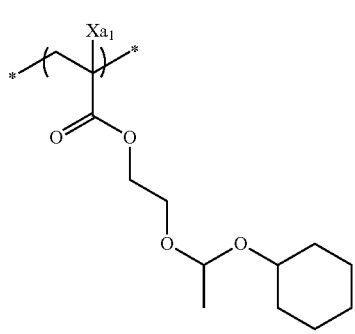
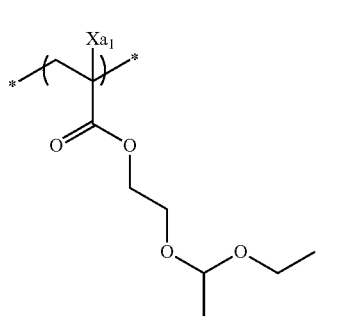

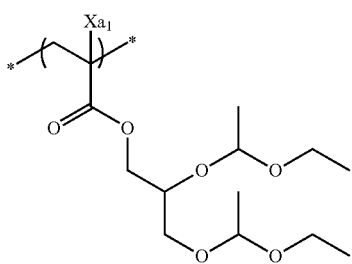
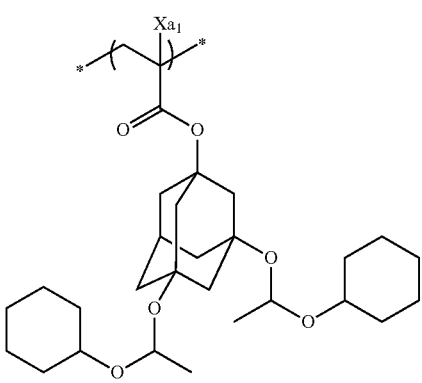
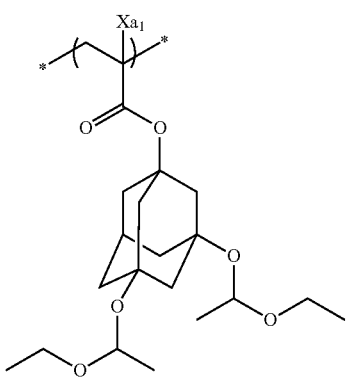
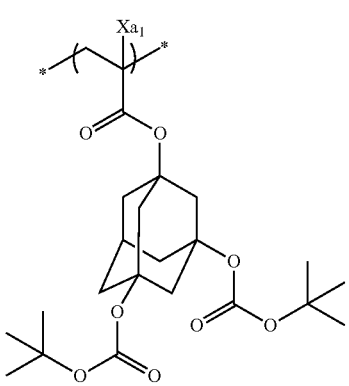
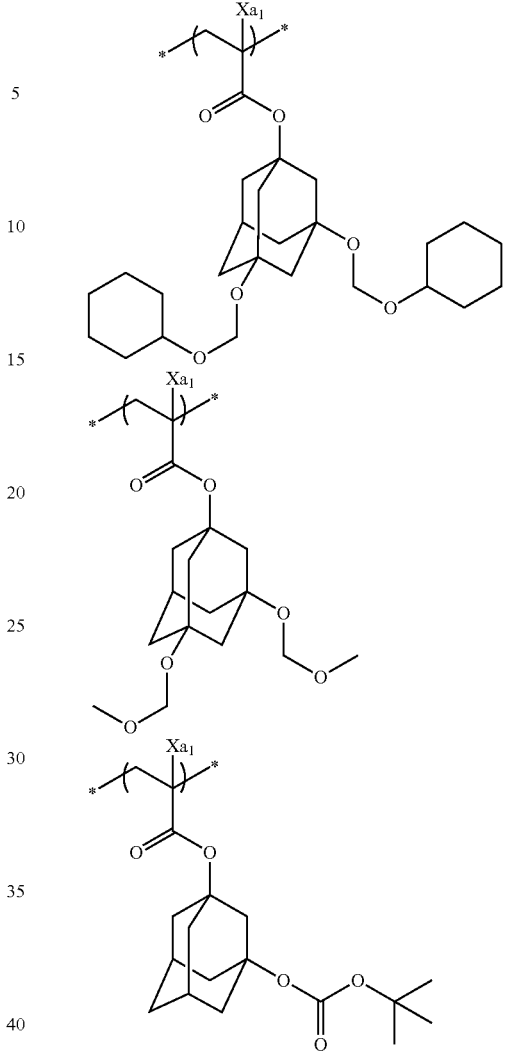

The repeating units having an acid-decomposable group may be used singly or in combination of two or more kinds thereof.

The content of the repeating unit having an acid-decomposable group in the resin (A) (a total content in the case where a plurality of the repeating units having an acid-decomposable group are present) is preferably 15% by mole or more, more preferably 20% by mole or more, still more preferably 25% by mole or more, and particularly preferably 40% by mole or more, based on all the repeating units of the resin (A). Among these, the resin (A) has a repeating unit represented by the general formula (AI), and the content of the repeating unit represented by the general formula (AI) with respect to all the repeating units of resin (A) is preferably 40% by mole or more.

When the content of the repeating unit having an acid-decomposable group with respect to all the repeating units of the resin (A) is 40% by mole or more, the glass transition temperature (Tg) of the resin (A) can be significantly raised, and as a result, an effect that an increase in the process cost as described above can be suppressed can be further ensured.

Furthermore, the content of repeating units having an acid-decomposable group is preferably 80% by mole or less, more preferably 70% by mole or less, and still more preferably 65% by mole or less, based on all the repeating units of the resin (A).

The resin (A) may contain a repeating unit having a lactone structure or sultone structure.

As the lactone structure or sultone structure, any having a lactone structure or sultone structure may be used, but a 5- to 7-membered ring lactone structure or a 5- to 7-membered ring sultone structure is preferred, and a structure where another ring structure is fused to a 5- to 7-membered ring lactone structure or sultone structure in the form of forming a bicyclo or spiro structure is more preferred. It is more preferred to include a repeating unit having a lactone structure represented by any of the following general formulae (LC1-1) to (LC1-21) and a sultone structure represented by any of the following general formulae (SL1-1) to (SL1-3). Further, the lactone structure or sultone structure may be bonded directly to the main chain. Preferred examples of the lactone structure include (LC1-1), (LC1-4), (LC1-5), (LC1-6), (LC1-13), (LC1-14), and (LC1-17), and particularly preferred examples of the lactone structure is (LC1-4). By using such a specific lactone structure, the defects of LER and development are improved.

[Chem. 9]

LC1-1
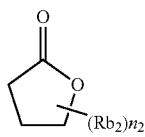

LC1-2
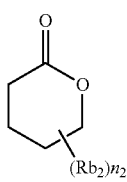

LC1-3
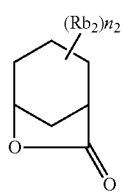

LC1-4
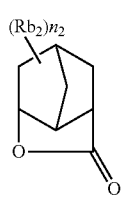

LC1-5
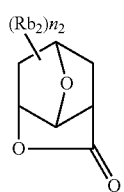

LC1-6
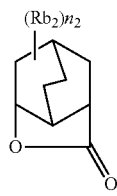

LC1-7
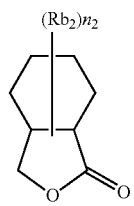

LC1-8
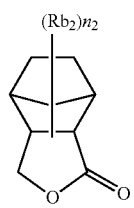

LC1-9
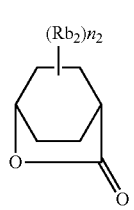

LC1-10
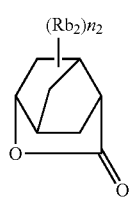

LC1-11
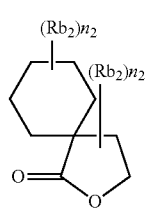

LC1-12
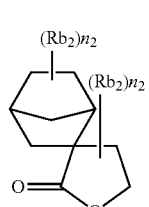

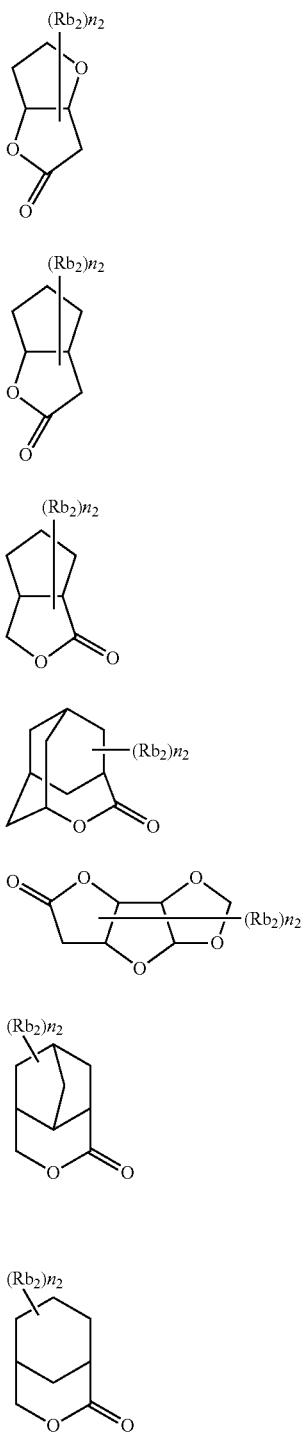

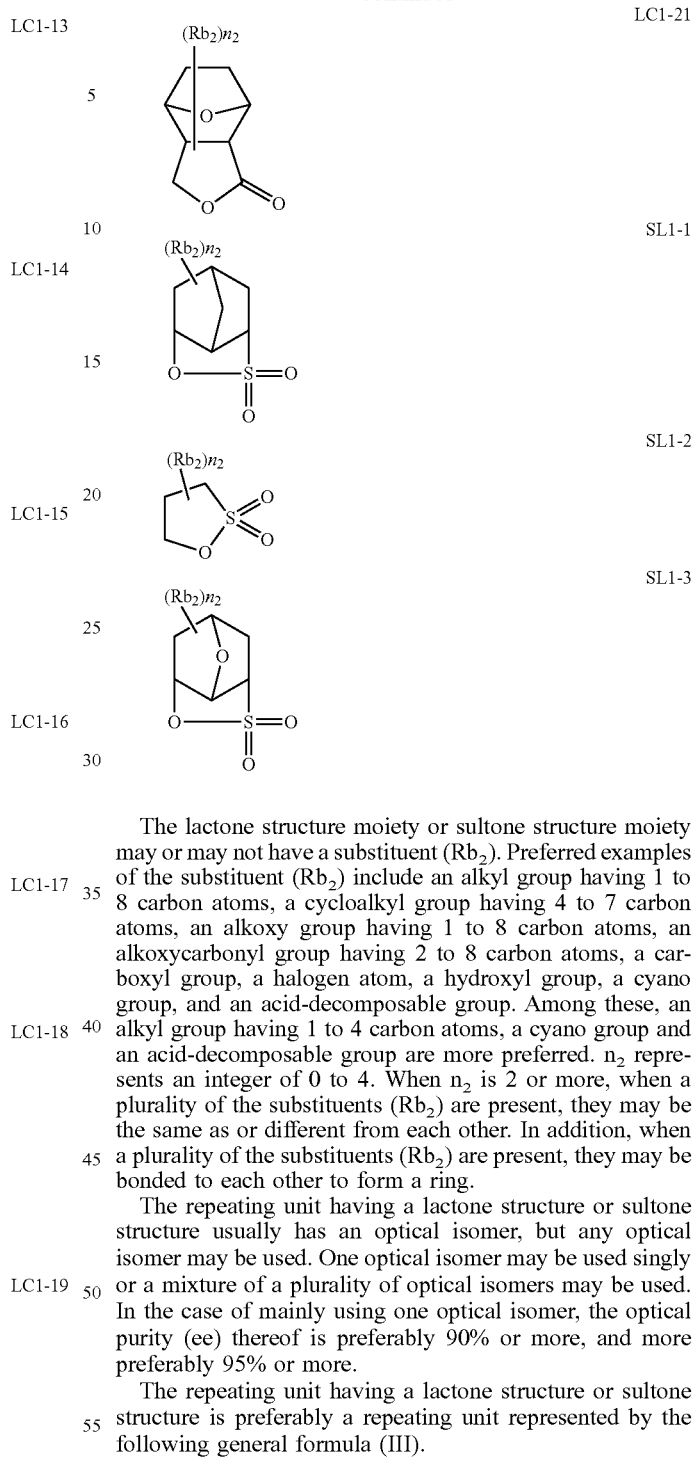

The lactone structure moiety or sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group and an acid-decomposable group are more preferred. $n_2$ represents an integer of 0 to 4. When $n_2$ is 2 or more, when a plurality of the substituents ($Rb_2$) are present, they may be the same as or different from each other. In addition, when a plurality of the substituents ($Rb_2$) are present, they may be bonded to each other to form a ring.

The repeating unit having a lactone structure or sultone structure usually has an optical isomer, but any optical isomer may be used. One optical isomer may be used singly or a mixture of a plurality of optical isomers may be used. In the case of mainly using one optical isomer, the optical purity (ee) thereof is preferably 90% or more, and more preferably 95% or more.

The repeating unit having a lactone structure or sultone structure is preferably a repeating unit represented by the following general formula (III).

[Chem. 10]

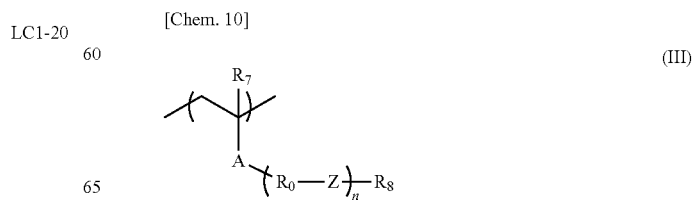

In the general formula (III),

A represents an ester bond (a group represented by —COO—) or an amide bond (a group represented by —CONH—).

In the case where a plurality of $R_0$'s are present, they each independently represent an alkylene group, a cycloalkylene group, or a combination thereof.

In the case where a plurality of Z's are present, they each independently represent a single bond, an ether bond, an ester bond, an amide bond, a urethane bond

[Chem. 11]

(a group represented by —O—C(=O)—NR— or —RN—C(=O)—O—), or a urea bond

[Chem. 12]

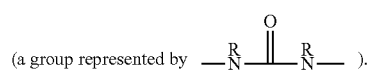

(a group represented by —RN—C(=O)—NR— ).

Here, R represents a hydrogen atom, an alkyl group, a cycloalkyl group, or an aryl group;

$R_8$ represents a monovalent organic group having a lactone structure or sultone structure;

n is the number of repetitions of the structure represented by —$R_0$—Z— and represents an integer of 0 to 5, preferably 0 or 1, and more preferably 0. When n is 0, —$R_0$—Z— is not present, giving a single bond.

$R_7$ represents a hydrogen atom, a halogen atom, or an alkyl group.

The alkylene group or the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group.

The alkylene group and the cycloalkylene group of $R_0$, and the alkyl group in $R_7$ may be each substituted, and examples of the substituent include halogen atoms such as a fluorine atom, a chlorine atom, and a bromine atom; a mercapto group; a hydroxyl group; an alkoxy group such as a methoxy group, an ethoxy group, an isopropoxy group, a t-butoxy group, and a benzyloxy group; an acyloxy group such as an acetyloxy group and a propionyloxy group.

$R_7$ is preferably a hydrogen atom, a methyl group, a trifluoromethyl group, or a hydroxymethyl group.

A preferred chained alkylene group in $R_0$ is a chained alkylene group having 1 to 10 carbon atoms, and more preferably 1 to 5 carbon atoms, and examples thereof include a methylene group, an ethylene group, and a propylene group. A preferred cycloalkylene group in $R_0$ is a cycloalkylene group having 3 to 20 carbon atoms, and examples thereof include a cyclohexylene group, a cyclopentylene group, a norbornylene group, and an adamantylene group. In order to realize an effect of the invention, a chained alkylene group is more preferred, and a methylene group is particularly preferred.

The monovalent organic group having a lactone structure or sultone structure represented by $R_8$ is not limited as long as it has a lactone structure or sultone structure. Specific examples thereof include lactone structures or sultone structures represented by any one of the general formulae (LC1-1) to (LC1-21) and (SL1-1) to (SL1-3), and among these the structure represented by (LC1-4) is particularly preferred. Further, $n_2$ in (LC1-1) to (LC1-21) is more preferably 2 or less.

In addition, $R_8$ is preferably a monovalent organic group having an unsubstituted lactone structure or sultone structure, or a monovalent organic group having a substituted lactone structure or sultone structure with a methyl group, a cyano group, or an alcoxycarbonyl group, and a monovalent organic group having a substituted lactone structure with a cyano group (cyanolactone).

Specific examples of the repeating unit having a lactone structure or sultone structure are shown below, but the invention is not limited thereto.

[Chem. 13]

(wherein Rx represents H, $CH_3$, $CH_2OH$, or $CF_3$)

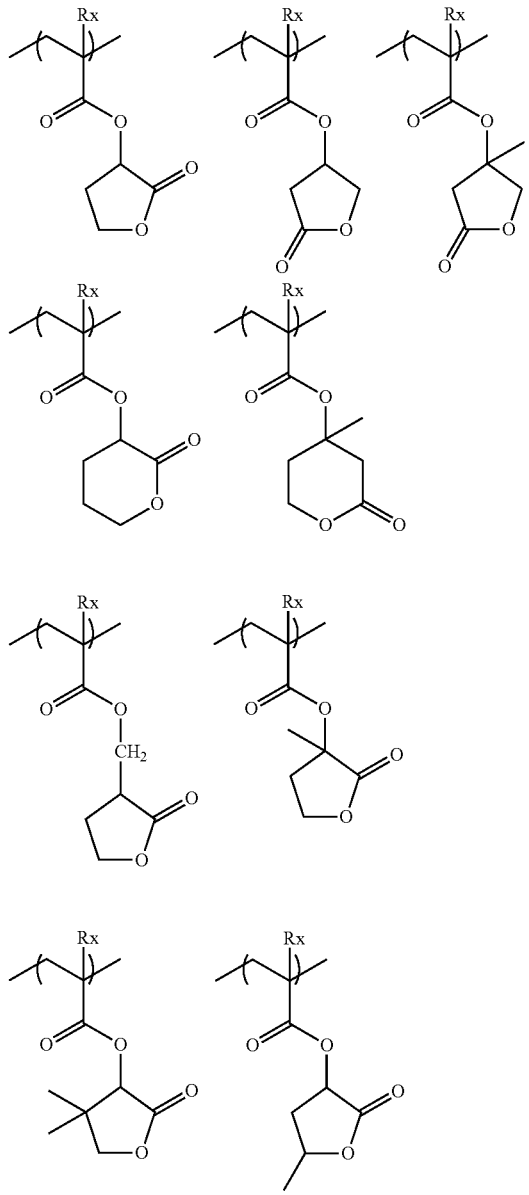

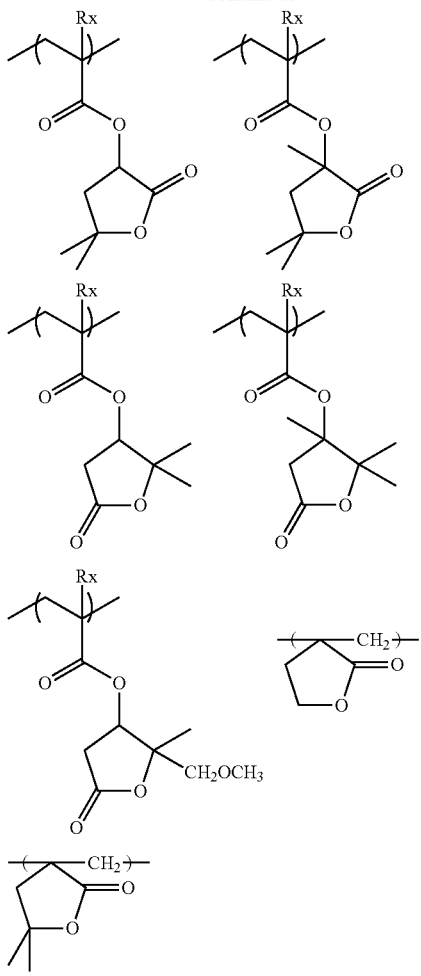
[Chem. 14]
(wherein Rx represents H, CH₃, CH₂OH, or CF₃)
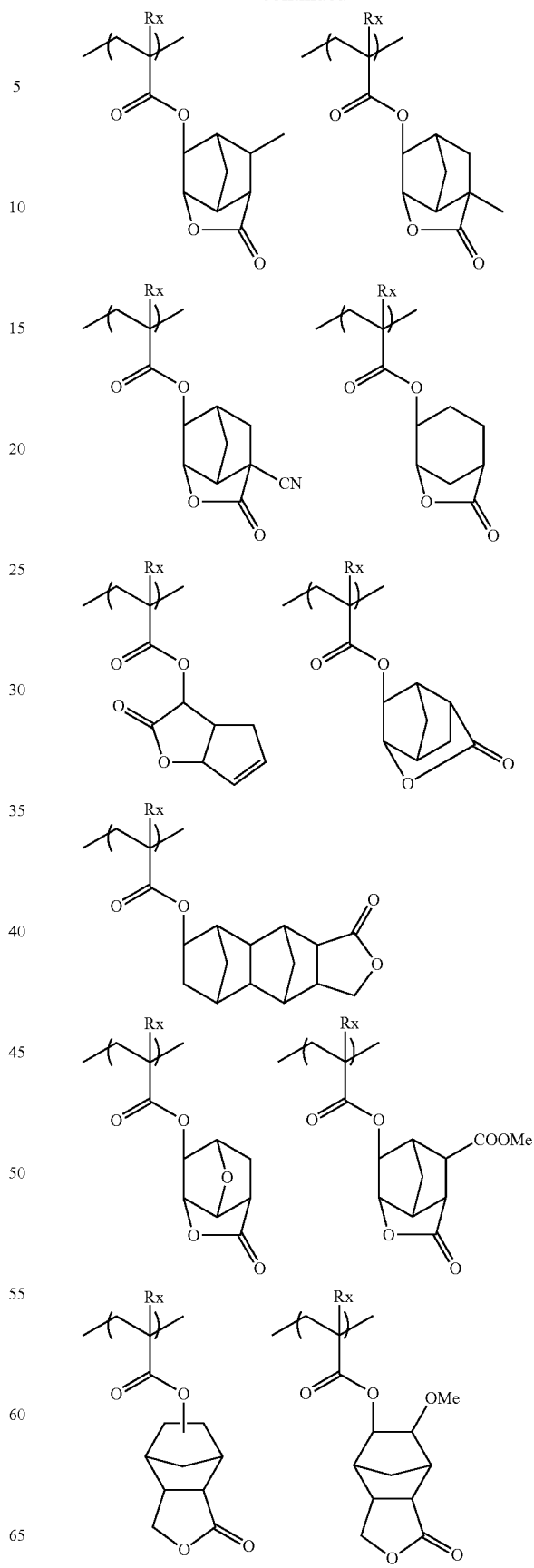

-continued
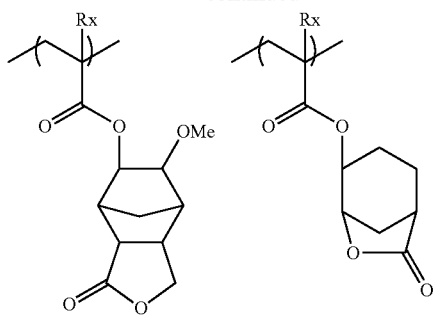
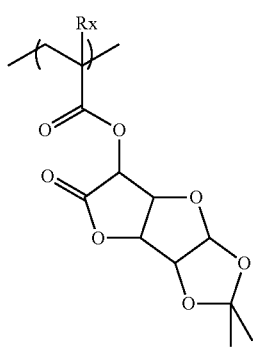
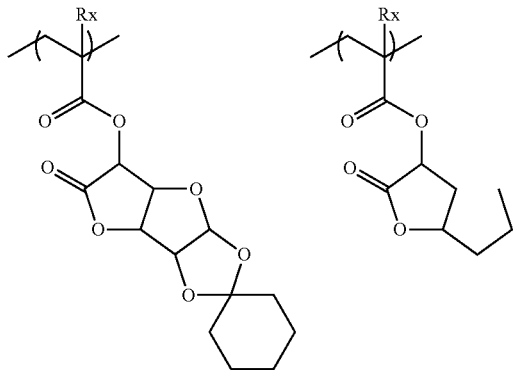
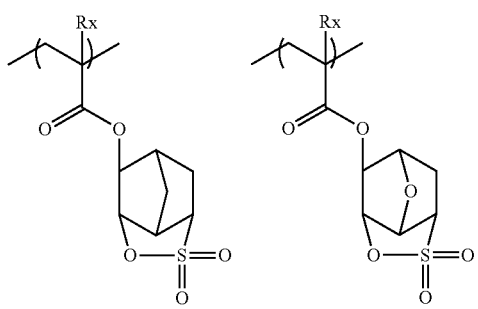
-continued
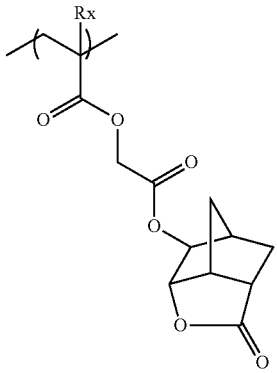
[Chem. 15]
(wherein Rx represents H, CH₃, CH₂OH, or CF₃)
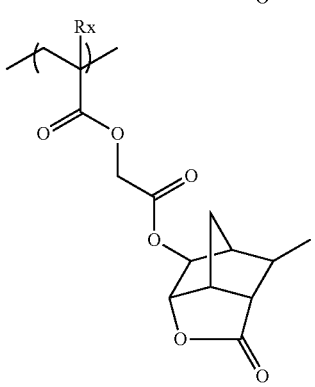
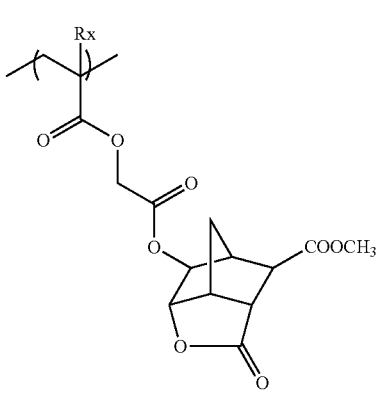
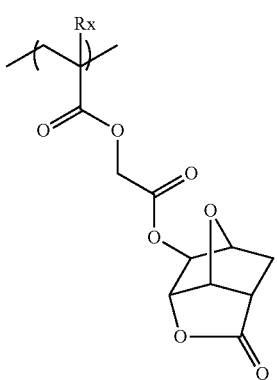

47
-continued
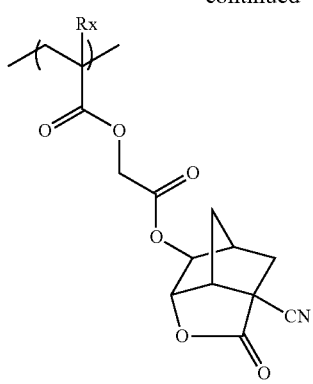
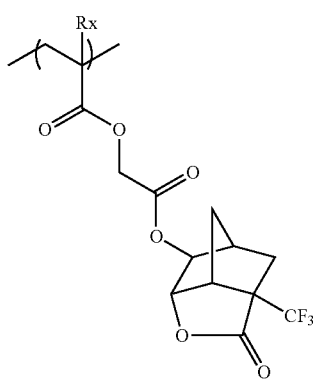
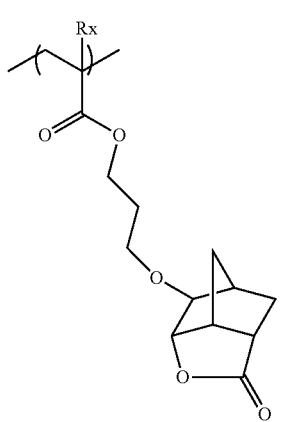
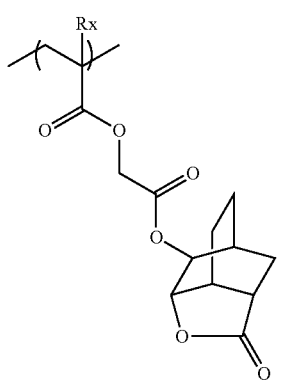
48
-continued
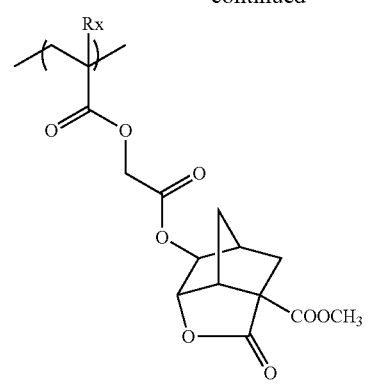
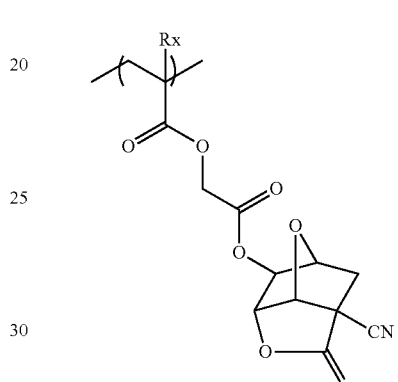
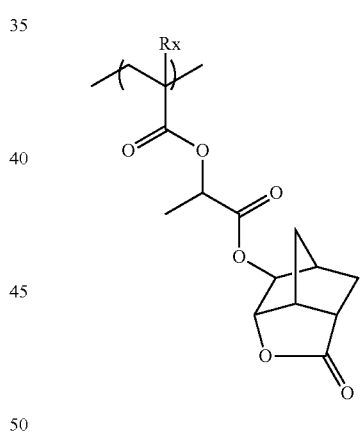
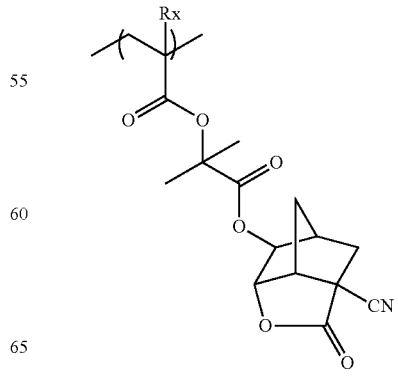

-continued

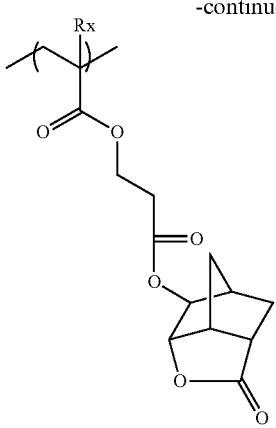

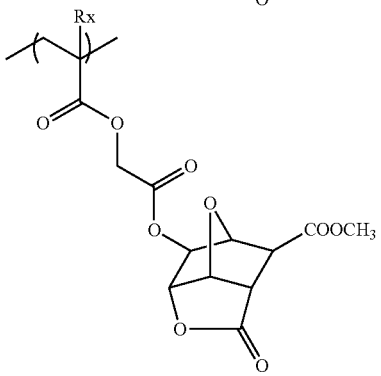

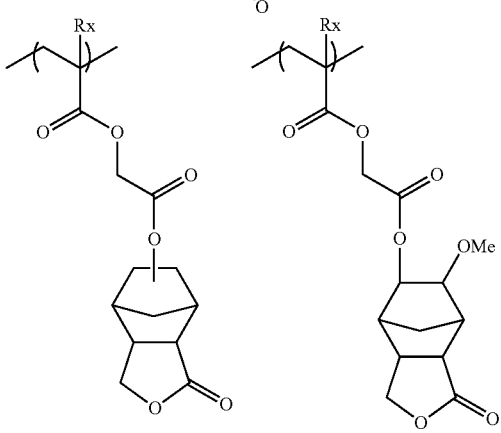

In order to enhance the effect of the invention, 2 or more kinds of the repeating units having a lactone structure or sultone structure may be used in combination.

When the resin (A) contains a repeating unit having a lactone structure or sultone structure, the content of the repeating unit having a lactone structure or sultone structure is preferably 5 to 60% by mole, more preferably 5 to 55% by mole, and still more preferably 10 to 50% by mole, based on all repeating units in the resin (A).

Furthermore, the resin (A) may contain a repeating unit having a cyclic carbonate ester structure.

The repeating unit having a cyclic carbonate ester structure is preferably a repeating unit represented by the following general formula (A-1).

[Chem. 16]

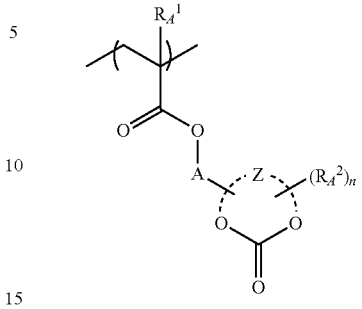

(A-1)

In the general formula (A-1), $R_A^1$ represents a hydrogen atom or an alkyl group;

when n is 2 or more, $R_A^2$'s each independently represent a substituent;

A represents a single bond, or a divalent linking group;

Z represents an atomic group which is combined with a group represented by —O—C(=O)—O— to form a monocyclic or polycyclic structure; and n represents an integer of 0 or more.

The general formula (A-1) will be described in detail.

The alkyl group represented by $R_A^1$ may have a substituent such as a fluorine atom. $R_A^1$ preferably represents a hydrogen atom, a methyl group, or a trifluoromethyl group, and more preferably a methyl group.

Examples of the substituent represented by $R_A^2$ include an alkyl group, a cycloalkyl group, hydroxyl group, an alkoxy group, an amino group, and an alkoxycarbonylamino group, preferably an alkyl group having 1 to 5 carbon atoms, for example, a linear alkyl group having 1 to 5 carbon atoms, such as a methyl group, an ethyl group, a propyl group, and a butyl group; and a branched alkyl group having 3 to 5 carbon atoms, such as an isopropyl group, an isobutyl group, and a t-butyl group. The alkyl group may have a substituent such as a hydroxyl group.

n represents the number of the substituents and is an integer of 0 or more. n is, for example, preferably 0 to 4, and more preferably 0.

Examples of the divalent linking group represented by A include an alkylene group, a cycloalkylene group, an ester bond, an amide bond, an ether bond, a urethane bond, a urea bond, and a combination thereof. The alkylene group is preferably an alkylene group having 1 to 10 carbon atoms, and more preferably an alkylene group having 1 to 5 carbon atoms, and examples thereof include a methylene group, an ethylene group, and a propylene group.

In one embodiment of the invention, A preferably represents a single bond or an alkylene group.

Examples of the monocycle including —O—C(=O)—O—, represented by Z, include 5- to 7-membered rings, in which a cyclic carbonate ester represented by the following general formula (a) has $n_A$=2 to 4, preferably a 5-membered ring or 6-membered ring ($n_A$=2 or 3), and more preferably a 5-membered ring ($n_A$=2).

Examples of the polycycle including —O—C(=O)—O—, represented by Z, include structures which form condensed rings with other ring structures having 1 or 2 or more cyclic carbonate esters represented by the following general formula (a), or structures forming a spiro ring. The "other ring structure" which can form a condensed ring or a spiro ring may be an alicyclic hydrocarbon group, an aromatic hydrocarbon group, or a heterocyclic group.

[Chem. 17]

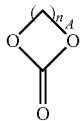
(a)

The monomer that corresponds to the repeating unit represented by the general formula (A-1) can be synthesized by well-known methods, for example, Tetrahedron Letters, Vol. 27, No. 32 p. 3741 (1986), Organic Letters, Vol. 4, No. 15 p. 2561 (2002), and the like.

In the resin (A), the repeating units represented by the general formula (A-1) may be contained singly or in combination of two or more kinds thereof.

In the resin (A), the content of the repeating unit having a cyclic carbonate ester structure (preferably repeating units represented by the general formula (A-1)) is preferably from 3 to 80% by mole, more preferably from 3 to 60% by mole, particularly preferably from 3 to 30% by mole, and most preferably from 10 to 15% by mole, based on all the repeating units constituting the resin (A). With this content, the developability, low defects, low LWR, low PEB temperature dependency, profiles, and the like as a resist can be improved.

Specific examples of the repeating unit represented by the general formula (A-1) (repeating units (A-1a) to (A-1w)) are shown below, but the invention is not limited thereto.

Further, $R_A^1$ in the following specific examples has the same definition as $R_A^1$ in the general formula (A-1).

[Chem. 18]

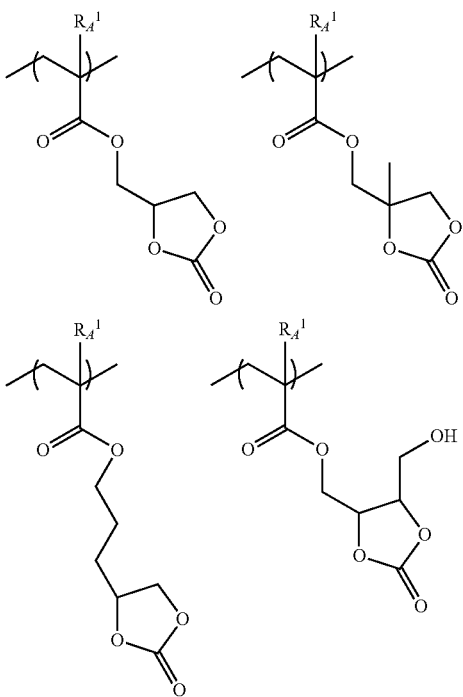

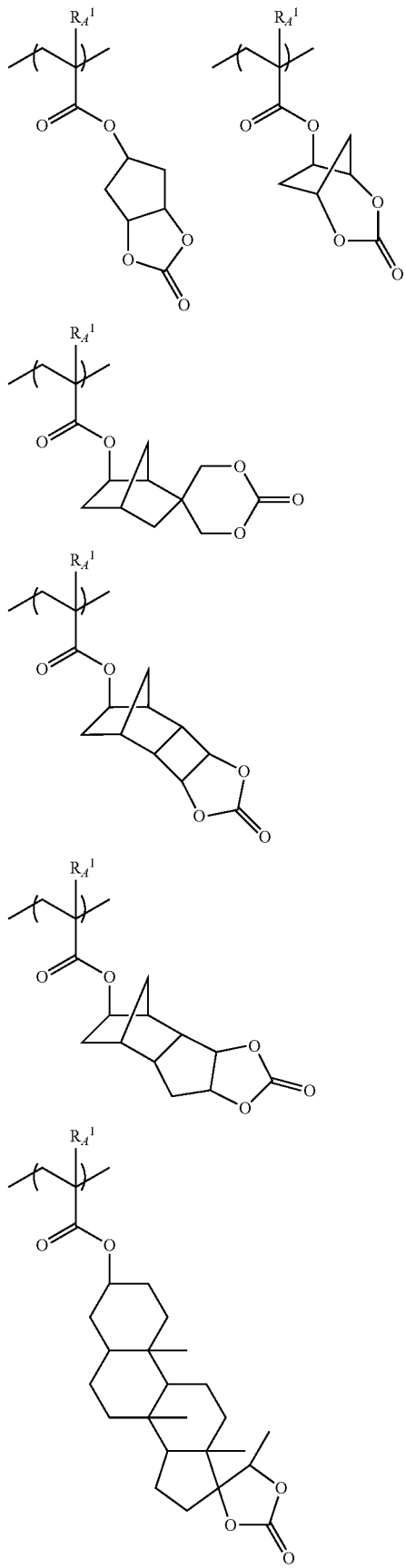

-continued

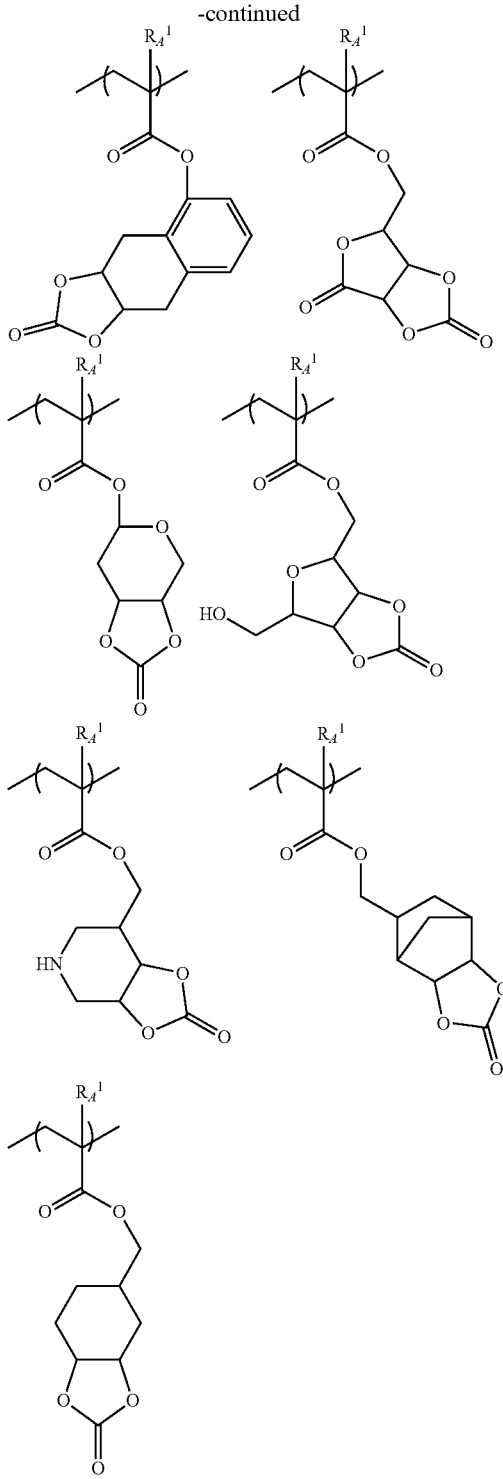

The resin (A) may have a repeating unit having a hydroxyl group or a cyano group. Thus, the adhesiveness with a substrate and affinity with a developer are improved. The repeating unit having a hydroxyl group or a cyano group is preferably a repeating unit having an alicyclic hydrocarbon structure substituted with a hydroxyl group or a cyano group and preferably has no acid-decomposable group.

In addition, the repeating unit having an alicyclic hydrocarbon structure substituted with a hydroxyl group or a cyano group is preferably different from a repeating unit having an acid-decomposable group (that is, preferably a repeating unit stable against an acid).

In the alicyclic hydrocarbon structure substituted with a hydroxyl group or a cyano group, the alicyclic hydrocarbon structure is preferably an adamantyl group, a diamantyl group, or a norborane group.

More preferred examples thereof include repeating units represented by any one of the following general formulae (AIIa) to (AIIc).

[Chem. 19]

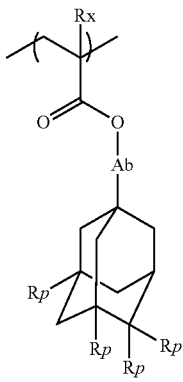

(AIIa)

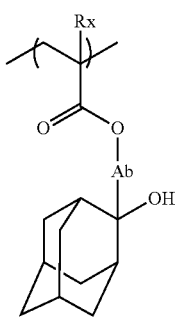

(AIIb)

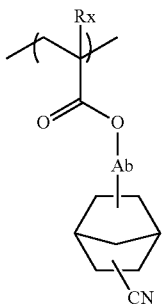

(AIIc)

In the formulae, $R_X$ represents a hydrogen atom, a methyl group, a hydroxymethyl group, or trifluoromethyl group.

Ab represents a single bond, or a divalent linking group.

Examples of the divalent linking group represented by Ab include an alkylene group, a cycloalkylene group, an ester bond, an amide bond, an ether bond, a urethane bond, a urea bond, and a combination thereof. As the alkylene group, an alkylene group having 1 to 10 carbon atoms is preferred, and an alkylene group having 1 to 5 carbon atoms is more preferred, and examples thereof include a methylene group, an ethylene group, and a propylene group.

In one embodiment of the invention, Ab is preferably a single bond, or alkylene group.

Rp represents a hydrogen atom, a hydroxyl group, or a hydroxyalkyl group. A plurality of Rp's may be the same as or different from each other, but at least one of a plurality of Rp's represents a hydroxyl group or a hydroxyalkyl group.

The resin (A) may or may not contain a repeating unit having a hydroxyl group or a cyano group, but in the case where the resin (A) contains a repeating unit having a hydroxyl group or a cyano group, the content of the repeating unit having a hydroxyl group or a cyano group is preferably from 1 to 40% by mole, more preferably from 3 to 30% by mole, and still more preferably from 5 to 25% by mole, based on all the repeating units in the resin (A).

Specific examples of the repeating unit having a hydroxyl group or a cyano group are shown below, but the invention is not limited thereto.

[Chem. 20]

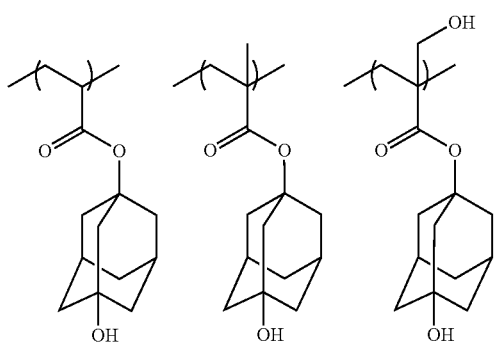

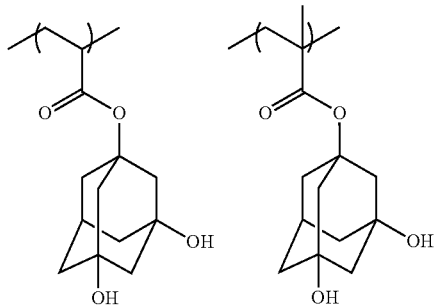

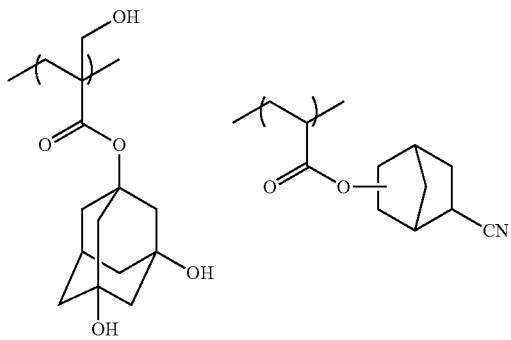

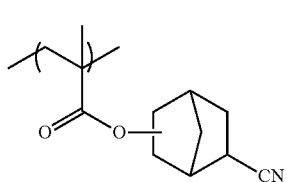

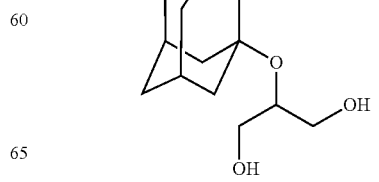

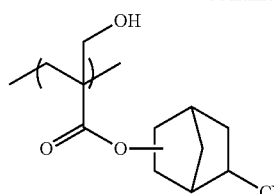

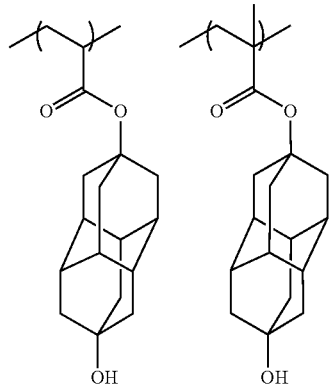

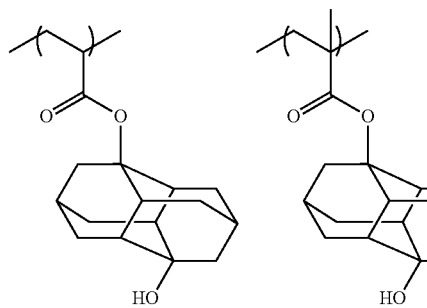

[Chem. 21]

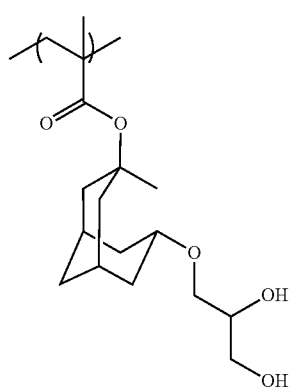

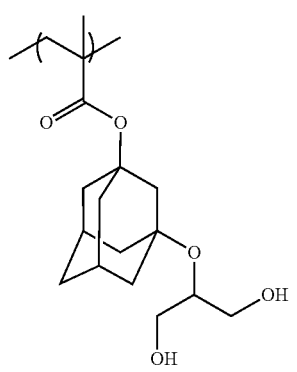

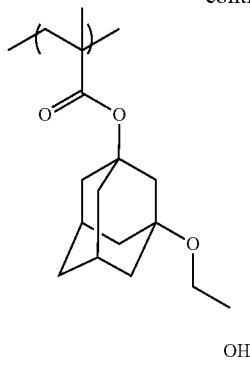

In addition, the monomers described after in paragraph 0011 and thereafter in the specification of WO2011/122336, or repeating units corresponding to the monomers, or the like can be suitably used.

The resin (A) may have a repeating unit having an acid group. Examples of the acid group include a carboxyl group, a sulfonamide group, a sulfonylimide group, a bissulfonylimide group, a naphthol structure, an aliphatic alcohol group (for example, a hexafluoroisopropanol group) with the α-position being substituted with an electron-withdrawing group, and more preferably has a repeating unit having a carboxyl group. By virtue of containing the repeating units having an acid group, the resolution increases in the usage of forming contact holes. As for the repeating units having an acid group, all of a repeating unit in which an acid group is directly bonded to the main chain of the resin, such as a repeating unit of an acrylic acid or methacrylic acid, a repeating unit in which an acid group is bonded to the main chain of the resin through a linking group, and a repeating unit in which an acid group is introduced into the polymer chain terminal by using an acid group-containing polymerization initiator or chain transfer agent during the polymerization, are preferred. The linking group may have a monocyclic or polycyclic hydrocarbon structure. A repeating unit with an acrylic acid or a methacrylic acid is particularly preferred.

The resin (A) may or may not contain a repeating unit having an acid group, but in the case where the resin (A) contains a repeating unit having an acid group, the content of the repeating unit having an acid group is preferably 25% by mole or less, and more preferably 20% by mole or less, based on all the repeating units in the resin (A). In the case where the resin (A) contains a repeating unit having an acid group, the content of the repeating unit having an acid group in the resin (A) is usually 1% by mole or more.

Specific examples of the repeating unit having an acid group are shown below, but the invention is not limited thereto.

In the specific examples, Rx represents H, $CH_3$, $CH_2OH$ or $CF_3$.

[Chem. 22]

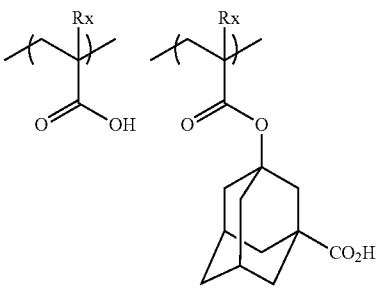
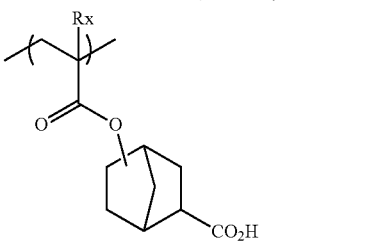
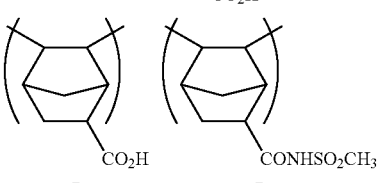
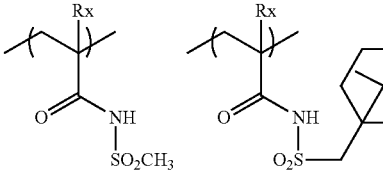
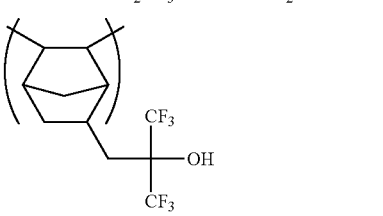
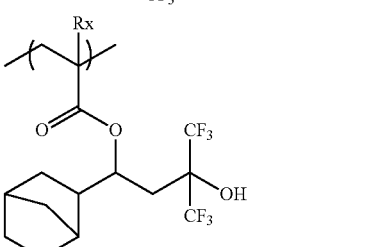
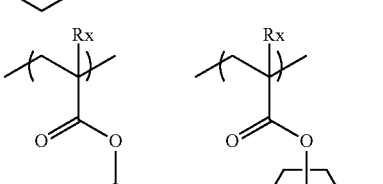
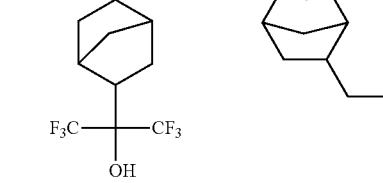

-continued

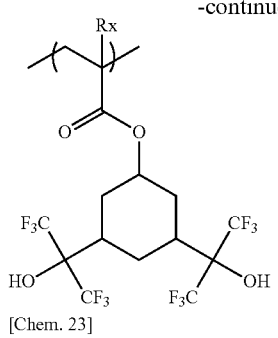

[Chem. 23]

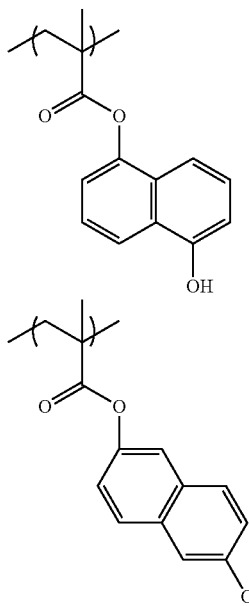

The resin (A) in the invention may further contain a repeating unit having an alicyclic hydrocarbon structure free from a polar group (for example, the above-described acid group, a hydroxyl group, or a cyano group) and not exhibiting acid decomposability. In this way, elution of the low-molecular-weight components from the resist film to the liquid for liquid immersion during liquid immersion exposure can be reduced, and the solubility of the resin during development using a developer including an organic solvent can be appropriately adjusted. Examples of the repeating unit include a repeating unit represented by the general formula (IV).

[Chem. 24]

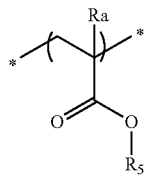

(IV)

In the general formula (IV), $R_5$ represents a hydrocarbon group having at least one cyclic structure and having no polar group.

Ra represents a hydrogen atom, an alkyl group or a —$CH_2$—O—$Ra_2$ group, in which $Ra_2$ represents a hydrogen atom, an alkyl group or an acyl group. Ra is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group or a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as a pinane ring, a bornane ring, a norpinane ring, a norbornane ring or a bicyclooctane ring (for example, a bicyclo[2.2.2]octane ring, or a bicyclo[3.2.1]octane ring), a tricyclic hydrocarbon ring such as a homobrendane ring, an adamantane ring, a tricyclo[5.2.1.0$^{2,6}$]decane ring or a tricyclo[4.3.1.1$^{2,5}$]undecane ring, and a tetracyclic hydrocarbon ring such as a tetracyclo[4.4.0.1$^{2,5}$.1$^{7,10}$]dodecane ring and a perhydro-1,4-methano-5,8-methanonaphthalene ring. Further, the crosslinked cyclic hydrocarbon ring also includes a condensed cyclic hydrocarbon ring, for example, a condensed ring formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring and a perhydrophenalene ring.

Preferred examples of the crosslinked cyclic hydrocarbon ring include a norbornyl group, an adamantyl group, a bicyclooctanyl group and a tricyclo[5.2.1.0$^{2,6}$]decanyl group. More preferred examples of the crosslinked cyclic hydrocarbon ring include a norbornyl group and an adamantyl group.

These alicyclic hydrocarbon groups may have a substituent, and preferred examples of the substituent include a halogen atom, an alkyl group, a hydroxyl group in which a hydrogen atom is substituted, and an amino group in which a hydrogen atom is substituted. The halogen atom is preferably a bromine atom, a chlorine atom, or a fluorine atom, and the alkyl group is preferably a methyl group, an ethyl group, an n-butyl group, or a t-butyl group. The alkyl group may further have a substituent, and the substituent which the alkyl group may further have includes a halogen atom, an alkyl group, a hydroxyl group in which a hydrogen atom is substituted, and an amino group in which a hydrogen atom is substituted.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having 1 to 4 carbon atoms; the substituted methyl group is preferably a methoxymethyl group, a methoxythiomethyl group, a benzyloxymethyl group, a t-butoxymethyl group, or a 2-methoxyethoxymethyl group; the substituted ethyl group is preferably a 1-ethoxyethyl group or a 1-methyl-1-methoxyethyl group; the acyl group is preferably an aliphatic acyl group having 1 to 6 carbon atoms, such as a formyl group, an acetyl group, a propionyl group, a butyryl group, an isobutyryl group, a valeryl group, and a pivaloyl group; and the alkoxycarbonyl group is preferably an alkoxycarbonyl group having 1 to 4 carbon atoms.

The resin (A) may or may not contain the repeating unit which has an alicyclic hydrocarbon structure containing no polar group and exhibits no acid decomposability, but when the resin (A) contains such a repeating unit, the content of the repeating unit is preferably from 1 to 50% by mole, and more preferably from 5 to 50% by mole, based on all the repeating units of the resin (A).

Specific examples of the repeating unit which has an alicyclic hydrocarbon structure containing no polar group, and exhibits no acid decomposability are shown below, but the invention is not limited thereto. In the formulae, Ra represents H, $CH_3$, $CH_2OH$, or $CF_3$.

[Chem. 25]

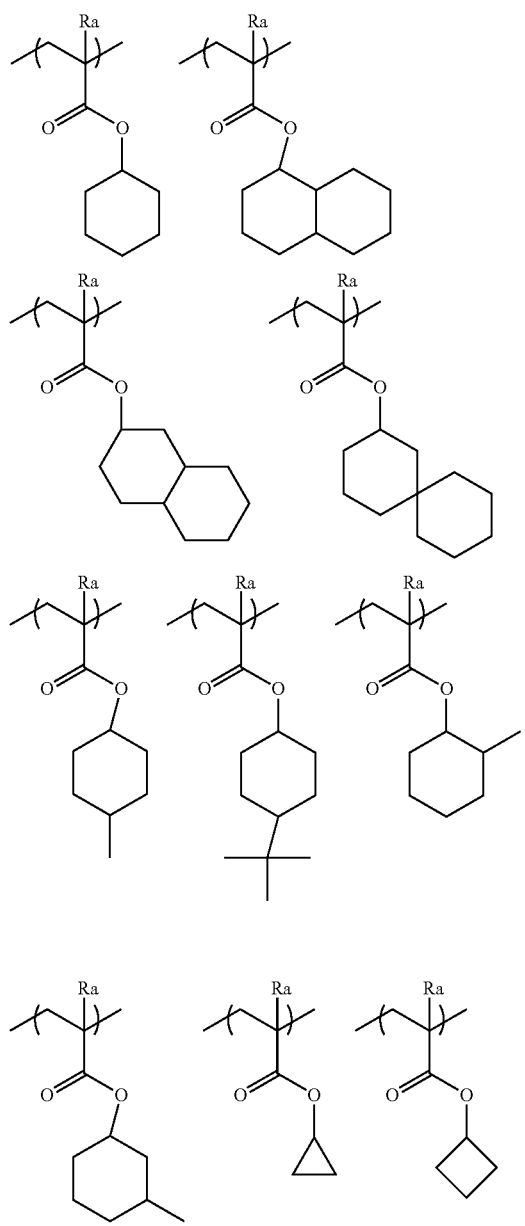

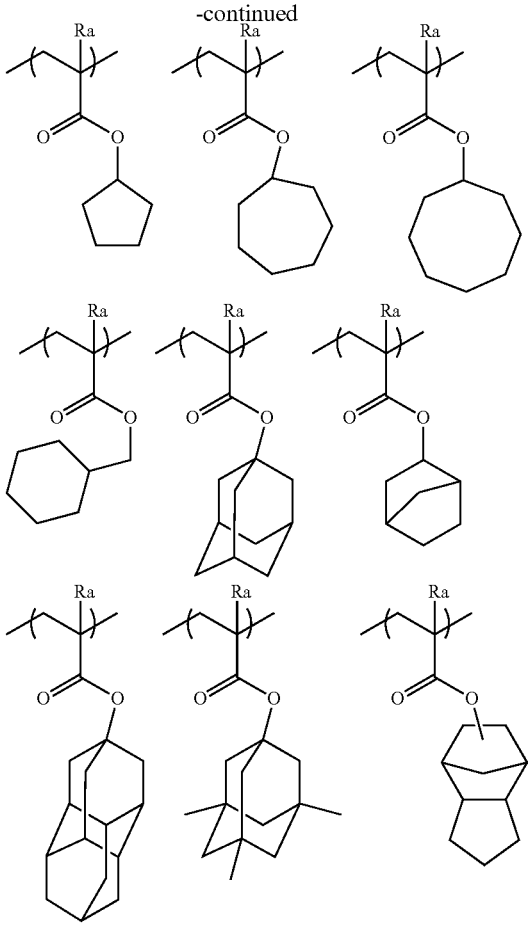

The resin (A) used in the composition of the invention may contain, in addition to the above-described repeating structural units, various repeating structural units for the purpose of controlling the dry etching resistance, suitability for standard developer, adhesiveness to a substrate, a resist profile, and characteristics generally required for an actinic ray-sensitive or radiation-sensitive resin composition, such as resolution, heat resistance, and sensitivity.

Examples of such a repeating structural unit include, but are not limited to, repeating structural units corresponding to the monomers described below.

Thus, it is possible to conduct fine regulation of the required performance of the resin used in the composition of the invention, in particular:

(1) solubility in coating solvents,
(2) film formability (glass transition point),
(3) alkaline developability,
(4) film thinning (selections of hydrophilic, hydrophobic, and alkali-soluble groups),
(5) adhesiveness of an unexposed area to a substrate,
(6) dry etching resistance,
and the like.

Examples of these monomers include a compound having one unsaturated bond capable of addition polymerization, selected from among acrylate esters, methacrylate esters, acrylamides, methacrylamides, allyl compounds, vinyl ethers, vinyl esters, and the like.

In addition, any unsaturated compound capable of addition polymerization that is copolymerizable with monomers corresponding to the above various repeating structural units may be copolymerized therewith.

In the resin (A) used in the composition of the invention, the molar ratios of individual repeating structural units contained are appropriately determined from the viewpoint of regulation of the dry etching resistance as well as the standard developer suitability, adhesiveness to a substrate, and a resist profile of the actinic ray-sensitive or radiation-sensitive resin composition, and generally required properties of the actinic ray-sensitive or radiation-sensitive resin composition, such as resolution, heat resistance, and sensitivity.

In the case where the composition of the invention is used for ArF exposure, in view of transparency to ArF light, the resin (A) used in the composition of the invention preferably has substantially no aromatic group (specifically, the ratio of an aromatic group-containing repeating unit in the resin is preferably 5% by mole or less, more preferably 3% by mole or less, and ideally 0% by mole, that is, the resin does not have an aromatic group), and the resin (A) preferably has a monocyclic or polycyclic alicyclic hydrocarbon structure.

The type of the resin (A) in the invention may be any one of a random type, a block type, a comb type, and a star type. The resin (A) can be synthesized by, for example, radical, cationic, or anionic polymerization of unsaturated monomers corresponding to the respective structures. Further, it is also possible to carry out polymerization using unsaturated monomers corresponding to the precursors of the respective structures, and then carry out a polymer reaction to obtain a desired resin.

In the case where the composition of the invention is used for ArF exposure, in view of transparency to ArF light, the resin (A) used in the composition of the invention preferably has substantially no aromatic group (specifically, the ratio of an aromatic group-containing repeating unit in the resin is preferably 5% by mole or less, more preferably 3% by mole or less, and ideally 0% by mole, that is, the resin does not have an aromatic group), and the resin (A) preferably has a monocyclic or polycyclic alicyclic hydrocarbon structure.

In the case where the composition of the invention contains a resin (D) as described later, it is preferable that the resin (A) contain neither a fluorine atom nor a silicon atom from the viewpoint of compatibility with the resin (D).

The resin (A) used in the composition of the invention is preferably a resin where all the repeating units are composed of a (meth)acrylate-based repeating unit. In this case, all the repeating units may be a methacrylate-based repeating unit, all the repeating units may be an acrylate-based repeating unit, or all the repeating units may be composed of a methacrylate-based repeating unit and an acrylate-based repeating unit, but the content of the acrylate-based repeating unit is preferably 50% by mole or less based on all the repeating units.

In the case where the composition of the invention is irradiated with KrF excimer laser light, an electron beam, X rays, or a high-energy beam at a wavelength of 50 nm or less (for example, EUV), the resin (A) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as a tertiary alkyl (meth)acrylate.

Preferred examples of the hydroxystyrene-based repeating unit having an acid-decomposable group include a repeating unit composed of t-butoxycarbonyloxystyrene, a 1-alkoxyethoxystyrene, and a tertiary alkyl (meth)acrylate. A repeating unit composed of a 2-alkyl-2-adamantyl (meth)acrylate and a dialkyl(1-adamantyl)methyl (meth)acrylate is more preferred.

The resin (A) of the invention may be synthesized by an ordinary method (for example, radical polymerization). Examples of the general synthetic method include a batch polymerization method in which a monomer species and an initiator are dissolved in a solvent and heated so as to accomplish polymerization and a dropping polymerization method in which a solution of monomer species and an initiator is added by dropwise addition to a heated solvent over a period of 1 to 10 hours. The dropping polymerization method is preferred. Examples of the reaction solvent include tetrahydrofuran, 1,4-dioxane, ethers such as diisopropyl ether, ketones such as methylethyl ketone and methyl isobutyl ketone, an ester solvent such as ethyl acetate, an amide solvent such as dimethylformamide and dimethylacetamide, and the later-described solvents capable of dissolving the composition of the invention, such as propylene glycol monomethyl ether acetate, propylene glycol monomethyl ether, and cyclohexanone. The polymerization is more preferably carried out using the same solvent as the solvent used in the photosensitive composition of the invention. By the use of the same solvent, generation of particles during storage may be inhibited.

The polymerization reaction is preferably carried out under an inert gas atmosphere such as nitrogen and argon. Regarding the polymerization initiator, the polymerization is started using a commercially available radical initiator (for example, an azo-based initiator and peroxide). The radical initiator is preferably an azo-based initiator, and an azo-based initiator having an ester group, a cyano group or a carboxyl group is more preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured into a solvent, and the desired polymer is collected by powder or solid collection, or other methods. The concentration during the reaction is in the range of 5% by mass to 50% by mass, and preferably 10% by mass to 30% by mass, and the reaction temperature is usually in the range of 10° C. to 150° C., preferably 30° C. to 120° C., and more preferably 60° C. to 100° C.

After the completion of reaction, the reaction solution is allowed to cool to room temperature and purified. The purification may be carried out by a normal method, for example, water washing or a liquid-liquid extraction method of combining appropriate solvents to remove residual monomers or oligomer components; a purification method in a solution state, such as ultrafiltration of extracting and removing only polymers having a molecular weight not more than a specific value; a reprecipitation method of adding dropwise the resin solution in a poor solvent to solidify the resin in the poor solvent and thereby removing residual monomers and the like; and a purification method in a solid state, such as washing of a filtered resin slurry with a poor solvent.

For example, the resin may be precipitated as a solid by contacting the resin described above with a solvent in which the resin is sparingly soluble or insoluble (poor solvent) and which has a volumetric amount of 10 times or less, preferably from 10 to 5 times, the reaction solution.

The solvent used during the operation of precipitation or reprecipitation from the polymer solution (a solvent for precipitation or reprecipitation) may be a poor solvent for the polymer, and the solvent appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer can be used. Among these, as a precipitation or reprecipitation solvent, a solvent including at least an alcohol (particularly methanol or the like) or water is preferred.

The amount of the precipitation or reprecipitation solvent used may be appropriately selected by taking into consideration the efficiency, yield and the like, but in general, the amount used is from 100 to 10000 parts by mass, preferably from 200 to 2000 parts by mass, and more preferably from 300 to 1000 parts by mass, based on 100 parts by mass of the polymer solution.

The temperature during the precipitation or reprecipitation may be appropriately selected by taking into consideration the efficiency or operability but is usually about 0° C. to 50° C., and preferably near room temperature (for example, approximately from 20° C. to 35° C.). The precipitation or reprecipitation operation may be carried out using a commonly employed mixing vessel such as stirring tank by a known method such as a batch system or a continuous system.

The precipitated or reprecipitated polymer is usually subjected to commonly employed solid-liquid separation such as filtration and centrifugation, then dried and used. The filtration is carried out using a solvent-resistant filter element preferably under pressure. The drying is carried out under atmospheric pressure or reduced pressure (preferably under reduced pressure) at a temperature of from 30° C. to 100° C., preferably approximately 30° C. to 50° C.

Incidentally, after the resin is once precipitated and separated, the resin may be dissolved again in a solvent and then put into contact with a solvent in which the resin is sparingly soluble or insoluble. That is, there may be used a method including, after the completion of radical polymerization reaction described above, bringing the polymer into contact with a solvent in which the polymer is sparingly soluble or insoluble to precipitate a resin (step a), separating the resin from the solution (step b), dissolving the resin again in a solvent to prepare a resin solution A (step c), bringing the resin solution A into contact with a solvent in which the resin is sparingly soluble or insoluble and which has a volumetric amount of less than 10 times (preferably a volumetric amount of 5 times or less) the resin solution A to precipitate a resin solid (step d), and separating the precipitated resin (step e).

Moreover, in order to inhibit the aggregation or the like of the resin after preparation of the composition, for example, as described in JP2009-037108A, a process of dissolving the synthesized resin in a solvent and heating the resulting solution at a temperature of about 30° C. to 90° C. for about 30 minutes to 4 hours may be added.

The weight average molecular weight of the resin (A) in the invention is preferably 7,000 or more, more preferably from 7,000 to 200,000, still more preferably from 7,000 to 50,000, particularly preferably from 7,000 to 40,000, and most preferably from 7,000 to 30,000. When the weight average molecular weight is less than 7000, the solubility in an organic developer increases too high, and thus, there occurs a risk that a fine pattern cannot be formed.

The dispersity (molecular weight distribution, Mw/Mn) is preferably from 1.0 to 3.0, more preferably in the range of 1.0 to 2.6, still more preferably from 1.0 to 2.0, and particularly preferably from 1.4 to 2.0. With a lower molecular weight distribution, the resolution and the resist shape are superior, the side wall of the resist pattern is smoother, and the roughness is excellent. In the invention, the weight average molecular weight (Mw) and the number average molecular weight (Mn) of the resin (A) may be obtained by using, for example, an HLC-8120 (manufactured by Tosoh Corporation) using TSK gel Multipore HXL-M columns (manufactured by Tosoh Corporation, 7.8 mm ID×30.0 cm and THF (tetrahydrofuran) as an eluent.

In the actinic ray-sensitive or radiation-sensitive resin composition in the invention, the blending ratio of the resin (A) in the entire composition is preferably from 30% by mass to 99% by mass, and more preferably from 60% by mass to 95% by mass, based on the total solid content.

In addition, in the invention, the resin (A) may be used singly or in combination of a plurality of kinds thereof.

[2] Compound (B) Capable of Generating Acid by Irradiation with Actinic Rays or Radiation The composition in the invention further contains a compound (B) capable of generating an acid by irradiation with actinic rays or radiation (which may also be hereinafter referred to as "acid generator"). The compound (B) capable of generating an acid by irradiation with actinic rays or radiation is preferably a compound capable of generating organic acids by irradiation with actinic rays or radiation.

As such an acid generator, photoinitiators for photo-cation polymerization, photoinitiators for photo-radical polymerization, photodecoloring agents of coloring materials, photodiscoloring agents, known compounds that generate an acid by irradiation with actinic rays or radiation, which are used in microresists, or the like, and mixtures thereof may be suitably selected and used.

Examples of the acid generator include diazonium salts, phosphonium salts, sulfonium salts, iodonium salts, imide sulfonates, oxime sulfonates, diazodisulfone, disulfone, and o-nitrobenzyl sulfonate.

Examples of the preferred compounds among the acid generators include the compounds represented by the following general formulae (ZI), (ZII), and (ZIII).

[Chem. 26]

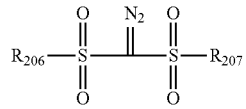

In the general formula (ZI), $R_{201}$, $R_{202}$, and $R_{203}$ each independently represent an organic group.

The organic group as $R_{201}$, $R_{202}$, and $R_{203}$ generally has 1 to 30 carbon atoms, and preferably 1 to 20 carbon atoms.

Further, two members out of $R_{201}$ to $R_{203}$ may be bonded to each other to form a ring structure, and the ring may contain an oxygen atom, a sulfur atom, an ester bond, an amide bond or a carbonyl group. Examples of the group formed by the mutual bonding of two members out of $R_{201}$ to $R_{203}$ include an alkylene group (for example, a butylene group and a pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl) imide anion, and a tris(alkylsulfonyl) methyl anion.

The non-nucleophilic anion is an anion having an exceedingly low ability for causing a nucleophilic reaction, and is also an anion capable of suppressing the decomposition with aging by the nucleophilic reaction in the molecule, which thus leads to improvement of the stability with aging of the resist composition.

Examples of the sulfonate anion include an aliphatic sulfonate anion, an aromatic sulfonate anion, and a camphor sulfonate anion.

Examples of the carboxylate anion include an aliphatic carboxylate anion, an aromatic carboxylate anion, and an aralkylcarboxylate anion.

The aliphatic moiety in the aliphatic sulfonate anion and the aliphatic carboxylate anion may be an alkyl group or a cycloalkyl group. It is preferably an alkyl group having 1 to 30 carbon atoms and a cycloalkyl group having 3 to 30 carbon atoms, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group in the aliphatic sulfonate anion and the aromatic sulfonate anion may have a substituent. Examples of the substituent of the alkyl group, the cycloalkyl group, and the aryl group of the aliphatic sulfonate anion and the aromatic sulfonate anion include a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or ring structure of these groups may further have an alkyl group (preferably having 1 to 15 carbon atoms) and a cycloalkyl group (preferably having 3 to 15 carbon atoms) as its substituent.

The aralkyl group in the aralkylcarboxylate anion is preferably an aralkyl group having 7 to 12 carbon atoms, and examples thereof include a benzyl group, a phenethyl group, a naphthylmethyl group, a naphthylethyl group, and a naphthylbutyl group.

The alkyl group, the cycloalkyl group, the aryl group, and the aralkyl group in the aliphatic carboxylate anion, the aromatic carboxylate anion, and the aralkylcarboxylate anion may have a substituent. Examples of the substituent include halogen atoms, alkyl groups, cycloalkyl groups, alkoxy groups, and alkylthio groups as described for the aromatic sulfonate anion.

Examples of the sulfonylimide anion include a saccharin anion.

The alkyl group in the bis(alkylsulfonyl) imide anion and the tris(alkylsulfonyl)methide anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, and a neopentyl group.

Two alkyl groups in the bis(alkylsulfonyl)imide anion may be linked to each other to form an alkylene group (preferably having 2 to 4 carbon atoms), and may be combined with an imide group and two sulfonyl groups to form a ring. Examples of the substituent of such an alkylene group formed by the linking of two alkyl groups in these alkyl groups and bis(alkylsulfonyl)imide anions include a halogen atom, and an alkyl group substituted with a halogen atom, an alkoxy group, an alkylthio group, an alkyloxysulfonyl group, an aryloxysulfonyl group, and a cycloalkylaryloxysulfonyl group, with an alkyl group substituted with a fluorine atom is preferred.

Other examples of the non-nucleophilic anion include phosphorus fluoride (for example, $PF_6^-$), boron fluoride (for example, $BF_4^-$) and antimony fluoride (for example, $SbF_6^-$).

The non-nucleophilic anion for $Z^-$ is preferably an aliphatic sulfonate anion substituted at least its α-position of sulfonic acid with a fluorine atom, an aromatic sulfonate anion substituted with a fluorine atom, or a group having a fluorine atom, a bis(alkylsulfonyl)imido anion in which an alkyl group is substituted with a fluorine atom, or a tris (alkylsulfonyl)methide anion in which an alkyl group is substituted with a fluorine atom. The nonnucleophilic anion is more preferably a perfluorinated aliphatic sulfonate anion having 4 to 8 carbon atoms or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

The acid generator is preferably a compound capable of generating an acid represented by the following general formula (V) or (VI) by irradiation with actinic rays or radiation. Since the acid generator is the compound capable of generating an acid, represented by the following general formula (V) or (VI), it has a cyclic organic group, and therefore, resolution and roughness performance can be further improved.

The non-nucleophilic anion may be an anion capable of generating an organic acid, represented by the following general formula (V) or (VI).

[Chem 27.]

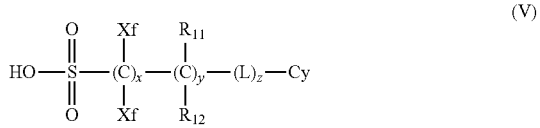

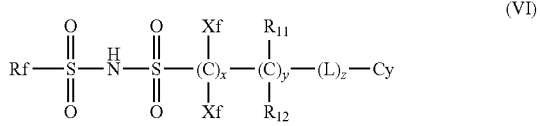

In the general formulae,

Xf's each independently represent a fluorine atom, or an alkyl group substituted with at least one fluorine atom;

$R_{11}$ and $R_{12}$ each independently represent a hydrogen atom, a fluorine atom, or an alkyl group;

L's each independently represent a divalent linking group;

Cy represents a cyclic organic group;

Rf represents a group containing a fluorine atom;

x represents an integer of 1 to 20;

y represents an integer of 0 to 10; and z represents an integer of 0 to 10.

Xf represents a fluorine atom, or an alkyl group substituted with at least one fluorine atom. The alkyl group preferably contains 1 to 10 carbon atoms, and more preferably 1 to 4 carbon atoms. Further, the alkyl group substituted with at least one fluorine atom is preferably a perfluoroalkyl group.

Xf is preferably a fluorine atom or a perfluoroalkyl group having 1 to 4 carbon atoms. Specific preferred examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$. Among these, a fluorine atom and $CF_3$ are more preferred. It is particularly preferable that both Xf's be fluorine atoms.

$R_{11}$ and $R_{12}$ each independently represent a hydrogen atom, a fluorine atom, or an alkyl group. The alkyl group may have a substituent (preferably a fluorine atom), and preferably contains 1 to 4 carbon atoms. A perfluoroalkyl group having 1 to 4 carbon atoms is more preferred. Specific examples of the alkyl group having a substituent with respect to $R_{11}$ and $R_{12}$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferred.

L is a divalent linking group. Examples of the divalent linking group include —COO—, —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), and a divalent linking group formed by combination of a plurality of these groups. Among these, —COO—, —OCO—, —CONH—, —NHCO—, —CO—, —O—, —SO$_2$—, —COO-alkylene group-, —OCO-alkylene group-, —CONH-alkylene group-, or —NHCO-alkylene group- is preferred, and —COO—, —OCO—, —SO$_2$—, —COO-alkylene group-, or —OCO-alkylene group- is more preferred.

Cy represents a cyclic organic group. Examples of the cyclic organic group include an alicyclic group, an aryl group, and a heterocyclic group.

The alicyclic group may be monocyclic or polycyclic, examples of the monocyclic alicyclic group include monocyclic cycloalkyl groups such as a cyclopentyl group, a cyclohexyl group, and a cyclooctyl group, and examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure containing 7 or more carbon atoms, such as a norbornyl group, a tricyclodecanyl group, a tetracyclodecanyl group, a tetracyclododecanyl group, and an adamantyl group, is preferred since diffusion into a film during a post-exposure baking (PEB) step is inhibited and a MEEF (Mask Error Enhancement Factor) is improved.

The aryl group may be monocyclic or polycyclic. Examples of the aryl group include a phenyl group, a naphthyl group, a phenanthryl group, and an anthryl group. Among these, a naphthyl group with a relatively low light absorbance at 193 nm is preferred.

The heterocyclic group may be monocyclic or polycyclic, and the polycyclic heterocyclic group can inhibit the diffusion of an acid. Further, the heterocyclic group may be aromatic or non-aromatic. Examples of the aromatic heterocycle include a furan ring, a thiophene ring, a benzofuran ring, a benzothiophene ring, a dibenzofuran ring, a dibenzothiophene ring, and a pyridine ring. Examples of the non-aromatic heterocycle include a tetrahydropyran ring, a lactone ring, a sultone ring, and a decahydroisoquinoline ring. As the heterocycle in the heterocyclic group, a furan ring, a thiophene ring, a pyridine ring, or a decahydroisoquinoline ring are particularly preferred. Further, examples of the lactone ring or the sultone ring include the lactone structures or the sultone structures exemplified in the above-described resin (A).

The cyclic organic group may have a substituent. Examples of the substituent include an alkyl group (may be linear or branched, preferably having 1 to 12 carbon atoms), a cycloalkyl group (may be monocyclic, polycyclic or spirocyclic, preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonate ester group. Incidentally, the carbon constituting the cyclic organic group (carbon contributing to ring formation) may be carbonyl carbon.

x is preferably from 1 to 8, more preferably from 1 to 4, and particularly preferably 1. y is preferably from 0 to 4, and more preferably 0. z is preferably from 0 to 8, and more preferably from 0 to 4.

Examples of the group containing a fluorine atom, represented by Rf, include an alkyl group having at least one fluorine atom, a cycloalkyl group having at least one fluorine atom, and an aryl group having at least one fluorine atom.

These alkyl group, cycloalkyl group, and aryl group may be substituted with fluorine atoms, or with the substituents containing fluorine atoms. In the case where Rf is a cycloalkyl group having at least one fluorine atom or an aryl group having at least one fluorine atom, examples of the other substituent containing a fluorine atom include an alkyl group substituted with at least one fluorine atom.

Furthermore, these alkyl group, cycloalkyl group, and aryl group may be further substituted with substituents containing no fluorine atoms. Examples of the substituent include those containing no fluorine atoms, among those described above for Cy.

Examples of the alkyl group having at least one fluorine atom represented by Rf include those described above for the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

Furthermore, as the non-nucleophilic anion, an anion represented by any one of the following general formulae (B-1) to (B-3) is also preferred.

First, an anion represented by the following general formula (B-1) will be described.

[Chem. 28]

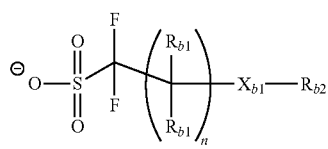
(B-1)

In the general formula (B-1), $R_{b1}$ each independently represent a hydrogen atom, fluorine atom, or a trifluoromethyl group ($CF_3$);

n represents an integer of 1 to 4, preferably an integer of 1 to 3, and more preferably 1 or 2;

$X_{b1}$ represents a single bond, an ether bond, an ester bond (—OCO— or —COO—), or a sulfonice ester bond (—OSO$_2$— or —SO$_3$—);

$X_{b1}$ is preferably an ester bond (—OCO— or —COO—) or a sulfonice ester bond (—OSO$_2$— or —SO$_3$—); and $R_{b2}$ represents a substituent having 6 or more carbon atoms.

The substituent having 6 or more carbon atoms with respect to $R_{b2}$ is preferably a bulky group, and examples thereof include an alkyl group, an alicyclic group, an aryl group, and a heterocyclic group, each having 6 or more carbon atoms.

The alkyl group having 6 or more carbon atoms with respect to $R_{b2}$ may be linear or branched, is preferably a linear or branched alkyl group having 6 to 20 carbon atoms, and examples thereof include linear or branched hexyl group, a linear or branched heptyl group, and a linear or branched octyl group. From the viewpoint of bulkiness, a branched alkyl group is preferred.

The alicyclic group having 6 or more carbon atoms with respect to $R_{b2}$ may be monocyclic or polycyclic. Examples of the monocyclic alicyclic group include monocyclic cycloalkyl groups such as a cyclohexyl group and a cyclooctyl group, and examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure containing 7 or more carbon atoms, such as a norbornyl group, a tricyclodecanyl group, a tetracyclodecanyl group, a tetracyclododecanyl group, and an adamantyl group, is preferred since diffusion into a film during a post-exposure baking (PEB) step is inhibited and a MEEF (Mask Error Enhancement Factor) is improved.

The aryl group having 6 or more carbon atoms with respect to $R_{b2}$ may be monocyclic or polycyclic. Examples of the aryl group include a phenyl group, a naphthyl group, a phenanthryl group, and an anthryl group. Among these, a naphthyl group with a relatively low light absorbance at 193 nm is preferred.

The heterocyclic group having 6 or more carbon atoms with respect to $R_{b2}$ may be monocyclic or polycyclic, and the polycyclic heterocyclic group can inhibit the diffusion of an acid. Further, the heterocyclic group may be aromatic or non-aromatic. Examples of the aromatic heterocycle include a benzofuran ring, a benzothiophene ring, a dibenzofuran ring, and a dibenzothiophene ring. Examples of the non-aromatic heterocycle include a tetrahydropyran ring, a lactone ring, and a decahydroisoquinoline ring. As the heterocycle in the heterocyclic group, a benzofuran ring, or a decahydroisoquinoline ring are particularly preferred. Further, examples of the lactone ring include the lactone structures exemplified in the above-described resin (P).

The substituent having 6 or more carbon atoms with respect to $R_{b2}$ may further have a substituent. Examples of the substituent include an alkyl group (may be linear or branched, preferably having 1 to 12 carbon atoms), a cycloalkyl group (may be monocyclic, polycyclic or spirocyclic, preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonic ester group. Incidentally, the carbon constituting the above-described alicyclic group, aryl group, or heterocyclic group (carbon contributing to ring formation) may be carbonyl carbon.

Specific examples of an anion represented by the general formula (B-1) are shown below, but the invention is not limited thereto.

[Chem. 29]

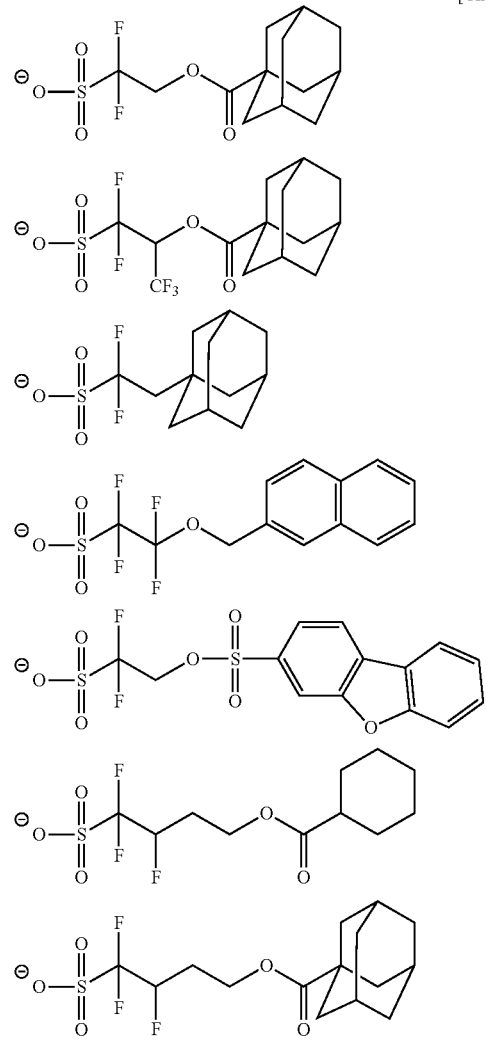

Next, an anion represented by the following general formula (B-2) will be described.

[Chem. 30]

(B-2)

In the general formula (B-2), $Q_{b1}$ represents a group having a lactone structure, a group having a sultone structure, or a group having a cyclic carbonate structure.

Examples of the lactone structure and sultone structure for $Q_{b1}$ include the same lactone structures and sultone structures as mentioned above with respect to the repeating unit having a lactone structure and a sultone structure described in the section of the resin (P), and specifically include any lactone structure represented by the general formulae (LC1-1) to (LC1-17) and any sultone structure represented by the general formulae (SL1-1) to (SL1-3).

The lactone structure or sultone structure may be directly bonded to an oxygen atom in an ester group in the general formula (B-2), but the lactone structure or sultone structure may be bonded to an oxygen atom in an ester group through an alkylene group (for example, a methylene group and an ethylene group). In this case, the group having a lactone structure or sultone structure can be mentioned as an alkyl group having the lactone structure or sultone structure as a substituent.

As the cyclic carbonate structure for $Q_{b1}$, a cyclic carbonate structure of a 5- to 7-membered ring is preferred, and examples thereof include 1,3-dioxan-2-one and 1,3-dioxan-2-one.

The cyclic carbonate structure may be directly bonded to an oxygen atom in an ester group in the general formula (B-2), but the cyclic carbonate structure may be bonded to an oxygen atom in an ester group through an alkylene group (for example, a methylene group and an ethylene group). In this case, the group having a cyclic carbonate structure can be mentioned as an alkyl group having the cyclic carbonate structure as a substituent.

Specific examples of the anion represented by the general formula (B-2) are shown below, but the invention is not limited thereto.

[Chem. 31]

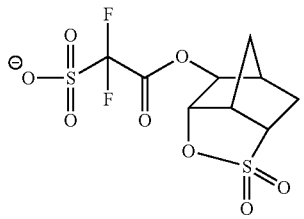

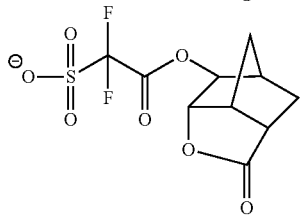

-continued

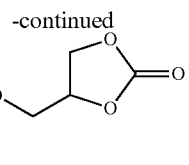

Next, an anion represented by the following general formula (B-3) will be described.

[Chem. 32]

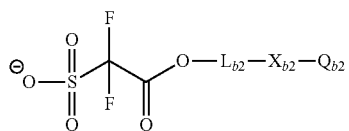
(B-3)

In the general formula (B-3), $L_{b2}$ represents an alkylene group having 1 to 6 carbon atoms, and examples thereof include a methylene group, an ethylene group, a propylene group, and a butylene group, with an alkylene group having 1 to 4 carbon atoms being preferred;

$X_{b2}$ represents an ether bond or an ester bond (—OCO— or —COO—); and $Q_{b2}$ represents an alicyclic group or an aromatic ring-containing group.

The alicyclic group with respect to $Q_{b2}$ may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure, having 7 or more carbon atoms, such as a norbornyl group, a tricyclodecanyl group, a tetracyclodecanyl group, a tetracyclododecanyl group, and an adamantyl group is preferred.

The aromatic ring-containing group with respect to $Q_{b2}$ is preferably an aromatic ring having 6 to 20 carbon atoms, and examples thereof include a benzene ring, a naphthalene ring, a phenanethrene ring, and an anthracene ring, with a benzene ring or a naphthalene ring being preferred. The aromatic ring may be substituted with at least one fluorine atom, and examples of the aromatic ring substituted with at least one fluorine atom include a per fluorophenyl group.

The aromatic ring may be directly bonded to $X_{b2}$, but the aromatic ring may be bonded to $X_{b2}$ through an alkylene group (for example, a methylene group and an ethylene group). In this case, the group having an aromatic ring can be mentioned as an alkyl group having the aromatic ring as a substituent.

Specific examples of the anion structure represented by the general formula (B-3) are shown below, but the invention is not limited thereto.

[Chem. 33]

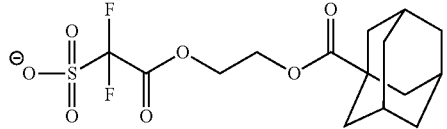

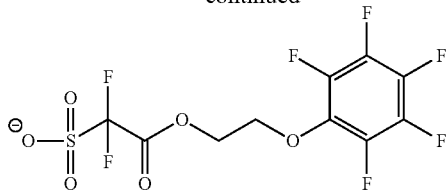

Examples of the organic group represented by $R_{201}$, $R_{202}$, and $R_{203}$ include the corresponding groups in the compounds (ZI-1), (ZI-2), (ZI-3), and (ZI-4) as described later.

Moreover, the compound may be a compound having a plurality of structures represented by the general formula (ZI). For example, the compound may be a compound having a structure where at least one of $R_{201}$ to $R_{203}$ in the compound represented by the general formula (ZI) is bonded to at least one of $R_{201}$ to $R_{203}$ in another compound represented by the general formula (ZI) through a single bond or a linking group.

More preferred examples of the component (ZI) include the compounds (ZI-1), (ZI-2), (ZI-3), and (ZI-4) as described below.

The compound (ZI-1) is an arylsulfonium compound, in which at least one of $R_{201}$ to $R_{203}$ in the general formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining ones being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same as or different from each other.

The alkyl group or the cycloalkyl group included in the arylsulfonium compound is preferably a linear or branched alkyl group having 1 to 15 carbon atoms or a cycloalkyl group having 3 to 15 carbon atoms, as desired, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group or a phenylthio group. The substituent is preferably a linear or branched alkyl group having 1 to 12 carbon atoms, a cycloalkyl group having 3 to 12 carbon atoms, or a linear, branched, or cyclic alkoxy group having 1 to 12 carbon atoms, more preferably an alkyl group having 1 to 4 carbon atoms, or an alkoxy group having 1 to 4 carbon atoms. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

Next, the compound (ZI-2) will be described.

The compound (ZI-2) is a compound in which $R_{201}$ to $R_{203}$ in the formula (ZI) each independently represent an organic group having no aromatic ring. Here, the aromatic ring also includes an aromatic ring containing a heteroatom.

The organic group containing no aromatic ring as $R_{201}$ to $R_{203}$ generally contains 1 to 30 carbon atoms, and preferably 1 to 20 carbon atoms.

$R_{201}$ to $R_{203}$ each independently preferably represent an alkyl group, a cycloalkyl group, an allyl group, or a vinyl group, still more preferably a linear or branched 2-oxoalkyl group, a 2-oxocycloalkyl group, or an alkoxycarbonylmethyl group, and particularly preferably a linear or branched 2-oxoalkyl group.

Preferable examples of the alkyl group and the cycloalkyl group of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group). More preferable examples of the alkyl group include a 2-oxoalkyl group and an alkoxycarbonylmethyl group, and more preferable examples of the cycloalkyl group include a 2-oxocycloalkyl group.

The 2-oxoalkyl group may be either linear or branched, and examples thereof include a group containing >C=O at the 2-position of the alkyl group.

The 2-oxocycloalkyl group is preferably the group containing >C=O at the 2-position of the cycloalkyl group.

Examples of the alkoxy group in the alkoxycarbonylmethyl group preferably include an alkoxy group having 1 to 5 carbon atoms (for example, a methoxy group, an ethoxy group, a propoxy group, a butoxy group, and a pentoxy group).

$R_{201}$ to $R_{203}$ may be further substituted with a halogen atom, an alkoxyl group (for example, having 1 to 5 carbon atoms), a hydroxyl group, a cyano group, or a nitro group.

Next, the compound (ZI-3) will be described.

The compound (ZI-3) is a compound represented by the following general formula (ZI-3), which has a phenacylsulfonium salt structure.

[Chem. 34]

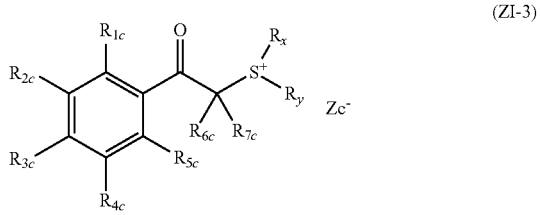

In the general formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group;

$R_{6c}$ and $R_{7c}$ each independently represent a hydrogen atom, an alkyl group, a cycloalkyl group, a halogen atom, a cyano group, or an aryl group; and $R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more members out of $R_{1c}$ to $R_{5c}$, $R_{5c}$ and $R_{6c}$, $R_{6c}$ and $R_{7c}$, $R_{5c}$ and $R_x$, and $R_x$ and $R_y$ may be bonded to each other to form a ring structure, and this ring structure may contain an oxygen atom, a sulfur atom, a ketone group, an ester bond, or an amide bond.

The ring structure includes an aromatic or non-aromatic hydrocarbon ring, an aromatic or non-aromatic heterocycle, and a polycyclic condensed ring formed by combination of two or more of these rings. The ring structure includes a 3- to 10-membered ring, and is preferably a 4- to 8-membered ring, and more preferably a 5- or 6-membered ring.

Examples of the group formed by the mutual bonding of any two or more members out of $R_{1c}$ to $R_{5c}$, $R_{6c}$ and $R_{7c}$, and $R_x$ and $R_y$ include a butylene group and a pentylene group.

The group formed by the mutual bonding of $R_{5c}$ and $R_{6c}$, and $R_{5c}$ and $R_x$ is preferably a single bond or an alkylene group, and examples of the alkylene group include a methylene group and an ethylene group.

$Zc^-$ represents a non-nucleophilic anion, and examples thereof include the same non-nucleophilic anions as $Z^-$ in the general formula (ZI).

The alkyl group as $R_{1c}$ to $R_{7c}$ may be either linear or branched, and examples thereof include an alkyl group having 1 to 20 carbon atoms, and preferably a linear or branched alkyl group having 1 to 12 carbon atoms (for example, a methyl group, an ethyl group, a linear or branched propyl group, a linear or branched butyl group, and a linear or branched pentyl group), and examples of the cycloalkyl group include a cycloalkyl group having 3 to 10 carbon atoms (for example, a cyclopentyl group and a cyclohexyl group).

The aryl group as $R_{1c}$ to $R_{5c}$ preferably has 5 to 15 carbon atoms, and examples thereof include a phenyl group and a naphthyl group.

The alkoxy group as $R_{1c}$ to $R_{5c}$ may be any of linear, branched, and cyclic, and examples thereof include an alkoxy group having 1 to 10 carbon atoms, preferably a linear and branched alkoxy group having 1 to 5 carbon atoms (for example, a methoxy group, an ethoxy group, a linear or branched propoxy group, a linear or branched butoxy group, and a linear or branched pentoxy group), and a cyclic alkoxy group having 3 to 10 carbon atoms (for example, a cyclopentyloxy group and a cyclohexyloxy group).

Specific examples of the alkoxy group in the alkoxycarbonyl group as $R_{1c}$ to $R_{5c}$ include the same alkoxy groups as mentioned above as $R_{1c}$ to $R_{5c}$.

Specific examples of the alkyl group in the alkylcarbonyloxy group and the alkylthio group as $R_{1c}$ to $R_{5c}$ include the same alkyl groups as mentioned above as $R_{1c}$ to $R_{5c}$.

Specific examples of the cycloalkyl group in the cycloalkylcarbonyloxy group as $R_{1c}$ to $R_{5c}$ include the same cycloalkyl groups as mentioned above as $R_{1c}$ to $R_{5c}$.

Specific examples of the aryl group in the aryloxy group and the arylthio group as $R_{1c}$ to $R_{5c}$ include the same aryl groups as mentioned above as $R_{1c}$ to $R_{5c}$.

Preferably, any one of $R_{1c}$ to $R_{5c}$ is a linear or branched alkyl group, a cycloalkyl group, or a linear, branched, or cyclic alkoxy group, and $R_{1c}$ to $R_{5c}$ more preferably has 2 to 15 carbon atoms, due to which the solvent solubility is more enhanced and generation of particles during storage is be inhibited.

The ring structure formed by the mutual bonding of any two or more members out of $R_{1c}$ to $R_{5c}$ preferably includes a 5- or 6-membered ring, and particularly preferably a 6-membered ring (such as a phenyl ring).

The ring structure formed by the mutual bonding of $R_{5c}$ and $R_{6c}$ preferably includes a 4 or more-membered ring (preferably a 5- or 6-membered ring) formed with the carbonyl carbon atom and carbon atom in the general formula (ZI-3) by the mutual bonding of $R_{5c}$ and $R_{6c}$ to constitute a single bond or an alkylene group (a methylene group, an ethylene group, and the like).

The aryl group as any of $R_{6c}$ and $R_{7c}$ is an aryl group having 5 to 15 carbon atoms, and examples thereof include a phenyl group and a naphthyl group.

In one embodiment of $R_{6c}$ and $R_{7c}$ the case where both of $R_{6c}$ and $R_{7c}$ are alkyl groups is preferred. Particularly, the case where $R_{6c}$ and $R_{7c}$ are each a linear or branched alkyl group having 1 to 4 carbon atoms is preferred, and the case where both of them are methyl groups is particularly preferred.

In addition, in the case where $R_{6c}$ and $R_{7c}$ are combined to form a ring, the group formed by the mutual bonding of $R_{6c}$ and $R_{7c}$ is preferably an alkylene group having 2 to 10 carbon atoms, and examples thereof include an ethylene group, a propylene group, a butylene group, a pentylene group, and a hexylene group. Further, the ring formed by the mutual bonding of $R_{6c}$ and $R_{7c}$ may contain a heteroatom such as an oxygen atom in the ring.

Examples of the alkyl group and the cycloalkyl group as $R_x$ and $R_y$ include the same alkyl groups and cycloalkyl groups with respect to $R_{1c}$ to $R_{7c}$.

Examples of the 2-oxoalkyl group and the 2-oxocloalkyl group as $R_x$ and $R_y$ include a group containing >C=O at the 2-position of the alkyl group and the cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. Examples of the alkyl group include an alkyl group having 1 to 12 carbon atoms, and preferably a linear alkyl group having 1 to 5 carbon atoms (for example, a methyl group and an ethyl group).

The allyl group as $R_x$ and $R_y$ is not particularly limited, but is preferably an unsubstituted allyl group or an allyl group substituted with a monocyclic or polycyclic cycloalkyl group (preferably a cycloalkyl group having 3 to 10 carbon atoms).

The vinyl group as $R_x$ and $R_y$ is not particularly limited, but is preferably an unsubstituted vinyl group or a vinyl group substituted with a monocyclic or polycyclic cycloalkyl group (preferably a cycloalkyl group having 3 to 10 carbon atoms).

The ring structure which may be formed by the mutual bonding of $R_{5c}$ and $R_x$ includes a 5-membered or higher ring (particularly preferably a 5-membered ring), formed together with a sulfur atom and a carbonyl carbon atom in the general formula (ZI-3) by the mutual bonding of $R_{5c}$ and $R_x$ to constitute a single bond or an alkylene group (for example, a methylene group and an ethylene group).

The ring structure which may be formed by the mutual bonding of $R_x$ and $R_y$ include a 5- or 6-membered ring, and particularly preferably a 5-membered ring (that is, a tetrahydrothiophene ring), formed together with the sulfur atom in the general formula (ZI-3) by divalent $R_x$ and $R_y$ (for example, a methylene group, an ethylene group, and a propylene group).

$R_x$ and $R_y$ are each preferably an alkyl group or a cycloalkyl group having 4 or more carbon atoms, more preferably an alkyl group or a cycloalkyl group having 6 or more carbon atoms, and still more preferably an alkyl group or a cycloalkyl group having 8 or more carbon atoms.

$R_{1c}$ to $R_{7c}$, $R_x$ and $R_y$ may further contain a substituent, and examples of such a substituent include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In the general formula (ZI-3), $R_{1c}$, $R_{2c}$, $R_{4c}$, and $R_{5c}$ each independently more preferably represent a hydrogen atom, and $R_{1c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, Specific examples of the cation of the compound represented by the general formula (ZI-2) or (ZI-3) in the invention will be shown below.

[Chem. 35]

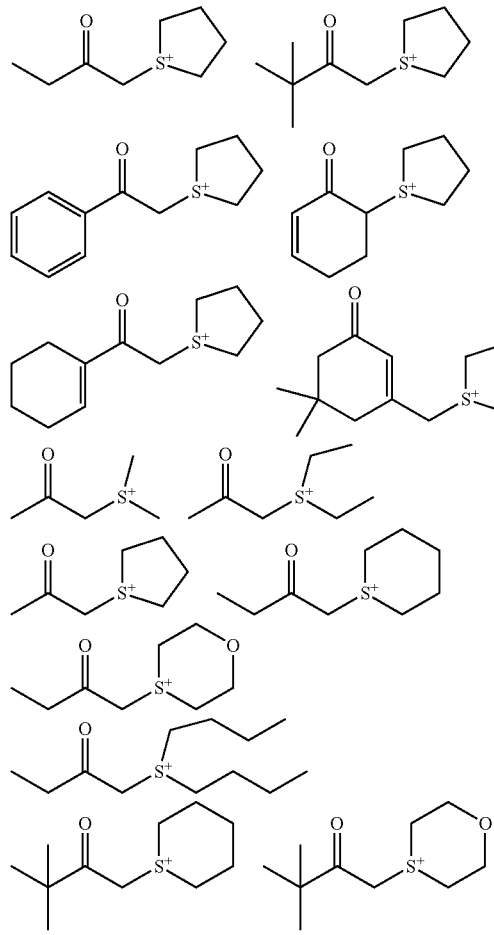

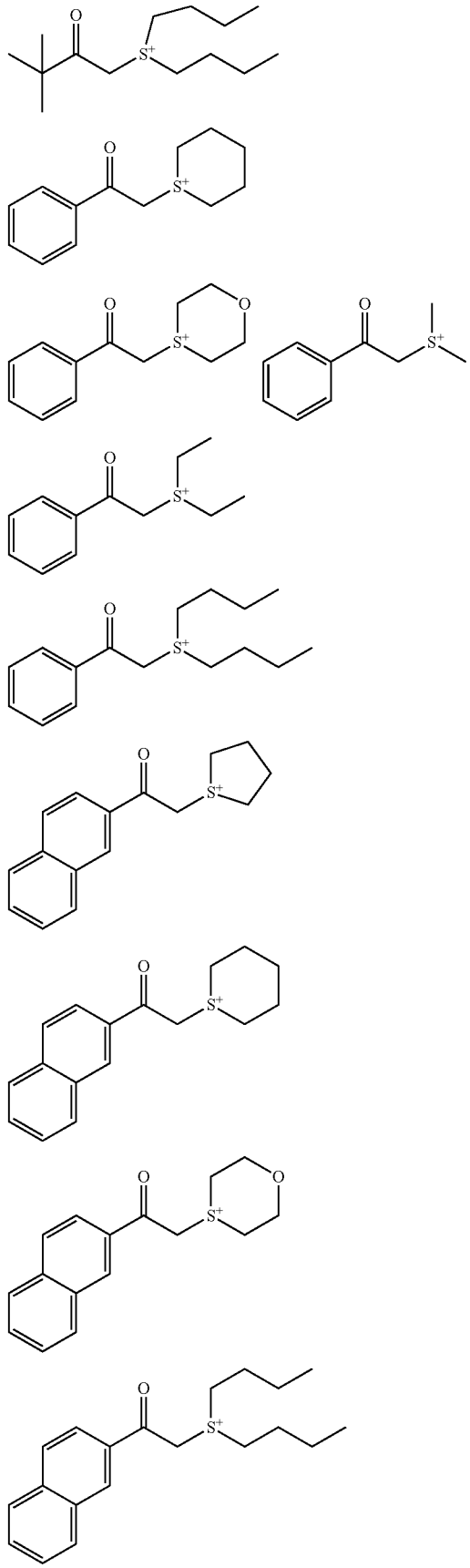

81
-continued
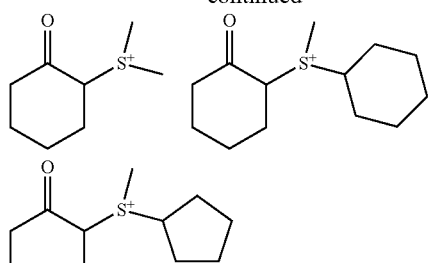
[Chem. 36]
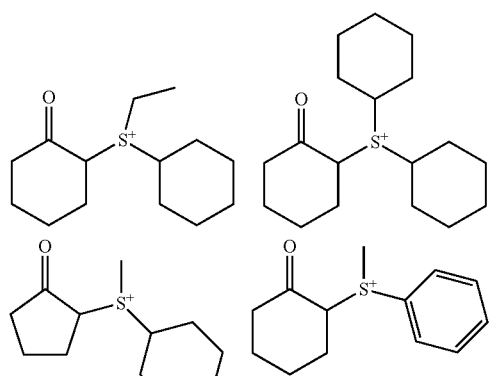
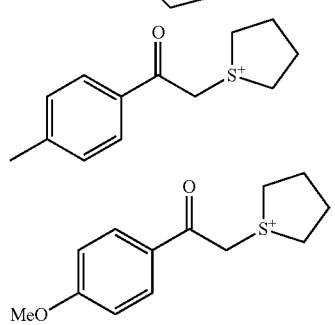
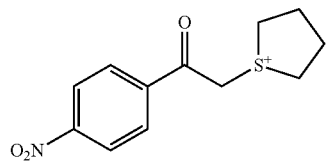
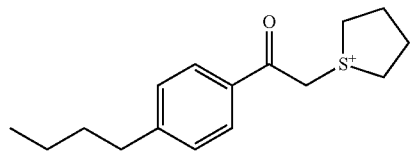
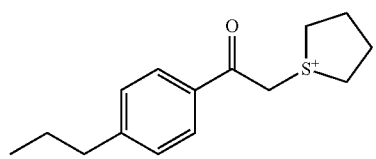
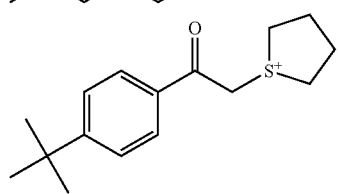
82
-continued
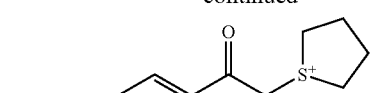
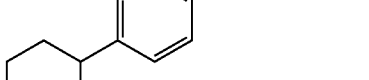
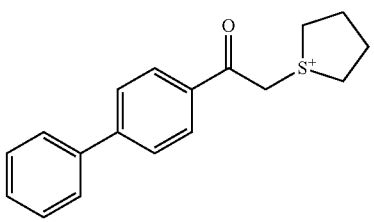
[Chem. 37]
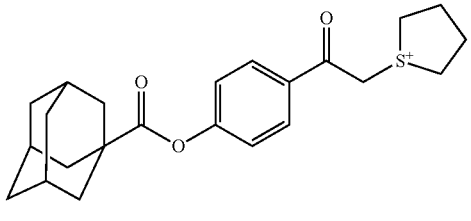
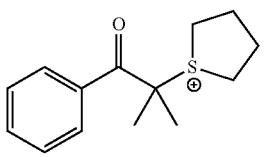
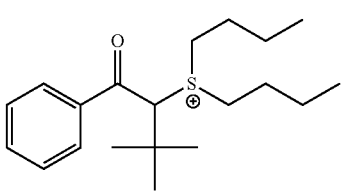
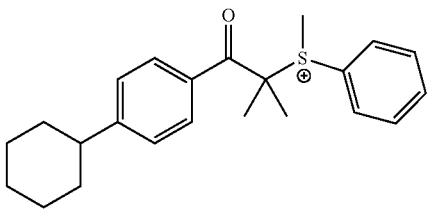
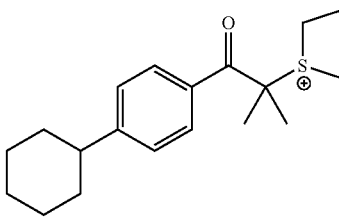
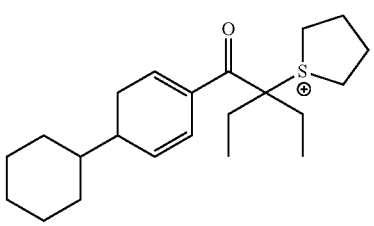

83
-continued
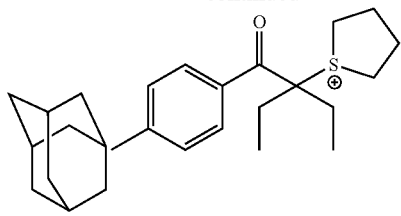
[Chem. 38]
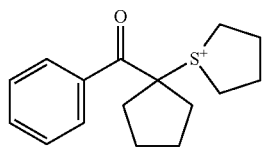
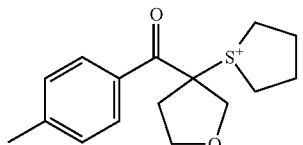
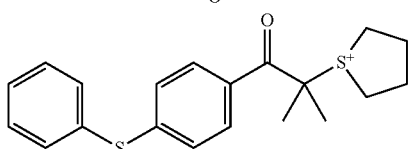
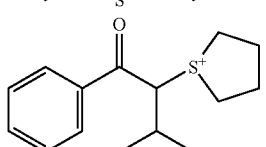
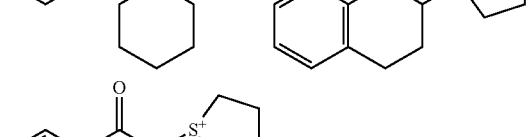
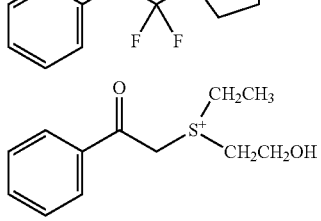
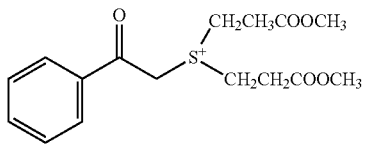
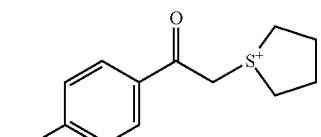
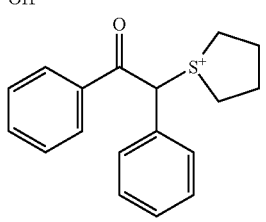
84
-continued
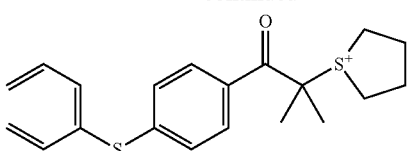
[Chem. 39]
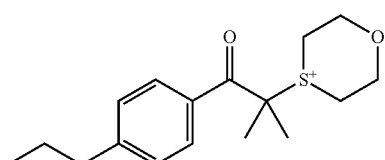
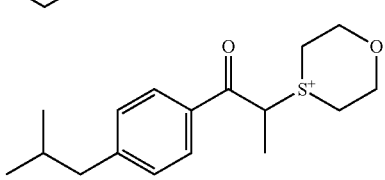
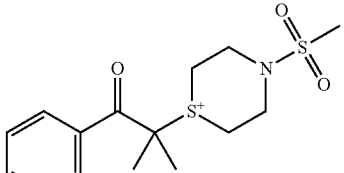
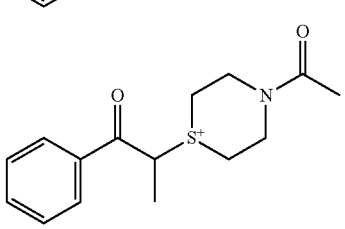
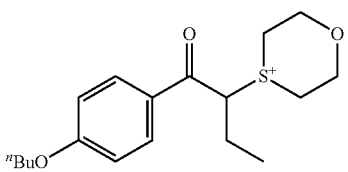
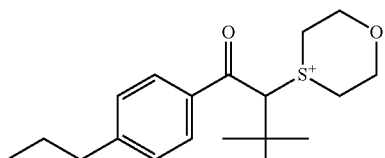
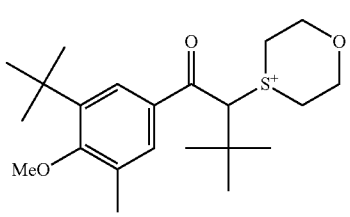

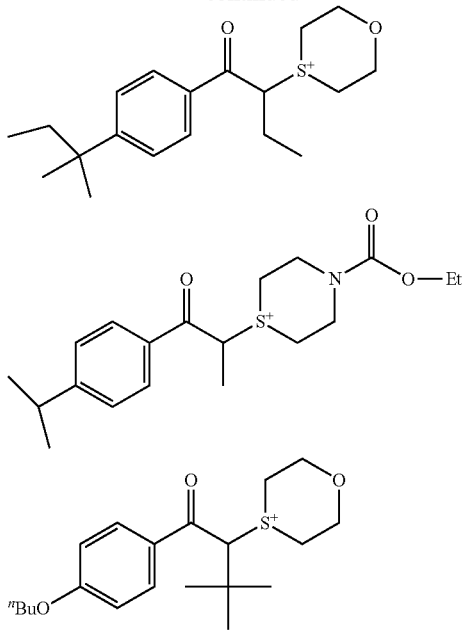
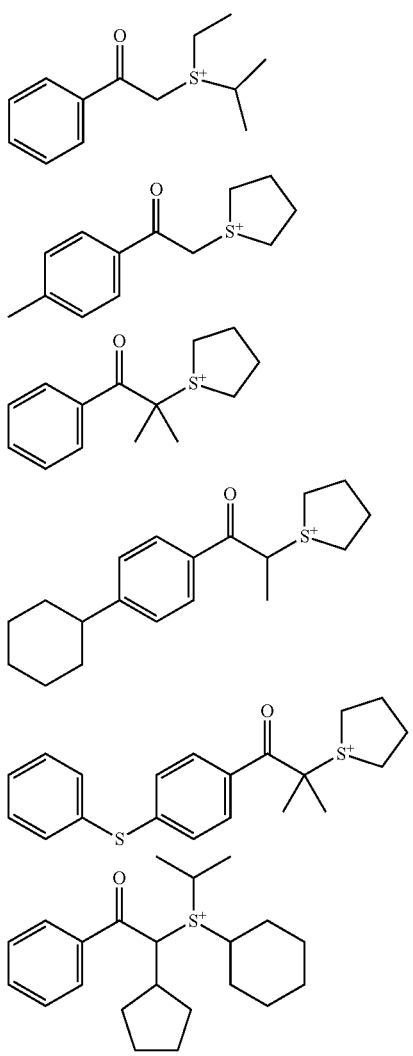
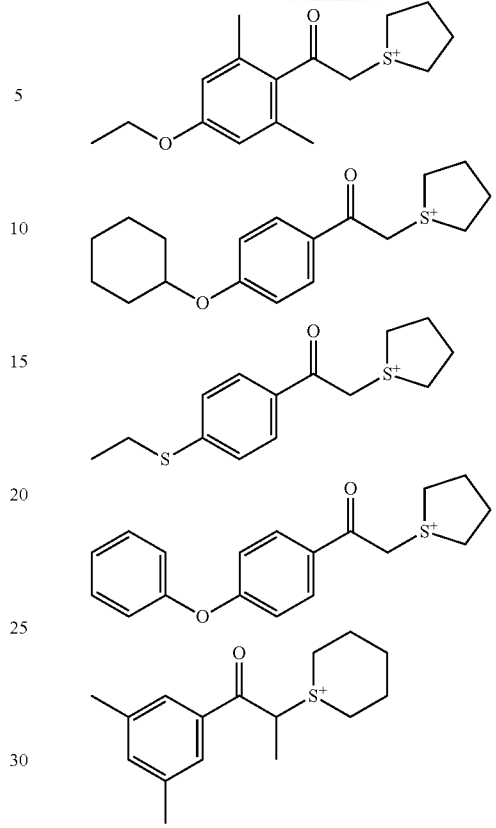

Next, the compound (ZI-4) will be described.

The compound (ZI-4) is represented by the following general formula (ZI-4).

[Chem. 41]

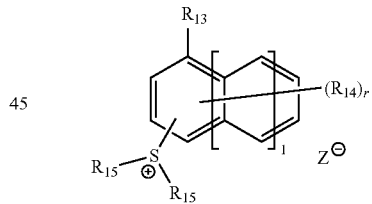

(ZI-4)

In the general formula (ZI-4), $R_{13}$ represents a group containing a hydrogen atom, a fluorine atom, a hydroxyl group, an alkyl group, a cycloalkyl group, an alkoxy group, an alkoxycarbonyl group, or a cycloalkyl group, and these groups may have a substituent;

when a plurality of $R_{14}$'s are present, they each independently represent a group containing a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group, and these groups may have a substituent;

$R_{15}$'s each independently represent an alkyl group, a cycloalkyl group, or a naphthyl group, and two $R_{15}$'s may be bonded to each other to form a ring, and these groups may have a substituent;

l represents an integer of 0 to 2;
r represents an integer of 0 to 8; and
$Z^-$ represents a non-nucleophilic anion, and examples thereof include the same non-nucleophilic anions as $Z^-$ in the general formula (ZI).

In the general formula (ZI-4), the alkyl group of $R_{13}$, $R_{14}$, and $R_{15}$ is linear or branched, preferably has 1 to 10 carbon atoms, and preferred examples thereof include a methyl group, an ethyl group, an n-butyl group, and a t-butyl group.

Examples of the cycloalkyl group of $R_{13}$, $R_{14}$, and $R_{15}$ include a monocyclic or polycyclic cycloalkyl group (preferably a cycloalkyl group having 3 to 20 carbon atoms), and particularly preferred examples thereof include cyclopropyl, cyclopentyl, cyclohexyl, cycloheptyl, and cyclooctyl.

The alkoxy group of $R_{13}$ and $R_{14}$ is linear or branched, preferably has 1 to 10 carbon atoms, and preferred examples thereof include a methoxy group, an ethoxy group, an n-propoxy group, and an n-butoxy group.

The alkoxycarbonyl group of $R_{13}$ and $R_{14}$ is linear or branched, preferably has 2 to 11 carbon atoms, and preferred examples thereof include a methoxycarbonyl group, an ethoxycarbonyl group, and an n-butoxycarbonyl group.

Examples of the group having a cycloalkyl group of $R_{13}$ and $R_{14}$ include a monocyclic or polycyclic cycloalkyl group (preferably a cycloalkyl group having of 3 to 20 carbon atoms), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total number of carbon atoms of 7 or more, more preferably a total number of carbon atoms of 7 to 15, and preferably has a monocyclic cycloalkyl group. The monocyclic cycloalkyloxy group having a total number of carbon atoms of 7 or more indicates a monocyclic cycloalkyloxy group where a cycloalkyloxy group such as a cyclopropyloxy group, a cyclobutyloxy group, a cyclopentyloxy group, a cyclohexyloxy group, a cycloheptyloxy group, a cyclooctyloxy group, and a cyclododecanyloxy group has a substituent such as an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, and an iso-amyl group; a hydroxyl group; a halogen atom (fluorine, chlorine, bromine, and iodine); a nitro group; a cyano group; a amide group; a sulfonamide-group; an alkoxy group such as a methoxy group, an ethoxy group, a hydroxyethoxy group, a propoxy group, a hydroxypropoxy group, and a butoxy group; an alkoxycarbonyl group such as a methoxycarbonyl group and an ethoxycarbonyl group; an acyl group such as a formyl group, an acetyl group, and a benzoyl group; and an acyloxy group such as an acetoxy group and a butyryloxy group; and a carboxyl group, and where the total number of carbon atoms inclusive of the number of carbon atoms of an arbitrary substituent on the cycloalkyl group is 7 or more.

Incidentally, examples of the polycyclic cycloalkyloxy group having a total number of carbon atoms of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total number of carbon atoms of 7 or more, and more preferably a total number of carbon atoms of 7 to 15, and is preferably an alkoxy group having a monocyclic cycloalkyl group. The alkoxy group having a total number of carbon atoms of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, and iso-amyloxy, in which the total number of carbon atoms inclusive of the number of carbon atoms of the substituent is 7 or more. Examples thereof include a cyclohexylmethoxy group, a cyclopentylethoxy group, and a cyclohexylethoxy group, with a cyclohexylmethoxy group being preferred.

In addition, examples of the alkoxy group having a total number of carbon atoms of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl group or the cycloalkylsulfonyl group of $R_{14}$ is linear, branched, or cyclic, preferably has 1 to 10 carbon atoms, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which each of the groups above may have include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched, or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include a linear, branched, or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include a linear, branched, or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl.

Examples of the alkoxycarbonyloxy group include a linear, branched, or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

Examples of the ring structure which may be formed by the mutual bonding of two $R_{15}$'s include a 5- or 6-membered ring, preferably a 5-membered ring (that is, a tetrahydrothiophene ring), formed together with the sulfur atom in the general formula (ZI-4) by two $R_{15}$'s and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may be combined with each other to form a ring (an aromatic or non-aromatic hydrocarbon ring, an aromatic or non-aromatic heterocycle, a polycyclic condensed ring formed by combination of two or more of these rings, or the like).

In the general formula (ZI-4), $R_{15}$ is preferably for example, a methyl group, an ethyl group, a naphthyl group, or a divalent group for forming a tetrahydrothiophene ring structure together with the sulfur atom when two $R_{15}$'s are bonded to each other, or the like.

The substituent which $R_{13}$ and $R_{14}$ may have is preferably a hydroxyl group, an alkoxy group, an alkoxycarbonyl group, or a halogen atom (particularly a fluorine atom).

l is preferably 0 or 1, and more preferably 1.

r is preferably from 0 to 2.

Specific examples of the cation of the compound represented by the general formula (ZI-4) in the invention will be shown below.

[Chem. 42]

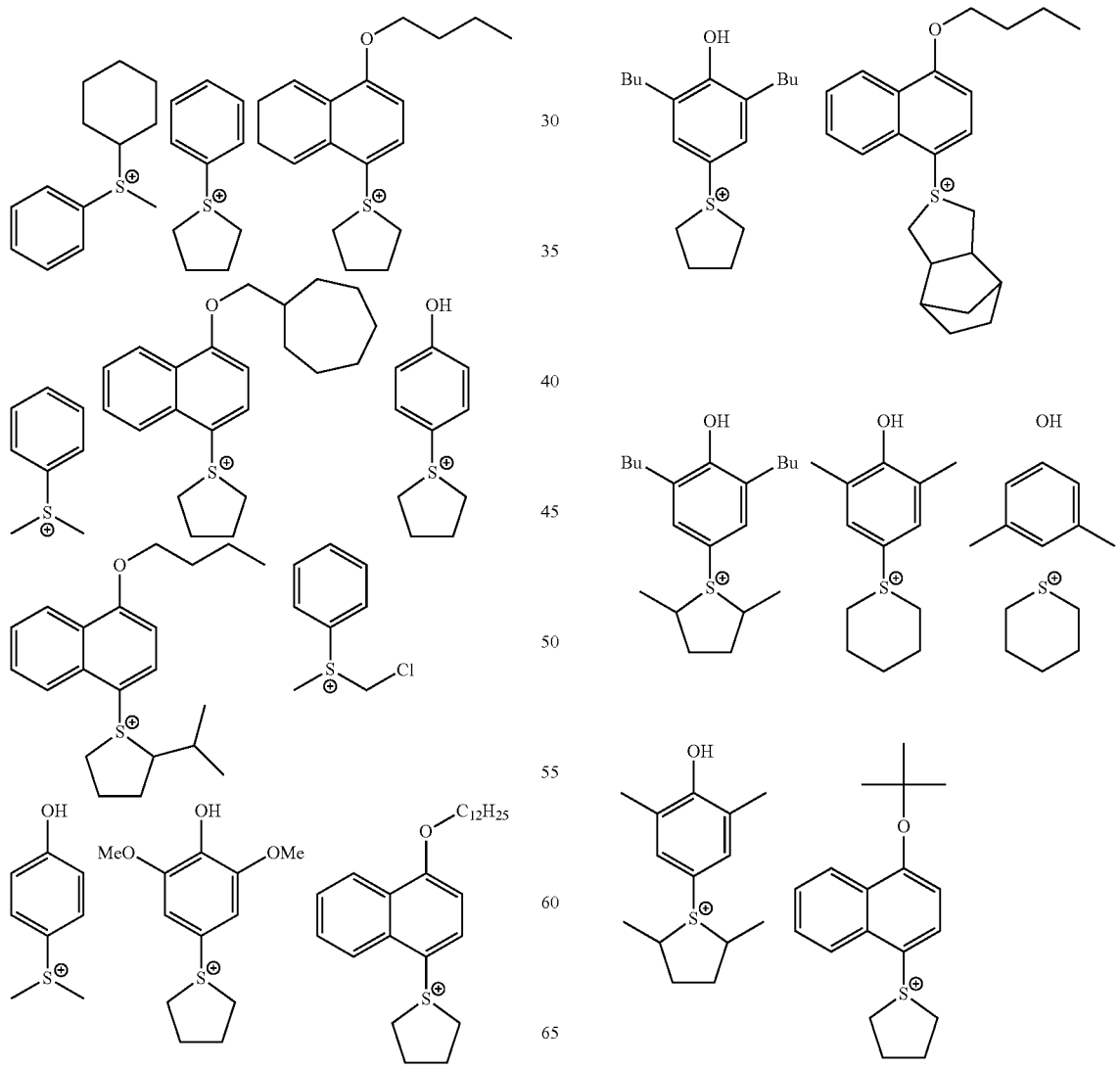

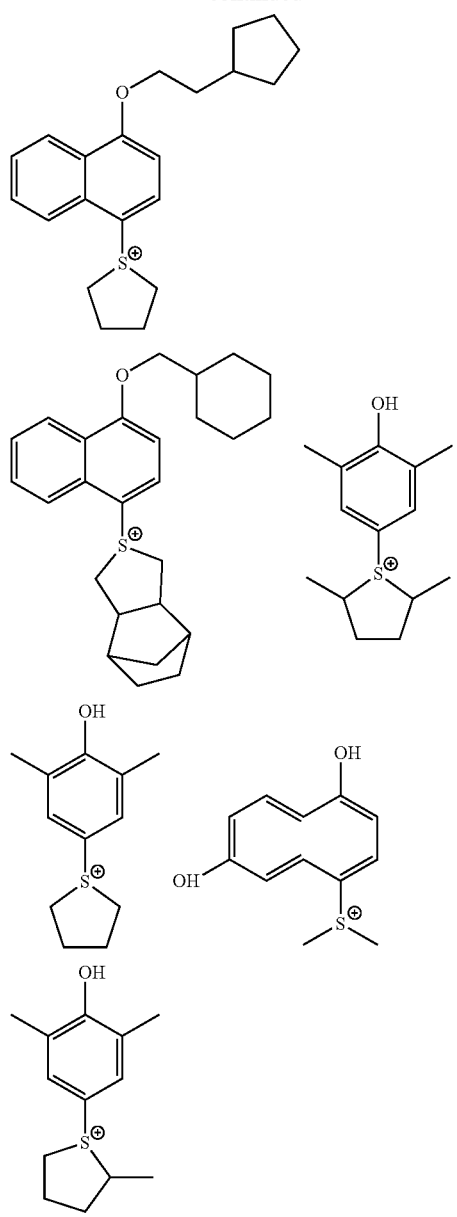
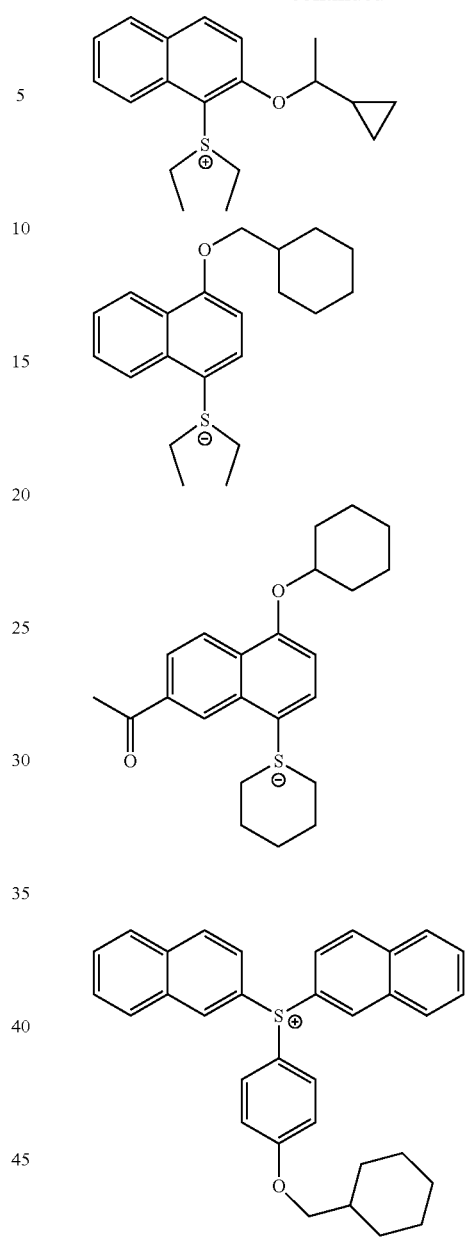
[Chem. 43]
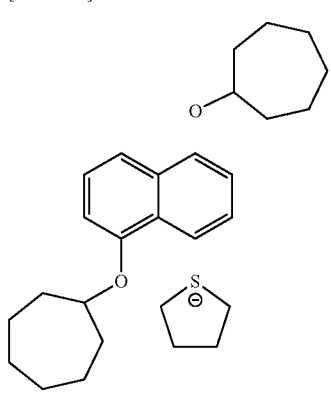
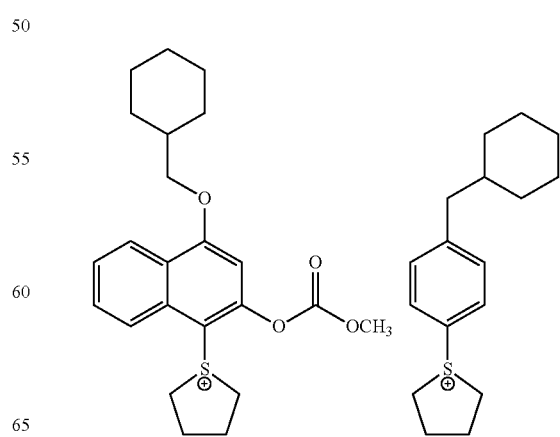

93
94
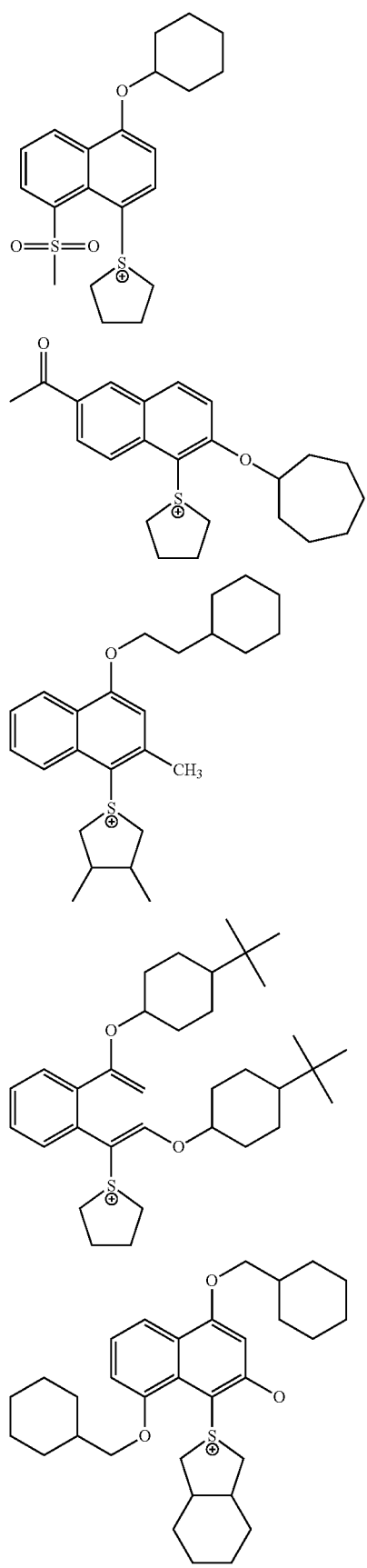
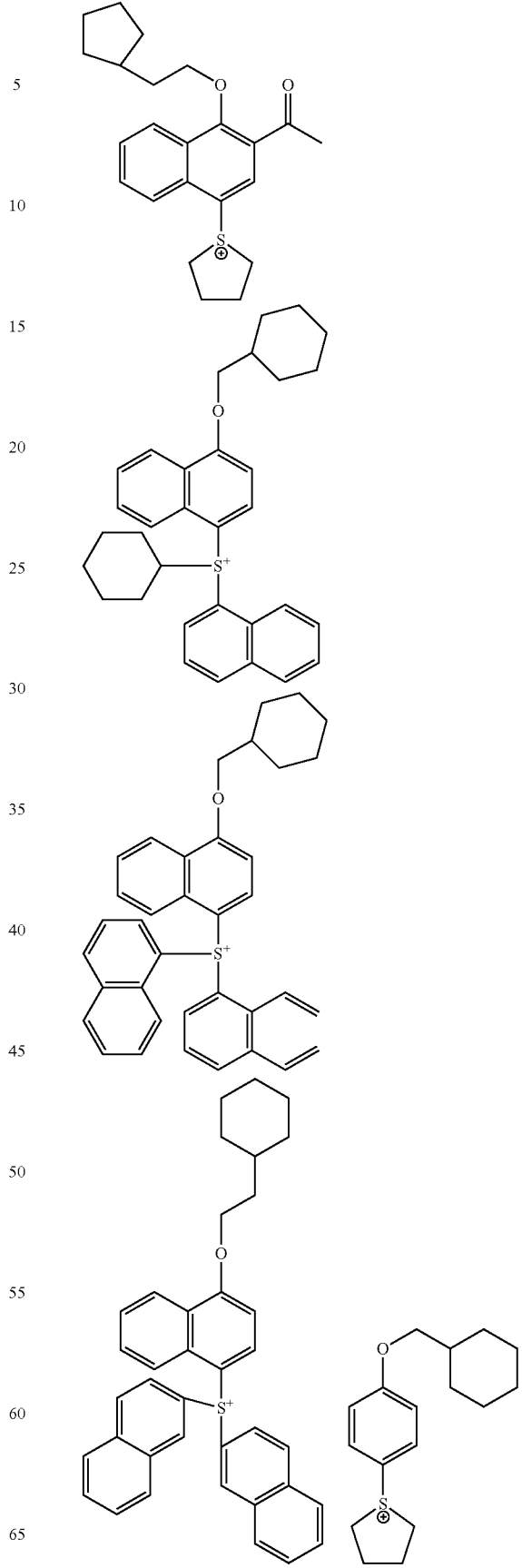

-continued

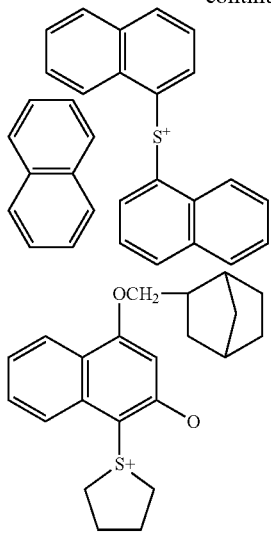

Next, the general formulae (ZII) and (ZIII) will be described.

In the general formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom or the like. Examples of the skeleton of the aryl group having a heterocyclic structure include pyrrole, furan, thiophene, indole, benzofuran, and benzothiophene.

Preferred examples of the alkyl group and the cycloalkyl group in $R_{204}$ to $R_{207}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, or a norbonyl group).

The aryl group, the alkyl group, and the cycloalkyl group of $R_{204}$ to $R_{207}$ may have a substituent. Examples of the substituent that the aryl group, the alkyl group, and the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents a non-nucleophilic anion, and examples thereof include the same non-nucleophilic anions as $Z^-$ in the general formula (ZI).

Other examples of the acid generator include compounds represented by the following general formulae (ZIV), (ZV), and (ZVI).

[Chem. 44]

$$Ar_3-SO_2-SO_2-Ar_4 \quad (ZIV)$$

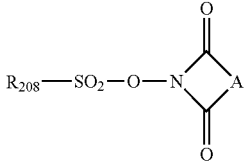

(ZV)

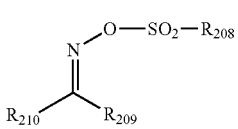

(ZVI)

In the general formulae (ZIV) to (ZVI), $Ar_3$ and $Ar_4$ each independently represent an aryl group;

$R_{208}$, $R_{209}$ and $R_{210}$ each independently represent an alkyl group, a cycloalkyl group, or an aryl group; and A represents an alkylene group, an alkenylene group, or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in the general formula (ZI-1).

Specific examples of the alkyl group and the cycloalkyl group of $R_{208}$, $R_{209}$ and $R_{210}$ are the same as specific examples of the alkyl group and the cycloalkyl group of $R_{201}$, $R_{202}$ and $R_{203}$ in the general formula (ZI-2), respectively.

Examples of the alkylene group of A include an alkylene group having 1 to 12 carbon atoms (for example, a methylene group, an ethylene group, a propylene group, an isopropylene group, a butylene group, and an isobutylene group); examples of the alkenylene group of A include an alkenylene group having 2 to 12 carbon atoms (for example, an ethenylene group, a propenylene group, and a butenylene group); and examples of the arylene group of A include an arylene group having 6 to 10 carbon atoms (for example, a phenylene group, a tolylene group, and a naphthylene group).

Among the acid generators, the compounds represented by the general formulae (ZI) to (ZIII) are more preferred.

Further, the acid generator is preferably a compound capable of generating an acid having one sulfonic acid group or imide group, more preferably a compound capable of generating a monovalent perfluoroalkanesulfonic acid, a compound capable of generating an aromatic sulfonic acid substituted with a monovalent fluorine atom or a fluorine atom-containing group, or a compound capable of generating an imide acid substituted with a monovalent fluorine atom or a fluorine atom-containing group, and still more preferably a sulfonium salt of a fluoro-substituted alkanesulfonic acid, fluorine-substituted benzenesulfonic acid, fluorine-substituted imide acid or fluorine-substituted methide acid. The acid generator which can be used is particularly preferably a compound capable of generating a fluoro-substituted alkanesulfonic acid, a fluoro-substituted benzenesulfonic acid, or a fluoro-substituted imide acid, in which pKa of the acid generated is −1 or less, and in this case, the sensitivity can be enhanced.

Particularly preferred examples of the acid generator are shown below.

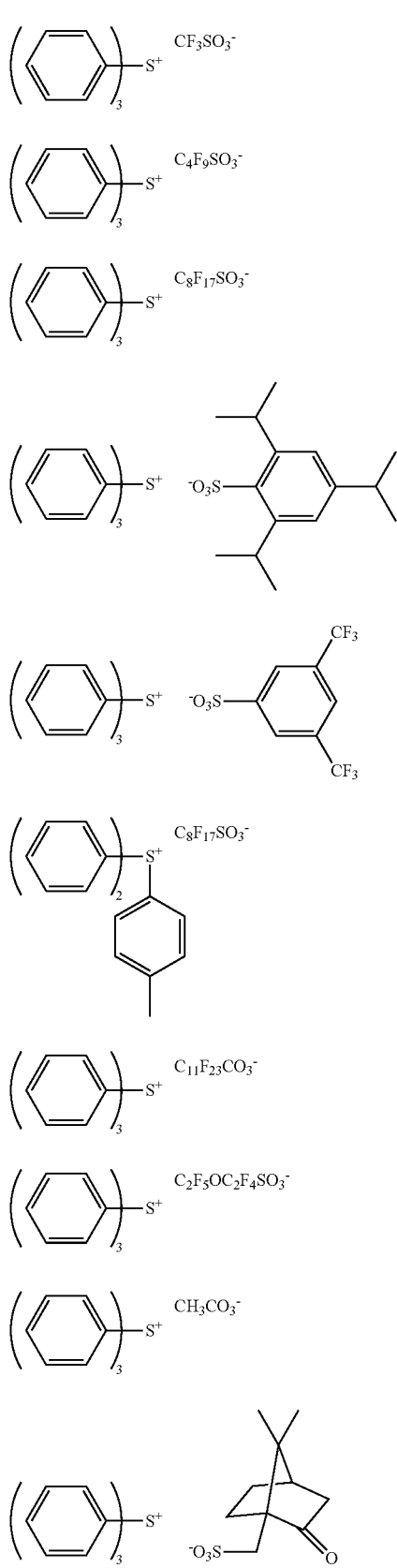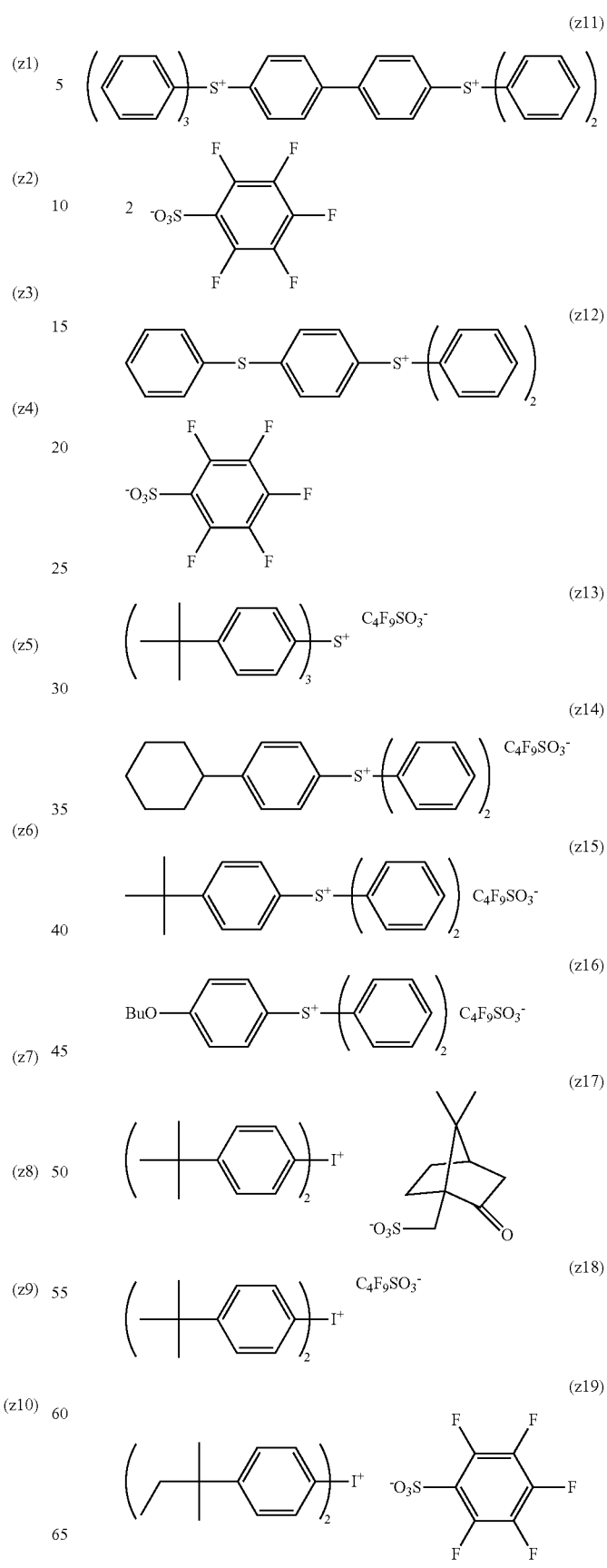

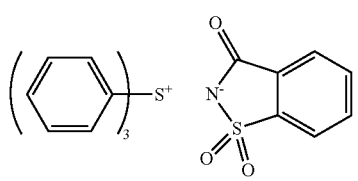 (z20)
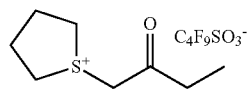 (z21)
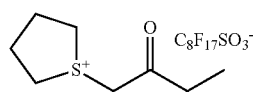 (z22)
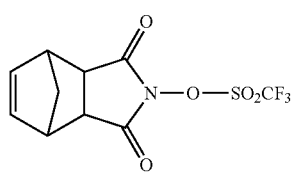 (z23)
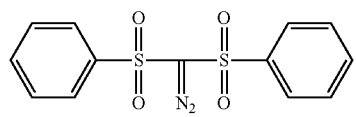 (z24)
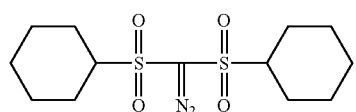 (z25)
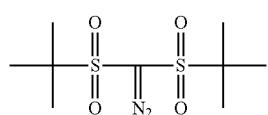 (z26)
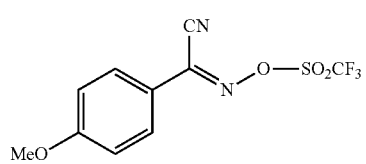 (z27)
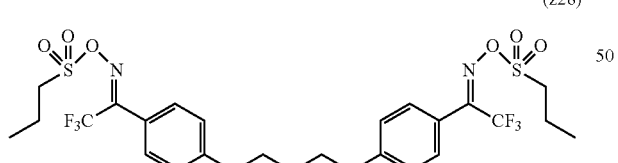 (z28)
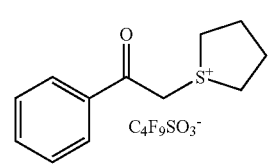 (z29)
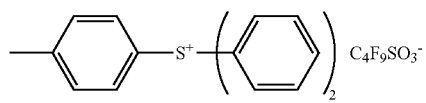 (z30)

(z39) 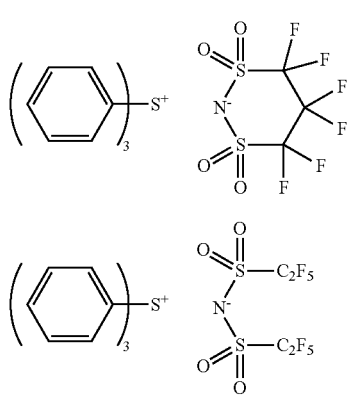
[Chem. 46]
(z40)
(z41) 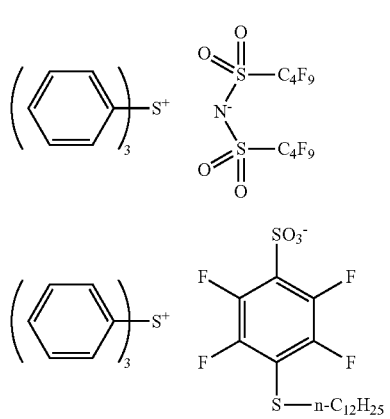
(z42)
(z43) 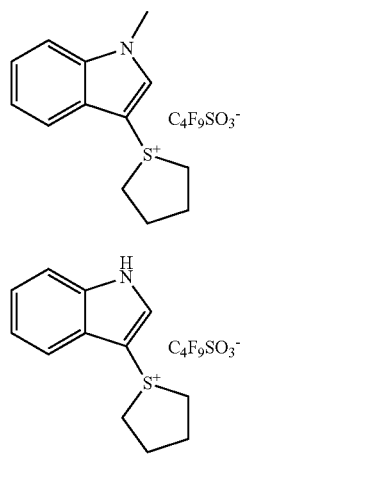
(z44)
(z45) 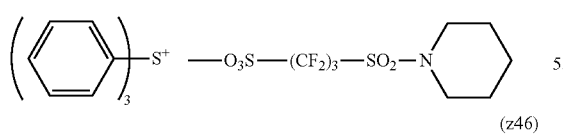
(z46) 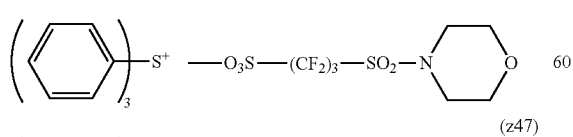
(z47) 
(z48) 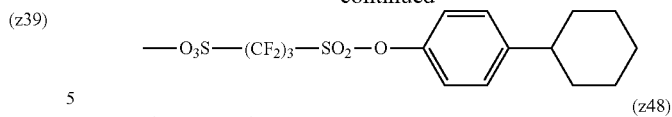
(z49) 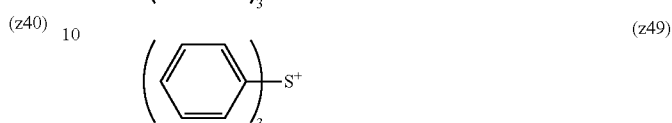
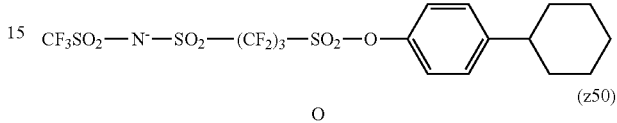
(z50) 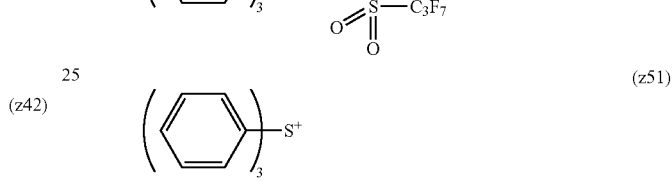
(z51) 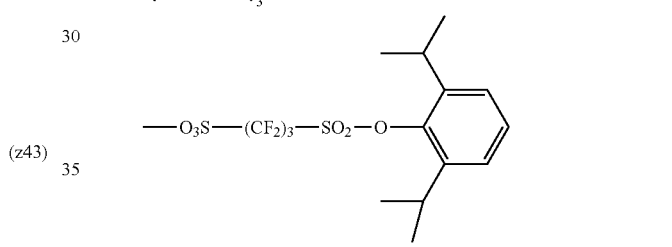
(z52) 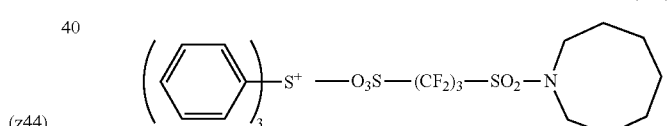
(z53) 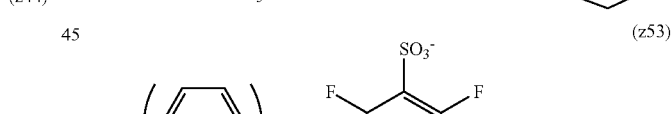
(z54) 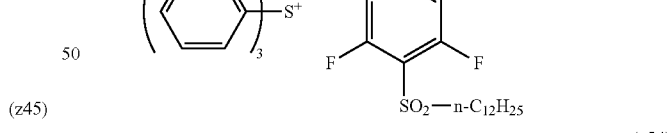
(z55) 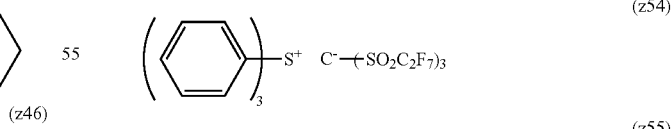
(z56) 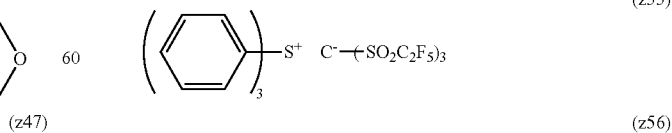

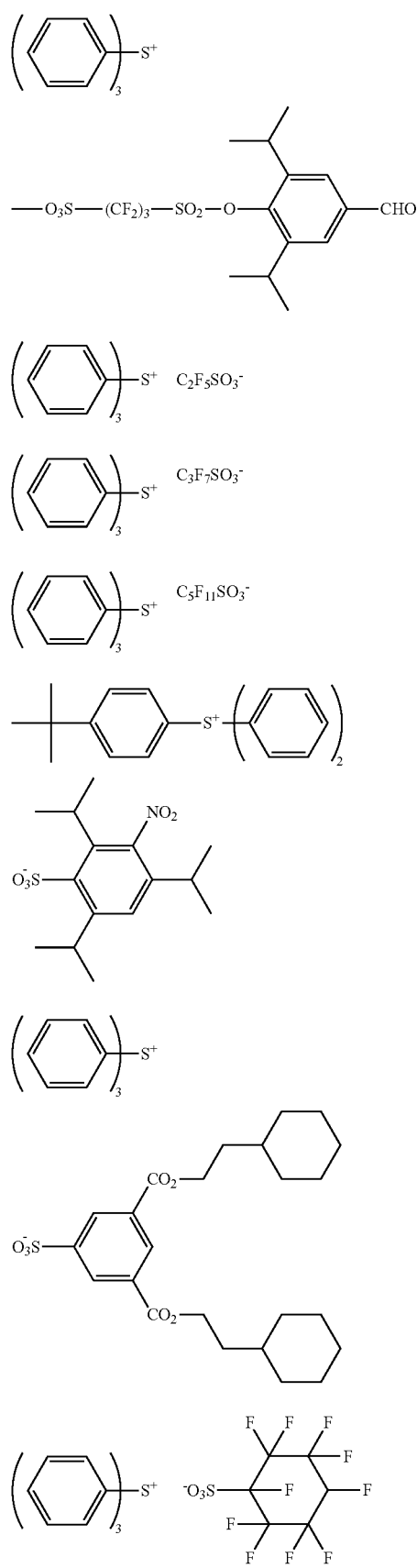
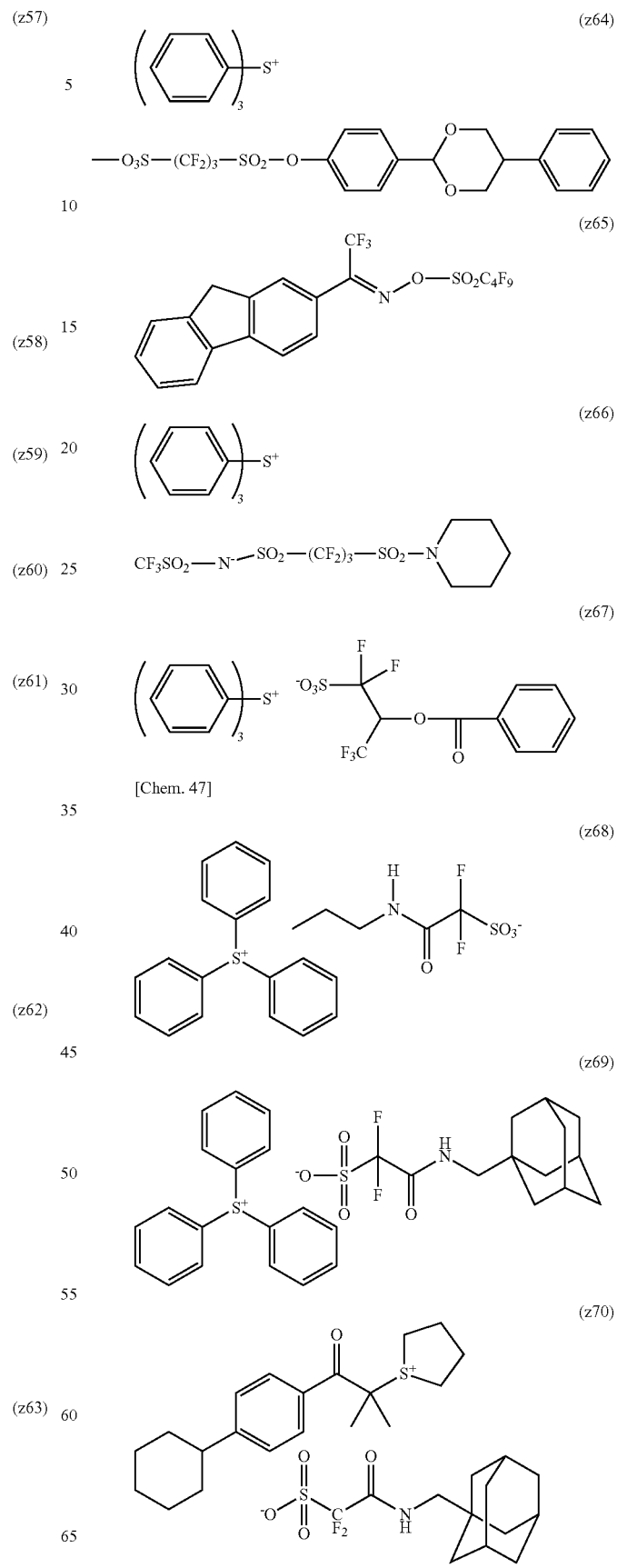

(z71) 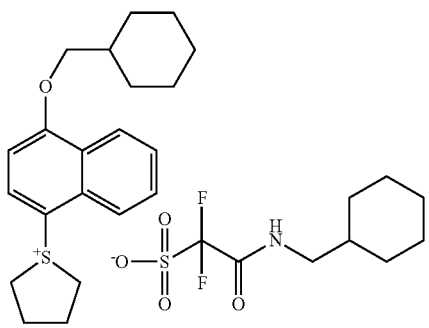
(z72) 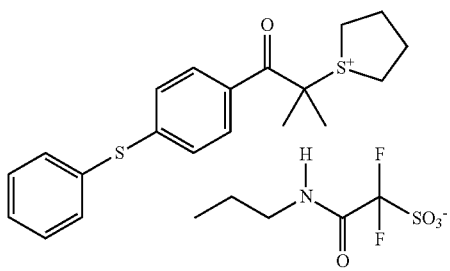
(z73) 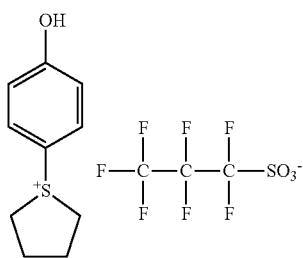
(z74) 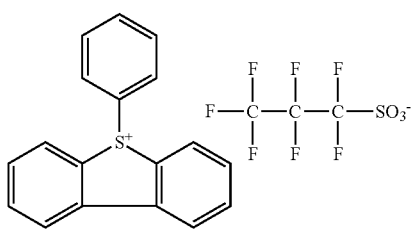
(z75)
(z76)
(z77) 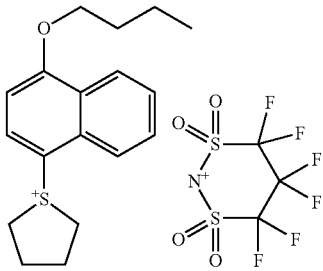
(z78) 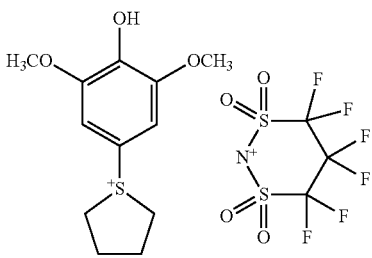
(z79) 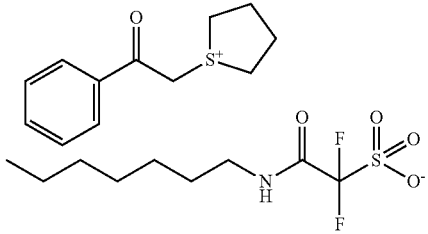
(z80) 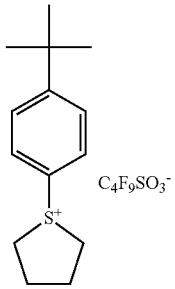
(z81) 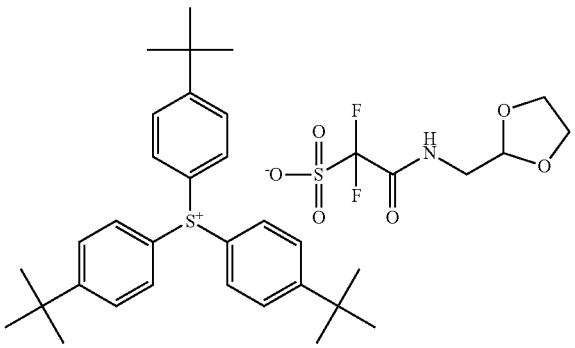

(z82) 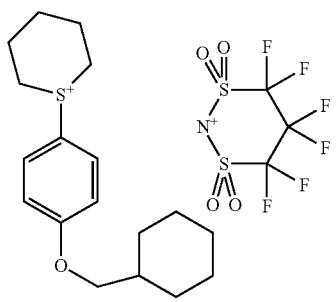
(z83) 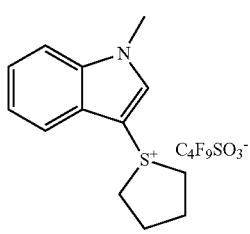
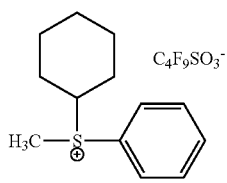
(z84) 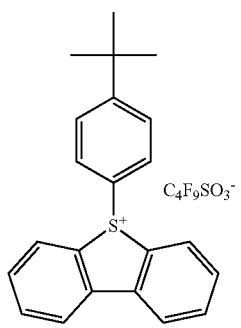
(z85) 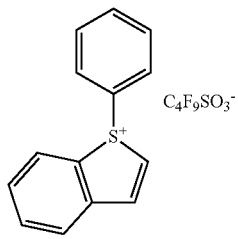
(z86) 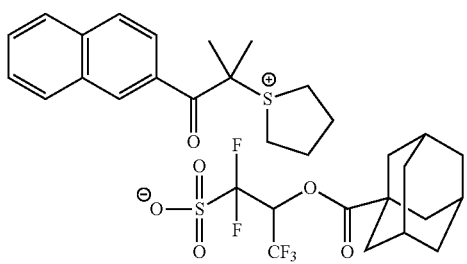
(z87)
(z88) 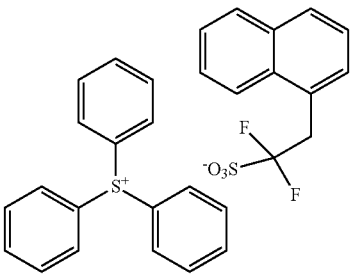
(Chem. 48)
(z89) 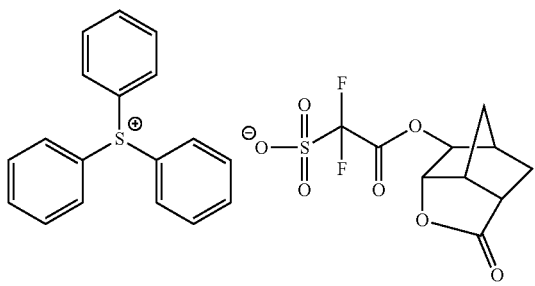
(z90) 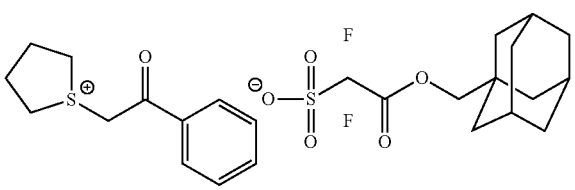
(z91) 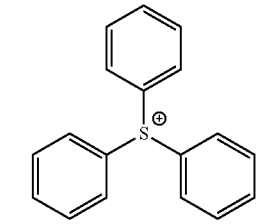
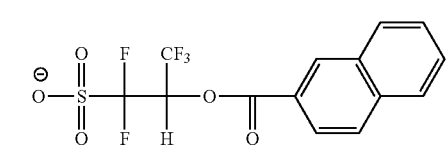
(z92) 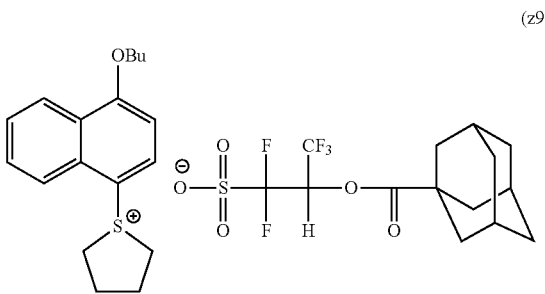

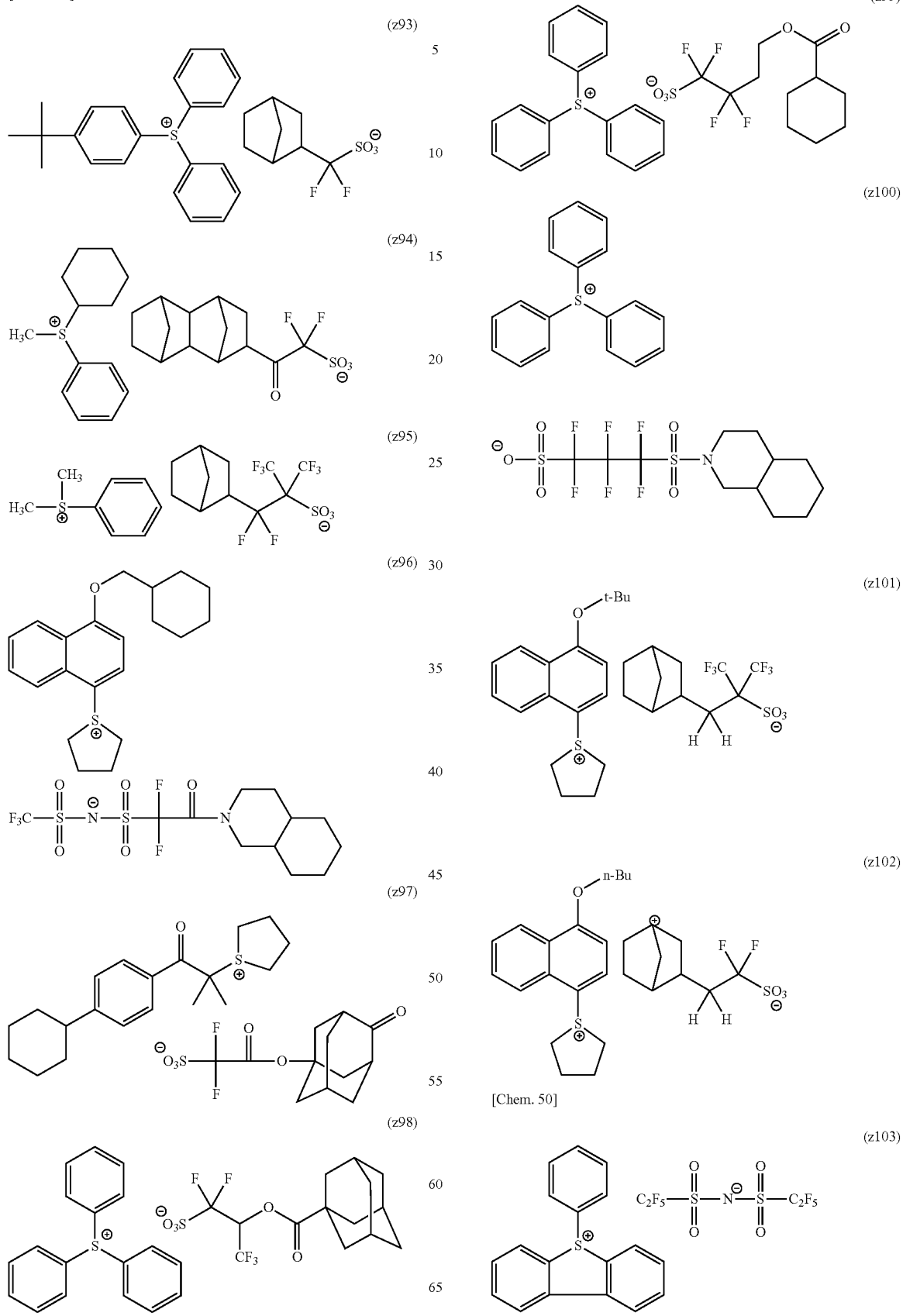

-continued
(z104)
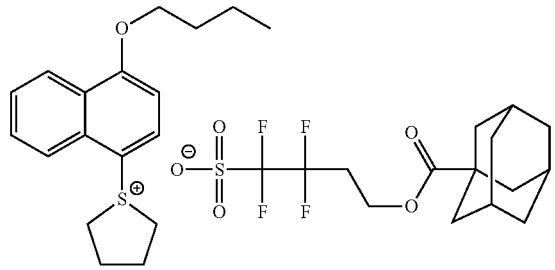
(z105)
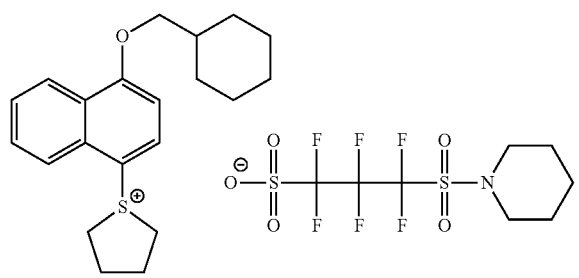
(z106)
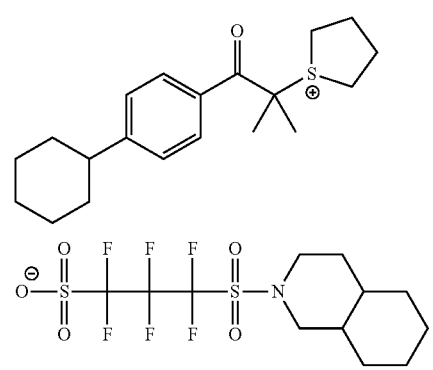
(z107)
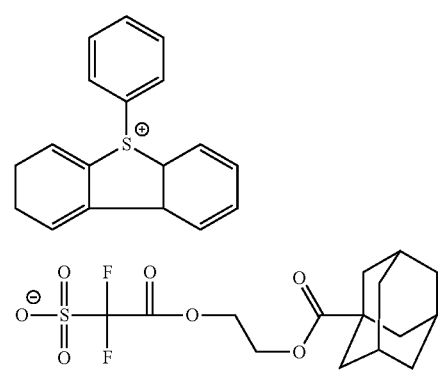
(z108)
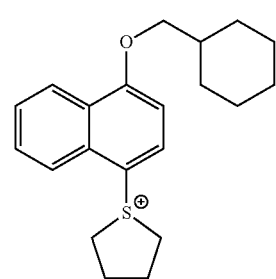
-continued
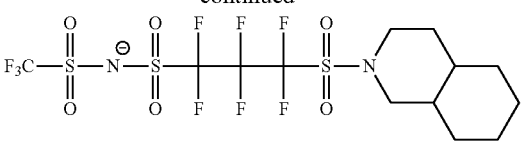
Furthermore, particularly preferred examples of the compound having an anion represented by any one of the general formulae (B-1) to (B-3) among the compounds (B) are shown below, but the invention is not limited thereto.
[Chem. 51]
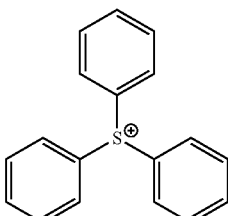
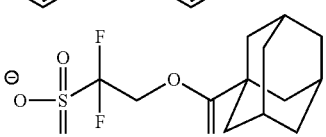
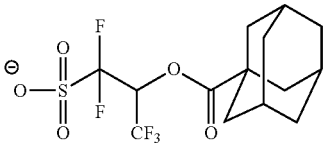
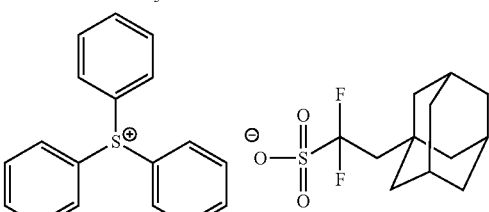
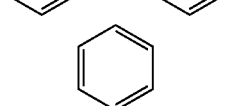
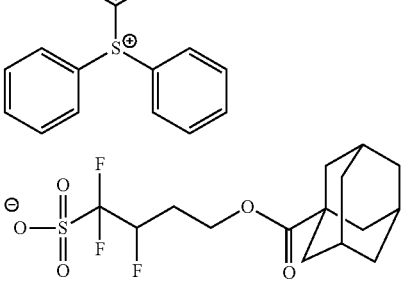

113
-continued
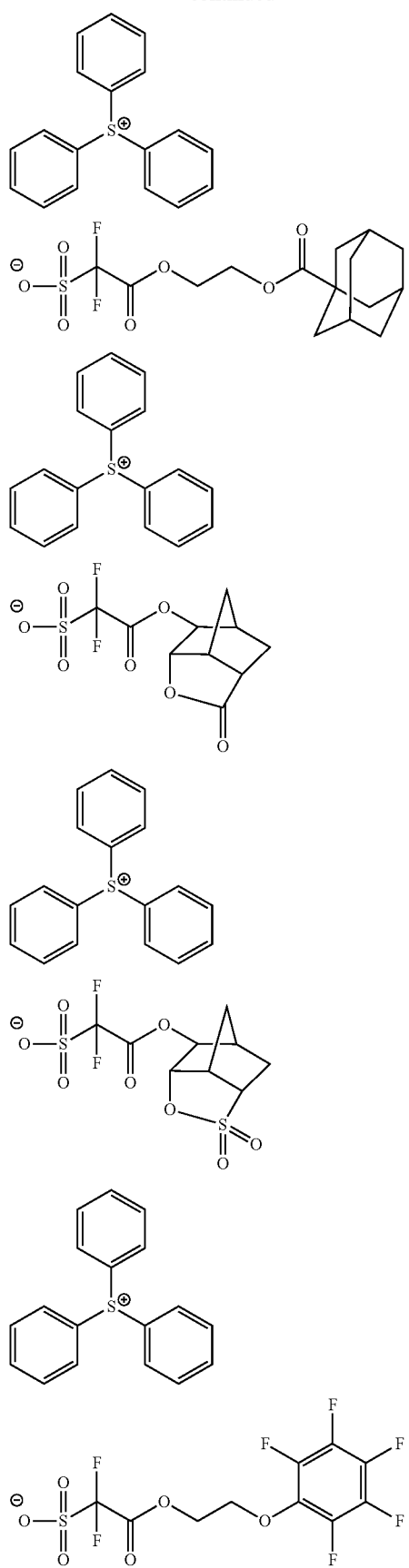
114
-continued
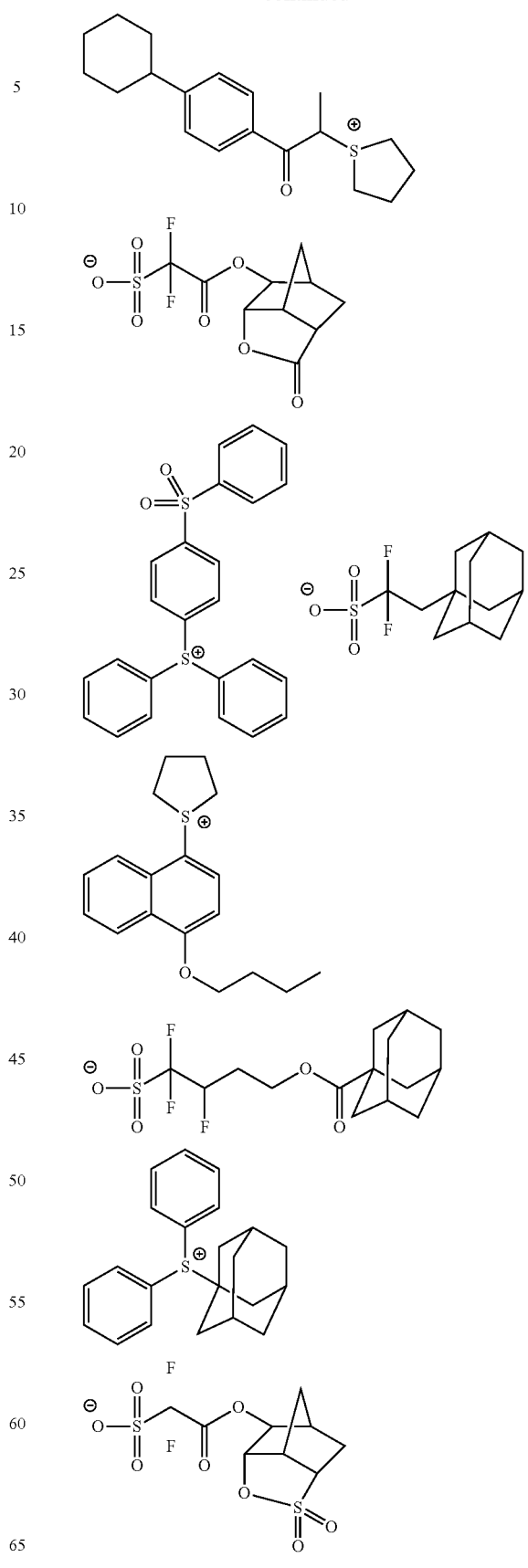

-continued

[Chem. 52]

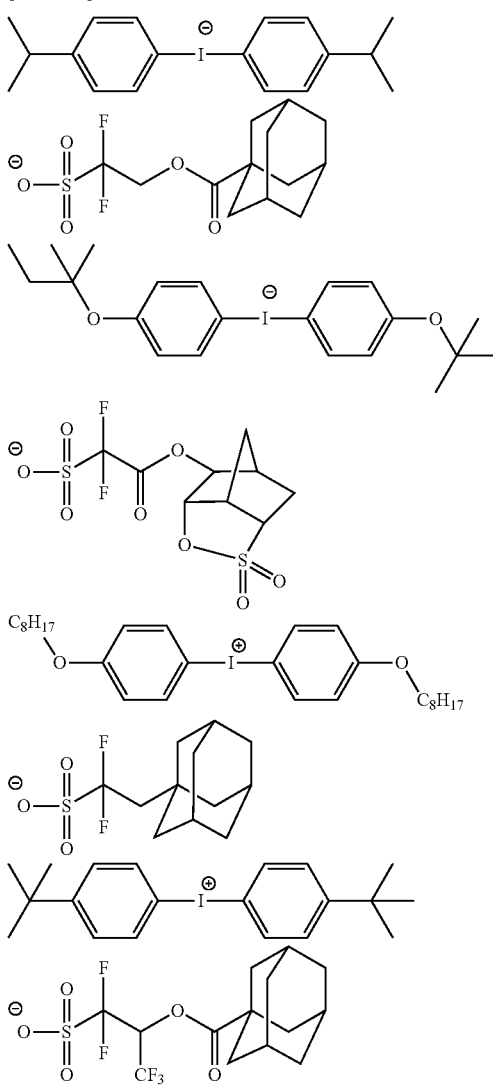

The acid generator (B) can be synthesized by a known method, and can be synthesized in accordance with the method described in, for example, JP2007-161707A, 0429 to 0210 of JP2010-100595A, 0051 to 0058 of WO2011/093280, 0382 to 0385 of WO2008/153110A, and JP2007-161707A.

The acid generators may be used singly or in combination of two or more kinds thereof.

The content of the compound capable of generating an acid by irradiation with actinic rays or radiation (excluding the case where the compound is represented by the general formula (ZI-3) or (ZI-4)) in the composition is preferably from 0.1% by mass to 30% by mass, more preferably from 0.5% by mass to 25% by mass, still more preferably from 3% by mass to 20% by mass, and particularly preferably from 3% by mass to 15% by mass, based on the total solid contents of the actinic ray-sensitive or radiation-sensitive resin composition.

Furthermore, in the case where the acid generator is represented by the general formula (ZI-3) or (ZI-4), the content thereof is preferably from 5% by mass to 35% by mass, more preferably from 6% by mass to 30% by mass, still more preferably from 6% by mass to 30% by mass, and particularly preferably from 6% by mass to 25% by mass, based on the total solid contents of the composition.

[3] (C) Solvent

The actinic ray-sensitive or radiation-sensitive resin composition of the invention may contain a solvent (C).

Examples of the solvent which can be used at the time of producing the actinic ray-sensitive or radiation-sensitive resin composition include an organic solvent such as alkylene glycol monoalkyl ether carboxylate, alkylene glycol monoalkyl ether, alkyl lactate, alkyl alkoxypropionate, cyclic lactone (preferably having 4 to 10 carbon atoms), monoketone compound (preferably having 4 to 10 carbon atoms) which may contain a ring, alkylene carbonate, alkyl alkoxyacetate, and alkyl pyruvate.

Specific examples of these solvents are the same as those described in paragraphs 0441 to 0455 of US Patent App. No. 2008/0187860.

In the invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably for example, an alkylene glycol monoalkyl ether or an alkyl lactate, more preferably propylene glycol monomethyl ether (PGME, an alternative name, 1-methoxy-2-propanol), or ethyl lactate. Further, the solvent not containing a hydroxyl group is preferably for example, an alkylene glycol monoalkyl ether acetate, an alkyl alkoxypropionate, a monoketone compound which may contain a ring, a cyclic lactone or an alkyl acetate, more preferably propylene glycol monomethyl ether acetate (PGME, alternative name, 1-methoxy-2-acetopropnae), ethyl ethoxypropionate, 2-heptanone, γ-butyrolactone, cyclohexanone, or butyl acetate, and most preferably propylene glycol monomethyl ether acetate, ethyl ethoxypropionate, or 2-heptanone.

The mixing ratio (by mass) of the solvent containing a hydroxyl group to the solvent not containing a hydroxyl group is from 1/99 to 99/1, preferably from 10/90 to 90/10, and more preferably from 20/80 to 60/40. A mixed solvent in which the solvent not containing a hydroxyl group is contained in an amount of 50% by mass or more is particularly preferred in view of coating uniformity.

The solvent is preferably a solvent containing propylene glycol monomethyl ether acetate, and more preferably a solvent of propylene glycol monomethyl ether acetate alone or a mixed solvent of two or more kinds, containing propylene glycol monomethyl ether acetate.

[4] Hydrophobic Resin (D)

The actinic ray-sensitive or radiation-sensitive resin composition in the invention may contain a hydrophobic resin (hereinafter also referred to as a "hydrophobic resin (D)" or simply a "resin (D)"), particularly when the composition is applied to immersion exposure (preferably, the hydrophobic resin (D) is not equivalent to the resin (A)).

By this, the hydrophobic resin (D) is unevenly distributed on the surface layer of the film and in the case where the immersion medium is water, the static/dynamic contact angle on the resist film surface for water as well as the followability of liquid for liquid immersion can be enhanced.

The hydrophobic resin (D) is, as described above, unevenly distributed to the interface but unlike a surfactant, does not have necessarily a hydrophilic group in the molecule and may not contribute to uniform mixing of polar/nonpolar substances.

The hydrophobic resin (D) preferably has any one or more, more preferably two or more, of a "fluorine atom", a "silicon atom", and a "CH$_3$ partial structure in the side chain of the resin" from the viewpoint of uneven distribution on the surface layer of the film.

In the case where the hydrophobic resin (D) contains a fluorine atom and/or a silicon atom, in the hydrophobic resin (D), the fluorine atom and/or silicon atom may be contained in a main chain or a side chain of the resin.

In the case where the hydrophobic resin (D) contains a fluorine atom, the resin is preferably a resin containing, as the fluorine atom-containing partial structure, a fluorine atom-containing alkyl group, a fluorine atom-containing cycloalkyl group or a fluorine atom-containing aryl group.

The fluorine atom-containing alkyl group (preferably having 1 to 10 carbon atoms, and more preferably having 1 to 4 carbon atoms) is a linear or branched alkyl group with at least one hydrogen atom being substituted by a fluorine atom. The fluorine atom-containing alkyl group may further have a substituent other than a fluorine atom.

The fluorine atom-containing cycloalkyl group is a monocyclic or polycyclic cycloalkyl group with at least one hydrogen atom being substituted by a fluorine atom. This fluorine atom-containing cycloalkyl group may further have a substituent other than a fluorine atom.

The fluorine atom-containing aryl group is an aryl group with at least one hydrogen atom of aryl groups such as a phenyl group and a naphthyl group being substituted by a fluorine atom. The fluorine atom-containing aryl group may further have a substituent other than a fluorine atom.

Preferred examples of the fluorine atom-containing alkyl group, the fluorine atom-containing cycloalkyl group, and the fluorine atom-containing aryl group include groups represented by the following general formulae (F2) to (F4), but the invention is not limited thereto.

[Chem. 53]

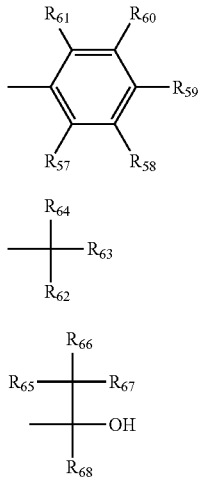

In the general formulae (F2) to (F4),
R$_{57}$ to R$_{68}$ each independently represent a hydrogen atom, a fluorine atom, or an (linear or branched) alkyl group, provided that at least one of R$_{57}$ to R$_{61}$, at least one of R$_{62}$ to R$_{64}$, and at least one of R$_{65}$ to R$_{68}$ represent a fluorine atom or an alkyl group (preferably 1 to 4 carbon atoms) with at least one hydrogen atom substituted with a fluorine atom.

It is preferable that all of R$_{57}$ to R$_{61}$ and R$_{65}$ to R$_{67}$ be fluorine atoms. R$_{62}$, R$_{63}$ and R$_{68}$ are each preferably a alkyl group (preferably having 1 to 4 carbon atoms) with at least one hydrogen atom substituted with a fluorine atom, and more preferably a perfluoroalkyl group having 1 to 4 carbon atoms. R$_{62}$ and R$_{63}$ may be connected to each other to form a ring.

Specific examples of the group represented by the general formula (F2) include a p-fluorophenyl group, a pentafluorophenyl group, and a 3,5-di(trifluoromethyl)phenyl group.

Specific examples of the group represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group, with a hexafluoroisopropyl group, a heptafluoroisopropyl group, a hexafluoro(2-methyl) isopropyl group, an octafluoroisobutyl group, a nonafluoro-t-butyl group, and a perfluoroisopentyl group being preferred, and a hexafluoroisopropyl group and a heptafluoroisopropyl group being more preferred.

Specific examples of the group represented by the general formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferred.

The fluorine atom-containing partial structure may be bonded directly to a main chain or may be bonded to a main chain through a group selected from the group consisting of an alkylene group, a phenylene group, an ether bond, a thioether bond, a carbonyl group, an ester bond, an amide bond, a urethane bond and a ureylene bond, or through a group formed by the combination of two or more thereof.

Specific examples of the repeating units having a fluorine atom are shown below, but the invention is not limited thereto.

In the specific examples, X$_1$ represents a hydrogen atom, —CH$_3$, —F, or —CF$_3$. X$_2$ represents —F or —CF$_3$.

[Chem. 54]

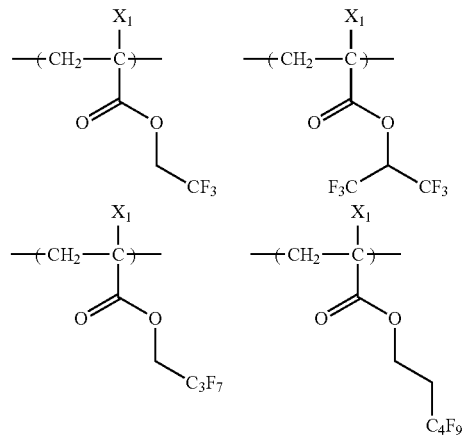

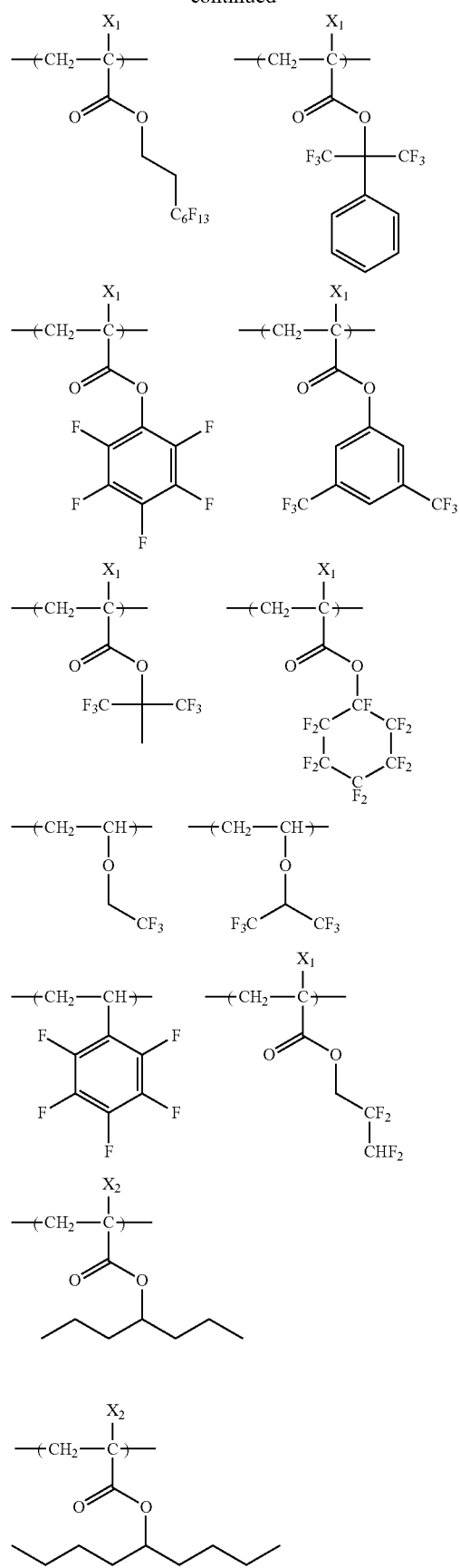
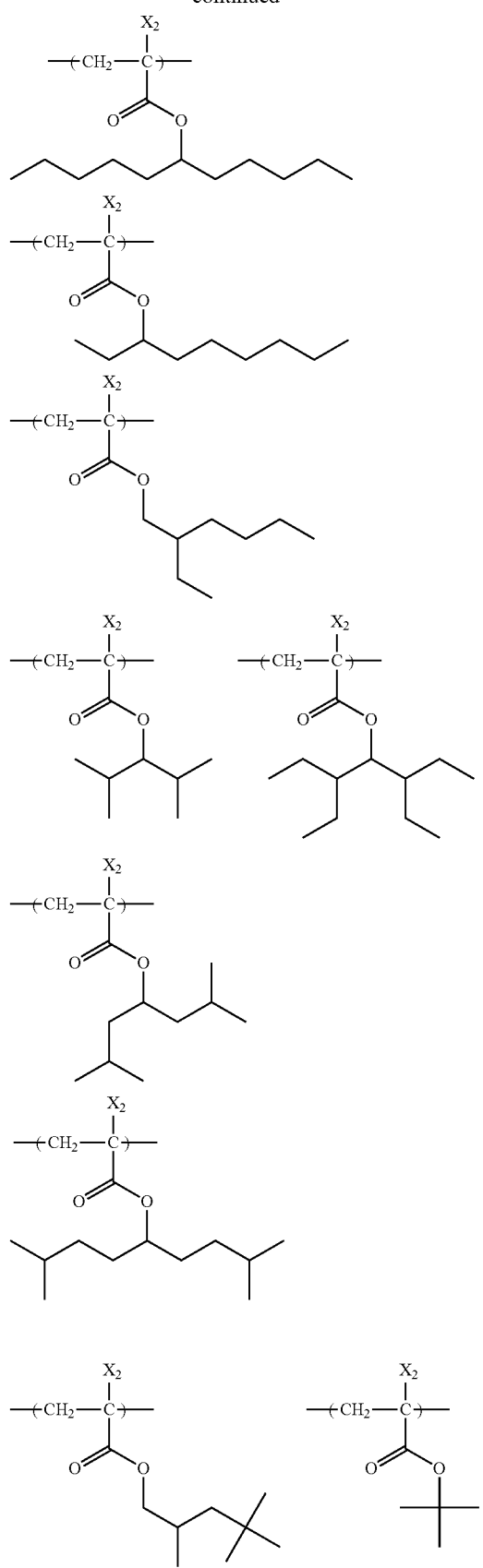

-continued

[Chem. 55]

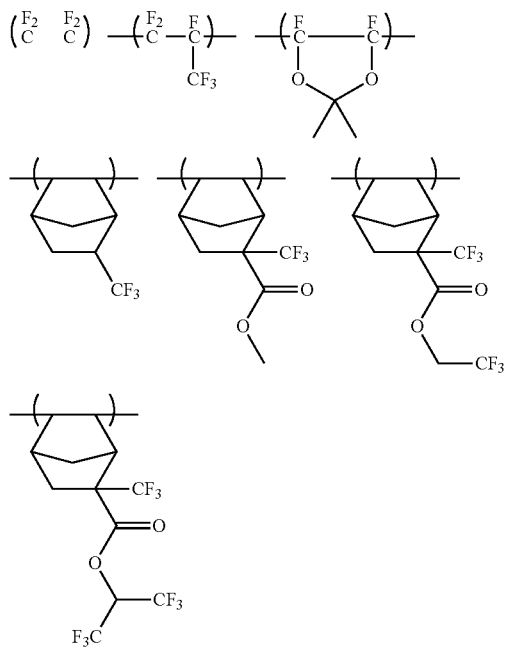

The hydrophobic resin (D) may contain a silicon atom. It is preferably a resin having an alkylsilyl structure (preferably a trialkylsilyl group) or a cyclosiloxane structure as a partial structure having a silicon atom.

Specific examples of the alkylsilyl structure or cyclosiloxane structure include groups represented by the following formulae (CS-1) to (CS-3).

[Chem. 56]

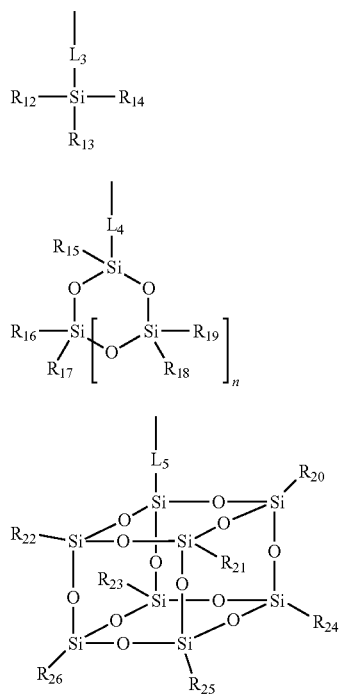

In the general formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms);

$L_3$ to $L_5$ each represent a single bond or a divalent linking group, and the divalent linking group is a single group or a combination of two or more groups (preferably having a total number of carbon atoms of 12 or less) selected from the group consisting of an alkylene group, a phenylene group, an ether bond, a thioether bond, a carbonyl group, an ester bond, an amide bond, a urethane bond, and a urea bond; and n represents an integer of 1 to 5, and is preferably an integer of 2 to 4.

Specific examples of the repeating unit having the groups represented by the following formulae (CS-1) to (CS-3) are shown below, but the invention is not limited thereto. Further, in the specific examples, $X_1$ represents a hydrogen atom, —$CH_3$, —F, or —$CF_3$.

[Chem. 57]

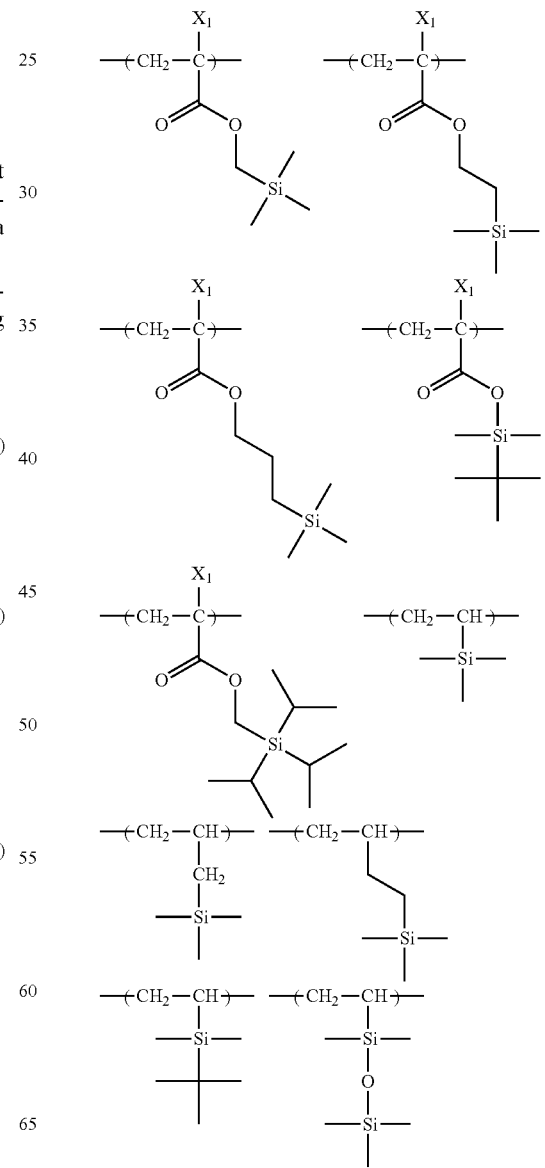

-continued

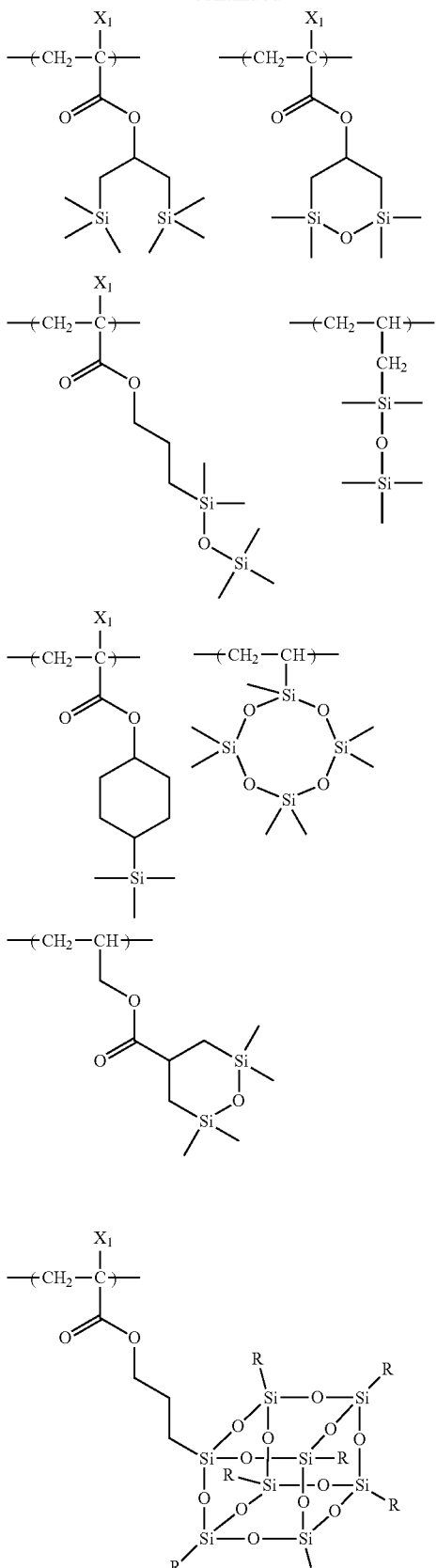

R = CH$_3$, C$_2$H$_5$, C$_3$H$_7$, C$_4$H$_9$

-continued

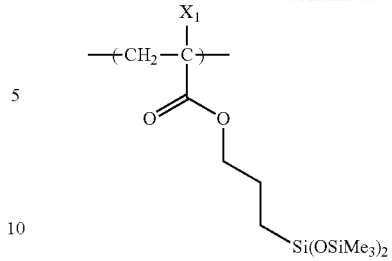

Furthermore, as described above, the hydrophobic resin (D) preferably includes a CH$_3$ partial structure in the side chain.

Here, the CH$_3$ partial structure (which may also be hereinafter simply referred to as a "side chain CH$_3$ partial structure") contained in the side chain in the resin (D) includes a CH$_3$ partial structure contained in an ethyl group, a propyl group, or the like.

On the other hand, since a methyl group (for example, an α-methyl group of a repeating unit having a methacrylic acid structure) directly bonded to a main chain of the resin (D) makes little contribution on uneven distribution on the surface of the resin (D) by the effect of the main chain, the methyl group is not included in the CH$_3$ partial structure in the invention.

More specifically, in the case where the resin (D) includes, for example, a repeating unit derived from a monomer having a polymerizable moiety having a carbon-carbon double bond, such as a repeating unit represented by the following general formula (M), and in the case where R$_{11}$ to R$_{14}$ are "itself" CH$_3$, the CH$_3$ is not included in the CH$_3$ partial structure contained in the side chain moiety in the invention.

On the other hand, a CH$_3$ partial structure present through a certain atom from the C—C main chain corresponds to the CH$_3$ partial structure in the invention. For example, in the case where R$_{11}$ is an ethyl group (CH$_2$CH$_3$), it is assumed that the resin has "one" CH$_3$ partial structure in the invention.

[Chem. 58]

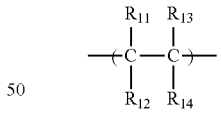

(M)

In the general formula (M),

R$_{11}$ to R$_{14}$ each independently represent a side chain moiety.

Examples of R$_{11}$ to R$_{14}$ in the side chain moiety include a hydrogen atom and a monovalent organic group.

Examples of the monovalent organic group with respect to R$_{11}$ to R$_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin (D) is preferably a resin having a repeating unit containing a CH$_3$ partial structure in a side chain moiety, and such a repeating unit more preferably has at least one repeating unit (x) of a repeating unit represented by the following general formula (II) and a repeating unit represented by the following general formula (III).

The repeating unit represented by the general formula (II) will be described in detail below.

[Chem. 59]

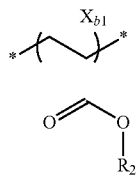
(II)

In the general formula (II), $X_{b1}$ represents a hydrogen atom, an alkyl group, a cyano group, or a halogen atom, and $R_2$ represents an organic group which has one or more $CH_3$ partial structures and is stable against an acid. Here, the organic group which is stable against an acid is more specifically preferably an organic group which has no "group capable of decomposing by the action of an acid to generate a polar group" in the resin (A).

The alkyl group of $X_{b1}$ preferably has 1 to 4 carbon atoms, and examples thereof include a methyl group, an ethyl group, a propyl group, a hydroxymethyl group, and a trifluoromethyl group, with a methyl group being preferred.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. The cycloalkyl group, the alkenyl group, the cycloalkenyl group, the aryl group, and the aralkyl group may further have an alkyl group as a substituent.

$R_2$ is preferably an alkyl group or an alkyl-substituted cycloalkyl group, which has one or more $CH_3$ partial structure.

The organic group having one or more $CH_3$ partial structures, which is stable against an acid, as $R_2$, preferably has 2 to 10 $CH_3$ partial structures, and more preferably 2 to 8 $CH_3$ partial structures.

In $R_2$, the alkyl group having one or more $CH_3$ partial structures is preferably a branched alkyl group having 3 to 20 carbon atoms. Specific preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, 1,5-dimethyl-3-heptyl group, and a 2,3,5,7-tetramethyl-4-heptyl group, more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group.

In $R_2$, the cycloalkyl group having one or more $CH_3$ partial structures may be monocyclic or polycyclic. Specific examples thereof include groups having monocyclic, bicyclic, tricyclic, and tetracyclic structures having 5 or more carbon atoms. The number of carbon atoms is preferably from 6 to 30, and particularly preferably from 7 to 25.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group, more preferably an adamantyl group, a norbornyl group, a cyclohexyl group, a cyclopentyl group, a tetracyclododecanyl group, and a tricyclodecanyl group, and still more preferably a norbornyl group, a cyclopentyl group, and a cyclohexyl group.

In $R_2$, the alkenyl group having one or more $CH_3$ partial structures is preferably a linear or branched alkenyl group having 1 to 20 carbon atoms, and more preferably a branched alkenyl group.

In $R_2$, the aryl group having one or more $CH_3$ partial structures is preferably an aryl group having 6 to 20 carbon atoms, and examples thereof include a phenyl group and a naphthyl group, and preferably a phenyl group.

In $R_2$, the aralkyl group having one or more $CH_3$ partial structures is preferably an aralkyl group having 7 to 12 carbon atoms, and examples thereof include a benzyl group, a phenethyl group, and a naphthylmethyl group.

In $R_2$, specific examples of the hydrocarbon group having 2 or more $CH_3$ partial structures include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, 1,5-dimethyl-3-heptyl group, a 2,3,5,7-tetramethyl-4-heptyl group, a 3,5-dimethylcyclohexyl group, 4-isopropylcyclohexyl group, 4-t-butylcyclohexyl group, and an isobornyl group, more preferably an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, 1,5-dimethyl-3-heptyl group, a 2,3,5,7-tetramethyl-4-heptyl group, a 3,5-dimethylcyclohexyl group, a 3,5-di-tert-butylcyclohexyl group, a 4-isopropylcyclohexyl group, a 4-t-butylcyclohexyl group, and an isobornyl group.

Preferred specific examples of the repeating unit represented by the general formula (II) are shown below, but the invention is not limited thereto.

[Chem. 60]

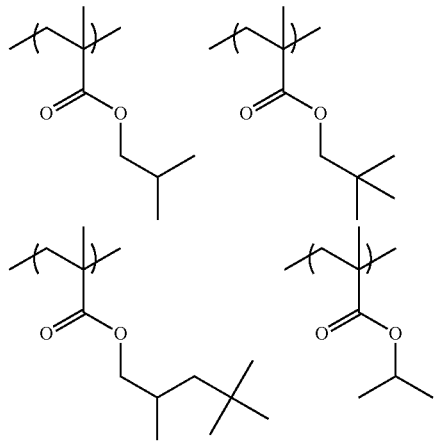

127
-continued
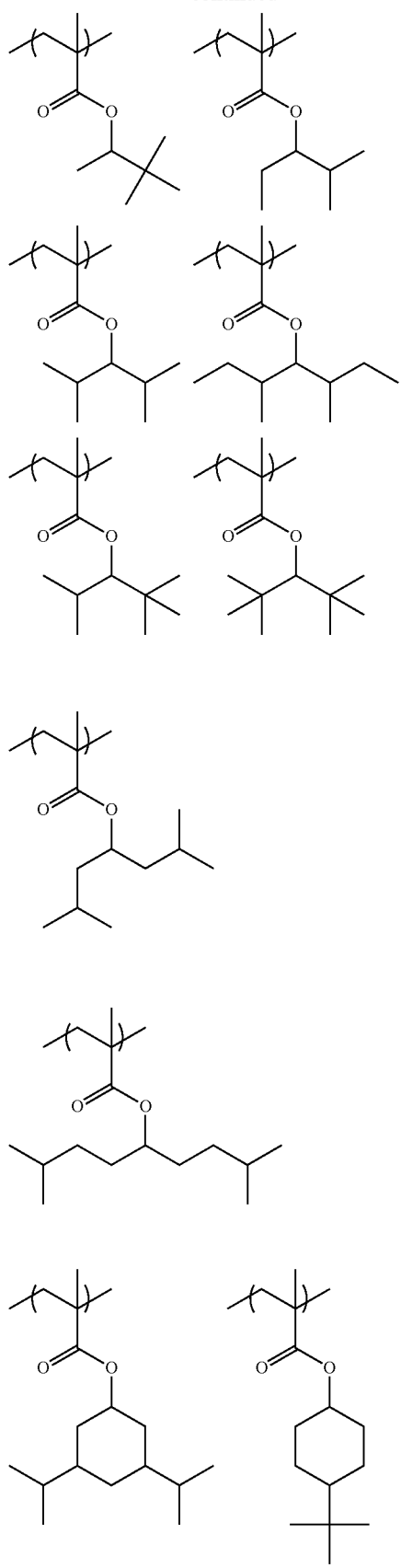
128
-continued
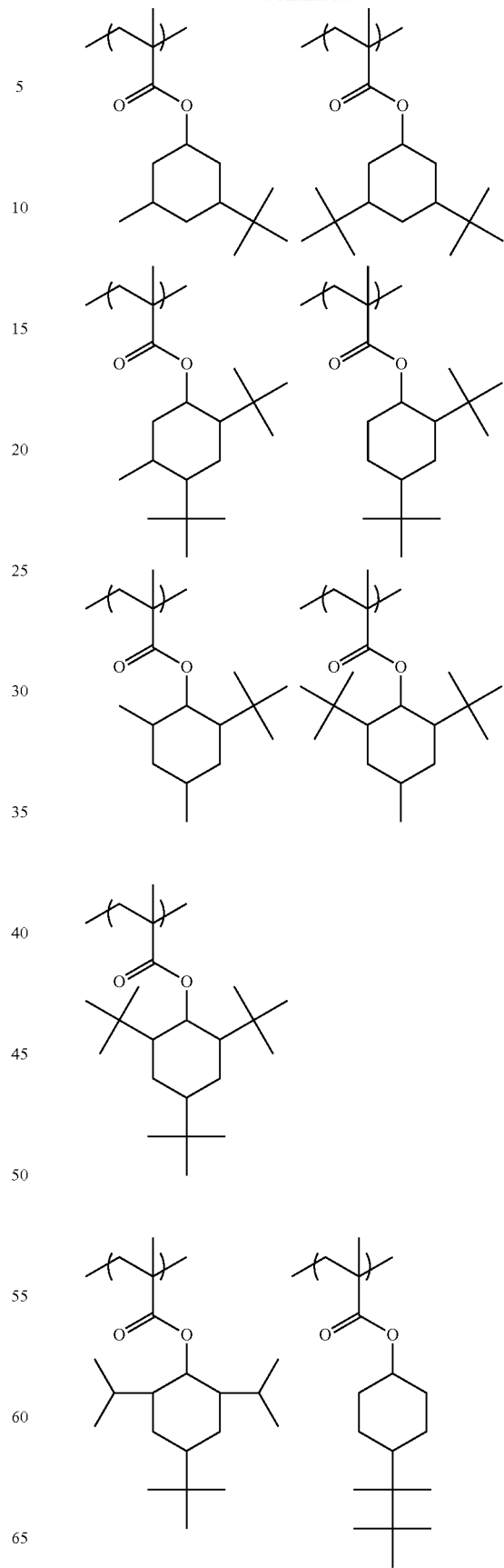

-continued

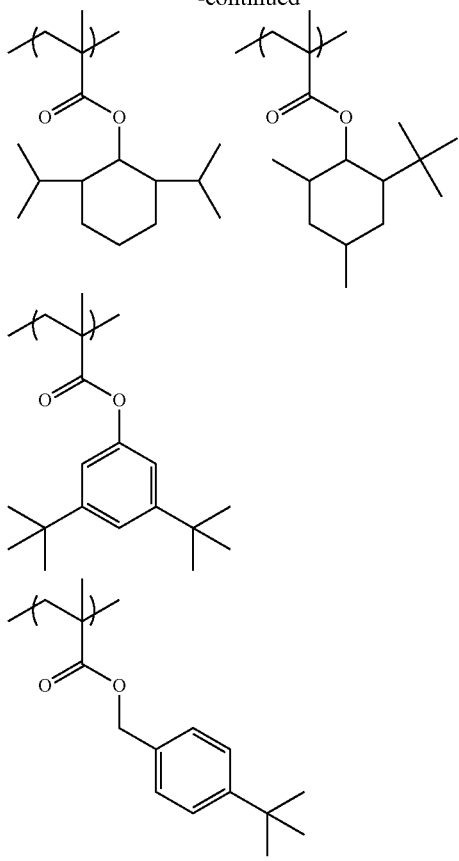

The repeating unit represented by the general formula (II) is preferably stable against an acid (non-acid-decomposable), and specifically, it preferably has no group capable of decomposing by the action of an acid to generate polar groups.

The repeating unit represented by the general formula (III) will be described in detail below.

[Chem. 61]

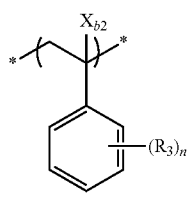

(III)

In the general formula (III), $X_{b2}$ represents a hydrogen atom, an alkyl group, a cyano group, or a halogen atom, and $R_3$ represents an organic group which has one or more $CH_3$ partial structures and is stable against an acid. n represents an integer of 1 to 5.

The alkyl group of $X_{b2}$ preferably has 1 to 4 carbon atoms, and examples thereof include a methyl group, an ethyl group, a propyl group, a hydroxymethyl group, and a trifluoromethyl group, with a hydrogen atom being preferred.

$X_{b2}$ is preferably a hydrogen atom.

$R_3$ is an organic group which is stable against an acid, more specifically preferably an organic group which has no "group capable of decomposing by the action of an acid to generate a polar group" described in the resin (A) above.

Examples of $R_3$ include an alkyl group having one or more $CH_3$ partial structures.

The organic group having one or more $CH_3$ partial structures, which is stable against an acid, as $R_3$, preferably has 1 to 10 $CH_3$ partial structures, more preferably 1 to 8 $CH_3$ partial structures, and still more preferably 1 to 4 $CH_3$ partial structures.

In $R_3$, the alkyl group having 3 to 20 carbon atoms, which has one or more $CH_3$ partial structures, is preferably a branched alkyl group. Specific preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group, and more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, 1,5-dimethyl-3-heptyl group, and a 2,3,5,7-tetramethyl-4-heptyl group.

In $R_3$, specific examples of the alkyl group having two or more $CH_3$ partial structures include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethyl pentyl group, a 2-ethylhexyl group, a 2,6-dimethylheptyl group, 1,5-dimethyl-3-heptyl group, and a 2,3,5,7-tetramethyl-4-heptyl group, and more preferably ones having 5 to 20 carbon atoms, and examples thereof include an isopropyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, 1,5-dimethyl-3-heptyl group, a 2,3,5,7-tetramethyl-4-heptyl group, and a 2,6-dimethyl heptyl group.

n is an integer of 1 to 5, preferably an integer of 1 to 3, and more preferably 1 or 2.

Preferred specific examples of the repeating unit represented by the general formula (III) are shown below, but the invention is not limited thereto.

[Chem. 62]

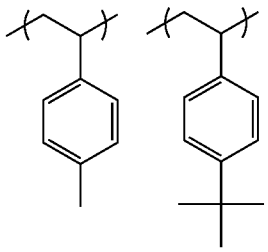

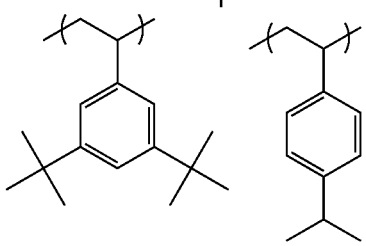

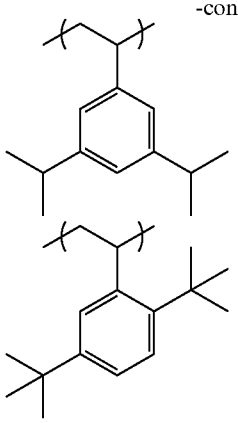

The repeating unit represented by the general formula (III) is preferably stable against an acid (non-acid-decomposable), and specifically, it preferably has no group capable of decomposing by the action of an acid to generate polar groups.

In the case where the resin (D) includes a $CH_3$ partial structure in a side chain moiety, and particularly, it has neither fluorine atom nor silicon atom, the content of at least one repeating unit (x) of the repeating unit represented by the general formula (II) and the repeating unit represented by the general formula (III) is preferably 90% by mole or more, and more preferably 95% by mole or more, based on all the repeating units of the resin (C). The content is usually 100% by mole or less, based on all the repeating units of the resin (C).

When the resin (D) contains 90% by mole or more of at least one repeating unit (x) of the repeating unit represented by the general formula (II) and the repeating unit represented by the general formula (III), based on all the repeating units of the resin (D), the surface freedom energy of the resin (C) increases. As a result, the resin (D) is hardly unevenly distributed on the surface layer of the resist film, and thus, the static/dynamic contact angle on the resist film for water as well as the followability of liquid for liquid immersion can be enhanced.

Furthermore, in (i) the case where the hydrophobic resin (D) contains a fluorine atom and/or a silicon atom as well as (ii) the case where the hydrophobic resin (D) contains a $CH_3$ partial structure in a side chain moiety, the resin may have at least one group selected from a group consisting of the following (x) to (z):
 (x) an acid group,
 (y) a group having a lactone structure, an acid anhydride group, or an acid imide group, and
 (z) a group capable of decomposing by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred examples of the acid group include a fluorinated alcohol group (preferably a hexafluoroisopropanol group), a sulfonimide group, and a bis(alkylcarbonyl)methylene group.

Examples of the repeating unit having the acid group (x) include a repeating unit in which an acid group is directly bonded to the main chain of the resin, such as a repeating unit by an acrylic acid or a methacrylic acid, and a repeating unit in which an acid group is bonded to the main chain of the resin through a linking group. Alternatively, in this repeating unit, an acid group is preferably introduced into the terminal of the polymer chain by using a polymerization initiator having an acid group or a chain transfer agent during the polymerization. Any of these cases are preferred. The repeating unit having the acid group (x) may have at least any one of a fluorine atom and a silicon atom.

The content of the repeating unit having the acid group (x) is preferably from 1 to 50% by mole, more preferably from 3 to 35% by mole, and still more preferably from 5 to 20% by mole, based on all the repeating units in the hydrophobic resin (D).

Specific examples of the repeating unit having the acid group (x) are shown below, but the invention is not limited thereto. In the formulae, Rx represents a hydrogen atom, $CH_3$, $CF_3$, or $CH_2OH$.

[Chem. 63]

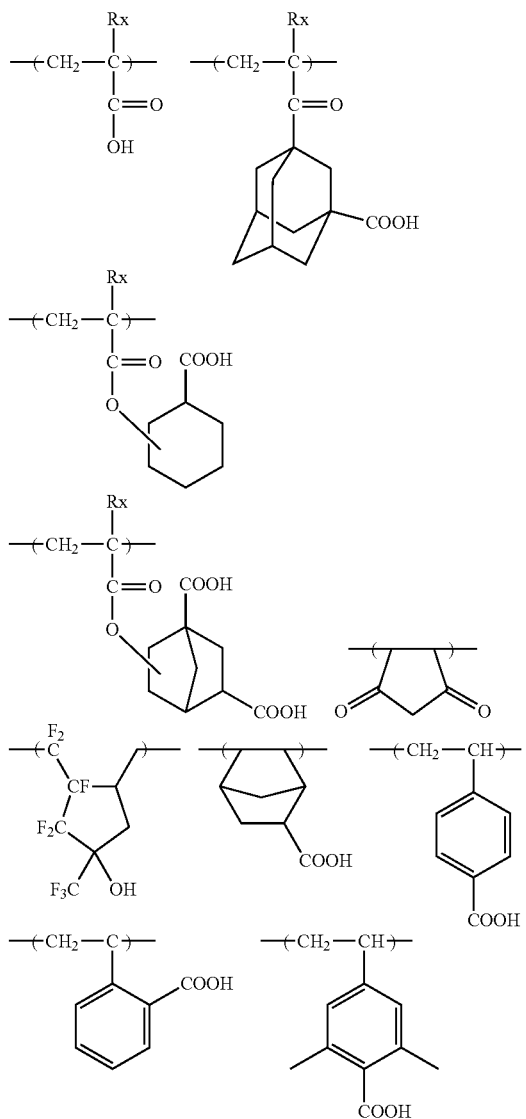

133
-continued
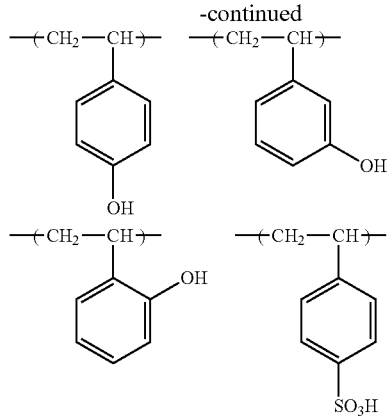
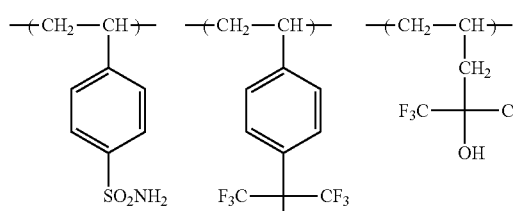
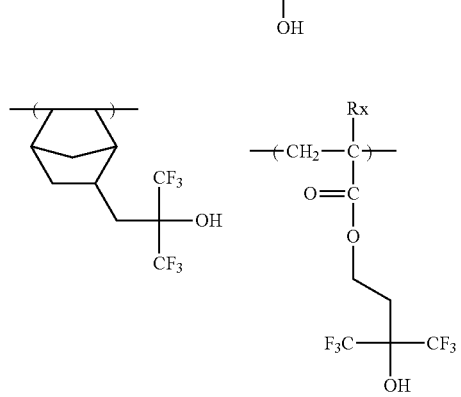
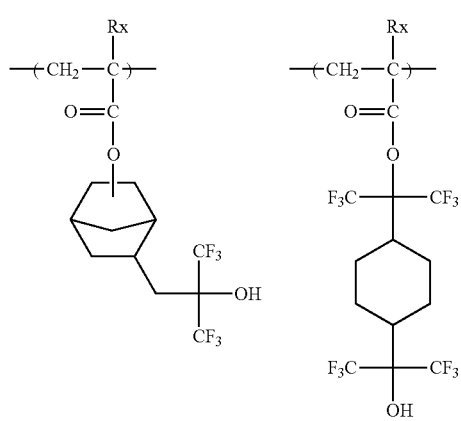
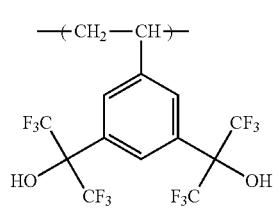
134
-continued
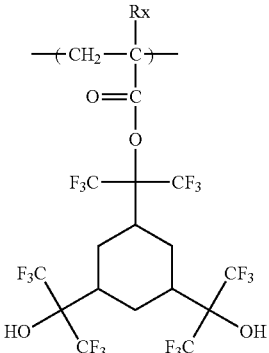
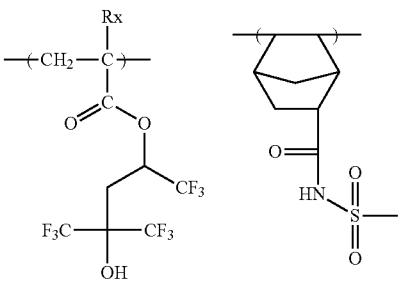
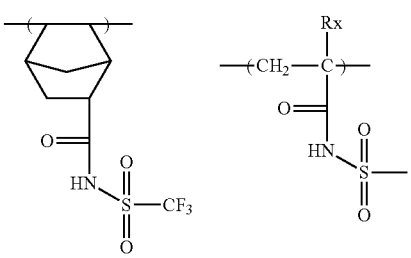
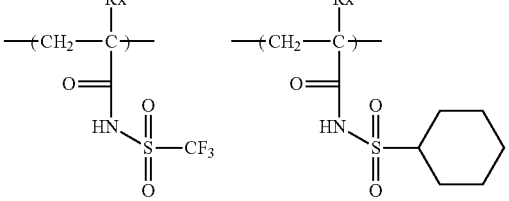
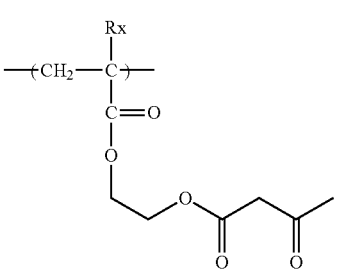

[Chem. 64]

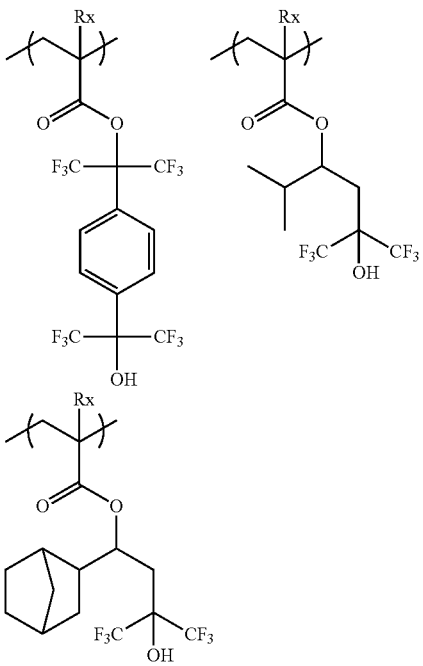

The group having a lactone structure, the acid anhydride group, or the acid imide group (y) is particularly preferably one having a lactone structure.

The repeating unit having such a group is a repeating unit in which the group is directly bonded to the main chain of the resin, such as a repeating unit by an acrylic ester or a methacrylic ester. This repeating unit may also be a repeating unit in which the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a group having a lactone structure are the same repeating units as those having a lactone structure described above in the paragraph concerning the acid-decomposable resin (A).

The content of the repeating unit having the group having a lactone structure, the acid anhydride group, or the acid imide group is preferably from 1 to 100% by mole, more preferably from 3 to 98% by mole, and still more preferably from 5 to 95% by mole, based on all the repeating units in the hydrophobic resin (D).

In the hydrophobic resin (D), examples of the repeating unit having a group (z) capable of decomposing by the action of an acid include those described above for the repeating unit having an acid-decomposable group in the resin (A). The repeating unit having a group (z) capable of decomposing by the action of an acid may have at least any one of a fluorine atom and a silicon atom. In the hydrophobic resin (D), the content of the repeating unit having a group (z) capable of decomposing by the action of an acid is preferably from 1 to 80% by mole, more preferably from 10 to 80% by mole, and still more preferably from 20 to 60% by mole, based on all the repeating units in the resin (D).

The hydrophobic resin (D) may further contain a repeating unit represented by the following general formula (III).

[Chem. 65]

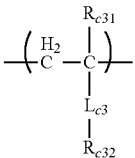

(III)

In the general formula (III),
$R_{c31}$ represents a hydrogen atom, an alkyl group (which may be substituted with a fluorine atom or the like), a cyano group or a —$CH_2$—O—$R_{ac2}$ group, in which $R_{ac2}$ represents a hydrogen atom, an alkyl group, or an acyl group, and $R_{c31}$ is preferably a hydrogen atom, a methyl group, a hydroxymethyl group, or a trifluoromethyl group, and particularly preferably a hydrogen atom or a methyl group;

$R_{c32}$ represents a group containing an alkyl group, a cycloalkyl group, an alkenyl group, a cycloalkenyl group, or an aryl group, each of which may be substituted with a group containing a fluorine atom or a silicon atom; and $L_{c3}$ represents a single bond or a divalent linking group.

In the general formula (III), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group or a naphthyl group, which may have a substituent.

$R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating unit represented by the general formula (III) is preferably from 1 to 100% by mole, more preferably from 10 to 90% by mole, and still more preferably from 30 to 70% by mole, based on all the repeating units in the hydrophobic resin.

The hydrophobic resin (D) preferably further contains a repeating unit represented by the following general formula (CII-AB).

[Chem. 66]

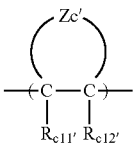

(CII-AB)

In the formula (CII-AB),
$R_{c11}'$ and $R_{c12}'$ each independently represent a hydrogen atom, a cyano group, a halogen atom, or an alkyl group; and $Z_c{}'$ represents an atomic group for forming an alicyclic structure containing two carbon atoms (C—C) to which $Z_c{}'$ is bonded.

The content of the repeating unit represented by the following general formula (CII-AB) is preferably from 1 to 100% by mole, more preferably from 10 to 90% by mole, and still more preferably from 30 to 70% by mole, based on all the repeating units in the hydrophobic resin.

Specific examples of the repeating units represented by the general formulae (III) and (CII-AB) are shown below, but the invention is not limited thereto. In the formulae, Ra represents H, $CH_3$, $CH_2OH$, $CF_3$, or CN.

[Chem. 67]

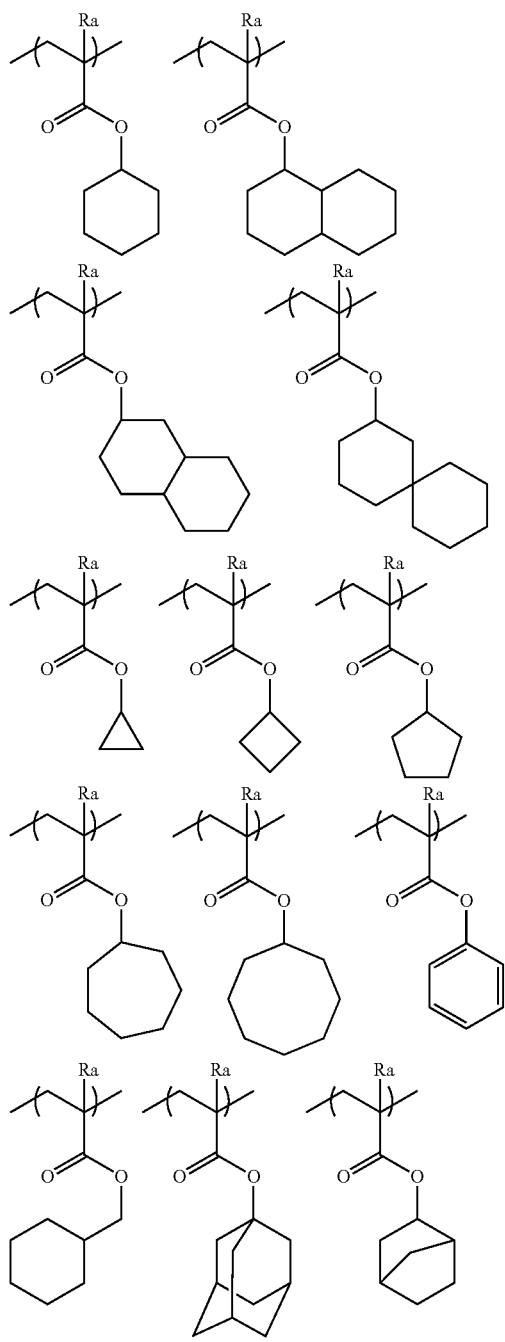

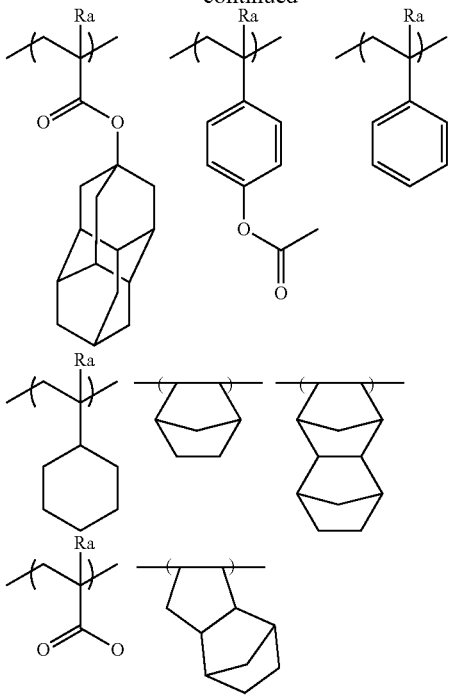

-continued

In the case where the hydrophobic resin (D) contains fluorine atoms, the content of the fluorine atoms is preferably from 5% by mass to 80% by mass, and more preferably from 10% by mass to 80% by mass, based on the weight average molecular weight of the hydrophobic resin (D). Further, the fluorine atom-containing repeating unit preferably occupies from 10% by mass to 100% by mole, and more preferably from 30% by mass to 100% by mole, based on all the repeating units contained in the hydrophobic resin (D).

In the case where the hydrophobic resin (D) contains silicon atoms, the content of the silicon atoms is preferably from 2% by mass to 50% by mass, and more preferably from 2% by mass to 30% by mass, based on the weight average molecular weight of the hydrophobic resin (D). Further, the silicon atom-containing repeating unit preferably occupies from 10% by mass to 100% by mole, and more preferably from 20% by mass to 100% by mole, based on all the repeating units contained in the hydrophobic resin (D).

On the other hand, particularly, in the case where the resin (D) contains a $CH_3$ partial structure in the side chain moiety, an embodiment in which the resin (D) does not substantially contain a fluorine atom and a silicon atom is also preferable, and in this case, specifically, the content of the repeating unit having a fluorine atom or a silicon atom is preferably, 5% by mole or less, more preferably 3% by mole or less, still more preferably 1% by mole or less, and ideally 0% by mole, based on all the repeating units in the resin (D), that is, the resin (D) does not have a fluorine atom and a silicon atom. Further, the resin (D) is preferably substantially constituted with only repeating units containing atoms selected from a carbon atom, an oxygen atom, a hydrogen atom, a nitrogen atom, and a sulfur atom. More specifically, the content of the repeating unit constituted with only atoms selected from a carbon atom, an oxygen atom, a hydrogen atom, a nitrogen atom, and a sulfur atom is preferably 95% by mole or more, more preferably 97% by mole or more, still more preferably 99% by mole or more, and ideally 100% by mole, based on all the repeating units in the resin (D).

The standard polystyrene-equivalent weight average molecular weight of the hydrophobic resin (D) is preferably from 1,000 to 100,000, more preferably from 1,000 to 50,000, and still more preferably from 2,000 to 15,000.

Furthermore, the hydrophobic resin (D) may be used singly or in combination of plural kinds thereof.

The content of the hydrophobic resin (D) in the composition is preferably from 0.01% by mass to 10% by mass, more preferably from 0.05% by mass to 8% by mass, and still more preferably from 0.1% by mass to 7% by mass, based on the total solid contents of the composition of the invention.

In the hydrophobic resin (D), similarly to the resin (A), it is of course preferred that the content of impurities such as metals be low, but also, the content of residual monomers or oligomer components is preferably from 0.01% by mass to 5% by mass, more preferably from 0.01% by mass to 3% by mass, and still more preferably from 0.05% by mass to 1% by mass. When these conditions are satisfied, an actinic ray-sensitive or radiation-sensitive resin composition free of extraneous substances in liquid or change with aging of sensitivity or the like can be obtained. Furthermore, from the viewpoint of resolution, resist profile, the side wall of a resist pattern, roughness, and the like, the molecular weight distribution (Mw/Mn, also referred to as dispersity) is preferably in the range of 1 to 5, more preferably 1 to 3, and still more preferably 1 to 2.

As for the hydrophobic resin (D), various commercially available products may be used or the resin may be synthesized by an ordinary method (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours, with the dropping polymerization method being preferred.

The reaction solvent, the polymerization initiator, the reaction conditions (for example, a temperature and a concentration), and the purification method after reaction are the same as those described for the resin (A), but the concentration for the reaction is preferably from 30% by mass to 50% by mass in the synthesis of the hydrophobic resin (D).

Specific examples of the hydrophobic resin (D) are shown below. Further, the molar ratio of the repeating units (corresponding to the respective repeating units starting from the left), the weight average molecular weight, and the dispersity in the respective resins are shown in the tables below.

[Chem. 68]

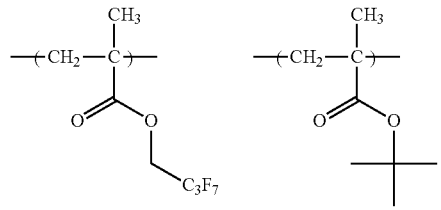
(HR-1)

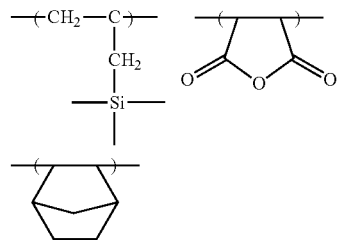
(HR-2)

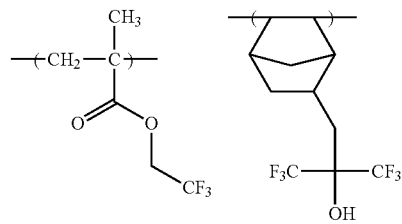
(HR-3)

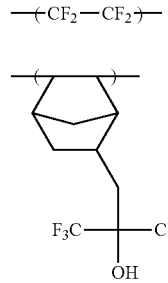
(HR-4)

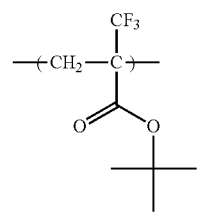
(HR-5)

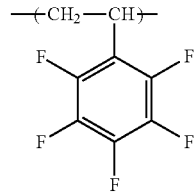
(HR-6)

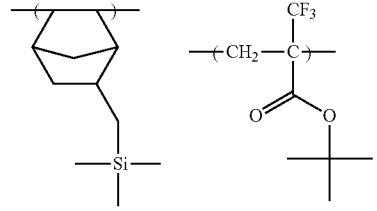
(HR-7)

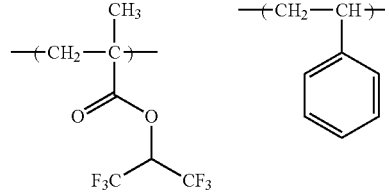
(HR-8)

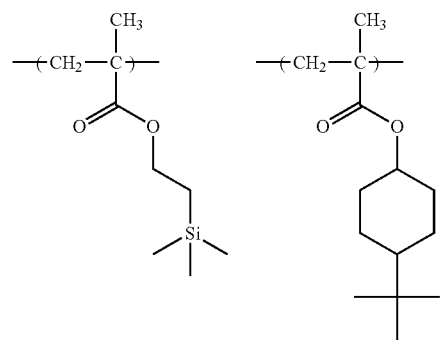
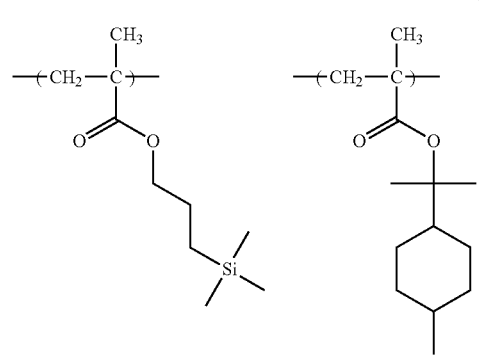
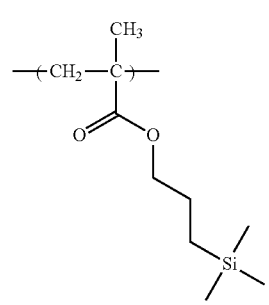
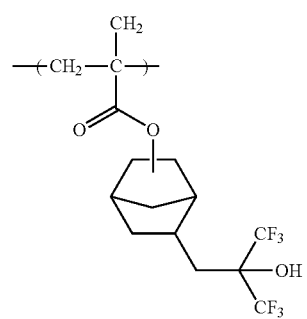
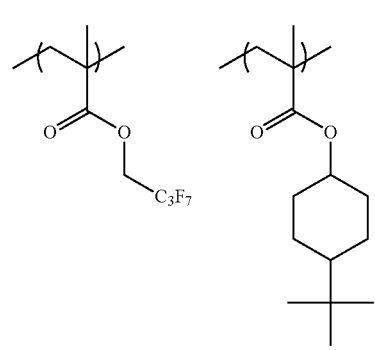
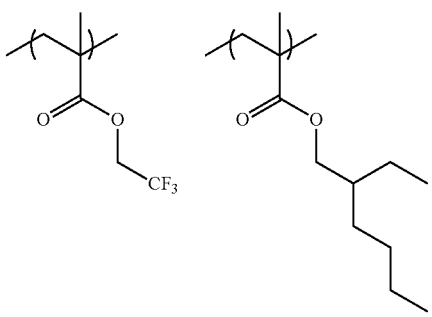
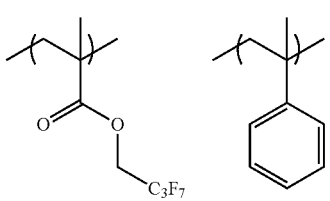
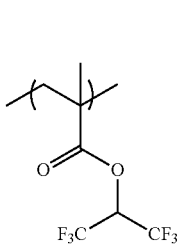
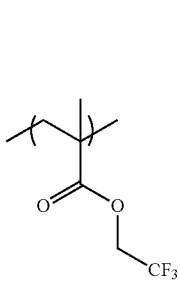
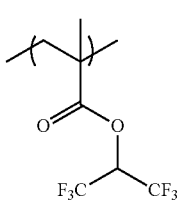
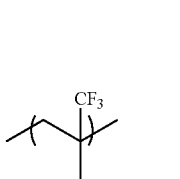

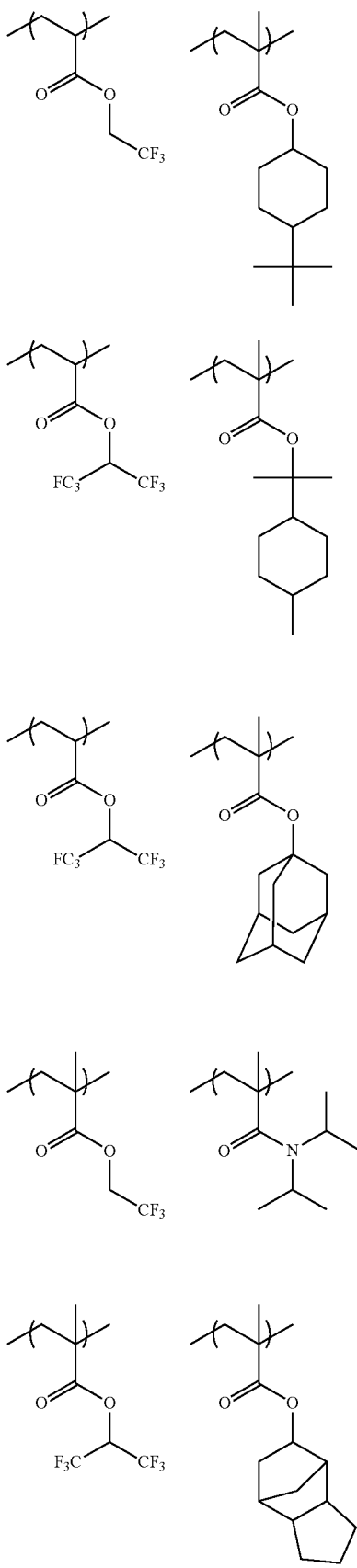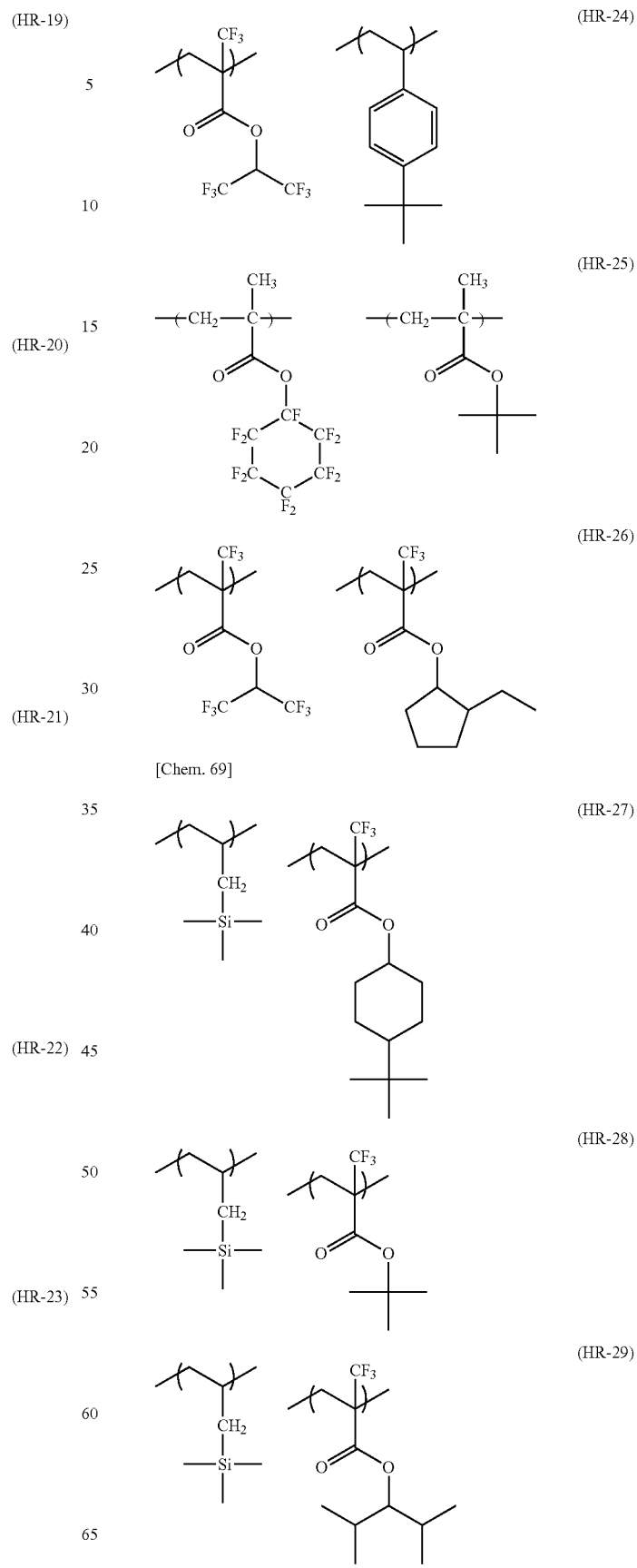

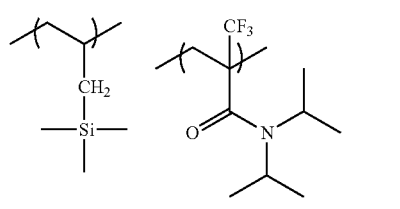
(HR-30)
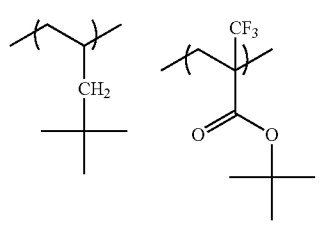
(HR-31)
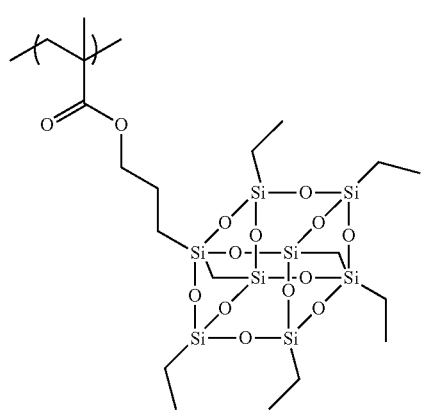
(HR-32)
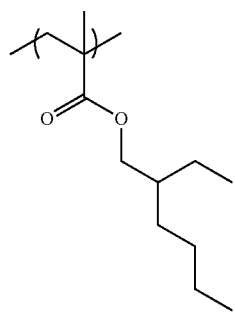
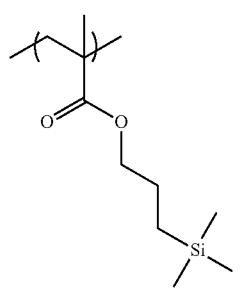 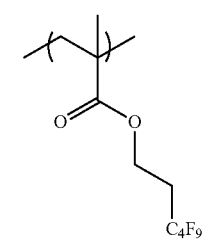
(HR-33)
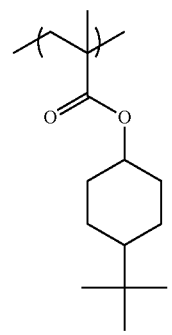
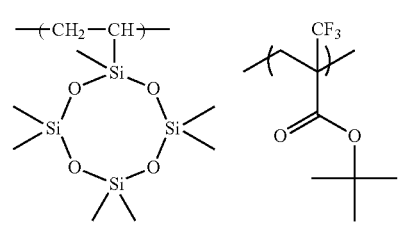
(HR-34)
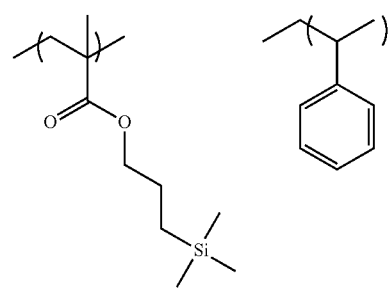
(HR-35)
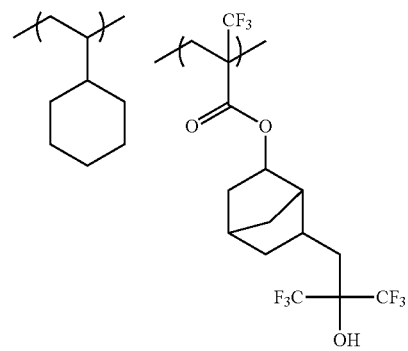
(HR-36)
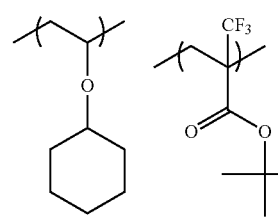
(HR-37)

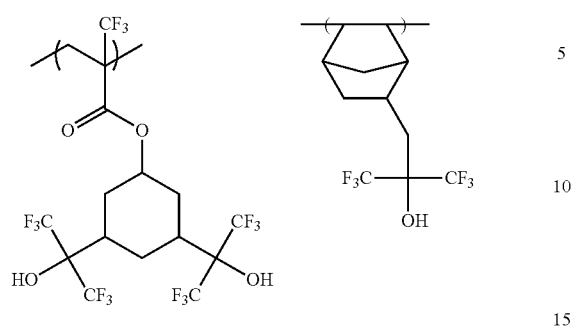
(HR-38)
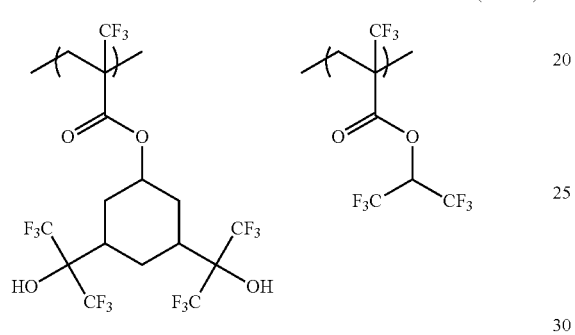
(HR-39)
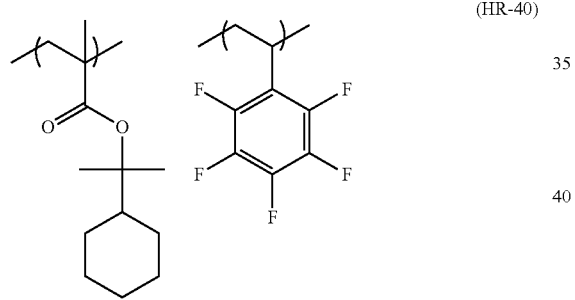
(HR-40)
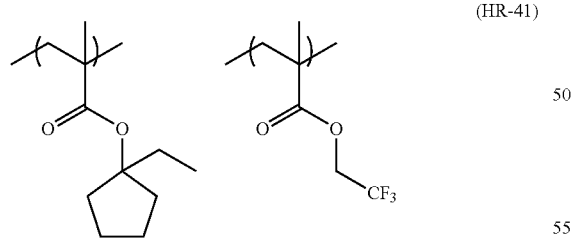
(HR-41)
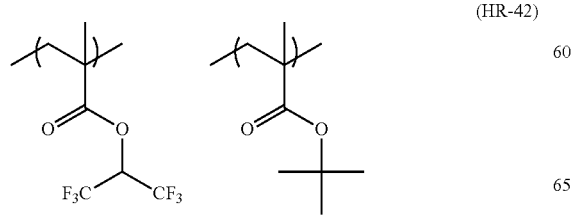
(HR-42)
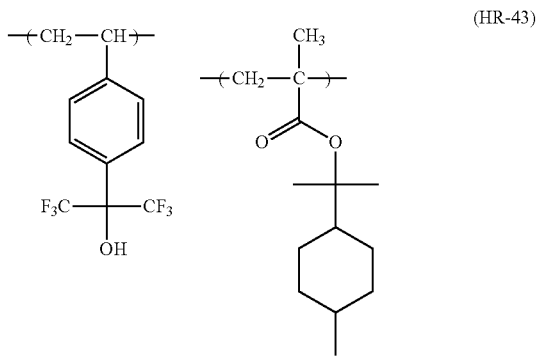
(HR-43)
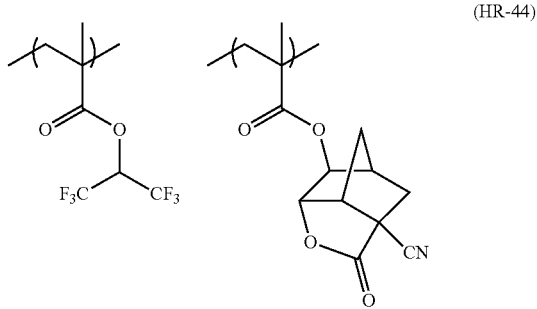
(HR-44)
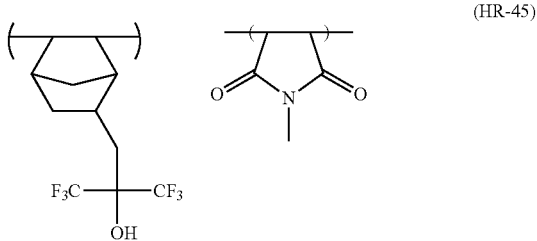
(HR-45)
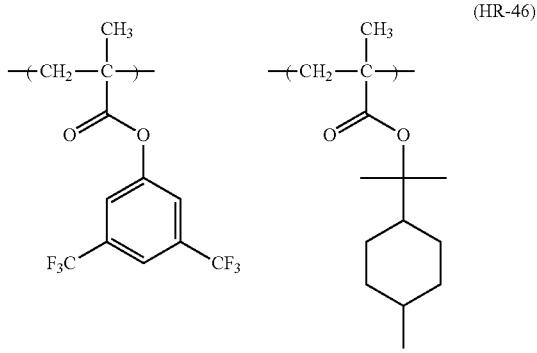
(HR-46)

(HR-47)
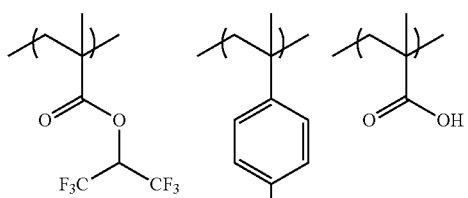
(HR-48)
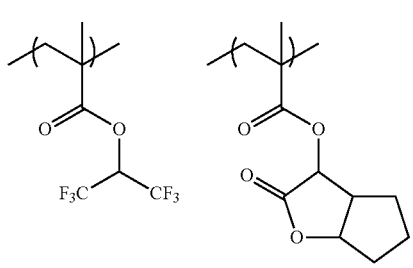
[Chem. 70]
(HR-49)
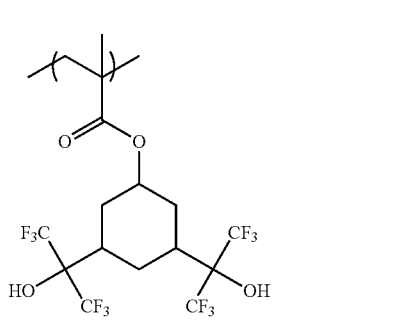
(HR-50)
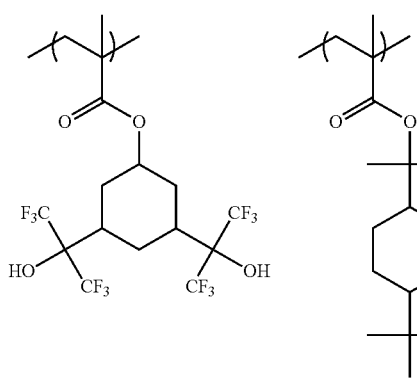
(HR-51)
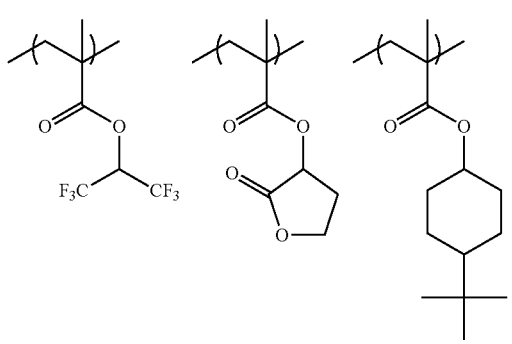
(HR-52)
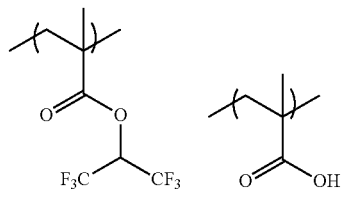
(HR-53)
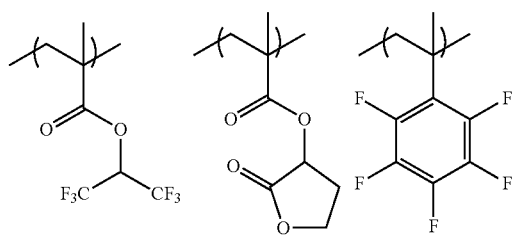
(HR-54)
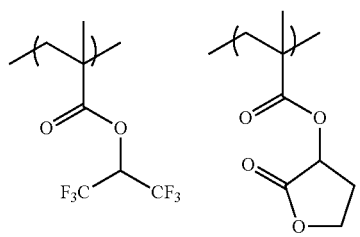
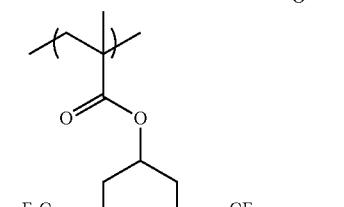
(HR-55)
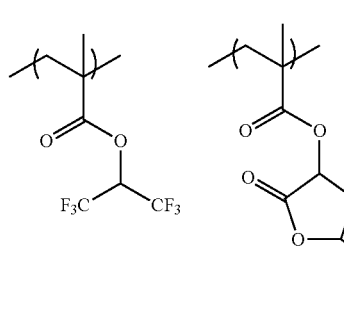

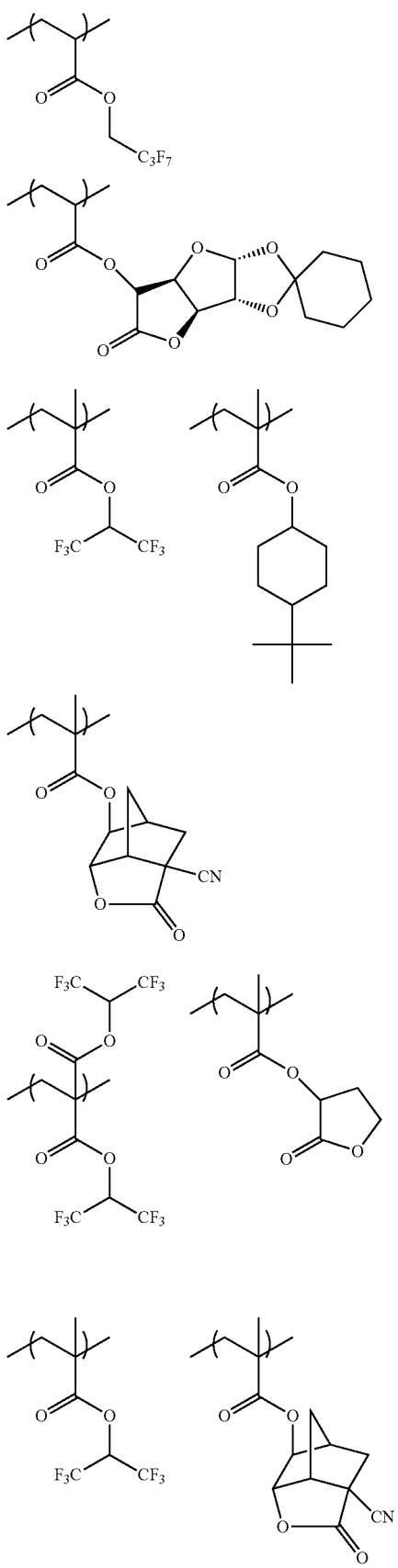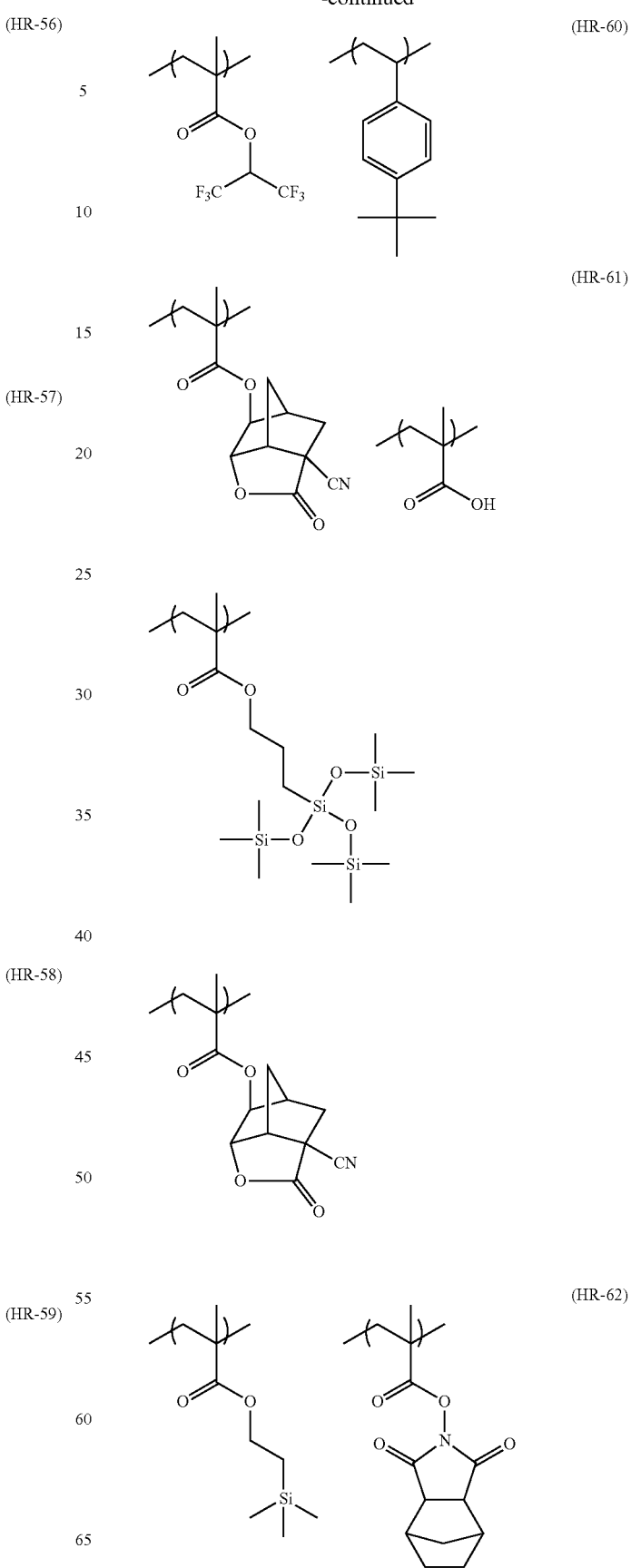

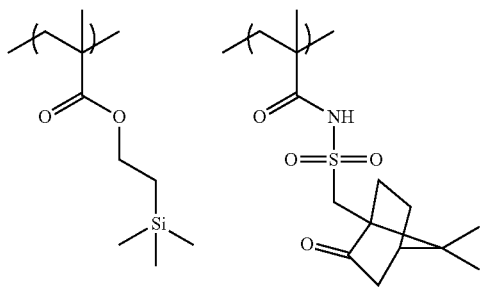
(HR-63)
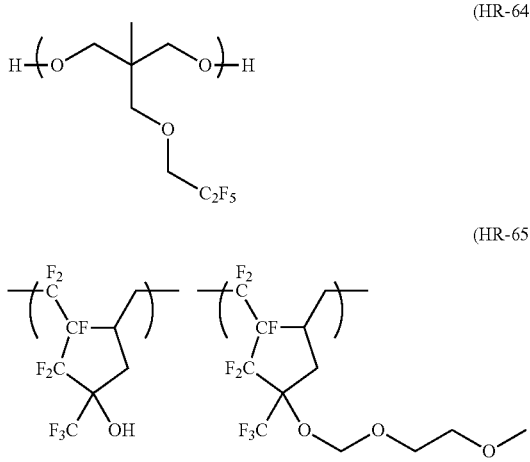
(HR-64)
(HR-65)
| Resin | Composition | Mw | Mw/Mn |
|---|---|---|---|
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
[Chem. 71]
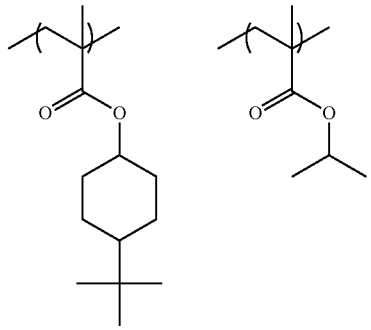
(C-1)
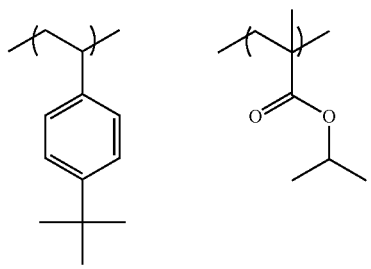
(C-2)
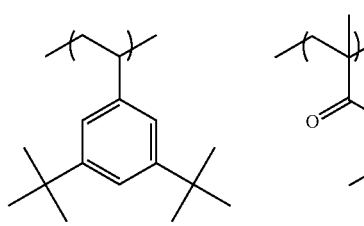
(C-3)
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |

-continued
(C-4) 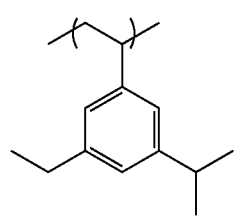 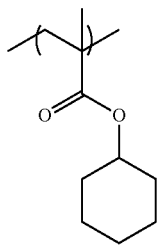
(C-5) 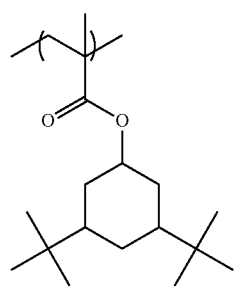
(C-6) 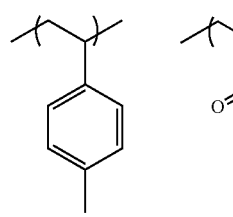
(C-7) 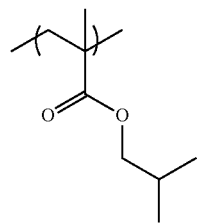
(C-8) 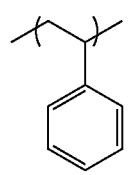 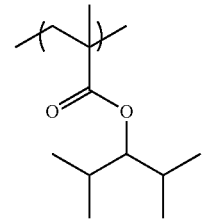
(C-9) 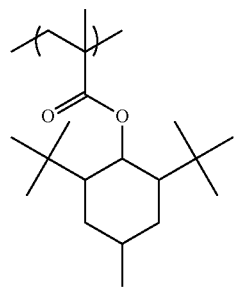
-continued
(C-10) 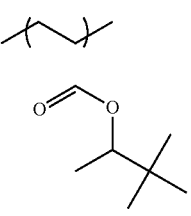
(C-11) 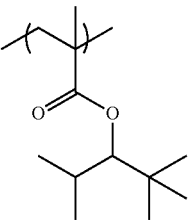
(C-12) 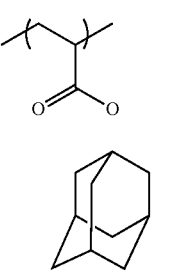
(C-13) 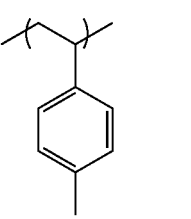
(C-14) 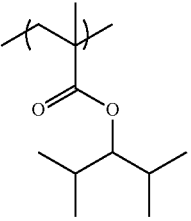
(C-15) 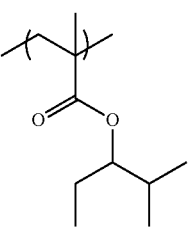

(C-16)
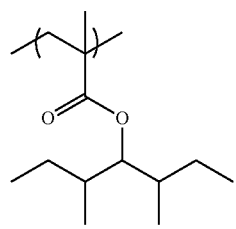 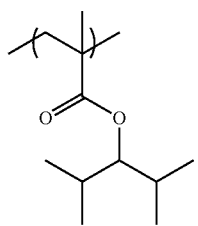
[Chem. 72]
(C-17)
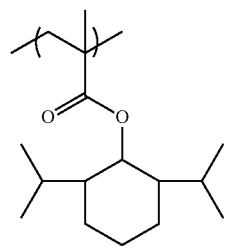 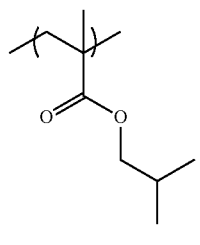
(C-18)
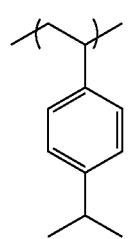 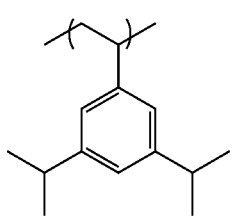
(C-19)
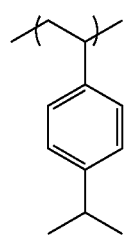 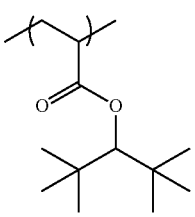
(C-20)
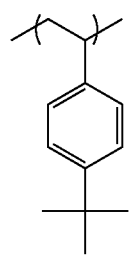 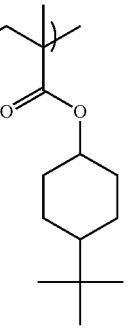
(C-21)
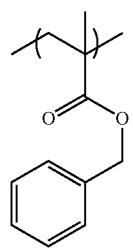 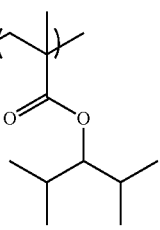
(C-22)
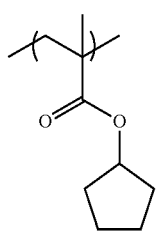 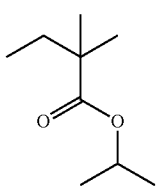
(C-23)
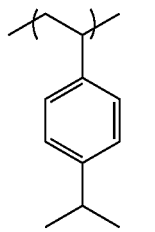 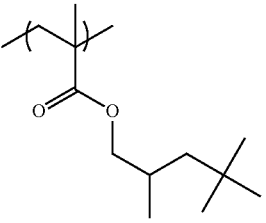
(C-24)
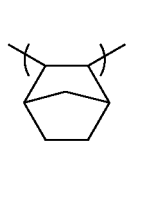 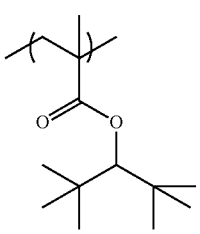
(C-25)
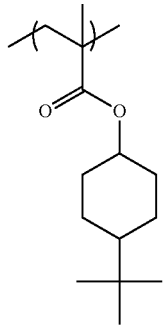 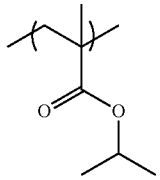 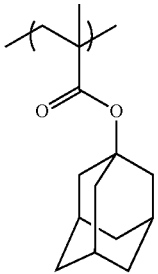
(C-26)
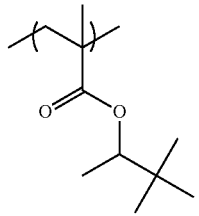 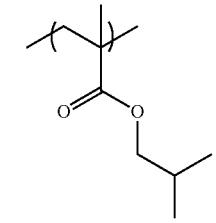
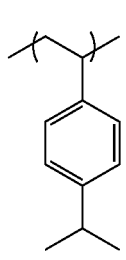

(C-27)
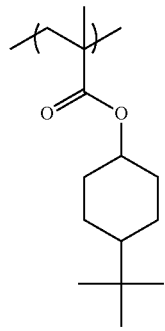
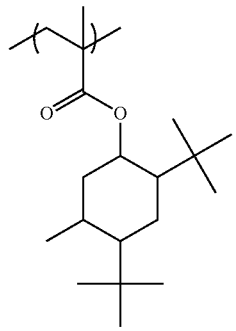
(C-28)
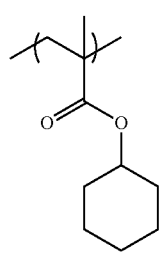
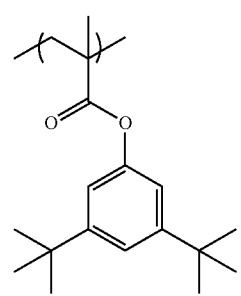
[Chem. 73]
(D-1)
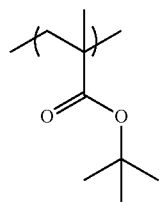
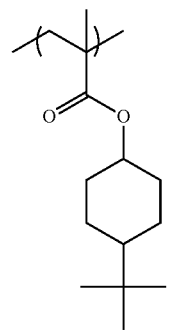
(D-2)
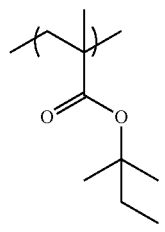
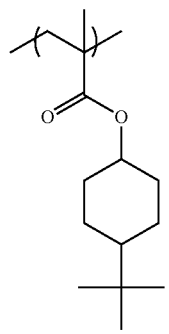
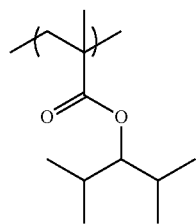
(D-3)
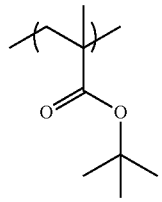
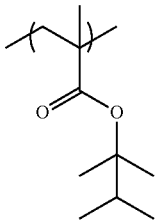
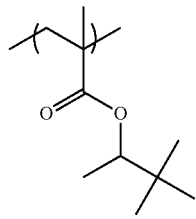
(D-4)
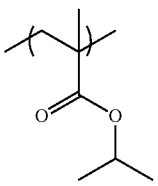
(D-5)
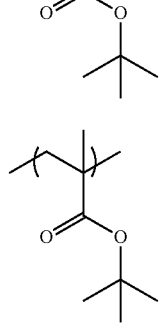
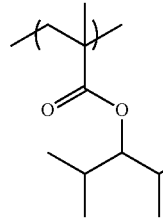
(D-6)
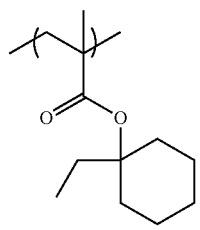
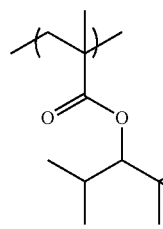
(D-7)
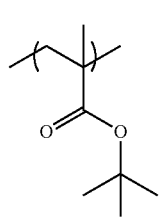
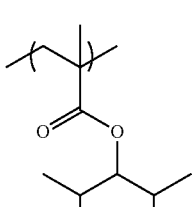
(D-8)
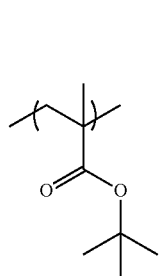
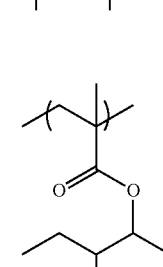

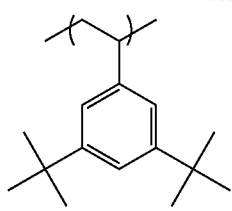
(D-9)
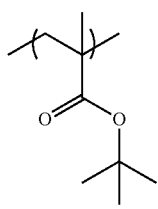 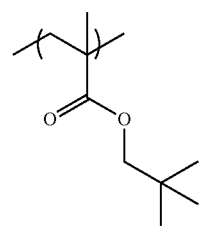 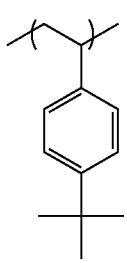
(D10)
[Chem. 74]
(D-11)
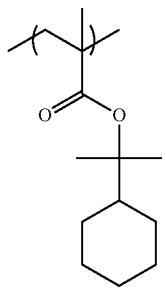 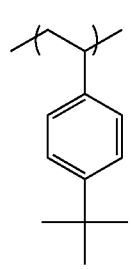
(D-12)
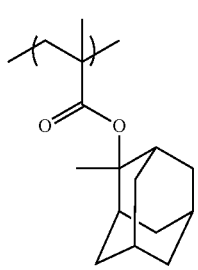 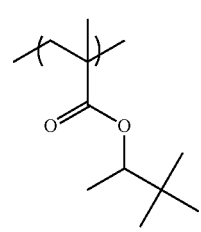
(D-13)
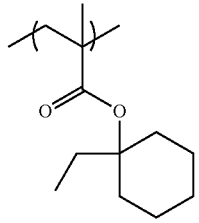 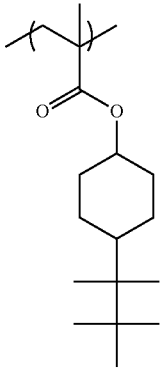
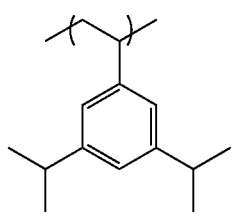
(D-14)
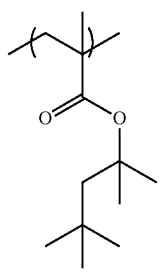 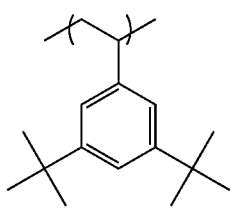
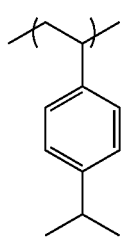
(D-15)
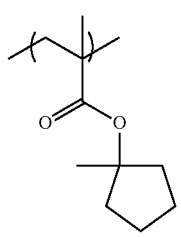 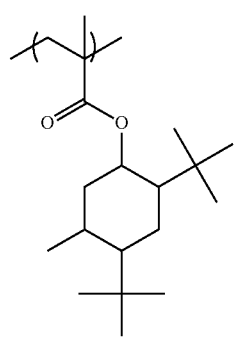

-continued

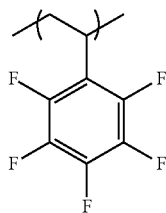

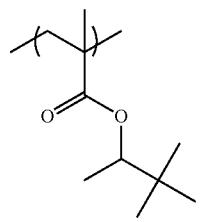

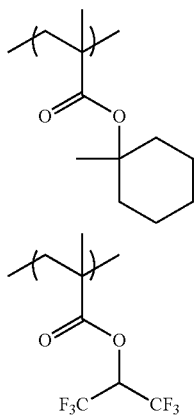

(D-16)

| Resin | Composition | Mw | Mw/Mn |
|---|---|---|---|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |

TABLE 3

| Resin | Composition | Mw | Mw/Mn |
|---|---|---|---|
| D-1 | 50/50 | 16500 | 1.72 |
| D-2 | 10/50/40 | 18000 | 1.77 |
| D-3 | 5/50/45 | 27100 | 1.69 |
| D-4 | 20/80 | 26500 | 1.79 |
| D-5 | 10/90 | 24700 | 1.83 |
| D-6 | 10/90 | 15700 | 1.99 |
| D-7 | 5/90/5 | 21500 | 1.92 |
| D-8 | 5/60/35 | 17700 | 2.10 |
| D-9 | 35/35/30 | 25100 | 2.02 |
| D-10 | 70/30 | 19700 | 1.85 |
| D-11 | 75/25 | 23700 | 1.80 |
| D-12 | 10/90 | 20100 | 2.02 |
| D-13 | 5/35/60 | 30100 | 2.17 |
| D-14 | 5/45/50 | 22900 | 2.02 |
| D-15 | 15/75/10 | 28600 | 1.81 |
| D-16 | 25/55/20 | 27400 | 1.87 |

[5-1] Basic Compound or Ammonium Salt Compound (N) Capable of Decreasing Basicity by Irradiation with Actinic Rays or Radiation The actinic ray-sensitive or radiation-sensitive resin composition in the invention preferably contains a basic compound or ammonium salt compound capable of decreasing the basicity by irradiation with actinic rays or radiation (hereinafter also referred to as a "compound (N)").

The compound (N) is preferably a compound (N-1) having a basic functional group or a group capable of generating an acidic functional group by irradiation with actinic rays or radiation together with an ammonium group. That is, the compound (N) is preferably a basic compound having a basic functional group and a group capable of generating an acidic functional group by irradiation with actinic rays or radiation, or an ammonium salt compound having a group capable of generating an acidic functional group by irradiation with actinic rays or radiation together with an ammonium group.

The compound which is generated due to decomposition of the compound (N) or (N-1) by irradiation with actinic rays or radiation and decreases the basicity includes compounds represented by the following general formulae (PA-I), (PA-II), and (PA-III), and from the viewpoint that excellent effects can be attained in a high level in terms of both LWR and local pattern dimensional uniformity and (DOF), the compounds represented by the general formulae (PA-II) and (PA-III) are particularly preferred.

First, the compound represented by the general formula (PA-I) will be described.

$$Q-A_1-(X)_n-B-R \qquad (PA\text{-}I)$$

In the general formula (PA-I), $A_1$ represents a single bond or a divalent linking group;

Q represents —SO$_3$H or —CO$_2$H, and Q corresponds to an acidic functional group that is generated by irradiation with actinic rays or radiation;

X represents —SO$_2$— or —CO—;

n represents 0 or 1;

B represents a single bond, an oxygen atom, or —N(Rx)—;

Rx represents a hydrogen atom or a monovalent organic group; and

R represents a monovalent organic group having a basic functional group, or a monovalent organic group having an ammonium group.

The divalent linking group in $A_1$ is preferably a divalent linking group having 2 to 12 carbon atoms, and examples thereof include an alkylene group and a phenylene group. The divalent linking group is more preferably an alkylene group having at least one fluorine atom, preferably having 2 to 6 carbon atoms, and more preferably 2 to 4 carbon atoms. The alkylene chain may contain a linking group such as an oxygen atom and a sulfur atom. Particularly, the alkylene group is preferably an alkylene group where from 30 to 100% by number of the hydrogen atoms are substituted with a fluorine atom, and more preferably an alkylene group where the carbon atom bonded to the Q site has a fluorine atom. The alkylene group is preferably a perfluoroalkylene group, and more preferably a perfluoroethylene group, a perfluoropropylene group, or a perfluorobutylene group.

The monovalent organic group in Rx is preferably a monovalent organic group having 4 to 30 carbon atoms, and examples thereof include an alkyl group, a cycloalkyl group, an aryl group, an aralkyl group, and an alkenyl group.

The alkyl group in Rx may have a substituent and is preferably a linear or branched alkyl group having 1 to 20 carbon atoms, and the alkyl chain may have an oxygen atom, a sulfur atom, or a nitrogen atom.

Further, the alkyl group having a substituent includes a group where a cycloalkyl group is substituted particularly with a linear or branched alkyl group (for example, an adamantylmethyl group, an adamantylethyl group, a cycohexylethyl group, and a camphor residue).

The cycloalkyl group in Rx may have a substituent and is preferably a cycloalkyl group having 3 to 20 carbon atoms, and the cycloalkyl group may contain an oxygen atom in the ring.

The aryl group in Rx may have a substituent, and is preferably an aryl group having 6 to 14 carbon atoms.

The aralkyl group in Rx may have a substituent and is preferably an aralkyl group having 7 to 20 carbon atoms.

The alkenyl group in Rx may have a substituent and examples thereof include a group having a double bond at an arbitrary position of the alkyl group described as Rx.

Preferred examples of the partial structure of the basic functional group include a crown ether structure, a primary to tertiary amine structure, and a nitrogen-containing heterocyclic structure (for example, pyridine, imidazole, and pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group or a nitrogen-containing heterocyclic structure. In these structures, from the viewpoint of enhancing the basicity, it is preferred that all atoms adjacent to a nitrogen atom contained in the structure are a carbon atom or a hydrogen atom. Further, in view of enhancing the basicity, an electron-withdrawing functional group (for example, a carbonyl group, a sulfonyl group, a cyano group, and a halogen atom) is preferably not bonded directly to the nitrogen atom.

The monovalent organic group in the monovalent organic group (group R) containing such a structure is preferably an organic group having 4 to 30 carbon atoms, and examples thereof include an alkyl group, a cycloalkyl group, an aryl group, an aralkyl group and an alkenyl group. These groups each may have a substituent.

The alkyl group, cycloalkyl group, aryl group, an aralkyl group and alkenyl group in the basic functional group- or ammonium group-containing alkyl, cycloalkyl, aryl, aralkyl, and alkenyl groups in R are the same as the alkyl group, the cycloalkyl group, the aryl group, the aralkyl group, and the alkenyl group mentioned as Rx.

Examples of the substituent which the respective groups above may have include a halogen atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). As for the cyclic structure in the aryl group, the cycloalkyl group, and the like, examples of the substituent further include an alkyl group (preferably having 1 to 20 carbon atoms). As for the aminoacyl group, examples of the substituent further include one or two alkyl groups (preferably having 1 to 20 carbon atoms).

In the case where B is —N(Rx)—, R and Rx are preferably bonded to each other to form a ring. By virtue of forming a ring structure, the stability is enhanced and the composition using this compound is also enhanced in the storage stability. The number of carbon atoms constituting the ring is preferably from 4 to 20, and the ring may be monocyclic or polycyclic and may contain an oxygen atom, a sulfur atom, or a nitrogen atom in the ring.

Examples of the monocyclic structure include a 4- to 8-membered ring containing a nitrogen atom. Examples of the polycyclic structure include a structure composed of a combination of two monocyclic structures or three or more monocyclic structures. The monocyclic structure and polycyclic structure may have a substituent, and preferred examples of the substituent include a halogen atom, a hydroxyl group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), and an aminoacyl group (preferably having 2 to 20 carbon atoms). As for the cyclic structure in the aryl group, cycloalkyl group and the like, the substituent further includes an alkyl group (preferably having 1 to 15 carbon atoms). As for the aminoacyl group, the substituent includes one or two alkyl groups (preferably having 1 to 15 carbon atoms).

Out of the compounds represented by the general formula (PA-T), a compound in which the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

Next, the compound represented by the general formula (PA-II) will be described.

$Q_1$-$X_1$—NH—$X_2$-$Q_2$     (PA-II)

In the general formula (PA-II)

$Q_1$ and $Q_2$ each independently represent a monovalent organic group, provided that either one of Q1 and Q2 has a basic functional group, and it also possible that Q1 and Q2 are bonded to each other to form a ring and the ring formed has a basic functional group; and $X_1$ and $X_2$ each independently represent —CO— or —$SO_2$—.

Further, —NH— corresponds to the acidic functional group generated by irradiation with actinic rays or radiation.

In the general formula (PA-II), the monovalent organic group as $Q_1$ and $Q_2$ is preferably a monovalent organic group having 1 to 40 carbon atoms, and examples thereof include an alkyl group, a cycloalkyl group, an aryl group, an aralkyl group, and an alkenyl group.

The alkyl group in $Q_1$ and $Q_2$ may have a substituent and is preferably a linear or branched alkyl group having 1 to 30 carbon atoms, and the alkyl chain may contain an oxygen atom, a sulfur atom, or a nitrogen atom.

The cycloalkyl group in $Q_1$ and $Q_2$ may have a substituent and is preferably a cycloalkyl group having 3 to 20 carbon atoms, and the ring may contain an oxygen atom or a nitrogen atom.

The aryl group in $Q_1$ and $Q_2$ may have a substituent and is preferably an aryl group having 6 to 14 carbon atoms.

The aralkyl group in $Q_1$ and $Q_2$ may have a substituent and is preferably an aralkyl group having 7 to 20 carbon atoms.

The alkenyl group in $Q_1$ and $Q_2$ may have a substituent and includes a group having a double bond at an arbitrary position of the alkyl group above.

Examples of the substituent which each of these groups may have include a halogen atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 10 carbon atoms). As for the cyclic structure in the aryl group, cycloalkyl group and the like, examples of the substituent further include an alkyl group (preferably having 1 to 10 carbon atoms). As for the aminoacyl group, examples of the substituent further include an alkyl group (preferably having 1 to 10 carbon atoms). Examples of the alkyl group having a substituent include a perfluoroalkyl group such as a perfluoromethyl group, a perfluoroethyl group, a perfluoropropyl group, and a perfluorobutyl group.

Preferred examples of the partial structure of the basic functional group which at least either one of $Q_1$ and $Q_2$ has are the same as those of the basic functional group in R of the general formula (PA-I).

In the case where $Q_1$ and $Q_2$ are bonded to each other to form a ring and the ring formed has a basic functional group, examples of the structure thereof include a structure where the organic group of $Q_1$ and $Q_2$ is further bonded to an alkylene group, an oxy group, an imino group, or the like.

In the general formula (PA-II), at least either one of $X_1$ and $X_2$ is preferably —$SO_2$—.

Next, the compound represented by the general formula (PA-III) will be described.

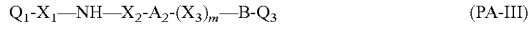

$$Q_1\text{-}X_1\text{—NH—}X_2\text{-}A_2\text{-}(X_3)_m\text{—B-}Q_3 \quad \text{(PA-III)}$$

In the general formula (PA-III), $Q_1$ and $Q_3$ each independently represent a monovalent organic group, provided that either one of $Q_1$ and $Q_3$ has a basic functional group. It is also possible that $Q_1$ and $Q_3$ are bonded to each other to form a ring and the ring formed has a basic functional group;

$X_1$, $X_2$ and $X_3$ each independently represent —CO— or —$SO_2$—;

$A_2$ represents a divalent linking group;

B represents a single bond, an oxygen atom, or —N(Qx)-; and

Qx represents a hydrogen atom or a monovalent organic group.

In the case where B is —N(Qx)-, $Q_3$ and Qx may are bonded to each other to form a ring.

m represents 0 or 1.

Further, —NH— corresponds to the acidic functional group generated by irradiation with actinic rays or radiation.

$Q_1$ has the same meaning as $Q_1$ in the general formula (PA-II).

Examples of the organic group of $Q_3$ are the same as those of the organic group of $Q_1$ and $Q_2$ in the general formula (PA-II).

Incidentally, in the case where $Q_1$ and $Q_3$ are bonded to each other to form a ring and the ring formed has a basic functional group, examples of the structure thereof include a structure where the organic group of $Q_1$ and $Q_3$ is further bonded to an alkylene group, an oxy group, an imino group or the like.

The divalent linking group in $A_2$ is preferably a divalent linking group having 1 to 8 carbon atoms and containing a fluorine atom, and examples thereof include a fluorine atom-containing alkylene group having 1 to 8 carbon atoms, and a fluorine atom-containing phenylene group. A fluorine atom-containing alkylene group is more preferred, and the number of carbon atoms thereof is preferably from 2 to 6, more preferably from 2 to 4. The alkylene chain may contain a linking group such as an oxygen atom and a sulfur atom. The alkylene group is preferably an alkylene group where from 30 to 100% by number of the hydrogen atoms are substituted with a fluorine atom, more preferably a perfluoroalkylene group, and still more preferably a perfluoroalkylene group having 2 to 4 carbon atoms.

The monovalent organic group in Qx is preferably an organic group having 4 to 30 carbon atoms, and examples thereof include an alkyl group, a cycloalkyl group, an aryl group, an aralkyl group and an alkenyl group. Examples of the alkyl group, the cycloalkyl group, the aryl group, the aralkyl group, and the alkenyl group are the same as those with respect to Rx in the formula (PA-I).

In the general formula (PA-III), each of $X_1$, $X_2$, and $X_3$ is preferably —$SO_2$—.

The compound (N) is preferably a sulfonium salt compound of the compound represented by the general formula (PA-I), (PA-II), or (PA-III), or an iodonium salt compound of the compound represented by the general formula (PA-I), (PA-II), or (PA-III), and more preferably a compound represented by the following formula (PA1) or (PA2).

[Chem. 75]

In the general formula (PA1), $R'_{201}$, $R'_{202}$, and $R'_{203}$ each independently represent an organic group, and specific examples thereof are the same as those with respect to $R'_{201}$, $R'_{202}$, and $R'_{203}$ of the general formula ZI in the component (B); and $X^-$ represents a sulfonate or carboxylate anion resulting from elimination of a hydrogen atom in the —$SO_3H$ moiety or —COOH moiety of the compound represented by the general formula (PA-I), or an anion resulting from elimination of a hydrogen atom in the —NH-moiety of the compound represented by the general formula (PA-II) or (PA-III).

In the general formula (PA2),

R'$_{204}$ and R'$_{205}$ each independently represent an aryl group, an alkyl group, or a cycloalkyl group, and specific examples thereof are the same as those with respect to R$_{204}$ and R$_{205}$ of the formula ZII in the component (B); and X$^-$ represents a sulfonate or carboxylate anion resulting from elimination of a hydrogen atom in the —SO$_3$H moiety or —COOH moiety of the compound represented by the general formula (PA-I), or an anion resulting from elimination of a hydrogen atom in the —NH-moiety of the compound represented by the general formula (PA-II) or (PA-III).

The compound (N) decomposes by irradiation with actinic rays or radiation to generate, for example, a compound represented by the general formula (PA-I), (PA-II), or (PA-III).

The compound represented by the general formula (PA-I) is a compound having a sulfonic or carboxylic acid group together with a basic functional group or an ammonium group and thereby being reduced in or deprived of basicity or changed from basic to acidic as compared with the compound (N).

The compound represented by the general formula (PA-II) or (PA-III) is a compound having an organic sulfonylimino or organic carbonylimino group together with a basic functional group and thereby being reduced in or deprived of basicity or changed from basic to acidic as compared with the compound (N).

In the invention, the expression "reduced in basicity by irradiation with actinic rays or radiation" means that the acceptor property for a proton (an acid generated by irradiation with actinic rays or radiation) of the compound (N) is decreased by irradiation with actinic rays or radiation. The expression "the acceptor property is decreased" means that when an equilibrium reaction of producing a non-covalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

In this way, a compound (N) capable of decreasing the basicity by irradiation with actinic rays or radiation is contained in the resist film, so that in the unexposed area, the acceptor property of the compound (N) is sufficiently brought out and an unintended reaction between an acid diffused from the exposed area or the like and the resin (A) can be inhibited, whereas in the exposed area, the acceptor property of the compound (N) decreases and the intended reaction of an acid with the resin (A) unfailingly occurs. Such an operation mechanism is considered to contribute to obtaining a pattern excellent in terms of a line width variation (LWR), local pattern dimensional uniformity, a focus latitude (DOF), and a pattern profile.

Incidentally, the basicity can be confirmed by measuring the pH, or a calculated value can be computed using commercially available software.

Specific examples of the compound (N) capable of generating a compound represented by the general formula (PA-I) by irradiation with actinic rays or radiation are illustrated below, but the invention is not limited thereto.

[Chem. 76]

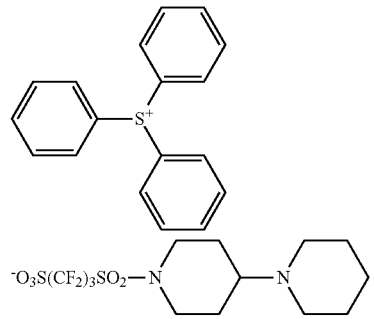

(PA-1)

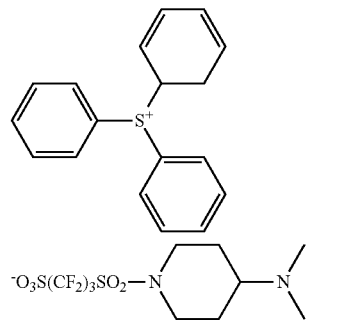

(PA-2)

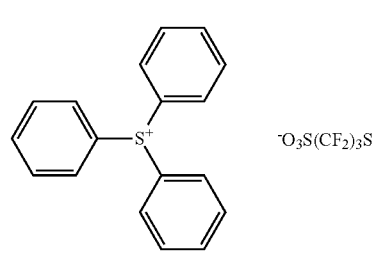

(PA-3)

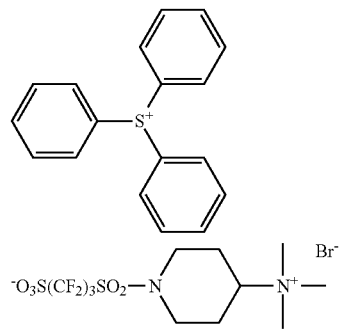

(PA-4)

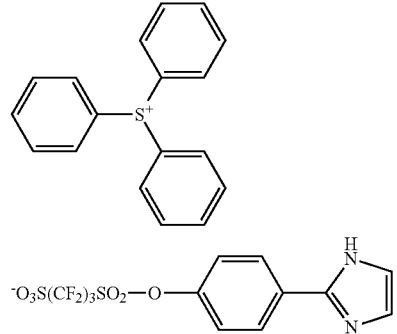

(PA-5)

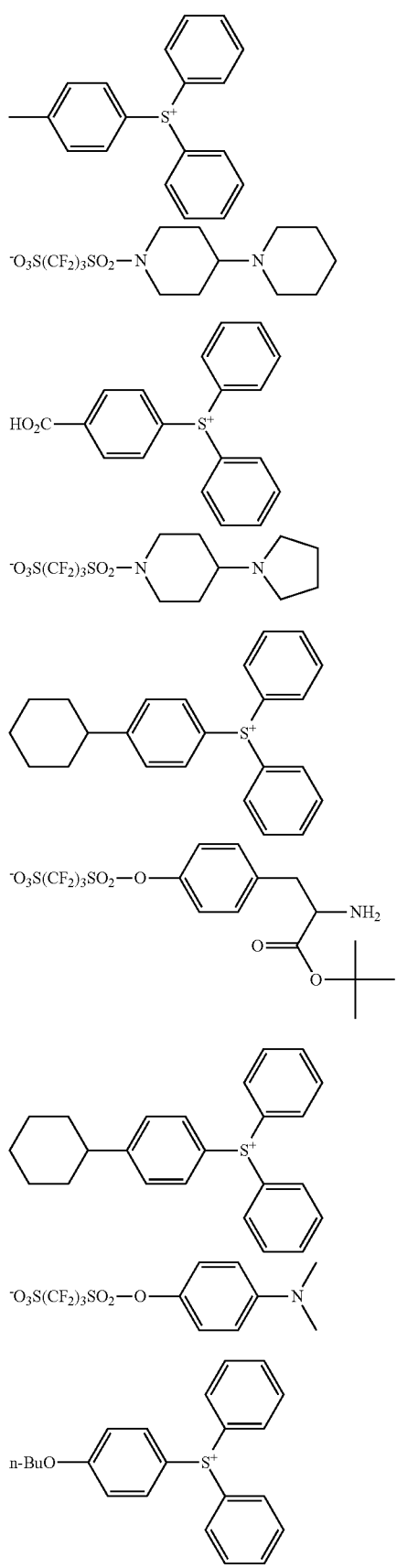
(PA-6)
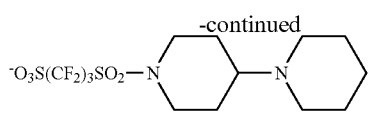
(PA-11)
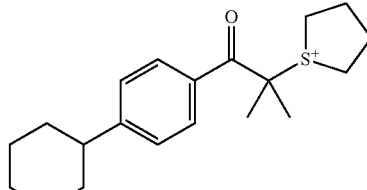
(PA-12)
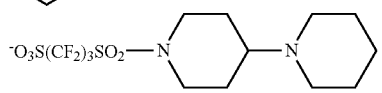
(PA-13)
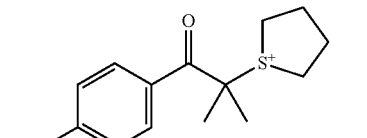
(PA-14)
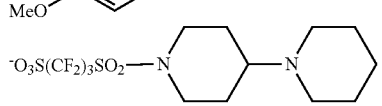
(PA-15)
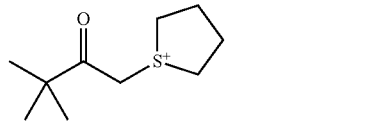
(PA-16)
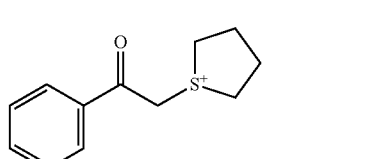
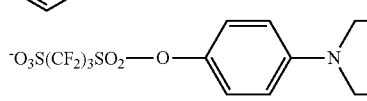
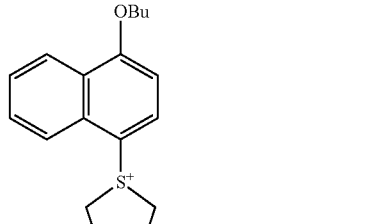
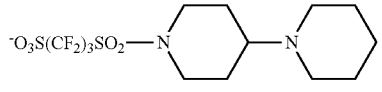
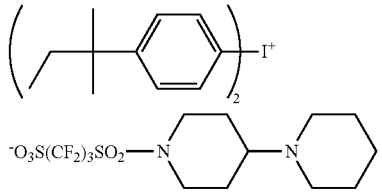

(PA-17)
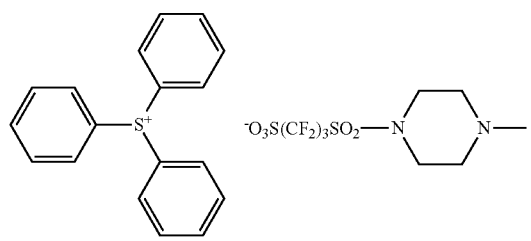
(PA-18)
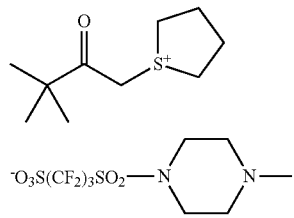
(PA-19)
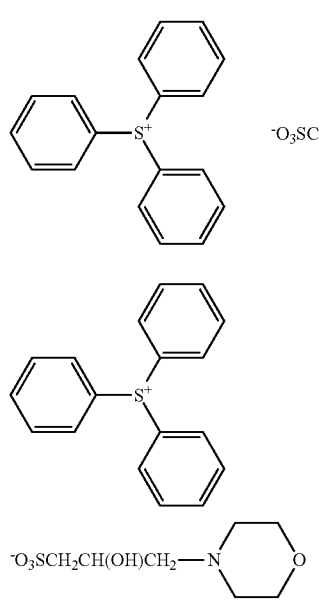
(PA-20)
(PA-21)
[Chem.77]
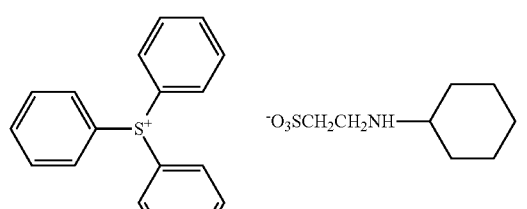
(PA-22)
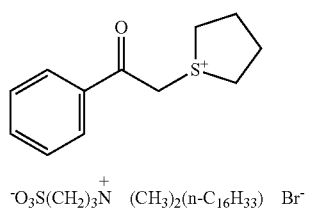
(PA-23)
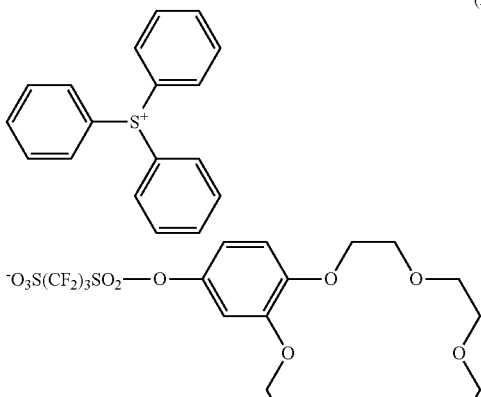
(PA-24)
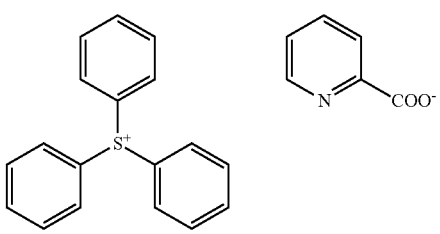
(PA-25)
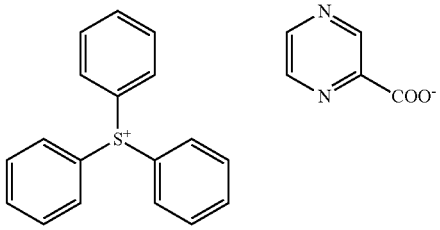
(PA-26)
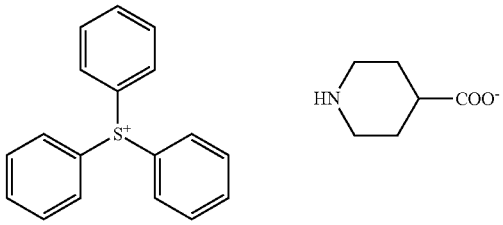
(PA-27)
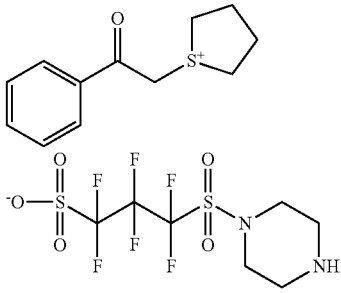
These compounds can be easily synthesized from a compound represented by the general formula (PA-I) or a lithium, sodium or potassium salt thereof and a hydroxide, bromide, chloride or the like of iodonium or sulfonium, by utilizing the salt exchange method described in JP1998-501909T (JP-H11-501909T) or JP2003-246786A. The synthesis may also be performed in accordance with the synthesis method described in JP1994-333851A (JP-H07-333851A).
Specific examples of the compound (N) capable of generating a compound represented by the general formula (PA-II) or (PA-III) by irradiation with actinic rays or radiation are illustrated below, but the invention is not limited thereto.
[Chem. 78]
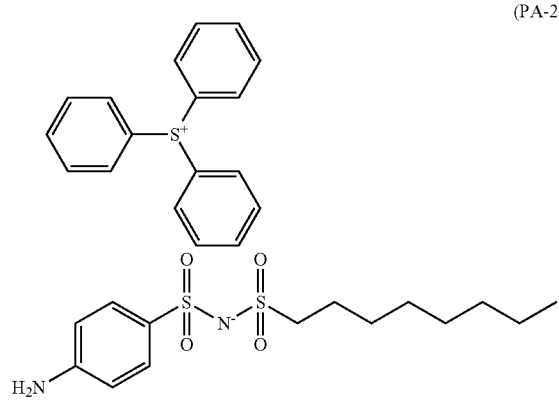
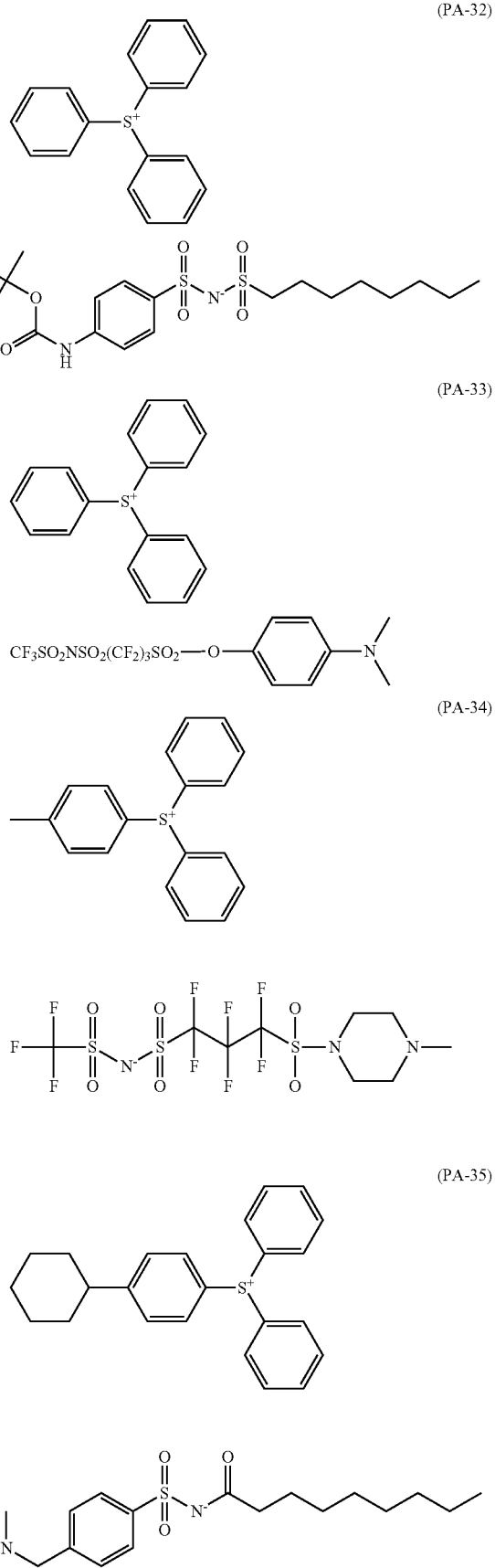

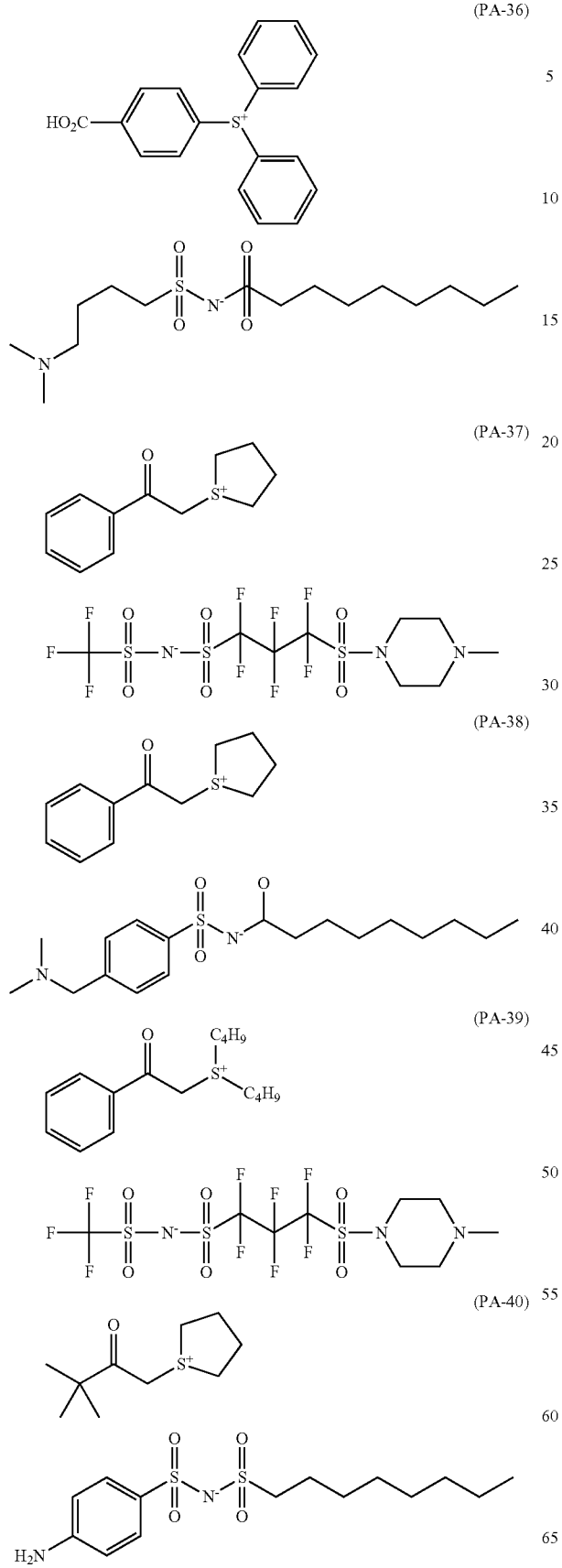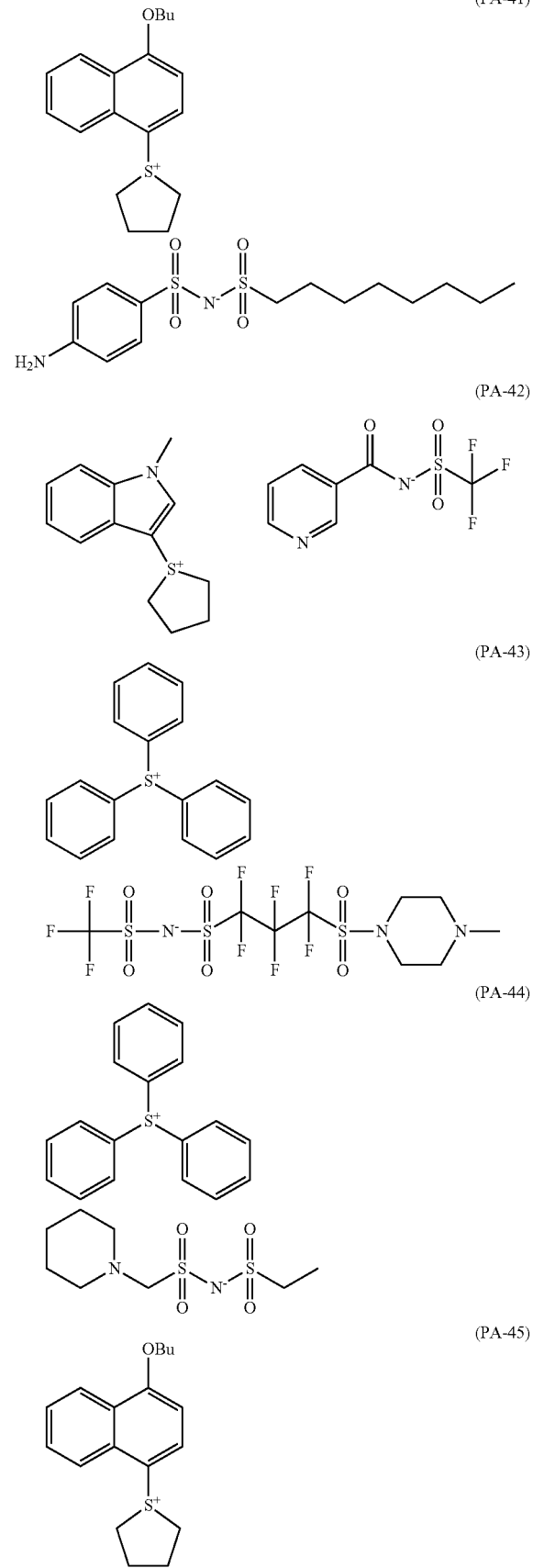

-continued (PA-46)

(PA-47)

(PA-48)

[Chem. 79]

(PA-49)

(PA-50)

-continued (PA-51)

(PA-52)

(PA-53)

(PA-54)

(PA-55)

-continued
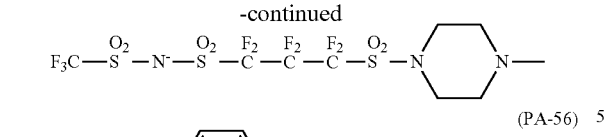
(PA-56)
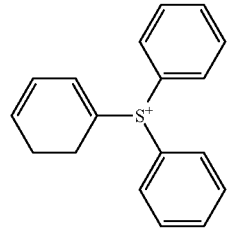
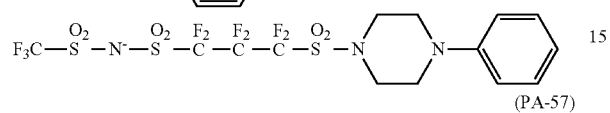
(PA-57)
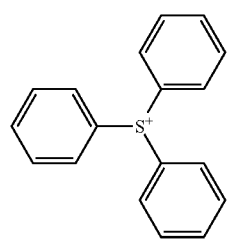
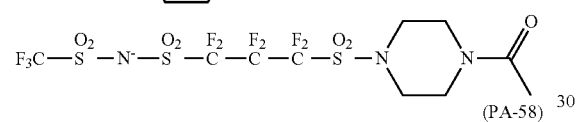
(PA-58)
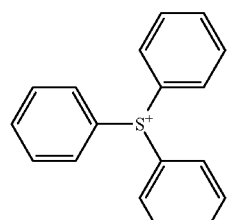
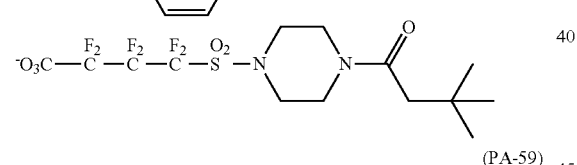
(PA-59)
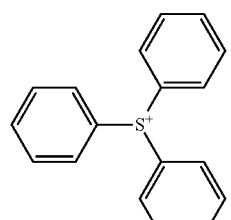
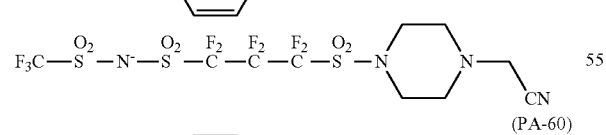
(PA-60)
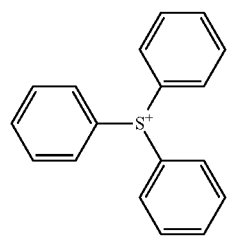
-continued
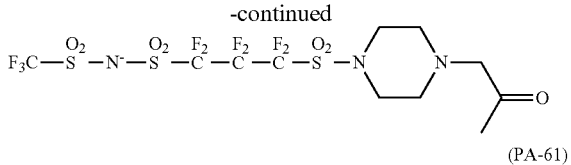
(PA-61)
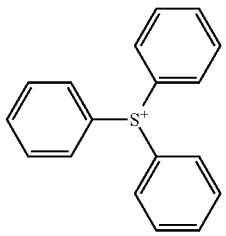
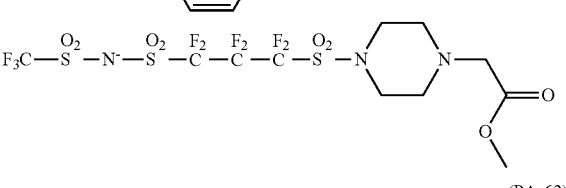
(PA-62)
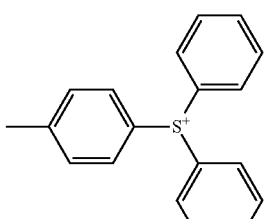
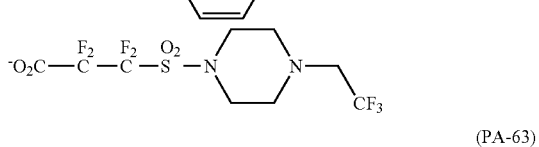
(PA-63)
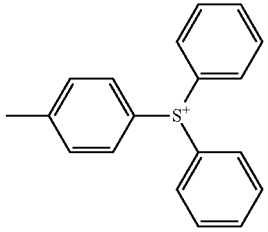
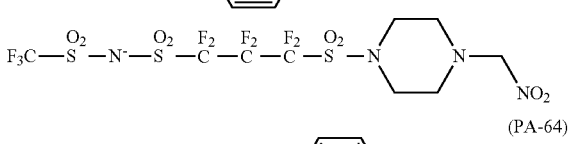
(PA-64)
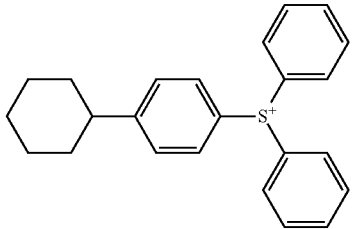
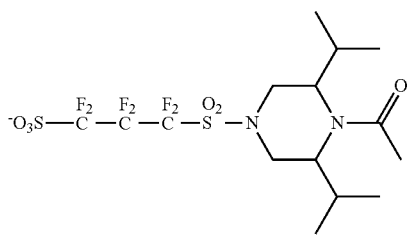

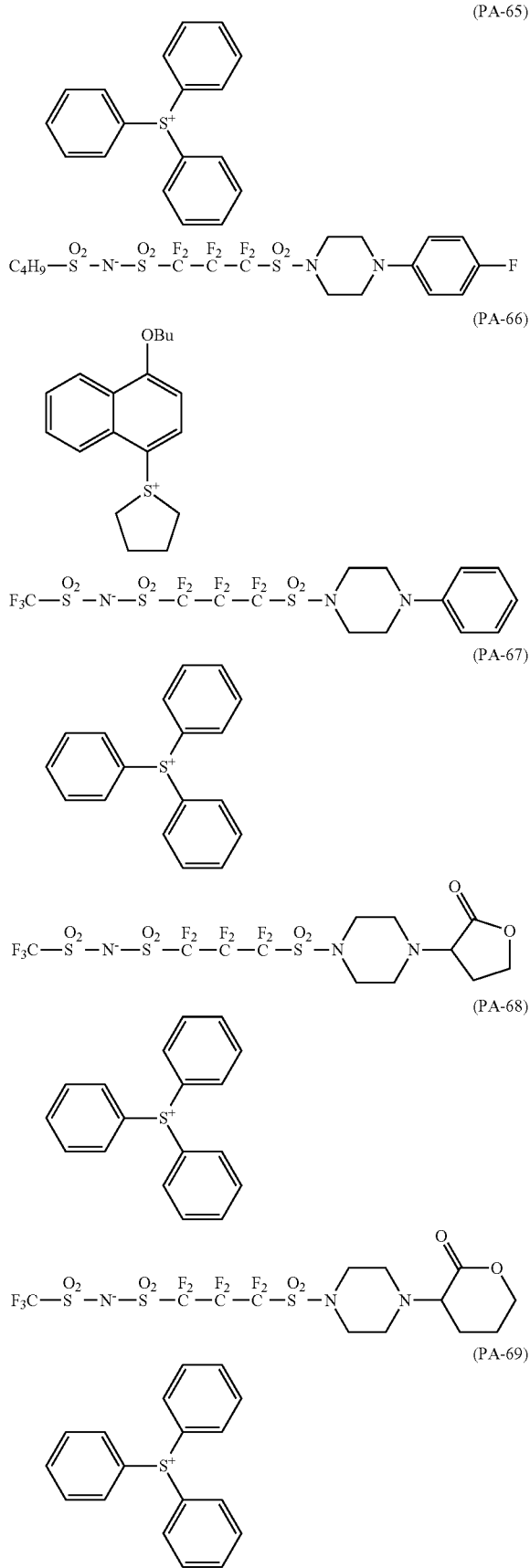

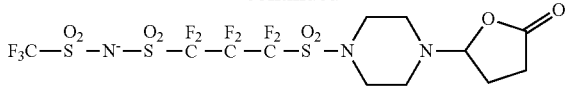

These compounds can be easily synthesized using a general sulfonic esterification reaction or sulfonamidation reaction. For example, the compound may be obtained by a method of selectively reacting one sulfonyl halide moiety of a bis-sulfonyl halide compound with an amine, alcohol or the like containing a partial structure represented by the general formula (PA-II) or (PA-III) to form a sulfonamide bond or a sulfonic ester bond and then hydrolyzing the other sulfonyl halide moiety, or a method of ring-opening a cyclic sulfonic anhydride by an amine or alcohol containing a partial structure represented by the general formula (PA-II). The amine or alcohol containing a partial structure represented by the general formula (PA-II) or (PA-III) can be synthesized by reacting an amine or an alcohol with an anhydride (for example, $(R'O_2C)_2O$ and $(R'SO_2)_2O$) or an acid chloride compound (for example, $R'O_2CCl$ and $R'SO_2Cl$) (R' is, for example, a methyl group, an n-octyl group or a trifluoromethyl group) under basic conditions. In particular, the synthesis may be performed in accordance with synthesis examples and the like in JP2006-330098A.

The molecular weight of the compound (N) is preferably from 500 to 1000.

The actinic ray-sensitive or radiation-sensitive resin composition in the invention may or may not contain the compound (N), but in the case where the composition contains the compound (N), the content thereof is preferably from 0.1% by mass to 20% by mass, and more preferably from 0.1% by mass to 10% by mass, based on the solid content of the actinic ray-sensitive or radiation-sensitive resin composition.

[5-2] Basic Compound (N')

The actinic ray-sensitive or radiation-sensitive resin composition in the invention may contain a basic compound (N') in order to reduce the change in performance with aging from exposure to heating, in which the basic compound (N') is a basic compound other than the compound (N).

Preferred examples of the basic compound (N') include compounds having structures represented by the following formulae (A') to (E').

[Chem. 80]

(A')

$$RA^{200}-N(RA^{201})-RA^{202}$$

(B')

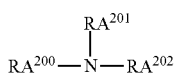

(C')

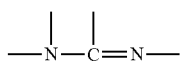

(D')

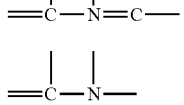

(E')

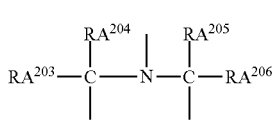

In the general formulae (A') and (E'),

RA$^{200}$, RA$^{201}$ and RA$^{202}$ may be the same as or different from each other, and each independently represents a hydrogen atom, an alkyl group (preferably having 1 to 20 carbon atoms), a cycloalkyl group (preferably having 3 to 20 carbon atoms), or an aryl group (having 6 to 20 carbon atoms), in which RA$^{201}$ and RA$^{202}$ may be bonded to each other to form a ring; and RA$^{203}$, RA$^{204}$, RA$^{205}$ and RA$^{206}$, which may be the same as or different from each other, represent an alkyl group (preferably having 1 to 20 carbon atoms).

The alkyl group may have a substituent, and the alkyl group having a substituent is preferably an aminoalkyl group having 1 to 20 carbon atoms, a hydroxyalkyl group having 1 to 20 carbon atoms, or a cyanoalkyl group (preferably having 1 to 20 carbon atoms).

The alkyl group in the general formulae (A') and (E') is more preferably unsubstituted.

Specific preferred examples of the basic compound (N') include guanidine, aminopyrrolidine, pyrazole, pyrazoline, piperazine, aminomorpholine, aminoalkylmorpholine and piperidine. More preferred specific examples of the basic compound (N') include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically, triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compound having an onium carboxylate structure is a compound in which the anion moiety of the compound having an onium hydroxide structure becomes a carboxylate, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound include a phenoxy group-containing amine compound, a phenoxy group-containing ammonium salt compound, a sulfonic ester group-containing amine compound, and a sulfonic ester group-containing ammonium salt compound.

As for the phenoxy group-containing amine compound, the phenoxy group-containing ammonium salt compound, the sulfonic ester group-containing amine compound, and the sulfonic ester group-containing ammonium salt compound, it is preferable that at least one alkyl group be bonded to the nitrogen atom. Further, it is preferable that the compound have an oxygen atom in the alkyl chain to form an oxyalkylene group. The number of the oxyalkylene groups within the molecule is 1 or more, preferably from 3 to 9, and more preferably from 4 to 6. Among the oxyalkylene groups, the structures of —CH$_2$CH$_2$O—, —CH(CH$_3$)CH$_2$O—, or —CH$_2$CH$_2$CH$_2$O— are preferred.

Specific examples of the phenoxy group-containing amine compound, the phenoxy group-containing ammonium salt compound, the sulfonic ester group-containing amine compound, and the sulfonic ester group-containing ammonium salt compound include, but are not limited to, compounds (C1-1) to (C3-3) illustrated in paragraph 0066 in the specification of US Patent App. No. 2007/0224539.

Furthermore, as one kind of the basic compound, a nitrogen-containing organic compound having a group capable of leaving by the action of an acid may also be used. Examples of such a compound include a compound represented by the following general formula (F). Incidentally, the compound represented by the following general formula (F) exhibits an effective basicity in the system as a result of elimination of the group capable of leaving by the action of an acid.

[Chem. 81]

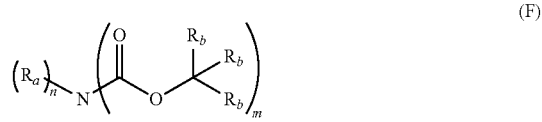

(F)

In the general formula (F),

R$_a$'s each independently represent a hydrogen atom, an alkyl group, a cycloalkyl group, an aryl group, or an aralkyl group, and when n=2, two R$_a$'s may be the same as or different from each other, and two R$_a$'s may be bonded to each other to form a divalent heterocyclic hydrocarbon group (preferably having 20 or less carbon atoms) or a derivative thereof;

R$_b$'s each independently represent a hydrogen atom, an alkyl group, a cycloalkyl group, an aryl group, or an aralkyl group, provided that when in —C(R$_b$)(R$_b$)(R$_b$), one more more R$_b$'s are hydrogen atoms, at least one of the rest of R$_b$'s is a cyclopropyl group or a 1-alkoxyalkyl group;

at least two R$_b$'s may be bonded to each other to form an alicyclic hydrocarbon group, an aromatic hydrocarbon group, a heterocyclic hydrocarbon group, or a derivative thereof, and n represents an integer of 0 to 2, m represents an integer of 1 to 3, and n+m=3.

In the general formula (F), each of the alkyl group, the cycloalkyl group, the aryl group, and the aralkyl group represented by R$_a$ and R$_b$ may be substituted with a functional group such as a hydroxyl group, a cyano group, an amino group, a pyrrolidino group, a piperidino group, a morpholino group, and an oxo group, an alkoxy group, or a halogen atom.

Examples of the alkyl group, the cycloalkyl group, the aryl group, and the aralkyl group (each of these alkyl, cycloalkyl, aryl and aralkyl groups may be substituted with the above-described functional group, an alkoxy group or a halogen atom) of R above include:

a group derived from a linear or branched alkane such as methane, ethane, propane, butane, pentane, hexane, heptane, octane, nonane, decane, undecane, and dodecane, or a group where the group derived from such an alkane is substituted with one or more kinds of or one or more groups of cycloalkyl groups such as a cyclobutyl group, a cyclopentyl group, and a cyclohexyl group;

a group derived from a cycloalkane such as cyclobutane, cyclopentane, cyclohexane, cycloheptane, cyclooctane, norbornane, adamantane and noradamantane, or a group where the group derived from such a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from an aromatic compound such as benzene, naphthalene and anthracene, or a group where the group derived from such an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from such a heterocyclic compound is substituted with one or more kinds of or one or more groups of linear or branched alkyl groups or aromatic compound-derived groups;

a group where the group derived from a linear or branched alkane or the group derived from a cycloalkane is substituted with one or more kinds of or one or more groups of aromatic compound-derived groups such as phenyl group, a naphthyl group, and an anthracenyl group; and a group where the substituent above is substituted with a functional group such as a hydroxyl group, a cyano group, an amino group, a pyrrolidino group, a piperidino group, a morpholino group, and an oxo group.

Moreover, examples of the divalent heterocyclic hydrocarbon group (preferably having 1 to 20 carbon atoms) formed by the mutual bonding of $R_a$'s or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane, and a group where the group derived from such a heterocyclic compound is substituted with one or more kinds of or one or more groups of linear or branched alkane-derived groups, cycloalkane-derived groups, aromatic compound-derived groups, heterocyclic compound-derived groups and functional groups such as a hydroxyl group, a cyano group, an amino group, a pyrrolidino group, a piperidino group, a morpholino group, and an oxo group.

Specific examples of the compound represented by the general formula (F) are shown below.

[Chem. 82]

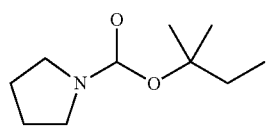
(D-1)

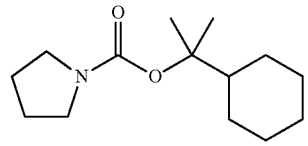
(D-2)

-continued

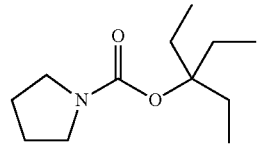
(D-3)

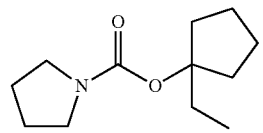
(D-4)

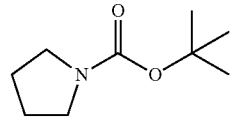
(D-5)

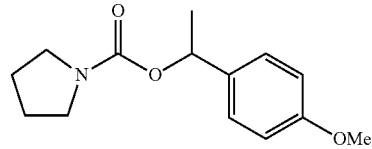
(D-6)

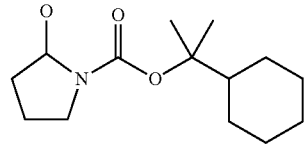
(D-7)

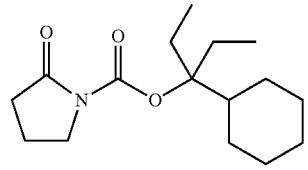
(D-8)

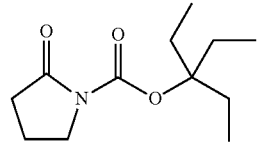
(D-9)

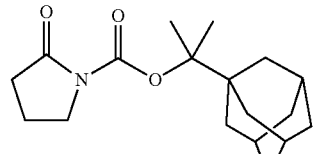
(D-10)

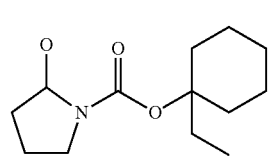
(D-11)

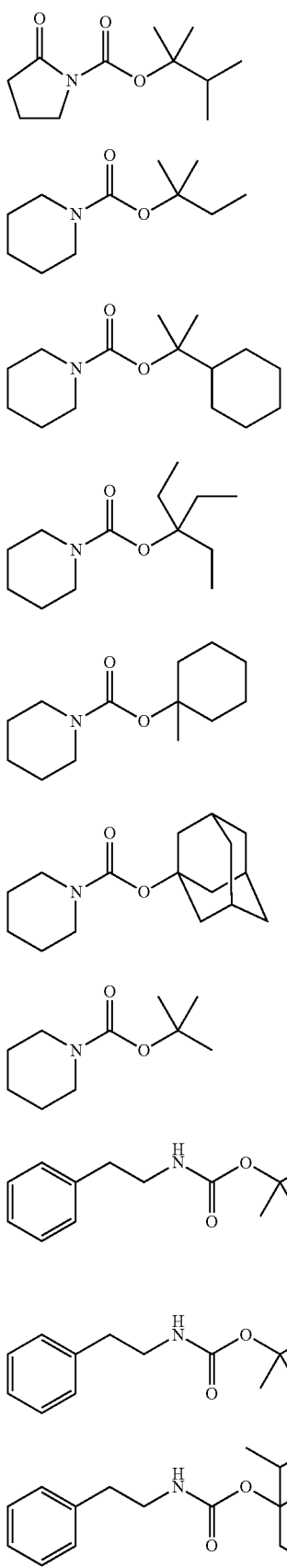
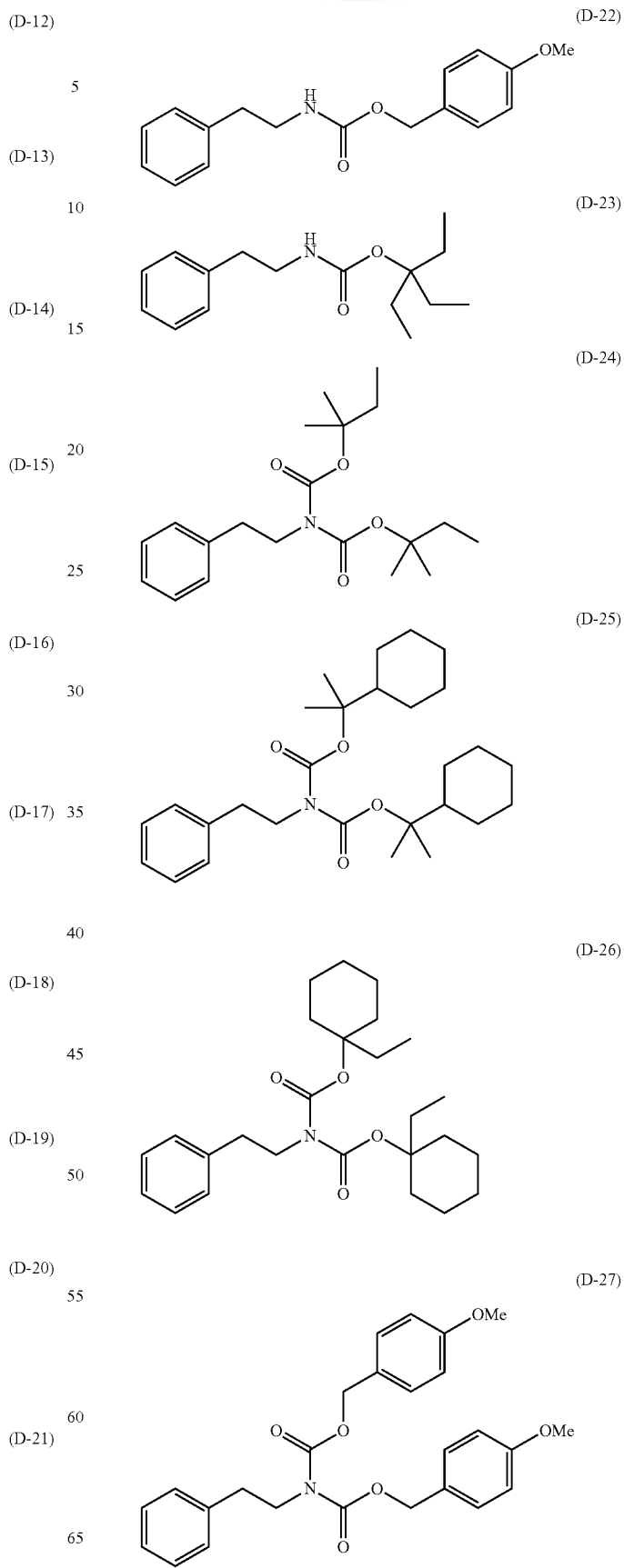

(D-28) 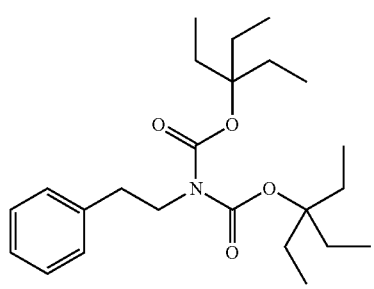
(D-29) 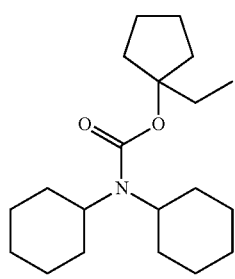
(D-30) 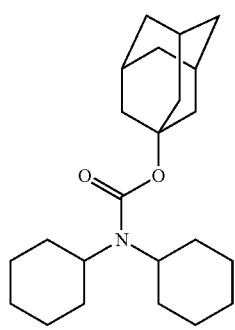
(D-31) 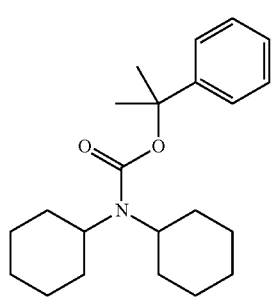
(D-32) 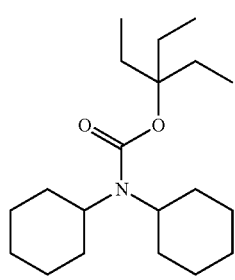
(D-33) 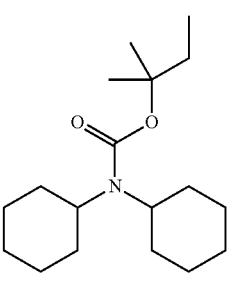
[Chem. 83]
(D-34) 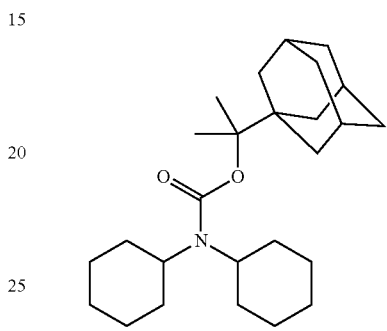
(D-35) 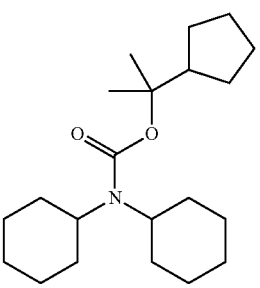
(D-36) 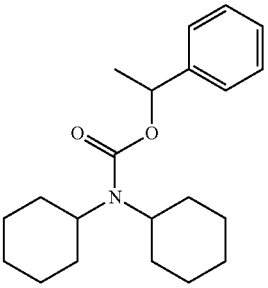
(D-37) 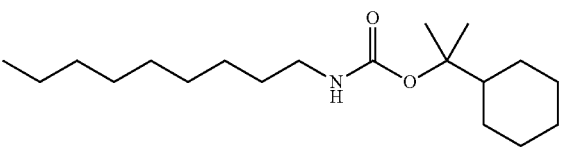
(D-38) 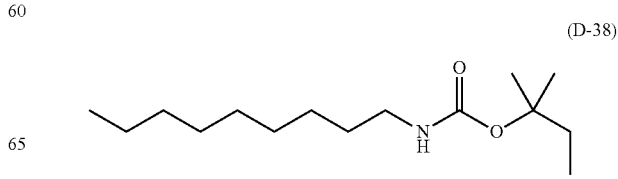

(D-39)
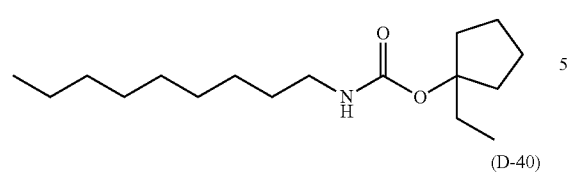
(D-40)
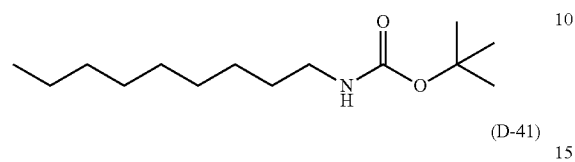
(D-41)
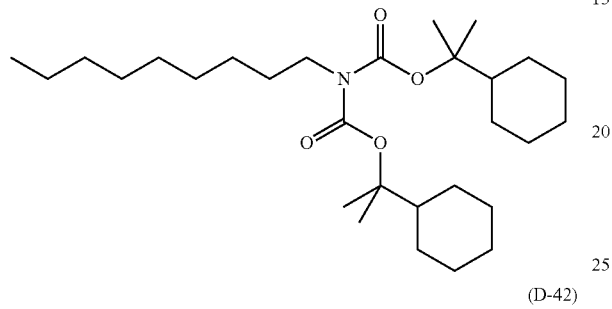
(D-42)
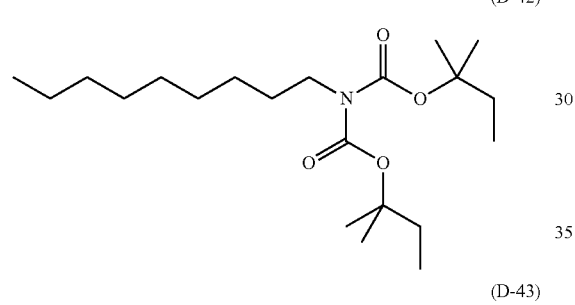
(D-43)
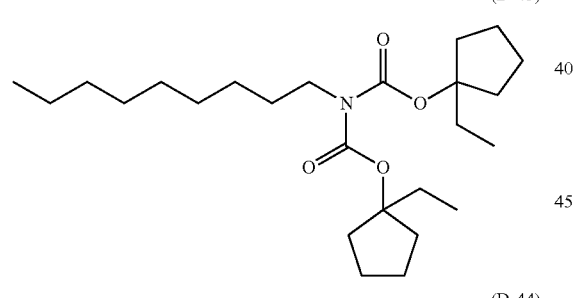
(D-44)
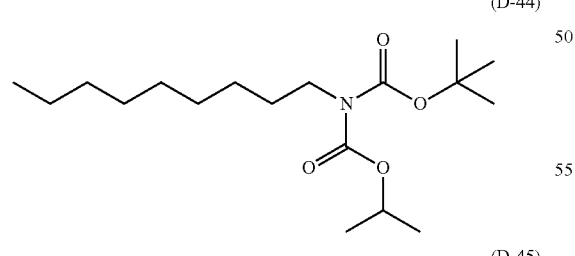
(D-45)
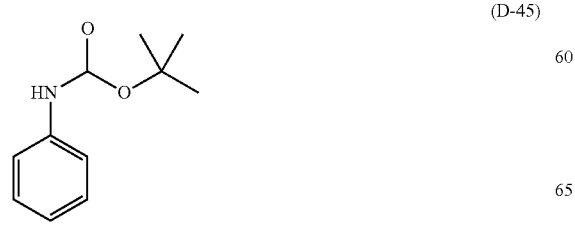
(D-46)
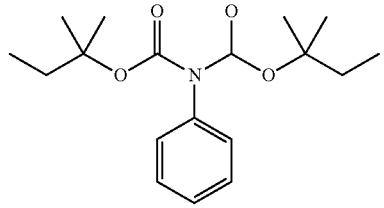
(D-47)
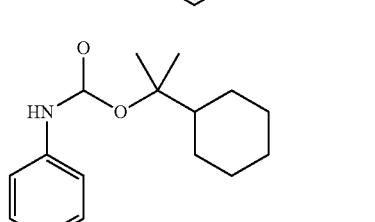
(D-48)
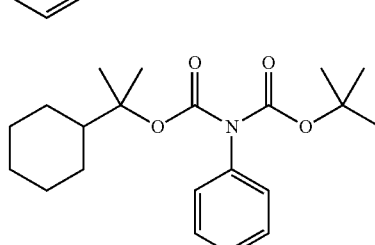
(D-49)
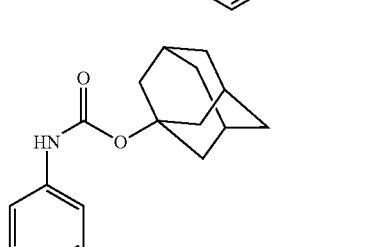
(D-50)
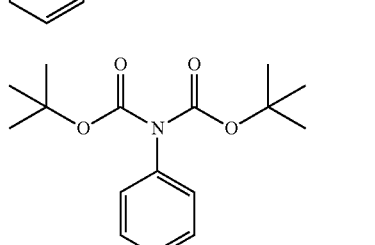
(D-51)
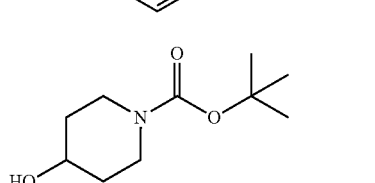
(D-52)
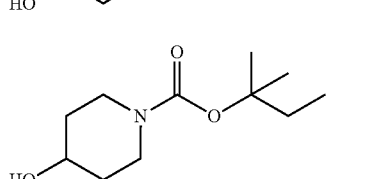
(D-53)
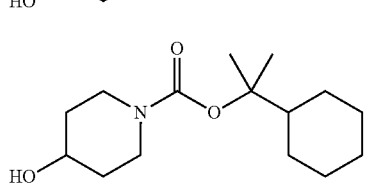

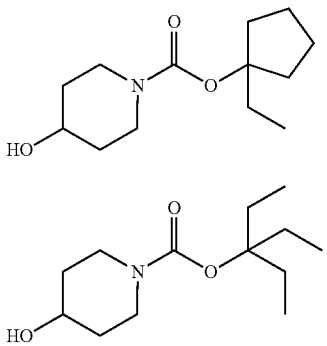

(D-54)

(D-55)

The compound represented by the general formula (F) to be used may be commercially available or may be synthesized, for example, from a commercially available amine by the method described in Protective Groups in Organic Synthesis, 4th edition, and the like. In particular, it may also be synthesized in accordance with, for example, a method described in JP2009-199021A as a general method.

Furthermore, as the basic compound (N'), a compound having an amine oxide structure may also be used. Specific examples of this compound include triethylaminepyridine N-oxide, tributylamine N-oxide, triethanolamine N-oxide, tris(methoxyethyl)amine N-oxide, tris(2-(methoxymethoxy) ethyl)amine oxide, 2,2',2"-nitrilotriethylpropionate N-oxide, N-2-(2-methoxyethoxy)methoxyethylmorpholine N-oxide, and other amine oxide compounds exemplified in JP2008-102383A.

The molecular weight of the basic compound (N') is preferably from 250 to 2000, and more preferably from 400 to 1000. From the viewpoints of further reduction of LWR and local pattern dimensional uniformity, the molecular weight of the basic compound is preferably 400 or more, more preferably 500 or more, and still more preferably 600 or more.

The basic compound (N') may be used in combination with the compound (N), or may be used singly or in combination of two or more kinds thereof.

The actinic ray-sensitive or radiation-sensitive resin composition in the invention may or may not contain the basic compound (N'), but in the case of the basic compound being contained, the amount of the basic compound (N') used is usually from 0.001% by mass to 10%% by mass by mass, and preferably from 0.01% by mass to 5% by mass, based on the solid content of the actinic ray-sensitive or radiation-sensitive resin composition.

[6] Surfactant (F)

The actinic ray-sensitive or radiation-sensitive resin composition in the invention may or may not further contain a surfactant, and in the case where it contains a surfactant, it is preferable to include any one fluorine-based and/or silicon-based surfactant (a fluorine-based surfactant, a silicon-based surfactant or a surfactant containing both fluorine atoms and silicon atoms) or two or more kinds thereof.

When the actinic ray-sensitive or radiation-sensitive resin composition in the invention contains the surfactant, a resist pattern with good sensitivity, resolution and adherence as well as few development defects can be obtained in using an exposure light source of 250 nm or less, and in particular, 220 nm or less.

Examples of the fluorine-based and/or silicon-based surfactant include the surfactants described in paragraph 0276 in the specification of US Patent App. No. 2008/0248425, such as EFtop EF301 and EF303 (manufactured by Shin-Akita Kasei K. K.); Florad FC430, 431, and 4430 (manufactured by Sumitomo 3M Inc.); Megafac F171, F173, F176, F189, F113, F110, F177, F120, and R08 (manufactured by Dainippon Ink & Chemicals, Inc.); Surflon S-382, SC101, 102, 103, 104, 105, and 106, and KH-20 (manufactured by Asahi Glass Co., Ltd.); Troysol S-366 (manufactured by Troy Chemical); GF-300, and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA); and FTX-204G, 208G, 218G, 230G, 204D, 208D, 212D, 218D, and 222D (manufactured by NEOS Co., Ltd.). In addition, a polysiloxane polymer KP-341 (manufactured by Shin-Etsu Chemical Co., Ltd.) may also be used as the silicon-based surfactant.

Furthermore, other than those known surfactants above, a surfactant using a polymer having a fluoro-aliphatic group derived from a fluoro-aliphatic compound which is produced by a telomerization method (also called a telomer method) or an oligomerization method (also called an oligomer method), may also be used. The fluoro-aliphatic compound can be synthesized by the method described in JP2002-90991A.

Examples of the above-described type of surfactant include Megafac F178, F-470, F-473, F-475, F-476, and F-472 (manufactured by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene))acrylate (or methacrylate), and a (poly(oxypropylene))acrylate (or methacrylate).

Moreover, a surfactant other than the fluorine-based and/or silicon-based surfactant, described in paragraph 0280 in the specification of US Patent App. No. 2008/0248425, may also be used in the invention.

These surfactants may be used singly or in combination of several kinds thereof.

In the case where the actinic ray-sensitive or radiation-sensitive resin composition contains the surfactant, the amount of the surfactant used is preferably from 0.0001% by mass to 2% by mass, and more preferably from 0.0005% by mass to 1% by mass, based on the total amount of the actinic ray-sensitive or radiation-sensitive resin composition (excluding the solvent).

On the other hand, by setting the addition amount of the surfactant to 10 ppm or less based on the total amount of the actinic ray-sensitive or radiation-sensitive resin composition (excluding the solvent), the hydrophobic resin is more unevenly distributed on the surface, so that the resist film surface can be made more hydrophobic and the followability of water at the immersion exposure can be enhanced.

[7] Other Additives (G)

The actinic ray-sensitive or radiation-sensitive resin composition in the invention may or may not contain onium carboxylate. Examples of the onium carboxylate include those described in paragraphs 0605 to 0606 in the specification of US Patent App. No. 2008/0187860.

The onium carboxylate can be synthesized by reacting sulfonium hydroxide, iodonium hydroxide, ammonium hydroxide, and carboxylic acid with silver oxide in a suitable solvent.

In the case where the actinic ray-sensitive or radiation-sensitive resin composition contains onium carboxylate, the content of the onium carboxylate is generally from 0.1% by mass to 20% by mass, preferably 0.5% by mass to 10% by mass, and still more preferably 1% by mass to 7% by mass, based on the total solid contents of the composition.

The actinic ray-sensitive or radiation-sensitive resin composition of the invention may further contain, for example, the acid generator as described in the composition (II) as described in detail later, a dye, a plasticizer, a photosensitizer, a light absorber, an alkali-soluble resin, a dissolution inhibitor, a compound for accelerating dissolution in a developer (for example, a phenol compound having a molecular weight of 1000 or less, or a carboxyl group-containing alicyclic or aliphatic compound), or the like, if desired.

The phenol compound having a molecular weight of 1000 or less can be easily synthesized by referring to the methods described, for example, in JP1991-122938A (JP-H04-122938A), JP1989-28531A (JP-H02-28531A), U.S. Pat. No. 4,916,210B, EP219294B, and the like.

Examples of the carboxyl group-containing alicyclic or aliphatic compound include a carboxylic acid derivative having a steroid structure, such as cholic acid, deoxycholic acid, and lithocholic acid, an adamantane carboxylic acid derivative, adamantane dicarboxylic acid, cyclohexane carboxylic acid, and cyclohexane dicarboxylic acid.

The actinic ray-sensitive or radiation-sensitive resin composition in the invention is preferably used in a film thickness of 30 to 250 nm, and more preferably from 30 to 200 nm, from the viewpoint of enhancing the resolving power. Such a film thickness can be obtained by setting the solid concentration in the actinic ray-sensitive or radiation-sensitive resin composition to an appropriate range, thereby imparting an appropriate viscosity and enhancing the coatability and the film-forming property.

The solid content concentration of the actinic ray-sensitive or radiation-sensitive resin composition for use in the invention is usually from 1.0% by mass to 10% by mass, preferably from 2.0% by mass to 5.7% by mass, and more preferably from 2.0% by mass to 5.3% by mass. When the solid content concentration is in this range, the resist solution can be uniformly applied on a substrate, and in addition, a resist pattern with excellent performance in terms of line edge roughness (LWR) can be formed. The reasons therefor are not clearly known, but it is considered that by setting the solid content concentration to 10% by mass or less, and preferably 5.7% by mass or less, the materials, particularly the photo-acid generator, in the resist solution are prevented from aggregation, and as a result, a uniform resist film can be formed.

The solid content concentration is a mass percentage of the mass of the resist components excluding the solvents, based on the total mass of the actinic ray-sensitive or radiation-sensitive resin composition.

The actinic ray-sensitive or radiation-sensitive resin composition of the invention is used, for example, after the above components are dissolved in a predetermined organic solvent, filtered using a filter, and then applied onto a predetermined support (substrate). The filter is preferably made of polytetrafluoroethylene, polyethylene, or nylon having a pore size of 0.1 μm or less, more preferably 0.05 μm or less, and still more preferably 0.03 μm or less. In the filtration using a filter, for example, cyclic filtration may be carried out as described in JP2002-62667A or filtration with serial or parallel connection of plural kinds of filters may be carried out. Further, the composition may be filtered plural times. In addition before or after the filtration using a filter, the composition may be subjected to a deaeration treatment or the like.

The invention relates to a method for producing an electronic device, including the pattern forming method of the invention as described above, and an electronic device produced by the preparation method.

The electronic device of the invention is suitably mounted on an electric/electronic device (for example, domestic appliances, OA medium-related devices, optical devices, and communication devices).

EXAMPLES

Synthetic Example (Synthesis of Resin A-1)

102.3 parts by mass of cyclohexanone was heated to 80° C. under a nitrogen gas flow. A mixed solution of 22.2 parts by mass of monomers represented by the following structural formula M-1, 22.8 parts by mass of monomers represented by the following structural formula M-2, 6.6 parts by mass of monomers represented by the following structural formula M-3, 189.9 parts by mass of cyclohexanone, and 2.40 parts by mass of dimethyl 2,2'-azobisisobutyrate [V-601, manufactured by Wako Pure Chemical Industries, Ltd.] was added dropwise thereto over 5 hours while stirring the solution. After completion of dropwise addition, the obtained solution was stirred furthermore at 80° C. for 2 hours. The reaction liquid was left to be cooled, then reprecipitated with a large amount of hexane/ethyl acetate (mass ratio of 9:1), and subsequently filtered. The obtained solid was dried in vacuo to obtain 41.1 parts by mass of a resin (A–1) of the invention.

[Chem. 84]

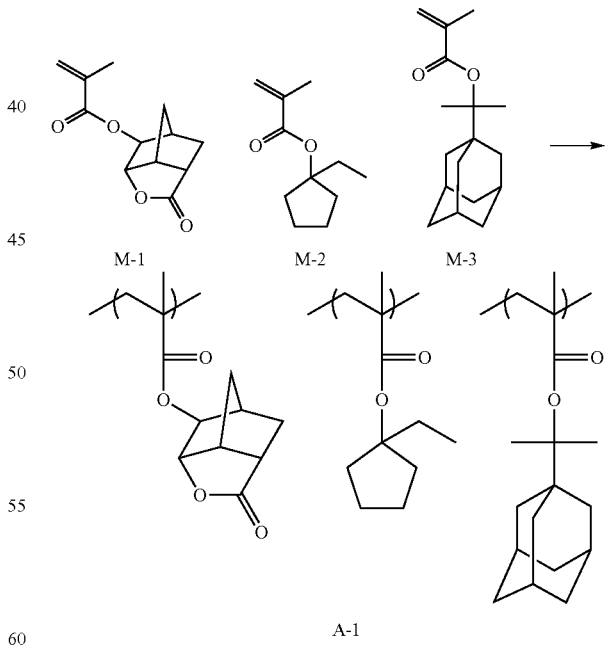

The weight average molecular weight (Mw: in terms of polystyrene) of the obtained resin determined by means of GPC (carrier: tetrahydrofuran (THF)) was as follows: Mw=9500 and dispersity, Mw/Mn=1.60. The compositional ratio (molar ratio) measured by means of $^{13}$C-NMR was 40/50/10.

<Resin (A)>
Hereinafter, in the same manner, resins A-2 to A-20 were synthesized. Then, the compositional ratios (molar ratios) of the repeating units (corresponding to the respective repeating units starting from the left), the weight average molecular weights (Mw), and the dispersity in the resins A-2 to A-20 as well as the resin A-1 are shown below.
[Chem. 85]
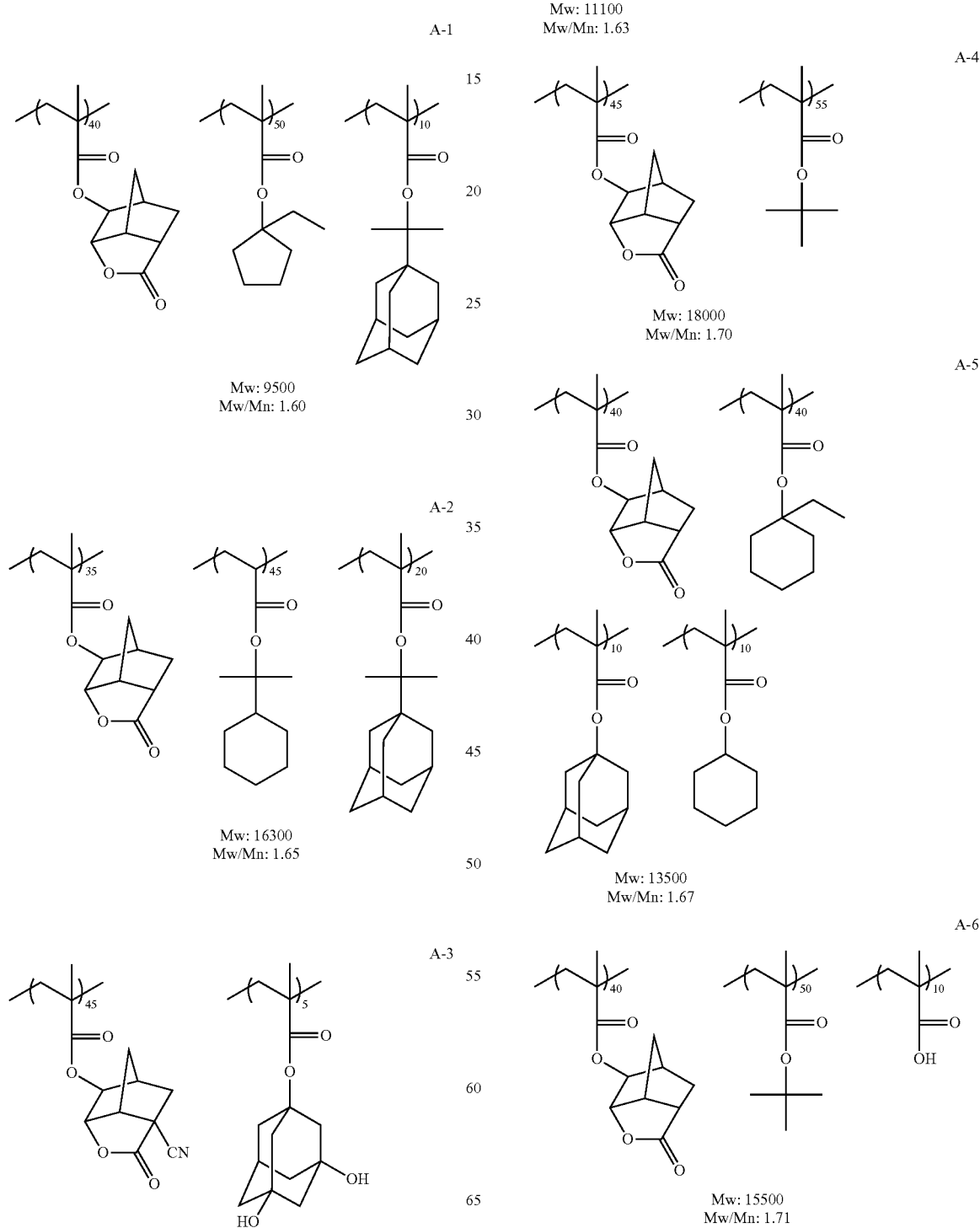

-continued
[Chem. 86]
A-7
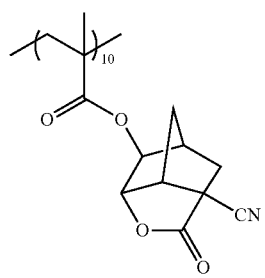
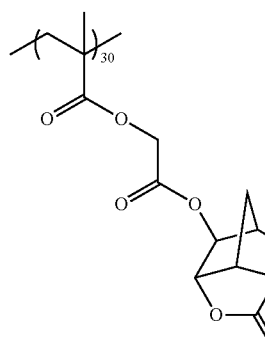
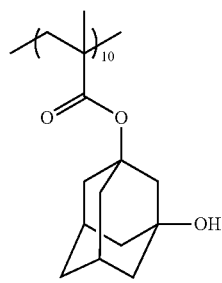
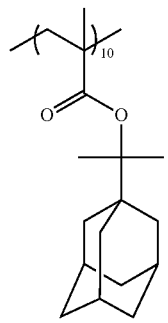
Mw: 10900
Mw/Mn: 1.65
A-8
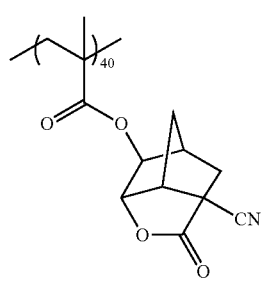
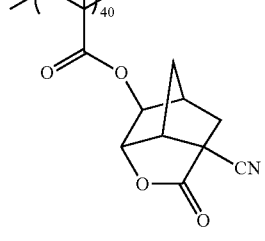
-continued
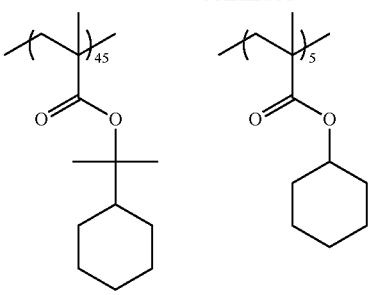
Mw: 10200
Mw/Mn: 1.66
A-9
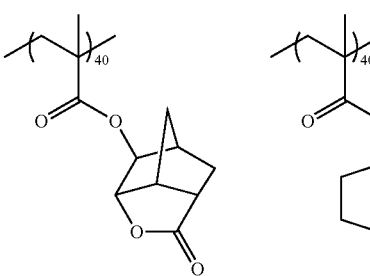
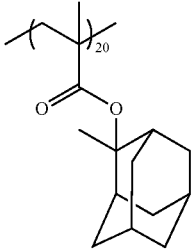
Mw: 10300
Mw/Mn: 1.71
A-10
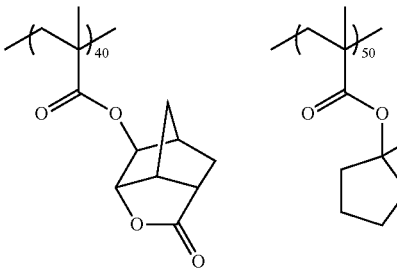
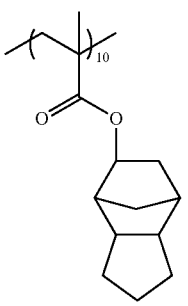
Mw: 9500
Mw/Mn: 1.66

A-11
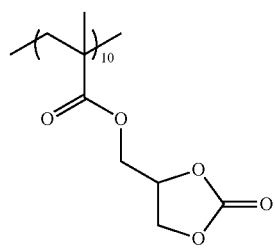
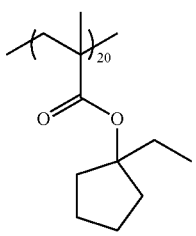
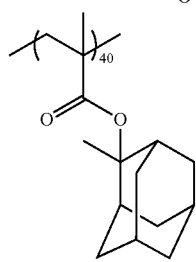
Mw: 7100
Mw/Mn: 1.62
A-12
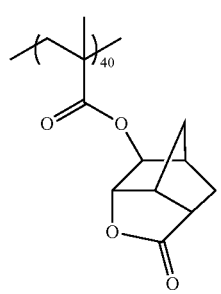
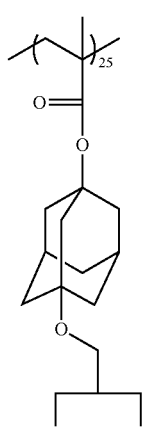
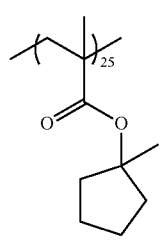
Mw: 6800
Mw/Mn: 1.65
[Chem. 87]
A-13
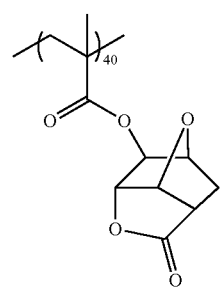
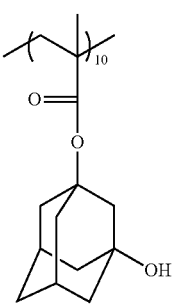
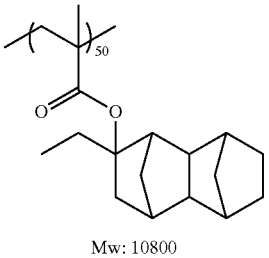
Mw: 10800
Mw/Mn: 1.71
A-14
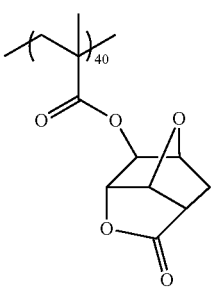
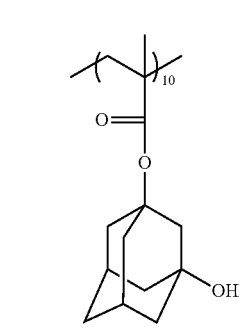
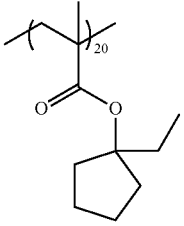
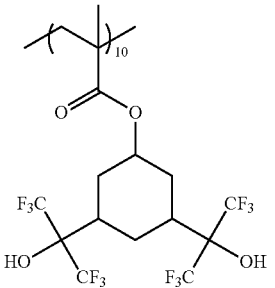
Mw: 9600
Mw/Mn: 1.72
A-15
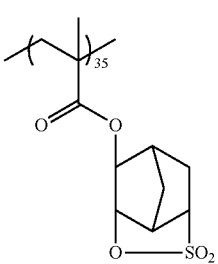

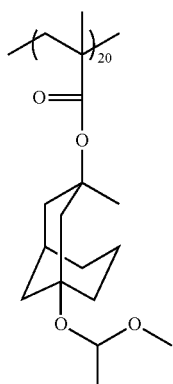
Mw: 10500
Mw/Mn: 1.62
A-16
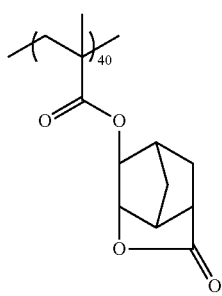
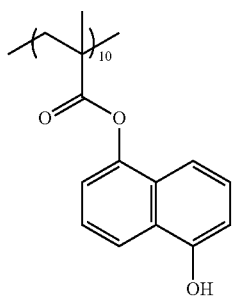
Mw: 8900
Mw/Mn: 1.67
A-17
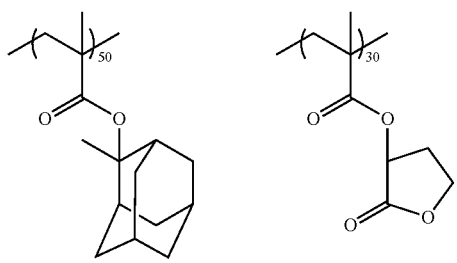
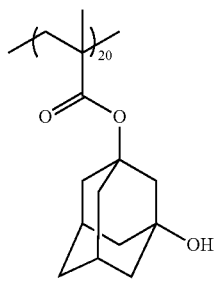
Mw: 11000
Mw/Mn: 1.68
A-18
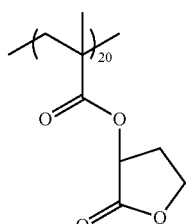
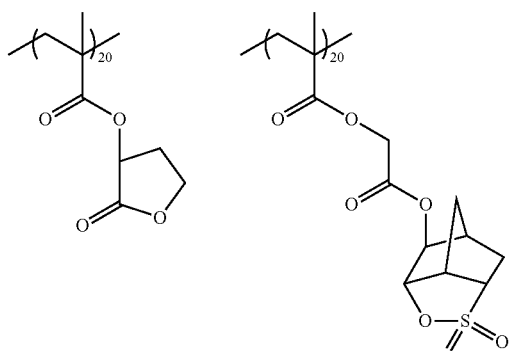
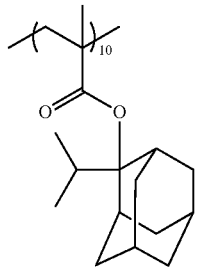
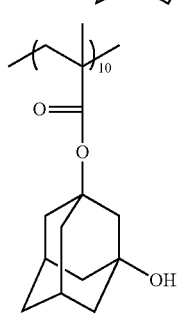
Mw: 11200
Mw/Mn: 1.65
[Chem. 88]
A-19
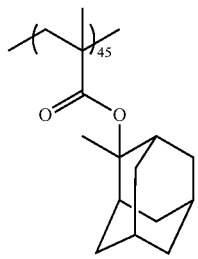
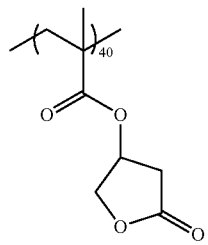

-continued

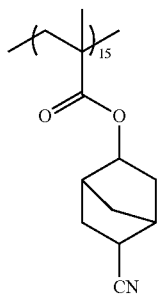

Mw: 9800
Mw/Mn: 1.70

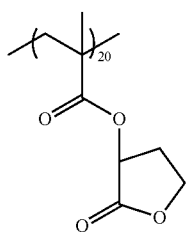

A-20

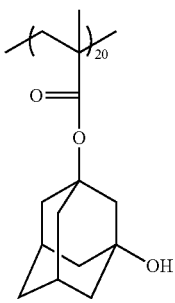

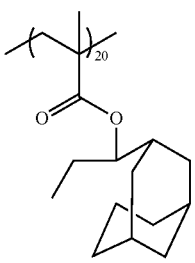

Mw: 9500
Mw:/Mn: 1.68

<Hydrophobic Resin>

Hereinafter, in the same manner, resins D-1 to D-13 were synthesized. The compositional ratios (molar ratios) of the repeating units (corresponding to the respective repeating units starting from the left), the weight average molecular weights (Mw), and the dispersity in the resins D-1 to D-13 are shown below.

[Chem.89]

D-1

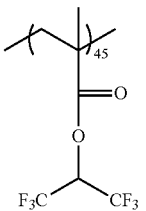 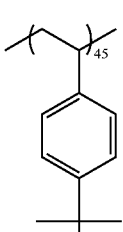 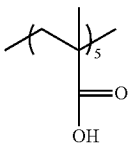

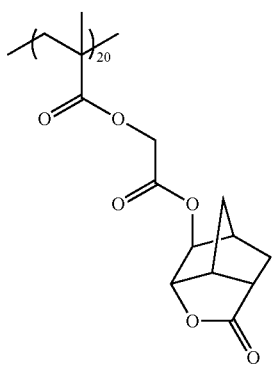

Mw: 7000
Mw/Mn: 1.66

D-2

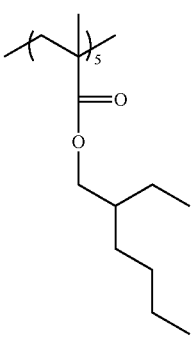

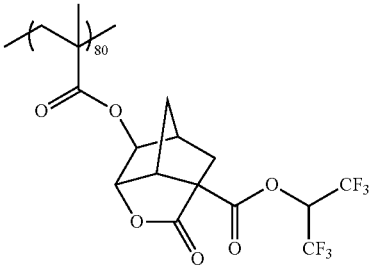

Mw: 12000
Mw/Mn: 1.71

D-3

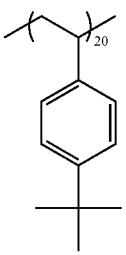

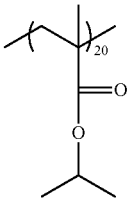

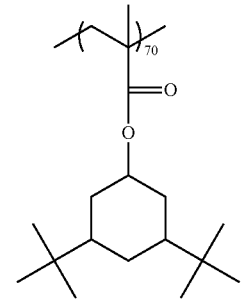

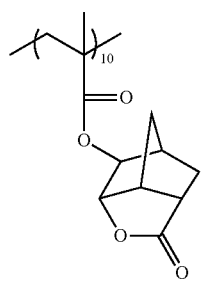
Mw: 8900
Mw/Mn: 1.62
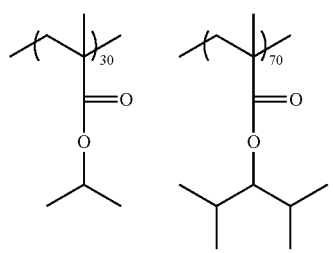
Mw: 22000
Mw/Mn: 1.67
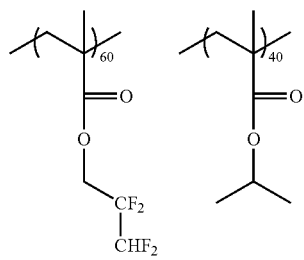
Mw: 14000
Mw/Mn: 1.61
[Chem. 90]
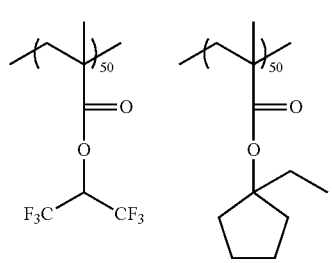
Mw: 9200
Mw/Mn: 1.60
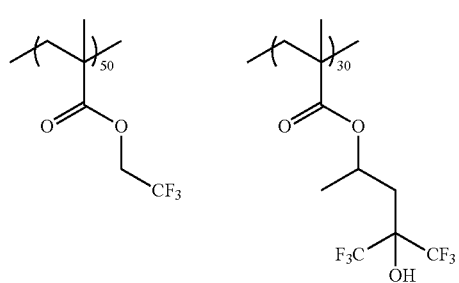
D-4
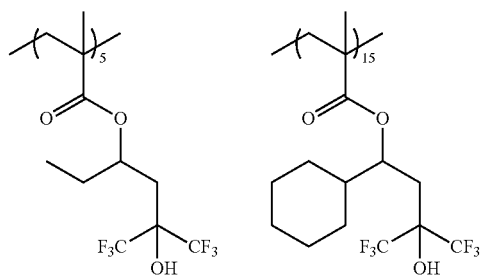
Mw: 9500
Mw/Mn: 1.72
D-5
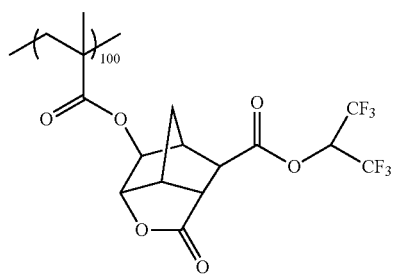
Mw: 12000
Mw/Mn: 1.73
D-6
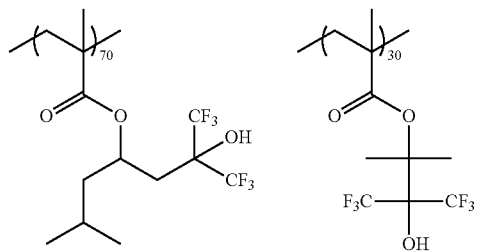
Mw: 9900
Mw/Mn: 1.65
D-7
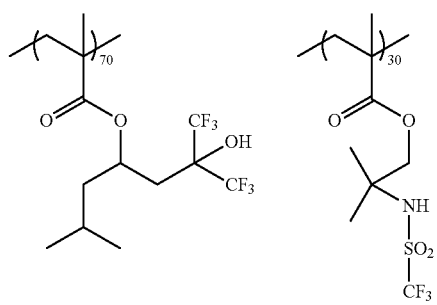
Mw: 10300
Mw/Mn: 1.60
D-8
D-9
D-10

-continued
D-11
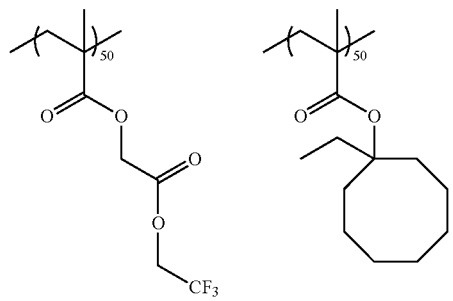
Mw: 11300
Mw/Mn: 1.68
D-12
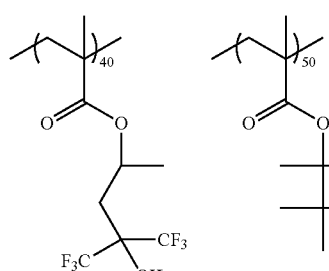
Mw: 9000
Mw/Mn: 1.65
D-13
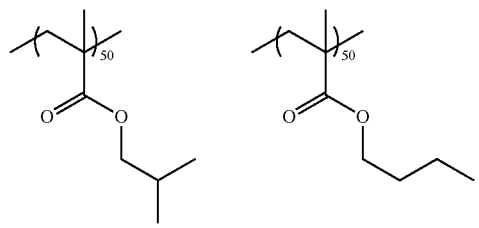
Mw: 13000
Mw/Mn: 1.65
<Acid Generator>
As the acid generator, the following compounds were used.
[Chem. 92]
PAG-1
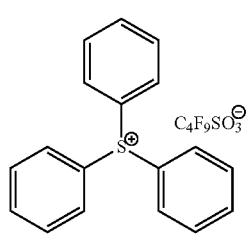
-continued
PAG-2
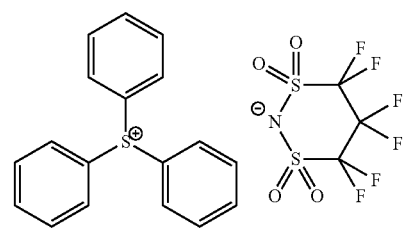
PAG-3
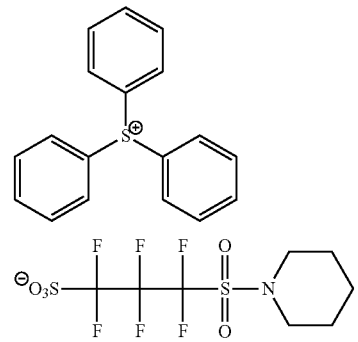
PAG-4
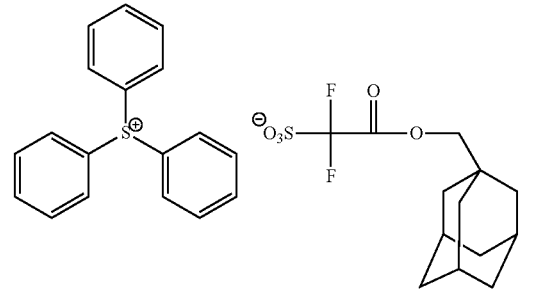
PAG-5
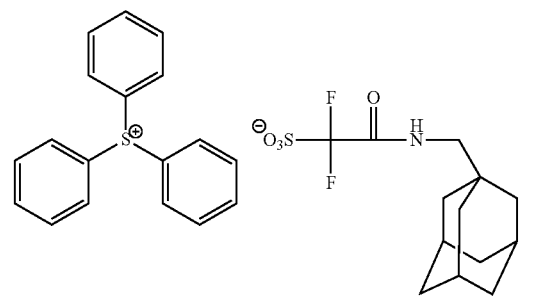
PAG-6
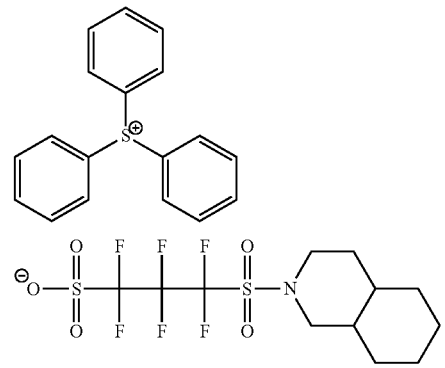

-continued
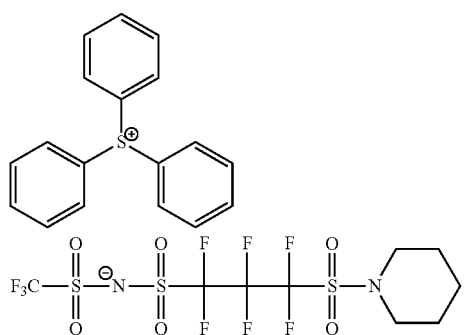
PAG-7
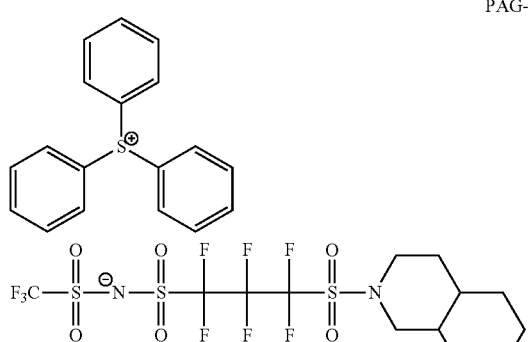
PAG-8
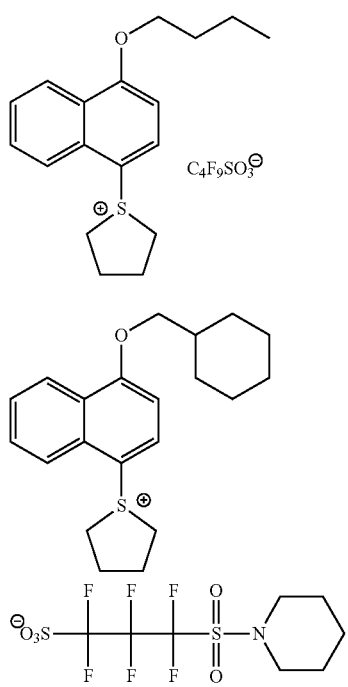
PAG-9
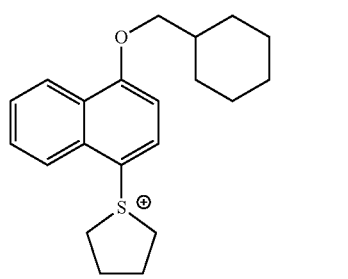
PAG-10
-continued
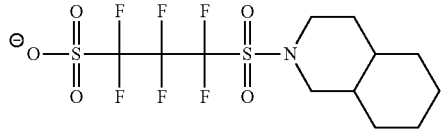
PAG-11
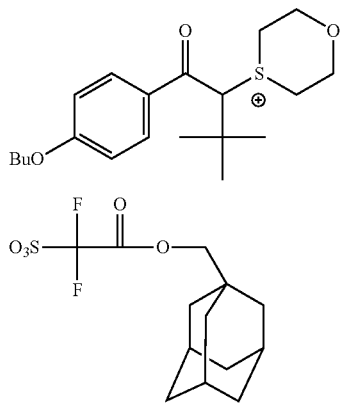
PAG-12
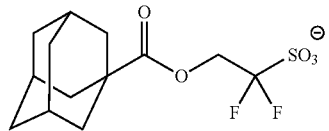
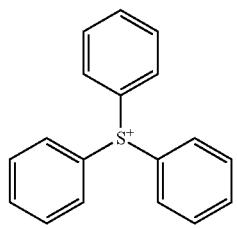
PAG-13
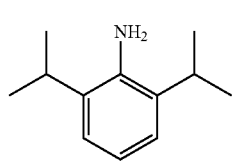
<Basic Compound (N) Capable of Decreasing Basicity by Irradiation with Actinic Rays or Radiation, and Basic Compound (N')>
As a basic compound capable of decreasing the basicity by irradiation with actinic rays or radiation, or a basic compound, the following compounds were used.
[Chem. 93]
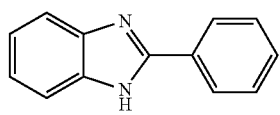
C-1
C-2

-continued

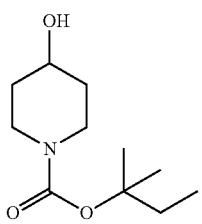
C-3
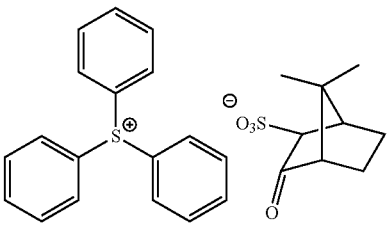

C-4
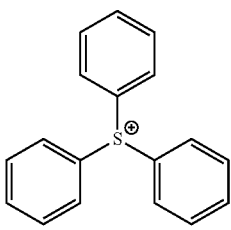

C-5
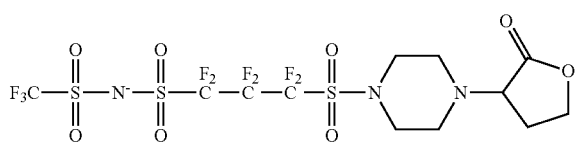
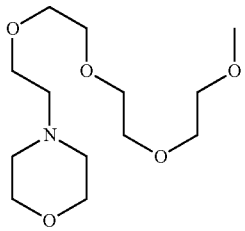

C-6

C-7: Tri-n-pentylamine

<Surfactant>

As the surfactant, the following surfactants were used.
W-1: Megafac F176 (manufactured by Dainippon Ink & Chemicals, Inc.; fluorine-based)
W-2: Megafac R08 (manufactured by Dainippon Ink & Chemicals, Inc.; fluorine-based and silicon-based)
W-3: Polysiloxane polymer KP-341 (manufactured by Shin-Etsu Chemical Co., Ltd.; silicone-based)
W-4: Troysol S-366 (manufactured by Troy Chemical)
W-5: KH-20 (manufactured by Asahi Glass Co., Ltd.)
W-6: PolyFox PF-6320 (manufactured by OMNOVA Solutions Inc.; fluorine-based)

<Solvent>

As the solvent, the following solvents were used.
SL-1: Propylene glycol monomethyl ether acetate (PGMEA)
SL-2: Propylene glycol monomethyl ether propionate
SL-3: 2-Heptanone
SL-4: Ethyl lactate
SL-5: Propylene glycol monomethyl ether (PGME)
SL-6: Cyclohexanone
SL-7: γ-Butyrol lactone
SL-8: Propylene carbonate Examples 1 to 40 and Comparative Examples 1 and 2

Method for Forming Resist Pattern (Preparation of Resist Composition)

The components shown in Table 1 below were dissolved in the solvents shown in the same table to 3.5% by mass in terms of a solid content, and the respective solutions were filtered through a polyethylene filter having a pore size of 0.03 μm, thereby producing actinic ray-sensitive or radiation-sensitive resin compositions (resist compositions) (I-1) to (I-21).

TABLE 1

| Composition | Resin (A) | Acid generator (B) | (g) | Compound (N) or Compound (N') | (g) | Resin (D) | (g) | Solvent | Mass ratio | Surfactant | (g) |
|---|---|---|---|---|---|---|---|---|---|---|---|
| I-1 | A-1 | 10 PAG-2 | 0.80 | C-1 | 0.14 | D-1 | 0.6 | SL-1/SL-5 | 80/20 | W-1 | 0.003 |
| I-2 | A-2 | 10 PAG-3 | 0.90 | C-2 | 0.14 | D-2 | 2.0 | SL-1 | 100 | W-2 | 0.003 |
| I-3 | A-3 | 10 PAG-4 | 0.85 | C-3 | 0.14 | D-3 | 4.0 | SL-1/SL-5 | 60/40 | W-3 | 0.003 |
| I-4 | A-4 | 10 PAG-5 | 0.45 | C-4 | 0.45 | D-4 | 4.0 | SL-1/SL-5 | 80/20 | None | — |
| I-5 | A-5 | 10 PAG-6 | 0.94 | C-5 | 0.11 | D-5 | 5.0 | SL-1/SL-2 | 90/10 | W-2 | 0.003 |
| I-6 | A-6 | 10 PAG-7 | 1.10 | C-6 | 0.30 | D-6 | 1.5 | SL-1/SL-5/SL-7 | 92/5/3 | W-1 | 0.003 |
| I-7 | A-7 | 10 PAG-8 | 1.15 | C-7 | 0.15 | D-7 | 1.1 | SL-5/SL-6 | 30/70 | None | — |
| I-8 | A-8 | 10 PAG-2/PAG-3 | 0.40/0.40 | C-3 | 0.16 | D-8 | 1.3 | SL-1/SL-7 | 95/5 | W-1 | 0.003 |
| I-9 | A-9 | 10 PAG-1/PAG-9 | 0.20/1.00 | C-3 | 0.15 | D-9 | 1.4 | SL-1/SL-6/SL-7 | 75/20/5 | W-5 | 0.003 |
| I-10 | A-10 | 10 PAG-3/PAG-10 | 0.30/1.00 | C-3 | 0.17 | D-10 | 1.0 | SL-1/SL-5 | 60/40 | W-4 | 0.003 |
| I-11 | A-11 | 10 PAG-6/PAG-11 | 0.15/1.00 | C-3 | 0.14 | D-11 | 1.5 | SL-1/SL-3 | 60/40 | W-1 | 0.003 |
| I-12 | A-12 | 10 PAG-6/PAG-12 | 0.25/1.00 | C-3 | 0.15 | D-12 | 1.8 | SL-1/SL-5 | 70/30 | W-5 | 0.003 |
| I-13 | A-13 | 10 PAG-3 | 0.50 | C-3/C-4 | 0.06/0.25 | D-13 | 2.0 | SL-1/SL-5 | 70/30 | W-1 | 0.001 |
| I-14 | A-14 | 10 PAG-4 | 0.78 | C-2 | 0.13 | D-1 | 1.0 | SL-1/SL-8 | 95/5 | None | — |
| I-15 | A-15 | 10 PAG-5 | 1.20 | C-2 | 0.15 | D-2 | 1.5 | SL-1 | 100 | W-1 | 0.003 |
| I-16 | A-16 | 10 PAG-6 | 1.50 | C-2 | 0.17 | D-3 | 2.0 | SL-1/SL-5 | 70/30 | W-6 | 0.003 |
| I-17 | A-17 | 10 PAG-7 | 1.10 | C-2 | 0.14 | D-4 | 2.0 | SL-1/SL-4 | 80/20 | W-1 | 0.003 |

TABLE 1-continued

| Composition | Resin (A) | Acid generator (B) | (g) | Compound (N) or Compound (N') | (g) | Resin (D) | (g) Solvent | Mass ratio | Surfactant | (g) |
|---|---|---|---|---|---|---|---|---|---|---|
| I-18 | A-18 | 10 PAG-13 | 0.88 | C-2 | 0.16 | D-5 | 2.0 SL-1/SL-5 | 60/40 | None | — |
| I-19 | A-19 | 10 PAG-3 | 0.90 | C-2 | 0.15 | D-6 | 1.0 SL-1 | 100 | W-3 | 0.003 |
| I-20 | A-20 | 10 PAG-4 | 0.85 | C-2 | 0.13 | D-7 | 2.0 SL-1/SL-5 | 60/40 | W-1 | 0.003 |
| I-21 | A-1/A-2 | 5/5 PAG-5 | 0.90 | C-2 | 0.14 | D-8 | 2.0 SL-1/SL-5 | 70/30 | W-4 | 0.003 |

(Formation of Resist Film)

SOC NCA9053EH (manufactured by Nissan Chemical Industries, Ltd.) was coated on a silicon wafer and baked at 240° C. for 60 seconds to form an SOC (Spin on Carbon) film having a film thickness of 200 nm. A silicon hard mask, NCH7433 (manufactured by Nissan Chemical Industries, Ltd.), was coated thereon and baked at 200° C. for 60 seconds to form a silicon hard mask film having a film thickness of 35 nm. The actinic ray-sensitive or radiation-sensitive resin compositions (I-1) to (I-21) were coated thereon and prebaked (PB) at 100° C. for 60 seconds to form a resist film having a film thickness of 80 nm.

(Formation of Resist Pattern)

The resist film was subjected to pattern exposure through a halftone mask of chromium with a pitch of 100 nm and line width of 60 nm, using an ArF excimer laser liquid immersion scanner (manufactured by ASML, XT1700i, NA 1.20, Dipole, outer sigma 0.980, inner sigma 0.89, and Y deflection). As the liquid for liquid immersion, ultrapure water was used. Then, the resist film was heated (Post Exposure Bake: PEB) at 105° C. for 60 seconds. Subsequently, the resist film was developed using the developer shown in Tables 2 and 3 by paddling for 30 seconds, and rinsed with a rinsing liquid shown in Tables 2 and 3 for 30 seconds (provided that, in the example in which there was no description of a rinsing liquid in the "Step of forming pattern" in Tables 2 and 3, the rinsing step was not carried out). Subsequently, the wafer was rotated at a rotation speed of 2000 rpm for 30 seconds, and then heated (Post Bake; PB) for 60 seconds at a temperature described in the section of "Post-development bake" in Tables 2 and 3 to obtain a pattern with 40 nm line/60 nm space.

However, in Comparative Examples 1 and 2, the pattern exposure was carried out through a halftone mask of chromium with a pitch of 100 nm and line width of 40 nm, a 2.38%-by-mass aqueous tetramethylammonium hydroxide (TMAH) solution was used as a developer, and pure water was used as a rinsing liquid to form a pattern with 40 nm line/60 nm space.

(Formation of Silicon Oxide Film by CVD Method)

A silicon oxide film having a thickness of 20 nm was formed on the periphery of the obtained line/space pattern using a CVD device under the conditions of substrate temperatures of 100° C. and 200° C., respectively.

(Evaluation of Resist Pattern)

With each of the obtained patterns, the presence or absence of a fitting shape, a resist profile shape, a line width roughness (LWR), the heat resistance at 200° C., a change in the resist shapes after carrying out CVD, and the verticality of the silicon oxide film after carrying out CVD were evaluated by the following methods.

The results at a substrate temperature of 100° C. during CVD are shown in Table 2.

The results at a substrate temperature of 200° C. during CVD are shown in Table 3.

<Method for Evaluating Presence or Absence of Fitting Shape>

The cross-sectional shape of the obtained line pattern was observed by a scanning electron microscope (S4800, manufactured by Hitachi High Technologies Corp.). The case where the bottom portion of the line pattern does not have a fitting shape was evaluated as A, and the case where the bottom portion of the line pattern has a fitting shape was evaluated as B.

<Method for Evaluating LWR>

The obtained line pattern was observed by a metrological scanning electron microscope (S9380II, manufactured by Hitachi, Ltd.), and in a range of 2 μm in the length direction of the line pattern, the distance from an observed edge to a standard line where the edge should be present was measured at 50 positions, and the standard deviations were determined to calculate 3τ. A smaller value indicates better performance.

<Method for Evaluating Profile Shape>

The cross-sectional shape of the obtained line pattern was observed by a scanning electron microscope (S4800, manufactured by Hitachi High Technologies Corp.), and evaluated according to the following evaluation criteria.

A: Rectangular

B: Generally rectangular, but slightly reversely tapered shape

C: Generally rectangular, but slightly tapered shape

D: Round-top shape

E: Collapsed shape

<Method for Evaluating Heat Resistance>

Using the wafer after post-development baking, the wafer was heated at 200° C. for 5 minutes and the line width before and after heating was observed by a metrological scanning electron microscope (S9380II, manufactured by Hitachi, Ltd.), thereby calculating [line width (nm) before heating]−[line width (nm) after heating]=[variation (nm) in CD at 200° C.]. A smaller value indicates better performance.

<Method for Evaluating Change in Resist Shapes after CVD>

The line pattern after CVD was fractured, observed by stage cross-sectional SEM (S4800, manufactured by Hitachi, Ltd.), and compared with the profile shape before CVD. For the comparison, the line width of the lines in the resist pattern at a position of 60 nm height from the substrate surface was measured and evaluated by the following evaluation criteria.

A: The change is within 2 nm and there is almost no change in the shapes.

B: The change is more than 2 nm and is equal to or less than 5 nm, and there is a slight change in the shapes.

C: The change is more than 5 nm and there is a large change in the shapes.

D: There is a large change in the shapes and the shape of the top is round.

<Method for Evaluating Verticality of Silicon Oxide Film after CVD>

The cross-sectional shape of the line pattern, with which a silicon oxide film could be formed by CVD, was observed by a scanning electron microscope (S4800, manufactured by Hitachi, Ltd.), and the rising angle of the silicon oxide film from the substrate was observed and evaluated by the following evaluation criteria.

A: The rising angle is 85 degrees or more
B: The rising angle is 80 degrees or more and less than 85 degrees
C: The rising angle is less than 80 degrees
D: The top is completely round and thus cannot act as a spacer.

<Rinsing Liquid>
As a rinsing liquid, the following rinsing liquid were used.
SR-1: 4-Methyl-2-pentanol
SR-2: 1-Hexanol As clearly shown from the results shown in Table 2, in Comparative Example 1 using a positive tone pattern form-

TABLE 2

| | | Step of forming pattern | | | After forming pattern | | | Evaluation of heat resistance | After forming SiO$_2$ by CVD (100° C.) | | |
|---|---|---|---|---|---|---|---|---|---|---|---|
| Example | Composition | Developer | Rinsing liquid | Post-development bake (° C.) | Fitting shape | Profile shape | LWR (nm) | Variation in CD at 200° C. (nm) | Change in resist shape | Verticality of SiO$_2$ film | LWR (nm) after CVD |
| Example 1 | I-1 | SG-1 | SR-1 | 200 | A | B | 3.4 | 1 | A | A | 4.4 |
| Example 2 | I-2 | SG-2 | SR-1 | 200 | A | A | 2.8 | 2 | A | A | 3.5 |
| Example 3 | I-3 | SG-3 | SR-1 | 250 | A | B | 3.0 | 2 | A | A | 3.7 |
| Example 4 | I-4 | SG-1 | None | 200 | A | A | 2.6 | 1 | A | A | 3.5 |
| Example 5 | I-5 | SG-1 | SR-1 | 200 | A | A | 2.5 | 1 | A | A | 3.3 |
| Example 6 | I-6 | SG-1 | SR-1 | 200 | A | B | 3.4 | 2 | A | A | 4.1 |
| Example 7 | I-7 | SG-1 | SR-2 | 200 | A | C | 5.1 | 3 | B | A | 5.2 |
| Example 8 | I-8 | SG-2 | SR-1 | 200 | A | C | 4.0 | 5 | B | B | 3.8 |
| Example 9 | I-9 | SG-1 | SR-1 | 250 | A | B | 3.9 | 1 | A | A | 5.0 |
| Example 10 | I-10 | SG-1 | None | 200 | A | B | 3.3 | 2 | A | A | 4.0 |
| Example 11 | I-11 | SG-1 | SR-1 | 200 | A | A | 2.9 | 1 | A | A | 3.8 |
| Example 12 | I-12 | SG-1 | SR-1 | 200 | A | B | 3.0 | 2 | A | A | 3.7 |
| Example 13 | I-13 | SG-1 | SR-1 | 200 | A | B | 3.6 | 4 | B | B | 3.7 |
| Example 14 | I-14 | SG-3 | None | 200 | A | B | 3.3 | 3 | B | A | 3.7 |
| Example 15 | I-15 | SG-1 | None | 200 | A | B | 3.3 | 5 | B | B | 3.3 |
| Example 16 | I-16 | SG-1 | None | 200 | A | B | 3.3 | 6 | B | B | 3.1 |
| Example 17 | I-17 | SG-2 | SR-1 | 250 | A | C | 4.1 | 6 | B | B | 3.6 |
| Example 18 | I-18 | SG-1 | SR-1 | 200 | A | B | 3.3 | 4 | B | B | 3.5 |
| Example 19 | I-19 | SG-1 | None | 200 | A | B | 3.3 | 4 | B | B | 3.5 |
| Example 20 | I-20 | SG-1 | SR-1 | 250 | A | B | 3.3 | 3 | B | A | 3.7 |
| Example 21 | I-21 | SG-1 | SR-1 | 200 | A | A | 2.6 | 1 | A | A | 3.5 |
| Example 22 | I-1 | SG-1 | SR-1 | 100 | A | B | 3.5 | 2 | A | A | 4.8 |
| Example 23 | I-4 | SG-1 | SR-1 | 150 | A | A | 2.6 | 2 | A | A | 3.7 |
| Example 24 | I-4 | SG-1 | None | None | A | A | 2.6 | 3 | A | A | 3.8 |
| Example 25 | I-3 | SG-1 | None | 100 | A | B | 3.0 | 3 | B | A | 4.1 |
| Example 26 | I-3 | SG-3 | SR-1 | 150 | A | B | 3.0 | 2 | B | B | 4.2 |
| Example 27 | I-9 | SG-1 | None | 100 | A | B | 3.9 | 2 | A | A | 5.1 |
| Example 28 | I-9 | SG-3 | SR-1 | None | A | B | 3.9 | 3 | B | A | 5.1 |
| Example 29 | I-17 | SG-1 | SR-1 | 100 | A | C | 4.1 | 7 | B | B | 4.8 |
| Comparative Example 1 | I-1 | 2.38 wt % TMAHaq | Pure water | 100 | B | D | 3.5 | >10 | C | C | 6.4 |

TABLE 3

| | | Step of forming pattern | | | After forming SiO$_2$ by CVD (100° C.) | | |
|---|---|---|---|---|---|---|---|
| Example | Composition | Developer | Rinsing liquid | Post-development baking (° C.) | Change in resist shape | Verticality of SiO$_2$ film | LWR (nm) after CVD |
| Example 30 | I-1 | SG-1 | SR-1 | 200 | A | A | 4.7 |
| Example 31 | I-3 | SG-3 | SR-1 | 250 | A | A | 4.0 |
| Example 32 | I-4 | SG-1 | None | 200 | A | A | 3.8 |
| Example 33 | I-9 | SG-1 | SR-1 | 250 | A | A | 5.2 |
| Example 34 | I-1 | SG-1 | SR-1 | 100 | A | A | 5.0 |
| Example 35 | I-4 | SG-1 | SR-1 | 150 | A | A | 4.1 |
| Example 36 | I-4 | SG-1 | None | None | B | B | 4.0 |
| Example 37 | I-3 | SG-1 | None | 100 | B | A | 4.5 |
| Example 38 | I-3 | SG-3 | SR-1 | 150 | B | B | 5.2 |
| Example 39 | I-9 | SG-1 | None | 100 | B | A | 5.3 |
| Example 40 | I-9 | SG-3 | SR-1 | None | B | B | 5.6 |
| Comparative Example 2 | I-1 | 2.38 wt % TMAHaq | Pure water | 100 | D | D | 10.4 |

<Developer>
As a developer, the following developers were used.
SG-1: Butyl acetate
SG-2: Methyl amyl ketone
SG-3: Ethyl 3-ethoxypropionate ing method, since there is a fitting shape and the heat resistance is insufficient in the shapes after forming a pattern, the change in the shapes in CVD is large and the verticality of the silicon oxide film which is important in the spacer process cannot be ensured.

However, according to Examples 1 to 29, since there is no fitting shape after forming a pattern, the heat resistance is high, and the change in the shapes in CVD is small, the verticality of the silicon oxide film which is important in the spacer process can be ensured.

In addition, from the results shown in Table 3, it could be found that in the case where the substrate temperature during CVD is 100° C. (Table 2), a silicon oxide film as a spacer could be barely obtained in Comparative Example 1, but as a result of the substrate temperature during CVD being 200° C., in Comparative Example 2 using a positive tone pattern forming method, the top turned completely round, and thus modified to be incapable of acting as a spacer. On the other hand, according to Examples 30 to 40, it could be found that in the high-temperature CVD, the verticability of a silicon oxide film which is important in the spacer process can be ensured.

As described above, according to the invention, even when a film is deposited on the periphery of the resist pattern by a high-temperature CVD method, it is hard to damage high rectangularity in the cross-sectional shape of the resist pattern by heat during deposition of the film and as a result, an increase in the process cost can be suppressed due to, for example, improvement of the film-forming stability of the silicon oxide film.

Furthermore, according to the invention, in lithography by a spacer method as described above, it is possible to form a spacer having high rectangularity and roughness performance, and further, it is also possible to form a pattern having high rectangularity and roughness performance by subjecting a substrate to be processed to an etching treatment using a spacer as a mask.

What is claimed is:

1. A pattern forming method comprising:
   (i) forming a first film on a substrate using an actinic ray-sensitive or radiation-sensitive resin composition including a resin (A) capable of increasing the polarity by the action of an acid to decrease the solubility in a developer including an organic solvent,
   (ii) exposing the first film,
   (iii) developing the exposed first film using a developer to form a negative tone pattern, the developer including an organic solvent in an amount greater than or equal to 90% by mass and less than or equal to 100% by mass based on the total amount of the developer,
   (iv) forming a second film on the substrate by a chemical vapor deposition method (CVD) so as to cover the periphery of the negative tone pattern, the chemical vapor deposition method (CVD) being Low-Pressure Chemical Vapor Deposition (LPCVD), Plasma-Exciton Chemical Vapor Deposition (PECVD), or Atomic Layer Deposition (ALD),
   (v) heating the negative tone pattern, after (iii) developing the exposed first film using a developer including an organic solvent to form a negative tone pattern and before (iv) forming the second film on the substrate so as to cover the periphery of the negative tone pattern, and
   (vi) removing the second film existing in an area other than the area on the side wall of the negative tone pattern, and (vii) selectively removing the negative tone pattern, after (iv) forming the second film on the substrate so as to cover the periphery of the negative tone pattern.

2. The pattern forming method according to claim 1, wherein the resin (A) comprises a repeating unit represented by the following general formula (AI):

[Chem. 1]

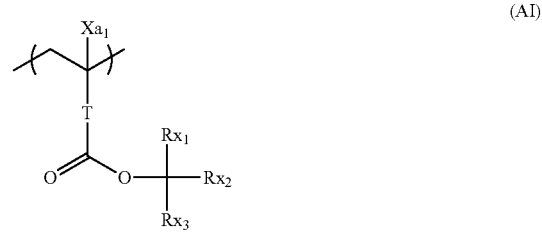

wherein in the general formula (AI),
$Xa_1$ represents a hydrogen atom, an alkyl group, a cyano group, or a halogen atom;
T represents a single bond or a divalent linking group;
$Rx_1$ to $Rx_3$ each independently represents an alkyl group or a cycloalkyl group; and
any two members of $Rx_1$ to $Rx_3$ may be bonded to each other to form a ring structure.

3. The pattern forming method according to claim 2, wherein the content of the repeating unit represented by the general formula (AI) is 40% by mole or more, based on all the repeating units of the resin (A).

4. The pattern forming method according to claim 1, wherein the heating temperature for (v) heating the negative tone pattern is 150° C. or higher.

5. The pattern forming method according to claim 1, wherein the second film is a silicon oxide film.

6. A method for producing an electronic device, comprising the pattern forming method according to claim 1.

7. The pattern forming method according to claim 1, wherein the second film is a metal oxide film or a metal nitride film.

8. The pattern forming method according to claim 1, wherein neither perhydropolysilazane (PHPS) nor methylhydropolysilazane (MHPS) is used in step (iv) of forming the second film on the substrate.

9. The pattern forming method according to claim 1, wherein a silicon nitride is not used in step (iv) of forming the second film on the substrate.

* * * * *